United States Patent
Sekiya et al.

(10) Patent No.: US 6,975,663 B2
(45) Date of Patent: Dec. 13, 2005

(54) SURFACE-EMISSION LASER DIODE OPERABLE IN THE WAVELENGTH BAND OF 1.1-7μM AND OPTICAL TELECOMMUNICATION SYSTEM USING SUCH A LASER DIODE

(75) Inventors: Takuro Sekiya, Kanagawa (JP); Akira Sakurai, Kanagawa (JP); Masayoshi Katoh, Kanagawa (JP); Teruyuki Furuta, Kanagawa (JP); Kazuya Miyagaki, Kanagawa (JP); Ken Kanai, Tokyo (JP); Atsuyuki Watada, Mishima (JP); Shunichi Sato, Watari-gun (JP); Koei Suzuki, Sendai (JP); Satoru Sugawara, Sendai (JP); Shinji Satoh, Yokohama (JP); Shuuichi Hikichi, Shibata-gun (JP); Naoto Jikutani, Yokohama (JP); Takashi Takahashi, Sendai (JP); Akihiro Itoh, Watari-gun (JP)

(73) Assignee: Ricoh Company, Ltd., Tokyo (JP)

( * ) Notice: Subject to any disclaimer, the term of this patent is extended or adjusted under 35 U.S.C. 154(b) by 16 days.

(21) Appl. No.: 10/085,204

(22) Filed: Feb. 26, 2002

(65) Prior Publication Data

US 2003/0053501 A1 Mar. 20, 2003

(30) Foreign Application Priority Data

| | | |
|---|---|---|
| Feb. 26, 2001 | (JP) | 2001-050083 |
| Feb. 26, 2001 | (JP) | 2001-050145 |
| Feb. 26, 2001 | (JP) | 2001-050171 |
| Feb. 26, 2001 | (JP) | 2001-051253 |
| Feb. 26, 2001 | (JP) | 2001-051256 |
| Feb. 26, 2001 | (JP) | 2001-051266 |
| Feb. 27, 2001 | (JP) | 2001-053190 |
| Feb. 27, 2001 | (JP) | 2001-053200 |
| Feb. 27, 2001 | (JP) | 2001-053213 |
| Feb. 27, 2001 | (JP) | 2001-053218 |
| Feb. 27, 2001 | (JP) | 2001-053225 |
| Mar. 15, 2001 | (JP) | 2001-073767 |
| Mar. 27, 2001 | (JP) | 2001-090711 |
| Jan. 29, 2002 | (JP) | 2002-019748 |
| Feb. 12, 2002 | (JP) | 2002-033590 |
| Feb. 26, 2002 | (JP) | 2002-050548 |

(51) Int. Cl.$^7$ ............................. H01S 3/08; H01S 5/00
(52) U.S. Cl. ................................... 372/99; 372/43
(58) Field of Search ...................... 372/43, 96, 99, 372/102, 45, 46

(56) References Cited

U.S. PATENT DOCUMENTS

| | | | | |
|---|---|---|---|---|
| 4,949,350 | A | * 8/1990 | Jewell et al. | 372/45 |
| 5,555,333 | A | 9/1996 | Kato | 385/89 |
| 5,759,453 | A | 6/1998 | Kato | 264/1.25 |
| 5,853,626 | A | 12/1998 | Kato | 264/1.25 |
| 5,864,575 | A | * 1/1999 | Ohiso et al. | 372/96 |

OTHER PUBLICATIONS

U.S. Appl. No. 10/370,737, filed Feb. 24, 2003, Miyagaki et al.
U.S. Appl. No. 10/386,056, filed Mar. 12, 2003, Sekiya.
U.S. Appl. No. 10/770, 446, filed Feb. 4, 2004, Kanai.
U.S. Appl. No. 10/994,321, filed Nov. 23, 2004, Miyagaki, et al.

* cited by examiner

Primary Examiner—Minsun Oh Harvey
Assistant Examiner—James Menefee
(74) Attorney, Agent, or Firm—Oblon, Spivak, McClelland, Maier & Neustadt, P.C.

(57) ABSTRACT

A surface-emission laser diode includes a distributed Bragg reflector tuned to wavelength of 1.1 μm or longer, wherein the distributed Bragg reflector includes an alternate repetition of a low-refractive index layer and a high-refractive index layer, with a heterospike buffer layer having an intermediate refractive index interposed therebetween with a thickness in the range of 5–50 nm.

28 Claims, 122 Drawing Sheets

$\theta \perp \fallingdotseq 15°, \theta // \fallingdotseq 15°$

FIG. 74A
FIG. 74B
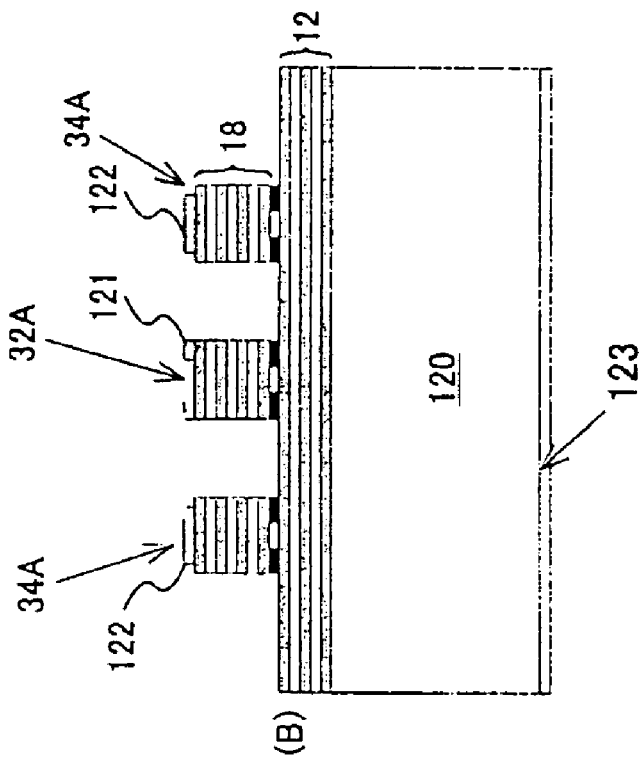
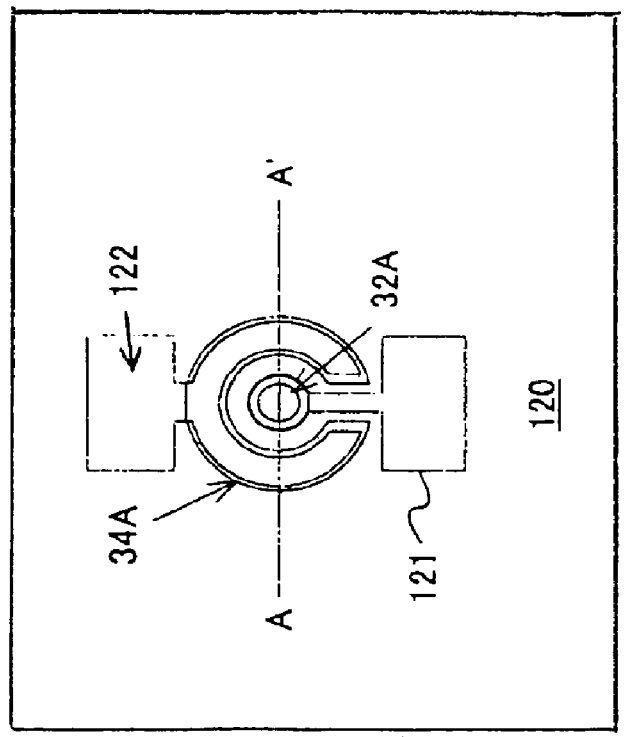

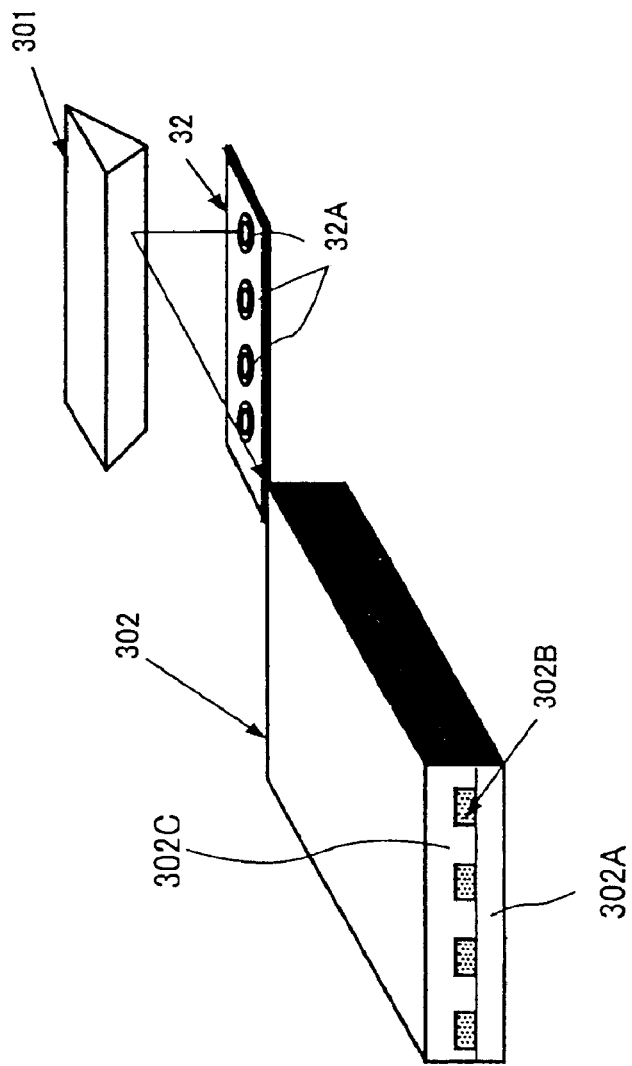
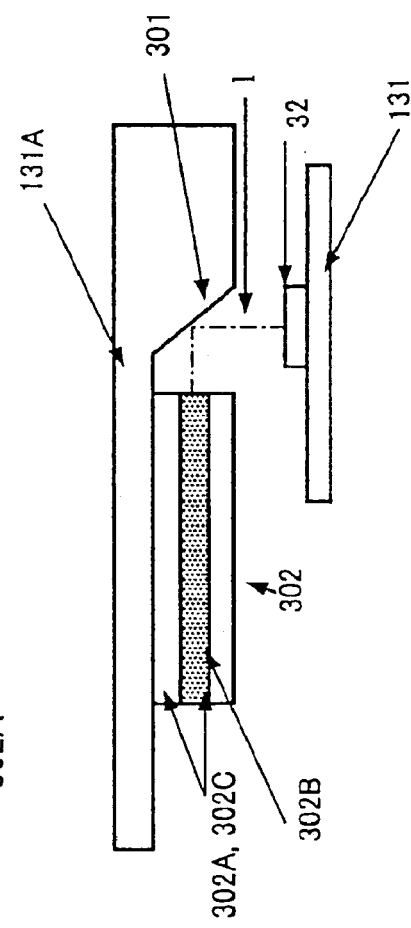
FIG. 97A
FIG. 97B

SURFACE-EMISSION LASER DIODE OPERABLE IN THE WAVELENGTH BAND OF 1.1-7μM AND OPTICAL TELECOMMUNICATION SYSTEM USING SUCH A LASER DIODE

BACKGROUND OF THE INVENTION

This invention generally relates to laser diodes and further to the art of optical telecommunication that uses a laser diode. Especially this invention is related to a so-called surface-emission laser diode that emits a laser beam in a generally vertical direction to a substrate surface. Also, the present invention is related to an optical transmission/reception system and optical-fiber telecommunication system that uses such a surface-emission laser diode.

A surface-emission laser diode is a laser diode that emits a laser beam in a generally vertical direction from a surface of a substrate. By using surface-emission laser diodes, two-dimensional array integration of laser diode is achieved easily. Further, the laser diode has an advantageous feature of relatively narrow divergent angle of the output optical beam (about 10 degrees), which is particularly suitable for coupling with optical fibers. Furthermore, inspection of the laser diode device is made easily in a surface-emission laser diode.

Thus, surface-emission laser diodes are suited to construct an optical transmission module (optical interconnection apparatus) of parallel-transmission type, and research and development are conducted prosperously. The immediate application of the optical interconnection apparatus would be the parallel connection between computers or circuit boards in a computer, including short-range optical-fiber telecommunication. In future, application to a large-scale computer network and trunk line system of long-range, large-capacity telecommunication is expected.

Generally, a surface-emission laser diode includes an active layer of a group III-V semiconductor material such as GaAs or GaInAs, and an optical resonator is formed by disposing an upper semiconductor Bragg reflector and a lower semiconductor Bragg reflector arranged respectively above and below the active layer.

In such a construction, the length of the optical resonator is remarkably short as compared with the case of an edge-emission laser diode. Therefore, it is necessary to increase the reflectance of the reflector to a high value (99% or more) for facilitating laser oscillation. Because of this, it is practiced to use a semiconductor Bragg reflector in a surface-emission laser diode as a reflector, wherein a semiconductor Bragg reflector is formed of an alternate and repetitive stacking of a high-refractive index material such as GaAs and a low refractive index material such as GaAs with a period of ¼ wavelength.

However, in the conventional semiconductor Bragg reflector that has the structure mentioned above, there arises a spike structure in the energy band as a result of band discontinuity at the hetero interface, at which the materials of different bandgaps are jointed, and the spike structure thus formed tends to function as a barrier against carriers. Thereby, there arises a problem in that the semiconductor multilayer part increases the resistance of the laser diode. Because of this, conventional surface-emission laser diodes constructed on a GaAs substrate have suffered from the problem of comparatively high operating voltage of about 2.5 volts or more. Because of this, it has been difficult to use the surface-emission laser diode with a CMOS driver integrated circuit, which produces a laser driving voltage of 2 volts at best. The itemization of this operating voltage of 2.5 volts is: 1.5V for the diode part; and 1V for the device resistance. In order to reduce the operational voltage below 2 V, it is necessary to reduce the device resistance by one-half, while it is extremely difficult to meet for this requirement at the present stage of technology.

In the case of a laser diode of long-wavelength band for use in optical telecommunication, such as the laser diode of 1.3 μm band or 1.55 μm, a low voltage operation is expected in view of the fact that only a voltage of 1 volt or less is applied to the diode part of the laser diode. Unfortunately, the desired low voltage operation is not materialized in such a long wavelength laser diode. In conventional long-wavelength laser diode, InP is used for the substrate and InGaAsP is used for the active layer. In such a system, the lattice constant of InP constituting the substrate is large, and it is difficult to achieve a large refractive-index difference in the reflector when a material that achieves lattice matching with the InP substrate is used for the reflector. Consequently, it has been necessary to stack 40 or more pairs in the reflector for realizing sufficient reflectance. In such a construction, however, the resistance of the reflector increases again as a result of increased stacking number of the reflector. Thus, it has been difficult to drive the laser diode driver by a CMOS integrated circuit.

In a surface-emission laser diode formed on an InP substrate, there is another problem of change of laser characteristic caused by the temperature. Because of this, it has been necessary to add an apparatus for stabilizing the temperature in the laser diode constructed on such an InP substrate. However, the use of such a temperature regulator is difficult in the apparatus for home use, which is subjected to a severe demand of cost reduction. Because of these problems of increased number of stacking in the reflector and the poor temperature characteristics, practical long-wavelength surface-emission laser diode has not yet commercialized.

In order to deal with the foregoing problems, there is a proposal to construct a surface-emission laser diode on a GaAs substrate by using an AlInP layer, which achieves a lattice matching with the GaAs substrate, in at least one of the upper and lower semiconductor Bragg reflectors as the low refractive index layer, and further by using a GaInNAs layer in at least one of the upper and lower semiconductor Bragg reflectors, as disclosed in Japanese Laid-Open Patent Application 9-237942, such that a large refractive index difference is realized in the reflector and the number of stacking therein is reduced while maintaining high reflectance.

In the foregoing conventional art, the bandgap of the active layer is reduced by 1.4 eV by using GaInNAs, in which N is introduced into the III-group V semiconductor material system of GaInAs. As a result, the laser diode can produce an optical beam with a wavelength longer than 0.85 μm. In the aforementioned prior art, it should be noted that the material system of GaInNAs can achieve a lattice matching with the GaAs substrate. Further, the prior art describes the semiconductor layer of GaInNAs can be a promising material for the long-wavelength surface-emission laser diode operable in the 1.3 micron band and 1.55 micron band.

In spite of such a description in the prior art with regard to the possibility of surface emission laser diode operable in the wavelength band longer than 0.85 μm, there has no such a laser diode actually materialized. The present situation would be something like that the theoretical construction is already established but the actual construction for materializing the laser diode is not discovered yet.

In one example, there is a laser diode that uses a semiconductor Bragg reflector formed by stacking high-refractive index material layers of GaAs and low refractive index material layers of AlAs alternately as noted above with the periods of ¼ wavelength. However, the laser diode structure thus formed does not provide optical emission at all, or operates but only with low power, indicating that the efficiency of optical emission is extremely small.

Similarly, there is a laser diode disclosed in the Japanese Laid Open Patent Application 9-237942 in which an AlInP layer is used for the low refractive index layer of the semiconductor Bragg reflector. In this case, too, the luminous efficacy of the laser diode is far from the level of practical use.

The reason of this unsatisfactory result is attributed to the chemical activity of the material including Al. More specifically, it is thought that the use of a material containing Al easily invites formation of crystal defects originating from Al. Thus, there have been proposals, as in the Japanese Laid-Open Patent Application 8-340146 and Japanese Laid-Open Patent Application 7-307525, to construct the semiconductor Bragg reflector with materials free from Al such as GaInNP and GaAs. However, the material system of GaInNP and GaAs can provide a refractive-index difference of about half as compared with the material system of AlAs and GaAs. Thus, the stacking number in the reflector has to be increased, and the object of reducing the resistance of the surface-emission laser diode is not attained.

Thus, at present, the surface-emission laser diode operable at the long-wavelength of 1.1–1.7 $\mu$m does not exist, and because of this, it is not possible to construct a computer network or optical-fiber telecommunication system that uses such a laser diode.

As explained before, in a conventional surface-emission laser diode, it was also not possible to use a CMOS circuit for the laser diode driver, and it has been necessary to use an expensive special driver circuit. On the other hand, if a mass-produced CMOS driver integrated circuit could be used, the cost of the optical telecommunication system that uses such a surface-emission laser diode would be reduced significantly.

Furthermore the use of a CMOS circuit can reduce the power supply voltage of the driver integrated circuit as well from 5V to 3.3V. With this, it is possible to reduce the power consumption of the system to about one-half, and a very large effect of electric power saving is obtained.

As noted before, there is a widespread expectation of optical-fiber telecommunication in relation to computer networks, and the like. Especially, there is a need of realizing a low cost system in order that the public accepts such an optical telecommunication system. Unfortunately, the surface-emission laser diode that can be used for this purpose and can be used with a low-cost CMOS driver integrated circuit, and oscillates at the long-wavelength band of 1.1–1.7 $\mu$m does not exist. Hence, the telecommunication system that uses such a surface emission laser diode does not exist.

Meanwhile, in the above-mentioned semiconductor Bragg reflector, in which semiconductor layers of different bandgaps are grown alternately, there arises the problem of spike formation in the band structure thereof at the hetero interface as a result of the band discontinuity. When such a spike structure is formed, the spike structure functions as a barrier with regard to the carriers. Thus, there arises a problem in that the electric resistance becomes very high in the semiconductor multilayer part of the surface-emission laser diode. This effect also contributes to the large drive voltage of 2.5 V for the surface-emission laser diode constructed on a GaAs substrate. As noted previously, it has been difficult to drive a laser diode having such a large driving voltage by the driver integrated circuit formed of a CMOS circuit (driving voltage is below 2 volts).

As noted previously, the itemization of this operating voltage of 2.5 volts is: 1.5V for the diode part; and 1V for the device resistance, and it is necessary to reduce the device resistance by one-half in order to drive the laser diode with a drive voltage below 2 volts. However, this is a very difficult subject.

Recently, the optical systems are used also for peripheral transmission/reception systems, and there is a widespread expectation about the computer networks using the optical-fiber telecommunication technology including such a peripheral transmission/reception system. Especially, there is a keen interest about a low cost optical system required for spreading of the optical fiber technology to the general public. However, the surface-emission laser diode that can be used for this purpose and can be used with a low-cost CMOS driver integrated circuit, and oscillates at the long-wavelength band of 1.1–1.7 $\mu$m does not exist yet. Hence, the telecommunication system that uses such a surface emission laser diode does not exist at the moment.

In such an optical-fiber telecommunication system that uses the long-wavelength surface-emission laser diode operating at the wavelength band of 1.1–1.7 $\mu$m, the photodetection device constructed on a Si substrate cannot be used, as such a photodetection device cannot detect the wavelength of 1.1–1.7 $\mu$m. In such a system, it is necessary to use a photodetection device that has a sensitivity to the wavelength of 1.1–1.7 $\mu$m. However, the photodetection device that has sensitivity to the desired wavelength band of 1.1–1.7 $\mu$m is expensive as compared with the low cost Si photodetection device. Thus, simple replacement of a conventional Si photodetection device with the photodetection device having the sensitivity to the wavelength of 1.1–1.7 $\mu$m causes an increase of cost of the whole optical-fiber telecommunication system. Thus, in order to realize an optical telecommunication system that uses the long-wavelength surface-emission laser diode of 1.1–1.7 $\mu$m band, an approach other than replacing the conventional Si photodetection device with an expensive photodetection device is needed.

Furthermore, a GaInNAs active layer having a high strain is used in the long-wavelength surface-emission laser diode, as will be explained below. In such a laser diode, deterioration of device characteristic may be caused as a result of the thermal stress caused by the difference of linear thermal expansion coefficient with regard to the mounting substrate.

Meanwhile, in the optical-fiber telecommunication system that uses a surface-emission laser diode, it is possible to arrange a number of laser diode elements, each formed of a surface-emission laser diode, with high integration density. Thus, the distance between the optical fibers can be reduced as compared with the case in which a conventional edge-emission laser diode is used for the laser diode array. Generally, optical fibers accommodated in an optical cable is provided with a marker band or a plastic ring in the form of a coloring layer or identification code (ID mark), in order to allow identification of the transmission line. When the distance between the optical fibers is reduced, the space available for these protection layers or rings is reduced.

In the production of an optical module that accommodates therein an array of surface-emission laser diodes, it should be noted that the produced optical module would becomes a defective product unless a necessary quality is secured for a predetermined number of laser diode elements in the array. Otherwise, the product loses the value thereof.

This issue is related to the yield of the laser diode production process. In the production of the module product that uses an array arrangement of the laser diode elements, there is an acute demand of establishing the production process in which the modules that function normally are utilized efficiently and the yield of production of the module is improved.

Summarizing above, there is no available long-wavelength surface-emission laser diode operable at the wavelength band of 1.1–1.7 μm and that there is no available optical transmission/reception system that uses such a laser diode.

SUMMARY OF THE INVENTION

Accordingly, it is a general object of the present invention to provide a novel and useful surface-emission laser diode operable in a long wavelength band and an optical transmission/reception system or optical telecommunication system that uses such a surface-emission laser diode.

Another and more specific object of the present invention is to provide a surface-emission laser diode or laser diode array having a distributed Bragg reflector tuned to a wavelength of 1.1 μm or longer wherein the electric resistance of the distributed Bragg reflector is minimized while maintaining high reflectance.

Another object of the present invention is to provide a surface-emission laser diode or laser diode array in which an intermediate layer is interposed between a high refractive index layer and a low refractive index layer constituting a distributed Bragg reflector with a refractive index intermediate between the high refractive index layer and the low refractive index layer, wherein the thickness of the intermediate layer is optimized for minimizing the resistance of the distributed Bragg reflector while maintaining a high reflectance.

Another object of the present invention is to provide a surface-emission laser diode or laser diode array in which an intermediate layer or heterospike buffer layer is interposed between a low refractive index layer having a wide bandgap and a high refractive index layer having a narrow bandgap with an intermediate bandgap, wherein the compositional profile of Al in the heterospike buffer layer is optimized so as to minimize the resistance of the distributed Bragg reflector while maintaining a high reflectance.

Another object of the present invention is to provide an optical interconnection system or optical telecommunication system using such a surface-emission laser diode or surface-emission laser diode array.

Another object of the present invention is to provide an optical transmission/reception system that uses a long-wavelength surface-emission laser diode operable at the laser oscillation wavelength of 1.1–1.7 μm with low operating voltage and small oscillation threshold current.

Another object of the present invention is to provide an optical transmission/reception system suitable for construction inside a building by using a surface-emission laser diode chip in which the operating voltage is reduced and the threshold current for laser oscillation is reduced.

Another object of the present invention is to provide a stabilized optical transmission/reception system by using a long-wavelength surface-emission laser diode chip operating stably at the wavelength of 1.1–1.7 μm for the optical source.

Another object of the present invention is to eliminate various problems that arise when such an optical transmission/reception system is actually incorporated in an electronic apparatus.

Another object of the present invention is to provide a low-cost and energy-saving optical transmission/reception system by using a surface-emission laser diode chip operable at low voltage with a small threshold current of laser oscillation.

Another object of the present invention is to facilitate the construction of an optical-fiber telecommunication system that uses a surface-emission laser diode operating at low voltage with low oscillation threshold current as an optical source, by increasing the length of the optical fiber cable extending from a module package beyond a certain length, and hence by improving the productivity of assembling the module package.

Another object of the present invention is to provide an optical-fiber telecommunication system that enables optical transmission of large capacity with low cost, by using a surface-emission laser diode having a reduced operational voltage and reduced oscillation threshold, as an optical source.

Another object of the present invention is to provide a reliable optical-fiber telecommunication system by using a surface-emission laser diode having a low operational voltage and low oscillation threshold as an optical source, such that the change of operational characteristic of the laser diode is suppressed and the lifetime of the laser diode is increased.

Another object of the present invention is to provide an optical telecommunication system realizing excellent optical coupling between a laser diode and an optical fiber, by using a surface-emission laser diode operable at a low operational voltage with low oscillation threshold, for an optical source.

Another object of the present invention is to provide an optical telecommunication system having a simple construction characterized by reduced number of parts and is simultaneously capable of realizing excellent optical coupling as a result of use of a surface-emission laser diode operable at a low operational voltage with low oscillation threshold, for an optical source.

Another object of the present invention is to provide an optical telecommunication system realizing excellent optical coupling between a laser diode and an optical fiber, by using a surface-emission laser diode operable at a low operational voltage with low oscillation threshold, for an optical source.

Another object of the present invention is to provide an optical telecommunication system capable of using a laser diode without causing damage therein, by using a surface-emission laser diode operable at a low voltage with low threshold current of laser oscillation.

According to the present invention, the surface-emission laser diode oscillates at the wavelength band of 1.1–1.7 microns suitable for use in an optical-fiber telecommunications in computer networks or long-range, large-capacity telecommunication trunks. The surface-emission laser diode of the present invention oscillates stably at this wavelength band with low operating voltage and low oscillation threshold. Conventionally, such a low surface-emission laser diode did not exist. The laser of the present invention oscillates at the aforementioned wavelength region with low operational voltage and low threshold current as a result of use of an improved semiconductor Bragg reflector. As a result of low power consumption, the surface-emission laser diode of the present invention successfully eliminates the heating problem. Thereby, the surface-emission laser diode of the present invention oscillates stably. By using such a surface-emission laser diode, it became possible to construct a practical point-to-point optical transmission/reception system with low cost.

In constructing such a point-to-point optical transmission/reception system, the present invention avoids localized bending of the transmission path. As a result, the optical transmission/reception system connects two points easily and with low cost, without damaging the optical fiber.

BRIEF DESCRIPTION OF THE DRAWINGS

FIGS. 74A and 74B are diagrams showing the constitution of a long-wavelength surface-emission laser diode chip according to an embodiment of this invention;

FIGS. 97A and 97B are diagrams showing the constitution of a connection part of a laser diode and an optical waveguide of an optical-fiber telecommunication system that uses a long-wavelength surface-emission laser diode according to an embodiment of this invention;

FIG. 120 is a diagram showing the constitution of a long-wavelength surface-emission laser diode according to an embodiment of this invention;

FIG. 121 is a diagram showing the constitution of a long-wavelength surface-emission laser diode module according to an embodiment of this invention;

FIG. 122 is a diagram showing an example of laser chip that is used in this invention;

FIG. 123 is a diagram showing a different example of laser chip that is used in this invention;

FIG. 124 is a diagram showing an example of system of this invention;

FIG. 125 is a diagram showing the constitution of such a laser chip that explains the system of this invention;

FIG. 126 is a diagram showing an example of control system of this invention;

FIG. 127 is a diagram showing a different example of the control system of this invention;

FIG. 128 is a diagram explaining the system of this invention;

FIG. 129 is another diagram explaining the system of this invention;

FIG. 130 is a diagram showing the production process of a laser array module that uses the long-wavelength surface-emission laser diode according to an embodiment of this invention;

FIG. 131 is a diagram explaining the quality control process used in the production process of FIG. 13o.

DETAILED EXPLANATION OF PREFERRED EMBODIMENTS

[First Embodiment]

First, a light-emitting device used in an optical-fiber telecommunication system of this invention will be explained with reference to FIG. 1.

Figure 1:
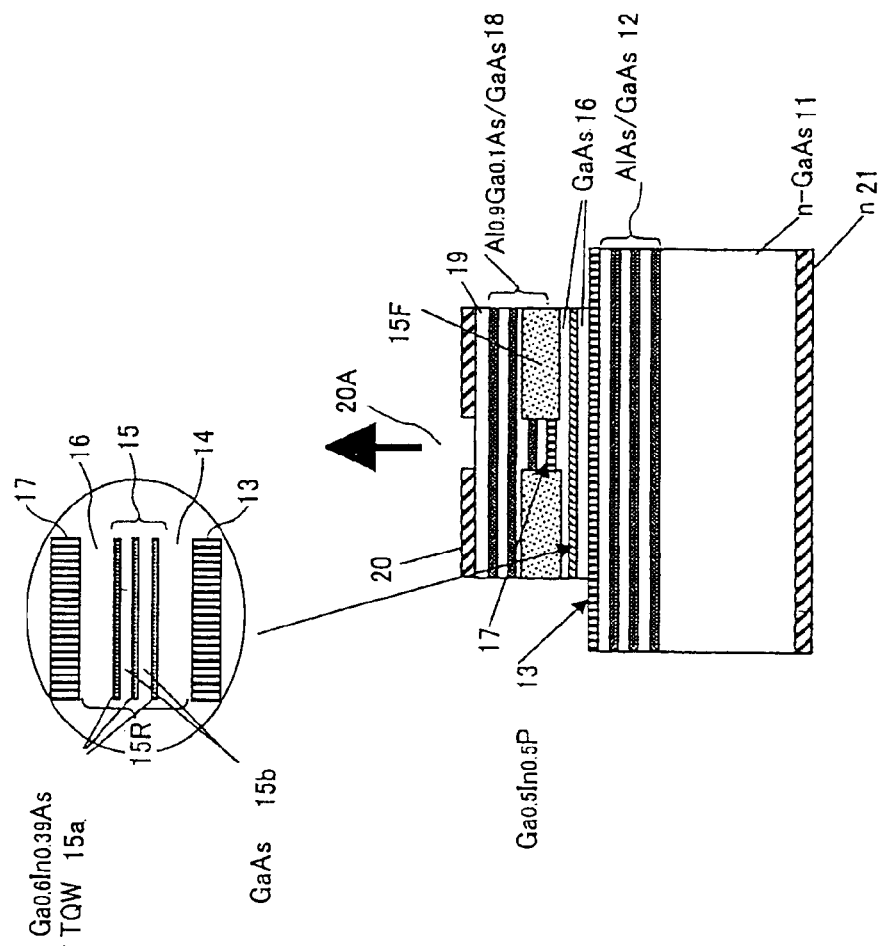
FIG. 1 is a diagram showing a cross-sectional view of a long-wavelength surface-emission laser diode according to a first embodiment of this invention.

FIG. 1 shows an example of a long-wavelength surface-emission laser diode that oscillates at the wavelength of 1.1–1.7 $\mu$m in which the transmission loss becomes minimum.

As explained before, while there have been some suggestions about the possibility of long-wavelength surface-emission laser diode that oscillating at the wavelength of 1.1–1.7 $\mu$m, there have been no knowledge available with regard to the material and constitution for the realization such a laser diode.

This invention provides concrete constitution of such a long-wavelength surface-emission laser diode that uses a material of GaInNAs system for the active layer.

In this invention, a high refractive index layer and a low refractive index layer of n-type AlGaAs respectively having a composition represented by $Al_xGa_{1-x}As$ (x=1.0) and $Al_yGa_{1-y}As$ (y=0) are stacked on an n-type GaAs substrate 11 having a (100) surface orientation alternately and repeatedly for 35 periods with a thickness $\lambda/4$ for each layer, wherein the $\lambda/4$ thickness is a thickness of ¼ times the oscillation wavelength $\lambda$ of the laser diode. As a result, an n-type semiconductor Bragg reflector (AlAs/GaAs lower semiconductor Bragg reflectors) 12 is formed on the GaAs substrate 11.

Next, an n-type GaInPAs layer 13 having a composition represented as $Ga_xIn_{1-x}P_yAs_{1-y}$ (x=0.5, y=1), is provided on the Bragg reflector 12 with a thickness of $\lambda/4$. In this example, this n-type $Ga_xIn_{1-x}P_yAs_{1-y}$ (x=0.5, y=1) layer 13 also constitutes one of the low refractive index layers that forms a part of the lower part reflector 12.

Further, a lower part spacer layer 14 of undoped GaAs is formed on the GaInPAs layer 13, and an active layer 15 having a multiple quantum well structure, in which three quantum well layers 15a each having a composition represented as $Ga_xIn_{1-x}As$ are stacked on the lower part spacer layer 14 with a GaAs barrier layer 15b having a thickness of 20 nm interposed therebetween. Further, an upper part spacer layer 16 of undoped GaAs is provided on the active layer 15. The active layer 15 forms a resonator 15R having a thickness $\lambda$ corresponding to one full wavelength of oscillation wavelength of the laser diode together with the upper and lower spacer layers 14 and 16. It should be noted that the resonator 15R constitutes the active region of the surface-emission laser diode.

In the constitution of FIG. 1, a p-type GaInPAs layer 17 doped with C (carbon) and having a composition of $Ga_xIn_{1-x}P_yAs_{1-y}$ (x=0.5, y=1) is formed further on the spacer layer 16. Further, a Zn-doped GaAs layer having a composition of $Al_xGa_{1-x}As$ (x=0) and a Zn-doped AlAs layer having a composition represented as $Al_xGa_{1-x}As$ (x=1.0) are formed on the p-type GaInPAs layer 17 alternately with a thickness of ¼ times the oscillation wavelength $\lambda$ in each medium, to form a periodical structure (one period).

Further, a semiconductor Bragg reflector 18 is formed thereon by stacking a C-doped, p-type AlGaAs layer having a composition represented as $Al_xGa_{1-x}As$ (x=0.9) and a Zn-doped, p-type GaAs having a composition represented as $Al_xGa_{1-x}As$ (x=0) alternately each with a thickness of ¼ times the oscillation wavelength λ of the laser diode in each medium, to form a periodic structure (25 periods). In this example, the p-type GaInPAs layer 17 also forms one of the low refractive index layers constituting a part of the upper part reflector.

Figure 2:
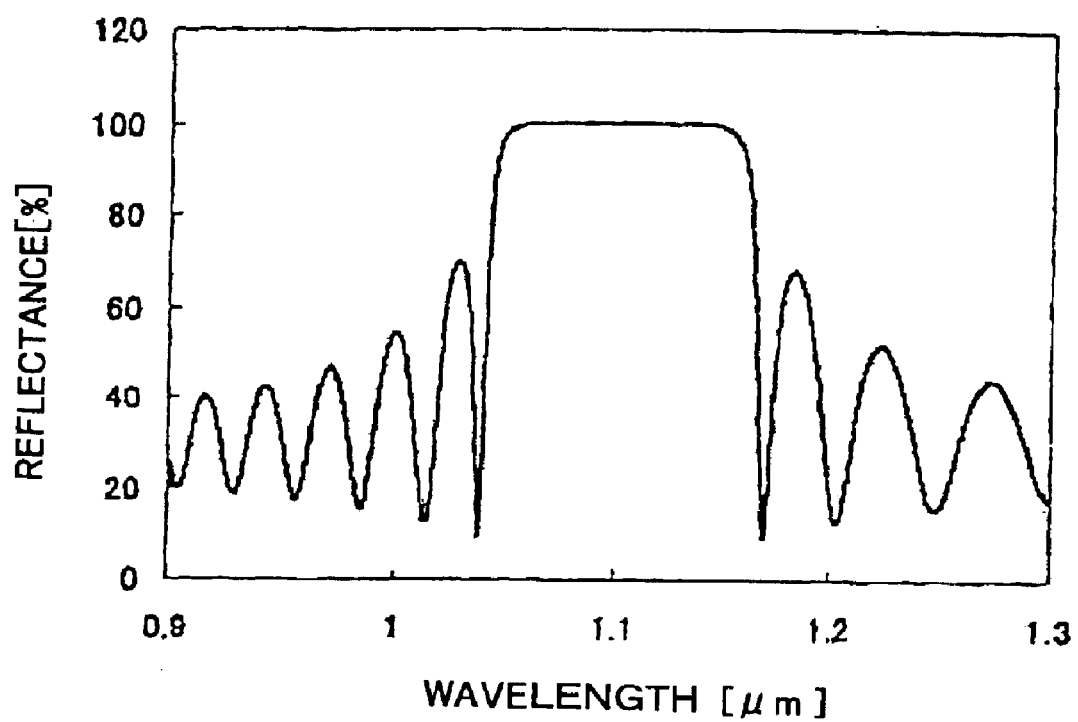
FIG. 2 is a diagram showing an example of reflection spectrum of a distributed Bragg reflector used in the laser diode of FIG. 1.

In this embodiment, each of the upper part reflector 18 and the lower part reflector 12 has the constitution of stacking a low refractive index layer and a high refractive index layer alternately, wherein it should be noted that a heterospike buffer layer having a composition represented as Al$_z$Ga1–zAs ($0 \leq y < z < x \leq 1$) and a refractive index intermediate between the low refractive index layer and the high refractive index layer is interposed in this invention between the low refractive index layer and the high refractive index layer as shown in FIG. 2.

Hereinafter, description will be made about the constitution of the reflector of the present invention that reflects the wavelength of 1.1 im or more in detail with reference to FIG. 2.

FIG. 2 shows a part of the semiconductor Bragg reflector 18. A similar constitution is formed also for the semiconductor Bragg reflector 12. In the description below, explanation for the Bragg reflector 12 will be omitted in view of the essentially same constitution of the reflector 18 and the reflector 12.

FIG. 2 shows an example of the reflection spectrum of the reflector in which a structural unit of AlAs/GaAs is repeated 24 times (24 pairs). In the example of FIG. 2, each of the AlAs layers is formed to have a thickness of 93.8 nm and each of the GaAs layers is formed to have a thickness of 79.3 nm, wherein it should be noted that these thicknesses are chosen so as to be equal to 1/4n wavelength of the optical radiation that has a wavelength of 1.1 μm in the vacuum environment. Here, n represents the refractive index of each of the AlAs layer and the GaAs layers. By setting the thickness of the layers constituting the distributed Bragg reflector to be equal to 1/4n times of a given wavelength λ, it is possible to tune the reflector to this wavelength λ, and the distributed Bragg reflector thus tuned shows a large reflectance in the wide wavelength band including the foregoing tuned wavelength λ. This wavelength λ will be referred to as designed wavelength.

It should be noted that the material of the AlGaAs system has various advantages for the material of the distributed Bragg reflector. For example, the AlGaAs material can be grown on a commonly available low-cost GaAs substrate with lattice matching. Further, the material has excellent heat radiation capability as compared with other semiconductor materials. Furthermore, by using the material system of AlGaAs, it becomes possible to secure a large diffractive index as compared with the case of using other material systems. For example, a refractive index difference of 0.5 is realized between the end member compositions AlAs and GaAs that constitute the AlGaAs system at the wavelength of 1.3 μm. Thus, it becomes possible to achieve a large reflectance with reduced number of stacked pairs as compared with the case of using other material system.

Figure 3:
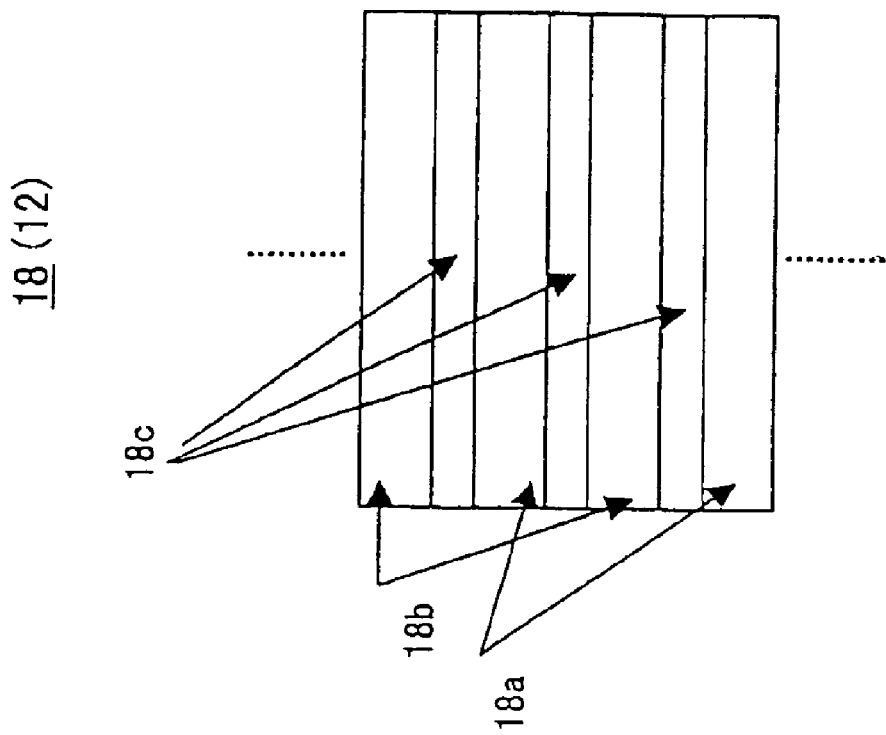
FIG. 3 is a cross-sectional view showing the constitution of a semiconductor Bragg reflector used in the long-wavelength surface-emission laser diode of the first embodiment.

FIG. 3 shows the construction of the distributed Bragg reflector constituting the upper reflector 18 or lower reflector 12 of the laser diode of FIG. 1.

FIG. 3 is referred to.

In the present embodiment, each of the upper and lower reflectors 18 and 12 is formed of a distributed Bragg reflector having a reflection wavelength of 1.1 μm or more and has a construction of stacking a lower refractive index layer 18a and an upper refractive index layer 18b, wherein it can be seen that there is provided a heterospike buffer layer 18c of Al$_x$Ga1–xAs ($0 \leq y < z < z \leq 1$) having a refractive index intermediate between the refractive index of the low refractive index layer 18a and the high refractive index layer 18b.

Such a heterospike buffer layer has been studied in relation to the laser diode of 0.85 μm band. However, it is still in the stage of feasibility study and no detailed study has been made with regard to the material, thickness, and like of the heterospike buffer layer. Further, there has been no proposal at all about such a heterospike buffer layer in relation to the long-wavelength surface-emission laser diode of 1.1–1.7 μm band as in the case of this invention. This is because the long-wavelength surface-emission laser diode of 1.1–1.7 μm band itself is a new field and few researches have been made so far.

The inventor of this invention noticed the usefulness of optical telecommunication technology that uses a long-wavelength surface-emission laser diode of 1.1–1.7 μm band and devotedly conducted a study so as to realize such a laser diode.

Such a heterospike buffer layer 18c is formed at the time of formation of the semiconductor Bragg reflector 12 or 18 by an MOCVD process, by controlling the source gas flow rate, such that the Al content in the AlGaAs film forming the heterospike buffer layer changes continuously or stepwise. With this, the refractive index of a film changes also continuously or stepwise.

In more detail, the supply rate of Ga and Al is changed such that the value of the compositional parameter z is changed in the Al$_z$Ga1–zAs ($0 \leq y < z < x \leq 1$) layer from 0 to 1.0, at the time of the formation of the AlGa s film 18c. With this, the film composition of the heterospike buffer layer changes gradually from GaAs to AlGaAs to AlAs. Such a change of the supply rate is caused by controlling the gas flow rate at the time of the formation of film 12c as noted before. A similar effect is obtained when the ratio of Al and Ga is changed stepwise or continuously.

The reason that such a heterospike buffer layer is provided is to eliminate the problem of is increased resistance, which appears in a semiconductor Bragg reflector, particularly in a p-type semiconductor Bragg reflector such as the Bragg reflector 18. Such increase of electric resistance is caused as a result of hetero barrier formed at the hetero interface where two different semiconductor layers of the semiconductor Bragg reflector make a contact. By changing the Al composition gradually at the hetero interface from the low refractive index layer to the high refractive index layer as in the case of this invention, there is also caused a corresponding gradual change of refractive index at the hetero interface. In this way, the occurrence of the hetero barrier at the hetero interface is successfully suppressed.

Hereinafter, more detailed explanation will be made about such a heterospike buffer layer with reference to FIG. 4.

Figure 4:
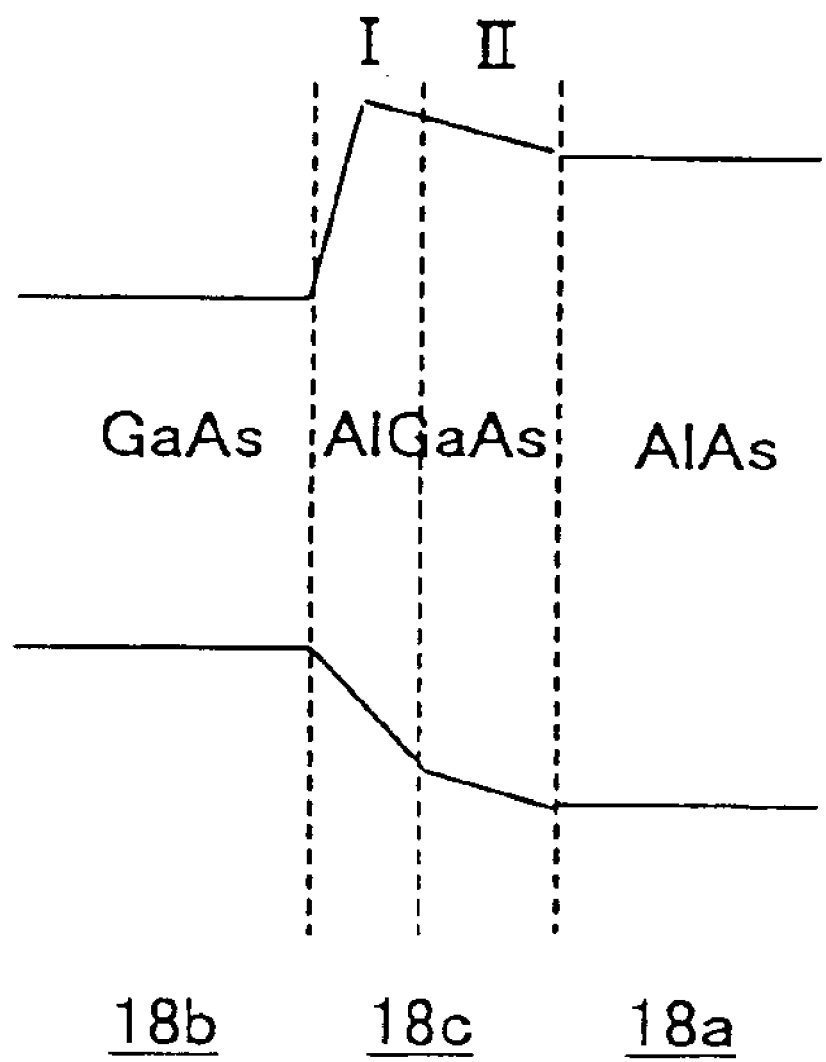
FIG. 4 is a diagram showing a compositional gradation of a heterospike buffer layer used in the semiconductor Bragg reflector constituting a part of the laser diode of the first embodiment.

FIG. 4 shows an example of the semiconductor Bragg reflector 18 provided with the heterospike buffer layer 18c between two semiconductor layers 18a and 18b constituting the semiconductor Bragg reflector. It should be noted that FIG. 4 shows the case of using the semiconductor material Al$_z$Ga1–zAs ($0 \leq y < z < x \leq 1$) of the AlGaAs system for the material of the semiconductor Bragg reflector.

The two semiconductor layers 18a and 18b constituting the semiconductor Bragg reflector 18 of FIG. 4 are AlAs and GaAs, and a compositional gradation layer changing the Al content gradually therein is provided between the layers 18a and 18b as the heterospike buffer layer. The heterospike buffer layer thus formed has valence band energy intermediate between the valence band energy of AlAs and the valence band energy of GaAs. Thus, the ratio of Al to Ga is changed from GaAs to AlGaAs to AlAs in the heterospike buffer layer, and the value of z of the AlzGa1−zAs ($0 \leq y < z < x \leq 1$) heterospike buffer layer is changed gradually from 0 to 1.0.

In the semiconductor material of the AlGaAs system, the bandgap energy increases with the Al content and the refractive index falls off with the Al content In the conduction band, there occurs an increase of band energy until the Al content x reaches 0.43, and the band energy starts to decrease thereafter. In the valence band, on the other hand, the valence band energy falls off monotonously with the increment of the Al content x. In total, the bandgap energy increases with the Al content x.

In the case of the quaternary system of AlGaInP, a similar trend as in the case of increasing the Al content in the AlGaAs system appears with increase of the AlInP composition, and the conduction band energy increases up to the point in which the AlInP composition has reached 0.7. Thereafter, the conduction band energy starts to decrease. On the other hand, the valence band energy decreases monotonously with the increase of AlInP composition.

In the example of FIG. 4, it should be noted that the rate of the compositional gradation (rate of increase of bandgap energy) is set larger in the region near the GaAs layer (region I in FIG. 4) as compared with the region near the AlAs layer (region II in FIG. 4). For the purpose of comparison, a structure having a linear compositional gradation layer, in which the Al content therein is changed only linearly, for the heterospike buffer layer 18c is shown in FIG. 5.

Figure 6:
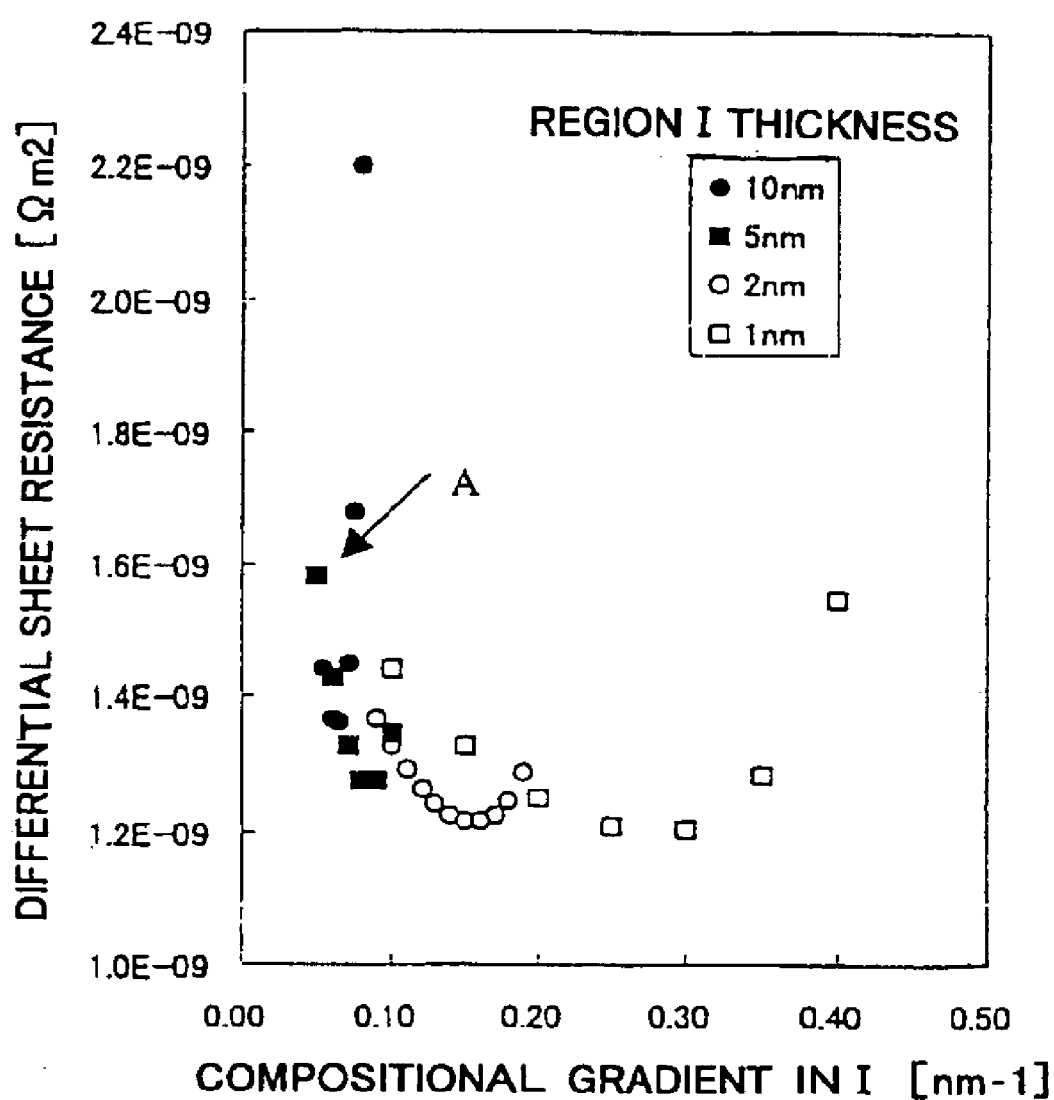
FIG. 6 is a diagram showing a result of evaluating a differentiation sheet resistance of the heterospike buffer layer of FIG. 4.

FIG. 6 shows the result of evaluation of the electric resistance of the p-type distributed Bragg reflector 18 tuned to the reflection wavelength of 1.3 μm, wherein the Bragg reflector 18 is formed by repeating the AlAs/GaAs unit structure, including therein the heterospike buffer layer of 20 nm is thickness between the AlAs layer 18a and the GaAs layer 18b, four times (four pair stacking).

In FIG. 6, each of the layers 18a–18c of the distributed Bragg reflector 18 including the heterospike buffer layer 18c is formed of a p-type layer having a career density of $1 \times 10^{18}$ cm$^{-3}$, and the vertical axis of FIG. 6 represents the value of differential sheet resistance at near zero bias state. On the other hand, the horizontal axis of FIG. 6 represents the Al compositional gradation in the region I. It should be noted that the "Al compositional gradation" is defined as the change of the Al content in the region I divided by the thickness of the region I. Thus, FIG. 6 represents the case in which the thickness of the region I is changed variously, while it should be noted that the total thickness of the region I and the region II is maintained constant at 20 nm. Thus, the thickness and the compositional gradation of the region II are determined by the thickness and the compositional gradation of the region I. The Al compositional gradation for the case a simple linear compositional gradation layer is provided between the GaAs layer and the AlAs layer becomes 0.05 nm$^{-1}$ This hits the A point of the drawing.

Figure 5:
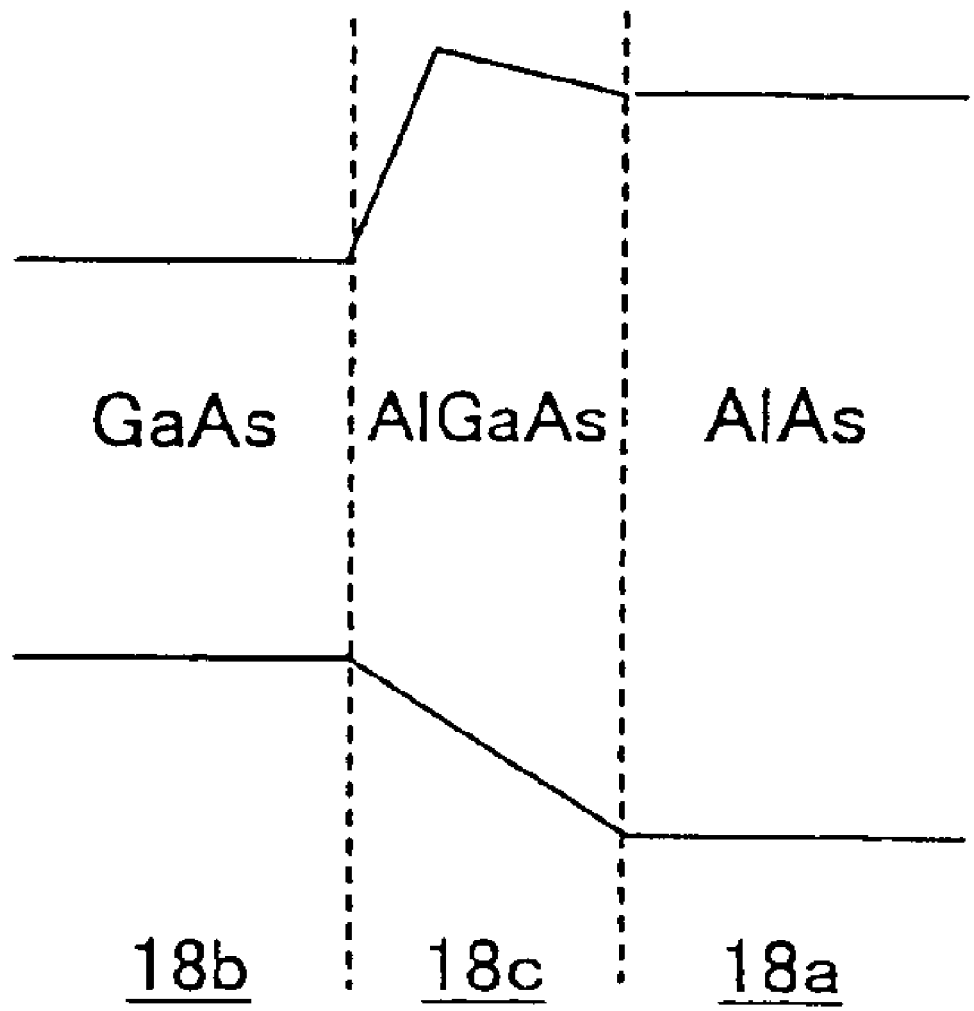
FIG. 5 is a diagram showing an example of changing an Al composition in the heterospike buffer layer.

From FIG. 6, it can be seen that the resistance is reduced further by increasing the Al compositional gradient in the heterospike buffer layer 18c from the region II to the region I as compared with the case of FIG. 5 in which the compositional gradation is linear throughout the heterospike buffer layer 18c. Also, it can be seen that there exists an optimum Al compositional gradation in which the resistance becomes minimum. For example, in the case the thickness of the region I is 10 nm (the same thickness as the region II), it can be seen that the resistance is reduced to about 80% of the conventional resistance value obtained for the case in which the Al compositional gradation is set to 0.09 nm$^{-1}$ This trend does not change depending on the applied voltage.

Next, the reason of this will be explained.

Figure 7:
FIG. 7 is a diagram showing the band structure of a distributed Bragg reflector near a heterojunction interface in a thermal equilibrium state.

FIG. 7 shows the valence band structure of the distributed Bragg reflector having the AlAs/GaAs structure for the part near the hetero surface in thermal equilibrium state.

FIG. 7 is referred to.

It can be seen that the heterospike originating from the band discontinuity appear predominantly at the side of the widegap AlAs layer. In the side of the GaAs layer, the occurrence of the notch is trifling. Thus, the notch at the side of the GaAs layer does not become the cause of increase of resistance. Therefore it is concluded that, for the reduction of resistance of a distributed Bragg reflector, it is important to eliminate or reduce the heterospike appearing at the side of the AlAs layer within a limited thickness of the heterospike buffer layer.

In the structure of FIG. 7, it can be seen that the Al content of the heterospike buffer layer 18c is increased sharply at the side of the GaAs layer 18b in which there occurs the notch formation, while this corresponds to a gentle compositional gradient at the side of the AlAs layer, in side which the remarkable heterospike formation takes place. By doing so, it becomes possible to reduce the spike formation as compared with the case of changing the composition of the heterospike buffer layer linearly as in the case of FIG. 5. When the Al compositional gradation is set smaller in the region I with regard to the region II, on the other hand, there occurs an unwanted increase of resistance.

Figure 8:
FIG. 8 is a diagram showing the band structure of the heterospike buffer layer of FIG. 3 in a thermal equilibrium state.

FIG. 8 shows the valence band diagram of the structures of FIGS. 3 and 4 in a thermal equilibrium state, wherein the continuous line represents the band structure of FIG. 3 while the dotted line represents the band structure of FIG. 4.

FIG. 8 is referred to. By using the compositional gradation profile of FIG. 4, it becomes possible to reduce the compositional gradation of the heterospike buffer layer 18c in the region II at the side of the AlAs layer 18a with regard to the region I at the side of the GaAs layer 18b as compared with case of using the simple compositional gradation of FIG. 5 with the same thickness. Thus, it is concluded that the resistance of the semiconductor distributed Bragg reflector is reduced by increasing the compositional gradation in the region I of the heterospike buffer layer I.

Figure 9:
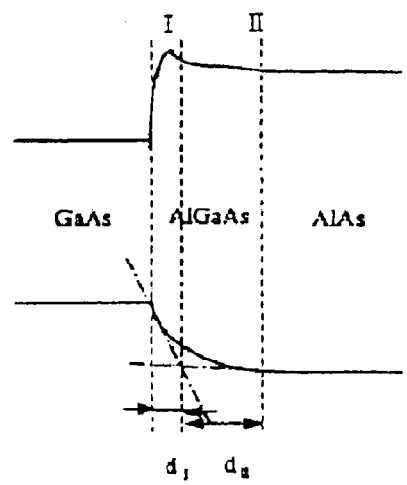
FIG. 9 is a diagram showing an example of the band structure of the heterospike buffer layer used in the present invention.

In the example of FIG. 4, it can be seen that the heterospike buffer layer 18c is formed of two regions I and II each having a linear Al compositional profile. On the other hand, it is also possible to change the Al content non-linearly as represented in FIG. 9. Even in such a case, it is possible to define the boundary between the regions I and II as an intersection of the intercept drawn to the valence band at the boundary between the GaAs layer 18b and the heterospike buffer layer 18c and the intercept drawn also to the valence band at the boundary between the AlAs layer 18a and the heterospike buffer layer 18c, as represented in FIG. 9.

Figure 10:
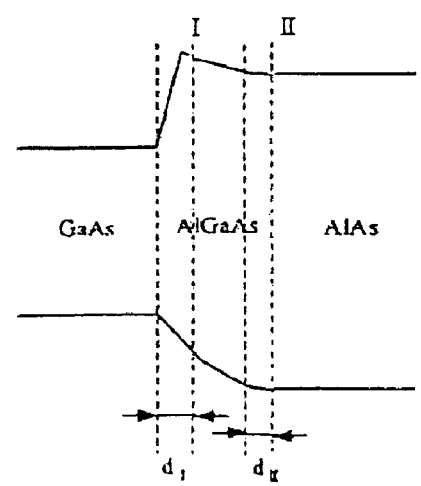
FIG. 10 is a diagram showing an example of the band structure of the heterospike buffer layer used in the present invention.

In the heterospike buffer layer 18c, it is not necessary that the Al composition changes continuously but another layer may exist between the regions I and II as represented in FIG. 10.

Figure 11:
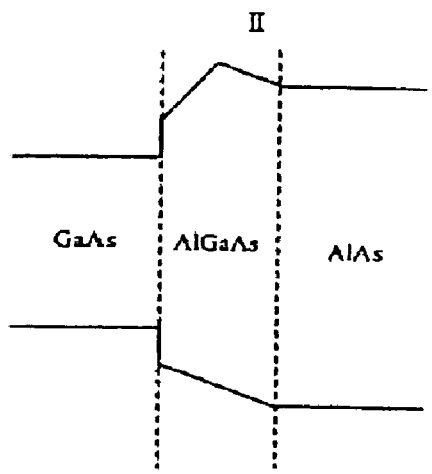
FIG. 11 is a diagram showing an example of the band structure of the heterospike buffer layer used in the present invention.
Figure 12:
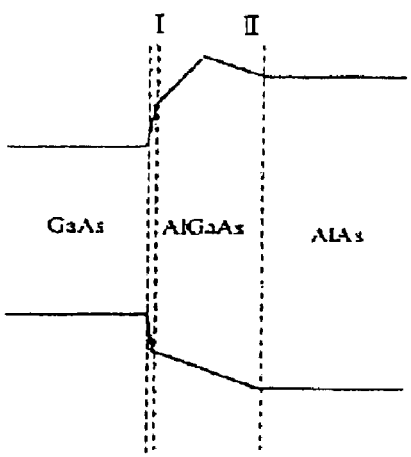
FIG. 12 is a diagram showing an example of the band structure of the heterospike buffer layer used in the present invention.

According to FIG. 6, the differential sheet resistance of the Bragg reflector is reduced with decreasing thickness of the region I. Further, it can be seen that the minimum of the differential sheet resistance is achieved when there is no region I provided as represented in FIG. 11 or when the thickness of the region I is small enough that it can be regarded that there is a discontinuity in the conduction band between the GaAs layer 18b (narrow gap layer) and the heterospike buffer layer 18c (widegap layer) as represented in FIG. 12.

Figure 13:
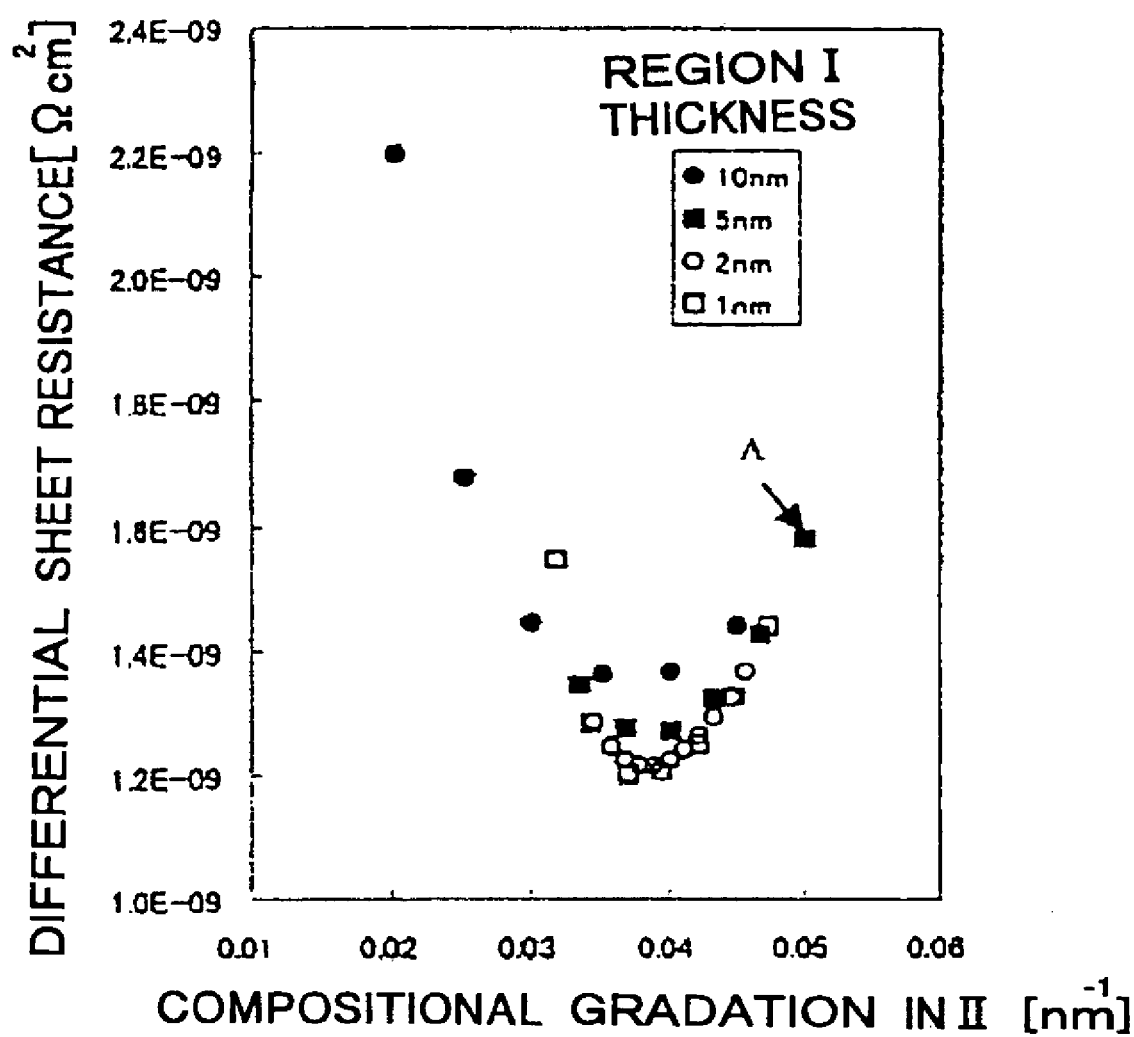
FIG. 13 is a diagram showing the relationship between the differential sheet resistance of the distributed Bragg reflector and the Al compositional profile in the heterospike buffer layer.

FIG. 13 shows the differential sheet resistance of the distributed Bragg reflector similar to the one shown in FIG. 6 as a function of the Al compositional gradation in the region II. It should be noted that the Al compositional gradation in the region II is determined uniquely from the Al compositional gradation in the region I and the thickness of the region I.

From FIG. 13, it can be seen that there appears a minimum of the differential sheet resistance at a particular value of the compositional gradation in the layer 11, wherein this particular value of the compositional gradation is irrelevant to the thicknesses of the regions I and II.

Figure 14:
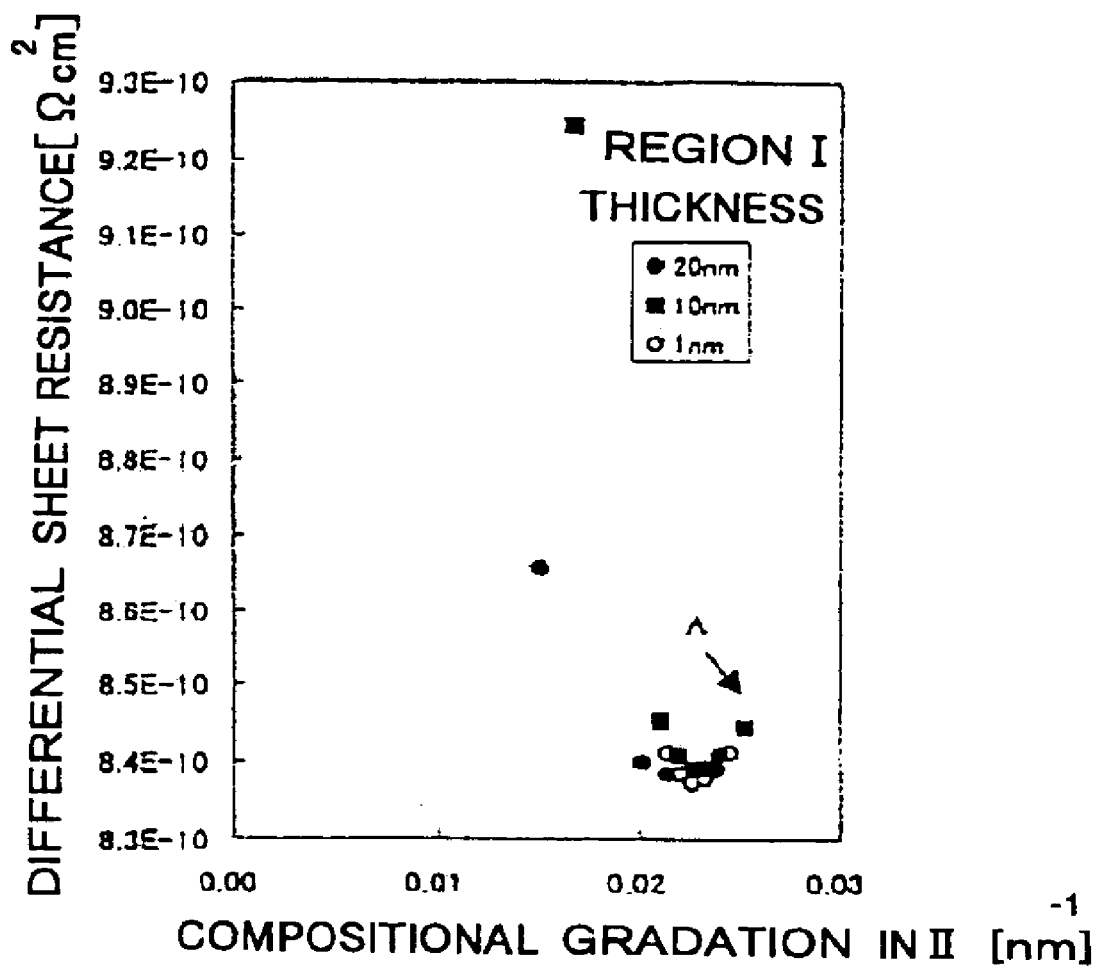
FIG. 14 is another diagram showing the relationship between the differential sheet resistance of the distributed Bragg reflector and the Al compositional profile in the heterospike buffer layer.

FIG. 14, on the other hand, shows a similar relationship as the case of FIG. 13 for the case the total thickens of the regions I and 11 is 40 nm.

Referring to FIG. 14, it can be seen that a similar minimum of resistance appears at a particular value of the Al compositional gradation.

From FIGS. 13 and 14, it is possible to evaluate the optimum discontinuity of valence band energy between the narrow gap layer (GaAs layer 18b of FIG. 3) and the heterospike buffer layer 18c for minimizing the resistance of the distributed Brag reflector having a heterospike buffer layer.

As noted above, in the semiconductor distributed Bragg reflector having a heterospike buffer layer, it is possible to minimize the resistivity of the reflector by changing the Al composition of the heterospike buffer layer sharply in the region I and optimizing the Al compositional gradation in the region II correspondingly, such that there appears a discontinuity or substantial discontinuity at the boundary between the narrow gap layer 18b and the heterospike buffer layer 18c.

For example, it is possible to reduce the resistance of the distributed Bragg reflector by about 75% by reducing the thickness of the region I to 1 nm in the heterospike buffer layer 18c having a thickness of 20 nm, as compared with the distributed Bragg reflector having a heterospike buffer layer of the same thickness except that the Al composition is changed linearly throughout the heterospike buffer layer.

Figure 15:
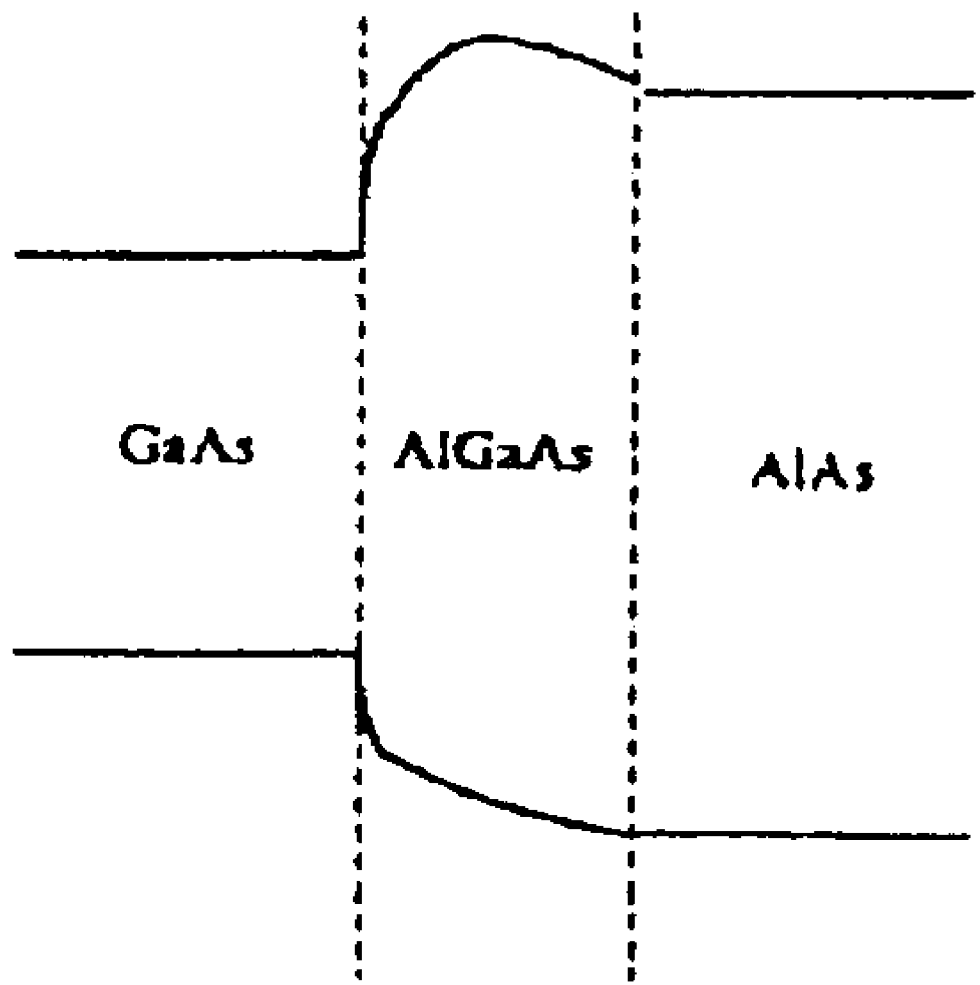
FIG. 15 is a diagram showing another band structure of the heterospike buffer layer.

In this case, too, it is not necessary that the Al content changes linearly in the regions I and II of the heterospike buffer layer 18c but the Al content may be changed non-linearly as represented in FIG. 15.

Further, it should be noted that the foregoing consideration is not limited to the distributed Bragg reflector of the AlGaAs system but is applicable also to the distributed Bragg reflector of other material systems such as AlGaInP system. In the case of the distributed Bragg reflector of the AlGaInP system, it is possible to achieve a similar effect by changing the AlInP composition in the heterospike buffer layer.

The present invention has a feature in that the main layer 18a or 18b and the heterospike relaxation layer 18c constituting the semiconductor distributed Bragg reflector of FIG. 3, have a carrier density in the range from $5 \times 10^{17}$ cm$^{-3}$ to $2 \times 10^{18}$ cm$^{-3}$, the heterospike relaxation layer 18c has a thickness in the range from 5 nm to 40 nm, and the average change rate of Al composition in the region II (see FIG. 4) is in the range from 0.02 nm$^{-1}$ to 0.15 nm$^{-1}$. Here, the Al compositional gradient in the region I is defined as "Al compositional gradient={variation (0-1) of Al content in the region I)/dI". By choosing each parameter of the heterospike buffer layer 18c that includes the distributed Bragg reflector to the foregoing range, reduction of resistance is achieved easily and effectively.

Table 12 below shows the Al composition gradient that provides minimum of the electric resistance and the corresponding sheet differential resistance for the case of changing the carrier density of the distributed Bragg reflector and the heterospike buffer layer 18c ($5 \times 10^{17}$ cm$^{-3}$, $2 \times 10^{18}$ cm$^{-3}$) and the thickness of the heterospike buffer layer 12 in the structure of FIG. 9, together with the percentage of the electric resistance decrease in comparison with the case in which a simple linear compositional gradient is used for the heterospike buffer layer (the structure of FIG. 5).

TABLE 12

| Heterospike buffer layer thickness | $5 \times 10^{17}$ [cm$^{-3}$] carrier density | $2 \times 10^{18}$ [cm$^{-3}$] carrier density |
|---|---|---|
| 5 [nm] | 0.16 [nm$^{-1}$]/ $8.4 \times 10^{-6}$ [Ω cm$^2$]/83% | 0.16/4.5 × 10$^{-8}$ [Ω cm$^2$]/90% |
| 40 [nm] | 0.02 [nm$^{-1}$]/ $2.1 \times 10^{-9}$[Ω cm$^2$]/91% | ... |

In view of increase of electrical resistance with decrease of the carrier density, the value of $5 \times 10^{17}$ cm$^{-3}$ is chosen as the actually allowable lower limit. Further, a value of $2 \times 10^{18}$ cm$^{-3}$ is chosen as the allowable upper limit in view of conspicuous optical absorption particularly in the case of a p-type semiconductor.

In the case the thickness of the heterospike buffer layer 12 is increased, a remarkable decrease of resistance is achieved. On the other hand, such a decrease of the thickness of the heterospike buffer layer 12 is not preferable in view of decrease of reflectance of the distributed Bragg reflector. From the viewpoint of reflectance, it is believed that the value of 40 nm or less is important for the practical thickness of the heterospike buffer layer.

In the case the thickness is too small, the desired resistance decrease is not attained. Thus, it is believed that the value of 5 nm or more is important for the thickness of the heterospike buffer layer 12 for realizing sufficient resistance reduction effect.

As compared with the case of the simple compositional gradation layer in which the Al content is changed linearly from the small-bandgap layer to the large bandgap layer constituting the main layers of the distributed Bragg reflector, the foregoing construction can achieve further reduction of the resistance. Within the foregoing range, the differential sheet resistance is decreased to about 75% ($1.2 \times 10^{-9}$ Ω cm$^2$ in terms of differential sheet resistance) in the embodiment of claim 3, and thus a significant effect is achieved.

Thus, the present embodiment can reduce the resistance further as compared with the case of using the linear compositional gradient in the heterospike buffer layer 18c of the same thickness. In the case of achieving the same resistance value, on the other hand, the present embodiment allows the use of reduced thickness for the necessary heterospike buffer layer 18c. Thus, adversary effect on the optical properties such as reflectance is minimized.

Thus, it becomes possible to obtain a distributed Bragg reflector excellent in terms of electric properties and optical properties, by choosing the structure of the distributed Bragg reflector and heterospike buffer layer as set forth in the claims.

Next, the optimum thickness of such a heterospike buffer layer $Al_zGa_{1-z}As$ ($0 \leq y < z < x \leq 1$) will be described.

Figure 16:
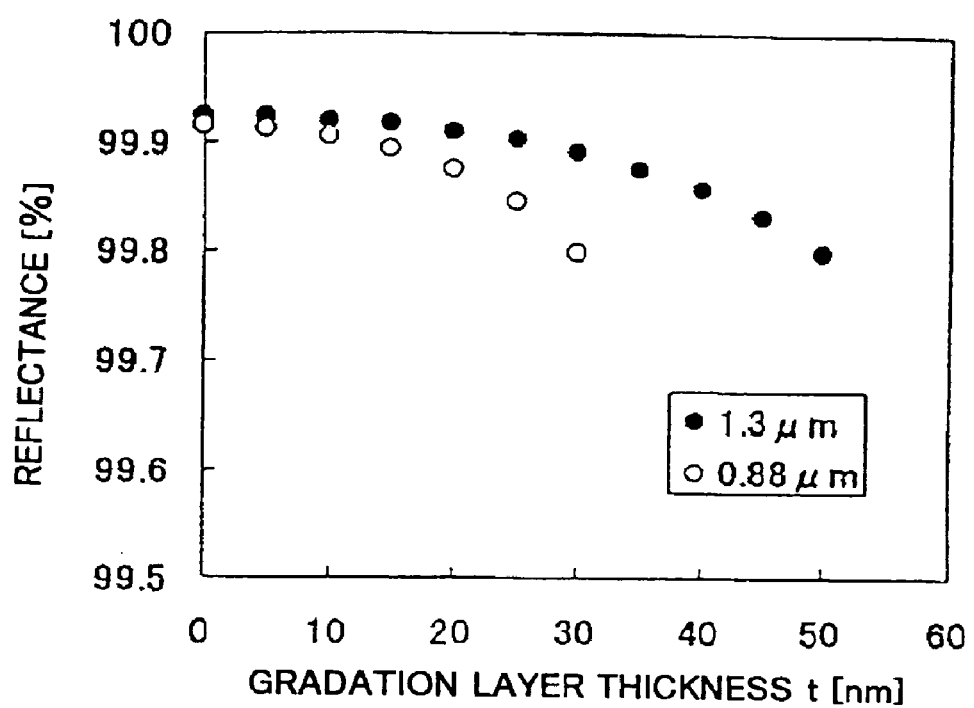
FIG. 16 is a diagram showing the relationship between the reflectance of the distributed Bragg reflector and the thickness of the heterospike buffer layer.

FIG. 16 shows the relationship between the reflectance and thickness of the heterospike buffer layer for a distributed Bragg reflector tuned to the 0.88 μm band and 1.3 μm band for the case the heterospike buffer layer 18c has a linear compositional profile of Al as represented in FIG. 5. The reason that the reflector tuned to the conventional wavelength of 0.88 μm was prepared in this experiment is to make a comparison with a conventional reflector tuned to this wavelength. It should be noted that GaAs absorbs optical radiation shorter than 0.87 μm. In FIG. 16, GaAs is used for the high refractive index layer and AlAs is used for the low refractive index layer.

The distributed Bragg reflector thus produced needed 18 pairs or more of the low refractive index layer and the high refractive index layer in order to achieve the reflectance exceeding 99.9% at the wavelength band of 0.88 μm, while 23 pairs or more were needed for achieving the same reflectance at the wavelength band of 1.3 μm. It should be noted that FIG. 16 represents the relationship between the reflectance and thickness of the heterospike buffer layer of the distributed Bragg reflector tuned to the respective wavelengths.

Table 1 summarizes the reflectance of FIG. 16.

TABLE 1

|  | 0 nm | 5 nm | 10 nm |
| --- | --- | --- | --- |
| 0.88 μm band | 99.914 | 99.912 | 99.905 |
| 1.3 μm band | 99.923 | 99.923 | 99.920 |

Referring to Table 1, it can be seen that there is no decrease of reflectance in the 1.3 μm band until the thickness of the heterospike buffer layer 18c reaches 5 nm. In the 0.88 μm band, on the other hand, there starts a decrease of reflectance at the thickness of 5 nm of the heterospike buffer layer 18c. In the case of a surface emission laser diode, the cavity length is characteristically small and the effect of reflection loss by the mirror appears conspicuously. Thus, even in the case the decrease of the reflectance is very small, a large effect is caused in the threshold current of the laser diode.

Figure 17:
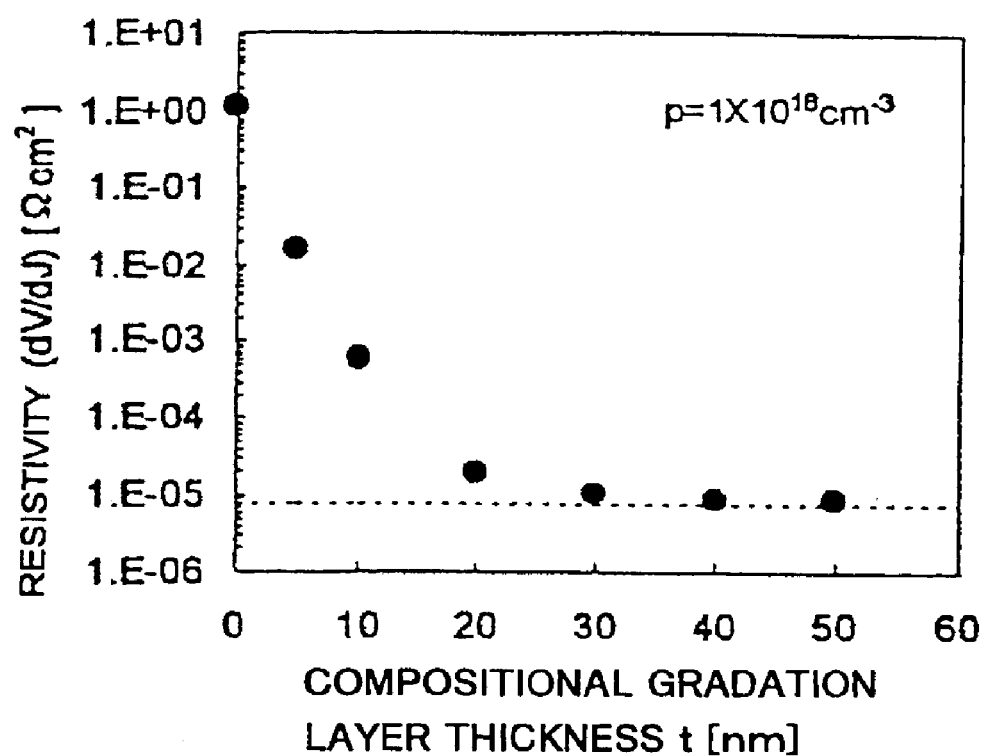
FIG. 17 is a diagram showing the relationship between the resistance of the distributed Bragg reflector and the thickness of the heterospike buffer layer.
Figure 18:
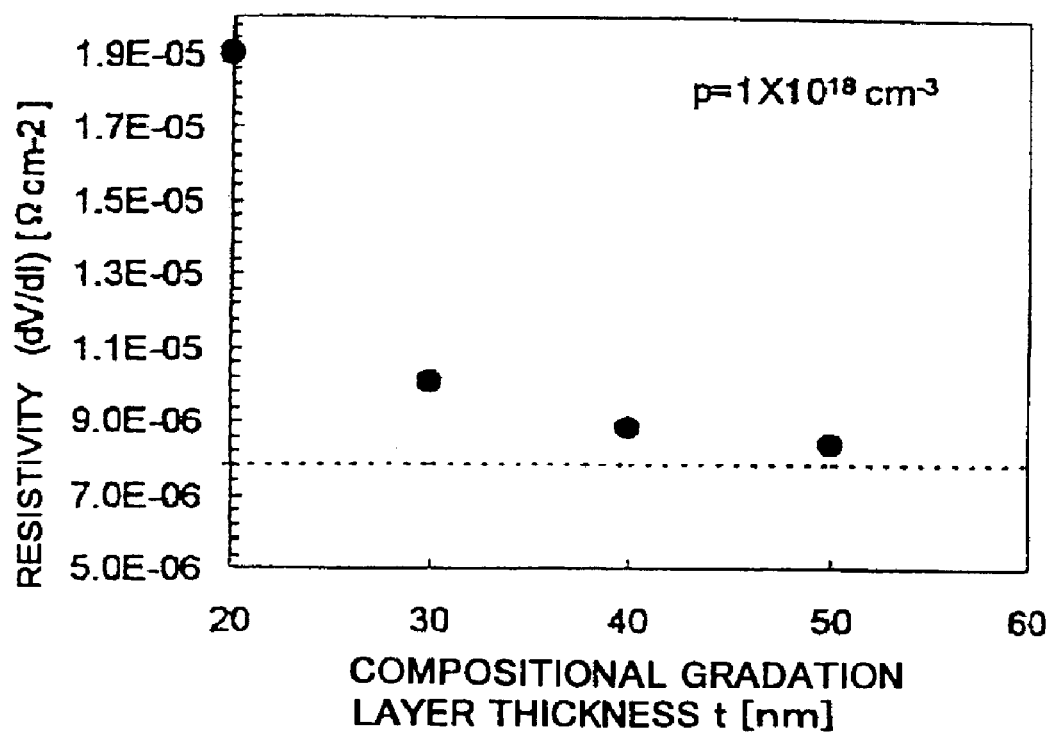
FIG. 18 is another diagram showing the relationship between the resistivity of the distributed Bragg reflector and the thickness of the heterospike buffer layer.

FIGS. 17 and 18 show the resistivity of the AlAs/GaAs distributed Bragg reflector, having the heterospike buffer layer 18c similar to FIG. 5 and tuned to the reflection wavelength of 1.3 μm, near the zero bias point. In the drawings, the resistivity is represented in terms of Ωcm² and is defined as dV/dJ (V: voltage represented in terms of volts; J: current density represented in terms of A/cm²). In the illustrated example, the number of pairs is four. It should be noted that FIG. 17 and FIG. 18 shows essentially the same diagram except that FIG. 17 shows the diagram in the logarithmic representation while FIG. 18 shows the diagram in the linear scale representation. In FIGS. 17 and 18, the broken line represents the resistivity evaluated from the bulk crystal resistivity, neglecting the effect of the band discontinuity. Further, each layer of the distributed Bragg reflector is doped to the p-type with the carrier density of 1×10¹⁸ cm⁻³.

Referring to FIG. 17, it can be sent hat the resistivity of the distributed Bragg reflector decreases with the thickness of the heterospike buffer layer 18c. In the case of the reflector tuned to the wavelength of 1.3 μm, the proportion of the compositional gradation layer 18c with regard to the rest of the layers lea and 18b is relatively small. Thus, it becomes possible to reduce the resistivity by two orders by providing the heterospike buffer layer 18c with the thickness of 5 nm, without causing influence to the reflectance. Longer the reflection wavelength, the heterospike buffer layer 18c can be formed with increased thickness. When the thickness is smaller than 5 nm, on the other hand, the desired reduction of the resistance is not obtained as can be seen from FIG. 17.

As represented in FIG. 17, the distributed Bragg reflector shows a very high resistivity value of 1 Ωcm² when the heterospike buffer layer 18c is omitted. Thus, in the matter of practical problems, it is extremely difficult to drive a laser diode having a distributed Bragg reflector in which 20 or more stacks are provided. In order to drive such a laser diode, a very high voltage would be needed. Thus, it is difficult to apply such a distributed Bragg reflector to a current driven device such as a surface-emission laser diode.

In the case of providing the heterospike buffer layer 18c with the thickness of 5 nm as noted above, the resistance of the reflector is reduced by two orders as compared with the case not providing such a heterospike buffer layer. As a result, supply of the drive current to the laser diode is facilitated and laser oscillation becomes possible. Further, the necessary drive voltage is reduced, and the problems such as failure or malfunctioning of the laser diode or reliability are resolved. As represented in Table 1, there is no decrease of reflectance. Thus, the laser oscillation can be achieved at a low threshold current density.

Thus, the foregoing thickness of 5 nm is thought as being the lower limit of the heterospike buffer layer that enables decrease of resistance without causing problems to the reflection performance at long wavelengths. Therefore, the heterospike buffer layer 18c should be formed with a thickness of 5 nm or more.

By increasing the thickness of the heterospike buffer layer 18c, the resistivity falls of sharply, and with this, the drive voltage and the heat generation of the device are reduced. Associated with this, the operational temperature range of the laser diode is extended and the laser output is increased.

In the case of allowing 99.8% reflectance for the distributed Bragg reflector, the maximum thickness of the heterospike buffer layer that can be provided to the distributed Bragg reflector tuned to the 0.88 μm wavelength is limited to 20 nm or less. In the case of the distributed Bragg reflector tuned to the 1.3 μm, it is possible to provide the heterospike buffer layer 18c up to the thickness of 50 nm.

As represented in FIG. 6, the resistance of the distributed Bragg reflector decreases with the thickness of the heterospike buffer layer 18c up to the thickness of 50 nm for the heterospike buffer layer 18c, and a resistivity of 1.05 times the bulk resistivity is achieved at the thickness of 50 nm for the layer 18c. When the thickness of the heterospike buffer layer 18c is increased further, on the other had, there appears a saturation in the decrease of the resistivity.

It should be noted that the reflectance of the distributed Bragg reflector starts to decrease sharply with increase of thickness of the heterospike buffer layer 18c, and the reflectance is reduced to the level of 99.8% or les when the thickness of the layer 18c has exceeded 50 nm. Thus, it is necessary to limit the thickness of the heterospike buffer layer 18c to be 50 nm or less in order to satisfy the requirement of high reflectance and low resistivity simultaneously.

Figure 19:
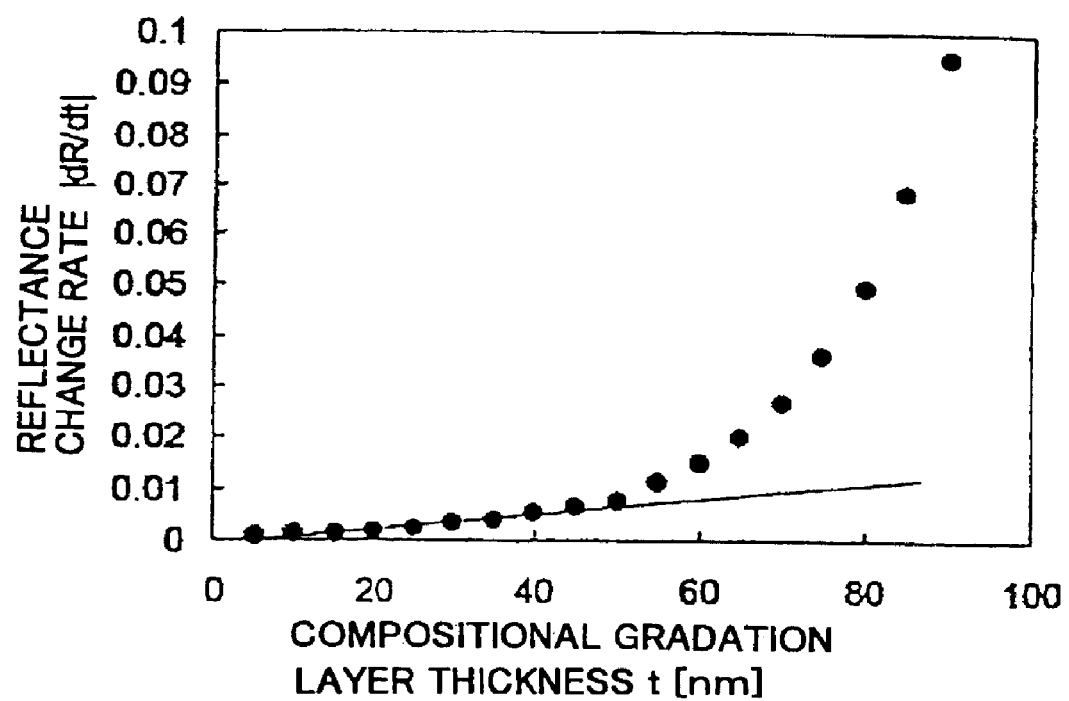
FIG. 19 is a further diagram showing the relationship between the resistivity of the distributed Bragg reflector and the thickness of the heterospike buffer layer.

FIG. 19 shows the reduction of the reflectance in detail, wherein FIG. 19 shows the change rate of the reflectance R (dR/dt) with regard to the thickness t of the heterospike buffer layer 18c.

Referring to FIG. 19, it can be seen that there occurs a sharp rise of the reflectance when the thickness of the heterospike buffer layer has exceeded 50 nm. With this, there occurs an increase of the threshold current of laser oscillation.

Thus, in the distributed Bragg reflector tuned to the wavelength of 1.3 μm and having a heterospike buffer layer having a thickness of 5 nm or more but 50 nm or less, it is possible to reduce the resistance caused by the heterointerface while maintaining a high reflectance. By using such a distributed Bragg reflector in a surface-emission. laser diode, it is possible to achieve a laser oscillation under a practical drive condition.

In the case of a surface-emission laser diode, it is necessary to design the reflector such that the distributed Bragg reflector 18 at the exit side has a relatively smaller reflectance for facilitating optical output in order to increase the output power of the laser diode. Further, in order to obtain a stable laser oscillation up to the high output region (high level injection region), it is necessary to set the output saturation point as high as possible by suppressing the device heat generation. The distributed Bragg reflector having a relatively thick (50 nm) heterospike buffer layer 18c of the present invention satisfies these conditions and is suited for use in a high-power laser diode.

Thus, according to the long-wavelength surface-emission laser diode of the present invention, it is possible to optimize the reflectance and electric properties of the distributed Bragg reflector used therein by optimizing the thickness of the heterospike buffer layer 18c within the range of 5–50 nm.

In the example of FIG. 3, the low refractive index layer 18a is formed of an AlAs layer and the high-refractive index layer 18b is formed of a GaAs layer. On the other hand, it is also possible to use two AlGaAs layers for the low-refractive index layer 18a and the high refractive index layer 18b, by changing the Al content in the AlGaAs layers. In this case, it is preferable to increase the difference of the Al content between the low-refractive index layer 18a and the high refractive index layer 18b for decreasing the number of stacks in the reflector, as the reflectance of the reflector is increased with increasing degree of difference of the refractive index between the low refractive index layer and the high refractive index layer. Thus, it will be noted that the construction of FIG. 3 provides the maximum refractive index difference between the low refractive index layer and the high refractive index layer by using GaAs and AlAs.

As noted already, in the heteroepitaxial structure in which there is a large difference of Al content between the low refractive index layer and the high refractive index layer, the band discontinuity at the valence band is also increased and there arises a problem of increased device resistance in trade off to the increase of the reflectance. Thus, in such a case, it is necessary to provide the heterospike buffer layer of sufficiently large thickness between the high refractive index layer 18b and the low refractive index layer 18a for reducing the resistivity of the reflector However, use of such a heterospike buffer layer has been difficult in the conventional distributed Bragg reflector tuned to the wavelength band of 0.85 μm. In the present invention, on the contrary, it is possible to achieve a high reflectance and simultaneously a low resistance while using the material system of GaAs/AlAs for the distributed Bragg reflector.

In the distributed Bragg reflector of FIG. 3, it is possible to form the heterospike buffer layer 18c in the range of 20–50 nm in the case the reflector is tuned to the reflection wavelength of 1.1 μm or more.

Referring to FIG. 17 again in more detail, it can be seen that the resistivity of the distributed Bragg reflector decreases sharply with increase of the thickness of the heterospike buffer layer 18c and then approaches gradually to the bulk resistivity. In the example of FIG. 17, the threshold thickness of the heterospike buffer layer 18c above which the saturation of resistivity takes place is about 20 nm. At this thickness of 20 nm, it can be seen that the resistivity is reduced to about twice the bulk resistivity. Thus, by using the thickness of 20 nm or more but 50 nm or less, it is possible to obtain a distributed Bragg reflector having a resistivity comparable to the bulk resistivity.

Figure 20:
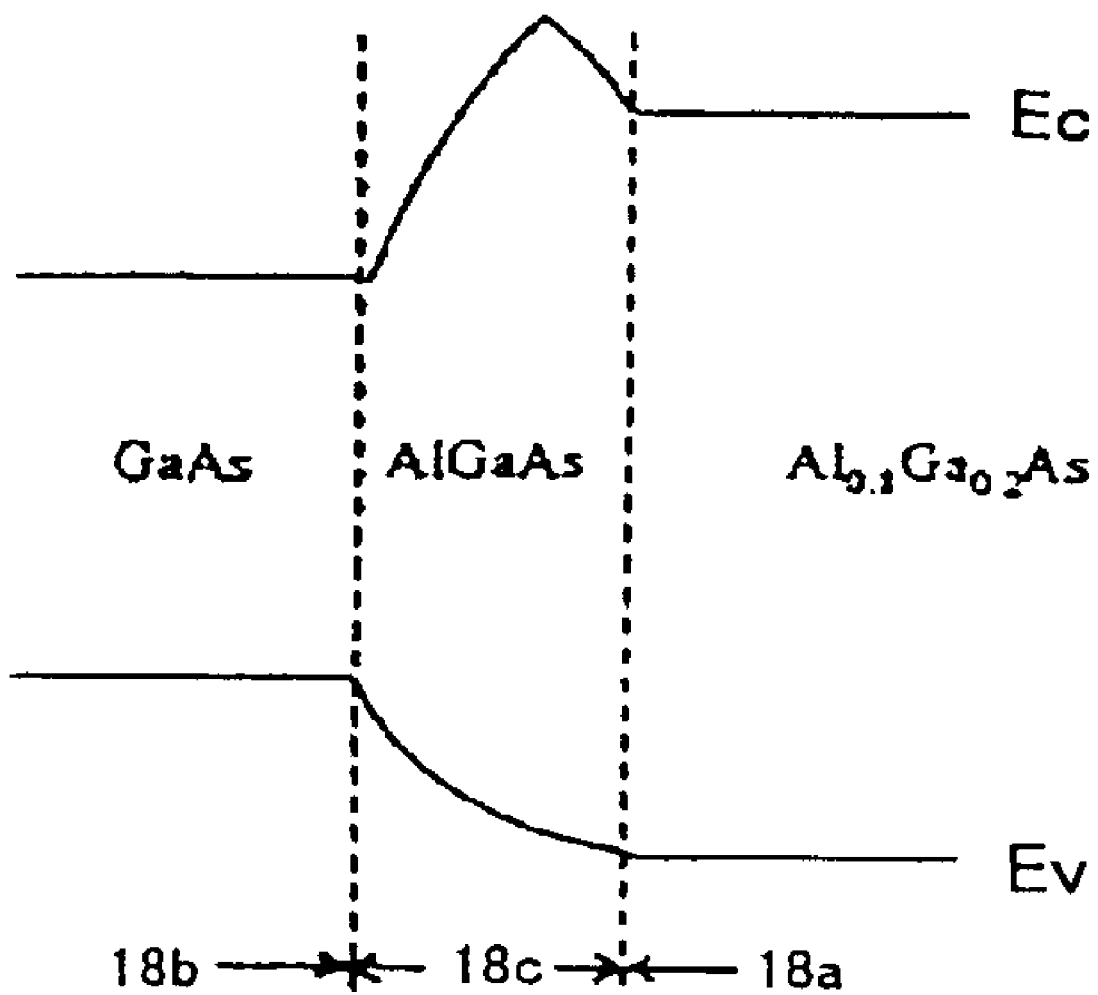
FIG. 20 is a further diagram showing another example of the band structure of the heterospike buffer layer.

FIG. 20 shows a band structure for another distributed Bragg reflector

In the example of FIG. 20, GaAs is used for the high-refractive index layer 18b in the structure of FIG. 3 while the low refractive index layer 18a formed of $Al_{0.8}Ga_{0.2}As$. Further, the example of FIG. 20 uses a compositional gradation layer having a thickness of 30 nm for the heterospike buffer layer 18c. In the example of FIG. 20, the compositional gradation layer is formed such that the valence band energy changes parabolic with the thickness. In such a parabolic compositional gradation layer, the valence band energy has a downwardly convex shape.

In the construction of FIG. 20, it should be noted that the design wavelength (λ) of the distributed Bragg reflector is 1.5 μm, and the thickness of the Al0.8Ga0.2As layer 18a and the thickness of the GaAs layer 18b are respectively chosen to 110.8 nm and 125.5 nm so as to be equal to λ/4n, wherein n is a refractive index in the respective layers.

In the distributed Bragg reflector of FIG. 20, each of the semiconductor layers is formed to have a thickness subtracted with the optical thickness of the parabolic compositional gradation layer 18c from the above noted thickness. In the case an $Al_{0.6}Ga_{0.4}As$ layer is used for the low-refractive index layer 18a as in the case of the embodiment to be described later, the λ/4n thickness of the $Al_{0.6}Ga_{0.4}As$ layer for the distributed Bragg reflector tuned to the 1.5 μm wavelength becomes 121.7 nm.

In the present embodiment, each of the Al0.8Ga0.2As layer 18a, the GaAs layer 18b and the parabolic compositional gradation layer 18c is doped to the p-type such that each of the foregoing layers have a uniform carrier density of $5 \times 10^{17}$ cm$^{-3}$.

Thus, in the present embodiment, the resistivity of the distributed Bragg reflector is reduced to the value generally equal to the bulk resistivity in spite of the fact that the-distributed Bragg reflector is doped to a relatively small doping density of $5 \times 10^{17}$ cm$^{-3}$ due to the use of the relatively thick compositional gradation layer 18c (50 nm). The use of such a low doping density is also advantageous in view of reduced optical absorption caused by the transition between the valence bands. It should be noted that, in such a distributed Bragg reflector tuned to the longer wavelength of 1.5 μm, it is easy to provide a thick parabolic compositional gradation layer 18c while maintaining high reflectance.

While a compositional gradation layer having a parabolic gradation is used for the heterospike buffer layer 18c in the embodiment of FIG. 20, the heterospike buffer layer 18c may be formed of another layer. Further, the distributed Bragg reflector may be tuned to the wavelength other than 1.5 μm. Similarly, the Al composition of the low-refractive index layer may be different from the one explained above. Further, the doping density may be changed in each of the layers in the distributed Bragg reflector.

As noted above, the resistance of the distributed Bragg reflector tuned to the long wavelength band of 1.1 μm or more is reduced sharply when the thickness of the heterospike buffer layer 18c is increased as is represented in FIG. 17, until the thickness of the heterospike buffer layer 18c exceeds a predetermined thickness. This predetermined thickness of the heterospike buffer layer 18c within which the sharp change of the resistivity takes place is related to the doping density used in the distributed Bragg reflector.

Figure 21:
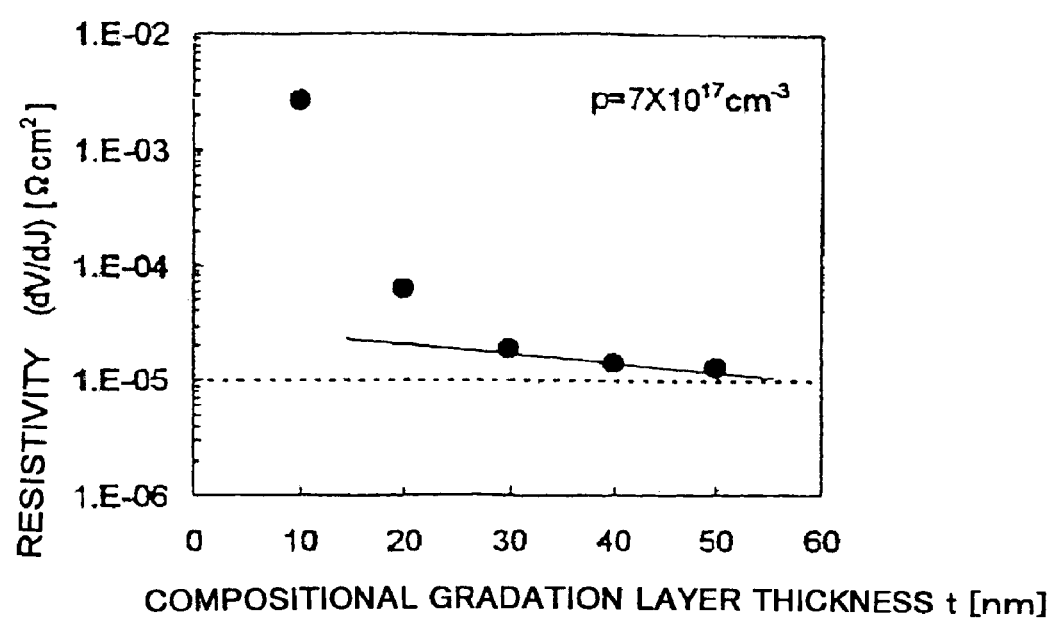
FIG. 21 is a diagram showing the relationship between the resistivity of the distributed Bragg reflector having the heterospike buffer layer of FIG. 20 and the thickness of the heterospike buffer layer.

FIG. 21 shows the case the doping density of 7×1017 cm−3 is used in the AlAs/GaAs distributed Bragg reflector of FIG. 20 for each of the layers therein.

Referring to FIG. 21 in which the doping density is reduced, it can be seen that the thickness range of the heterospike buffer layer 18c in which there occurs a sharp drop of the resistivity in the distributed Bragg reflector has been increased to 30 nm. When the foregoing limit is exceeded, it can be seen that the resistivity is changed linearly to the value of the bulk resistivity. Particularly, in the case of a p-type distributed Bragg reflector, there occurs an increase of optical absorption when the hole density (doping density) is increased as a result of optical absorption between the valence bands in addition to the free carrier absorption. Thus, when such a distributed Bragg reflector is applied to a laser diode, there is caused an increase of the laser threshold current.

Thus, from the viewpoint of optical absorption, it is preferable to use a low carrier density As the effect of the transition between the valence bands appears conspicuous for optical radiation of long wavelengths, it is important to suppress the absorption loss in the long wavelength laser diode operating at the wavelength of 1.1 μm or more. In the case of a conventional distributed Bragg reflector having a doping density exceeding $1 \times 10^{18}$ cm$^{-3}$, it is difficult to reduce the absorption loss.

Because of this reason, there are cases in which the doping density is reduced to $1 \times 10^{18}$ cm$^{-3}$ or less in one of the low refractive index layer 18a, the high refractive index layer 18b, the heterospike buffer layer 18c, or all of the layers 18a–18c. In such a distributed Bragg reflector in which the doping density is reduced, however, there occurs an increase of extension of the depletion layer, and the problem of increase of resistance is inevitable. When the doping density is thus reduced, therefore, it is necessary to increase the thickness of the heterospike buffer layer, while it is noted that such a compensating effect of the heterospike buffer layer appears when the thickness thereof has reached 30 nm or more. In the case the doping density is reduced further, a more thick heterospike buffer layer 18c is needed. In such a case, the effect of the hetero interface is compensated for by using a larger thickness for the heteroepitaxial buffer layer within the foregoing range, such as 40 nm or 50 nm. A similar argument applies also to the case when AlGaAs is used in place of AlAs in the distributed Bragg reflector.

Figure 22:
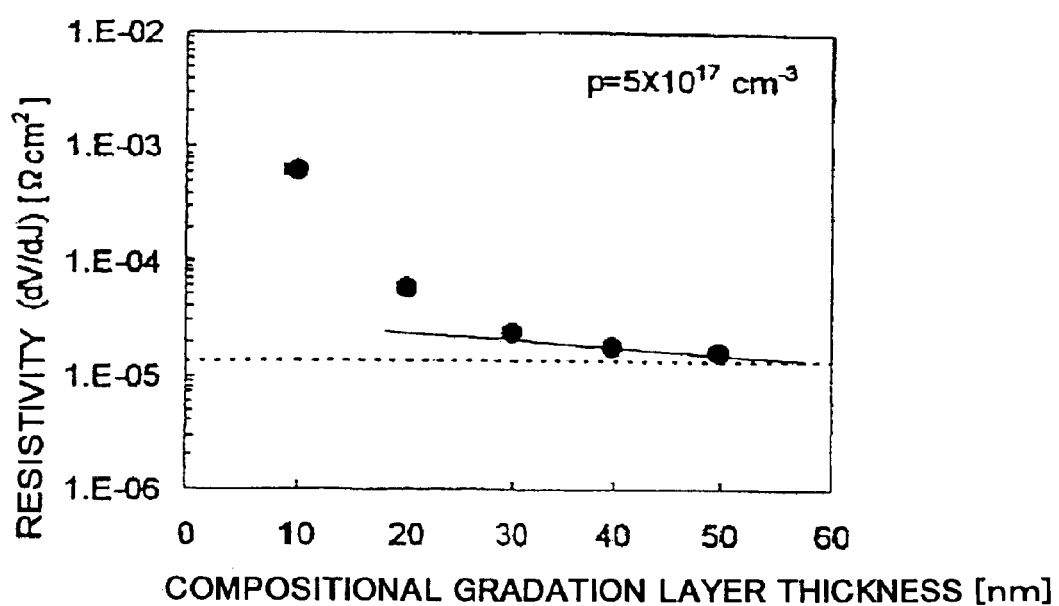
FIG. 22 is another diagram showing the relationship between the resistivity of the distributed Bragg reflector having the heterospike buffer layer of FIG. 20 and the thickness of the heterospike buffer layer.

FIG. 22 shows the result of calculation of resistivity of the distributed Bragg reflector including 4 pairs of the Al$_{0.8}$Ga$_{0.2}$As/GaAs structure. In the example of FIG. 22, the doping density of each layer is reduced further to the level of $5 \times 10^{17}$ cm$^{-3}$.

In this case, too, the heterospike buffer layer 18c has a thickness of 30 nm or more and it can be seen that the resistivity of the distributed Bragg reflector is comparable to the resistivity of the bulk resistivity. In the case of a distributed Bragg reflector in which any or all of the high refractive index layer 18a, low refractive index layer 18b and the heterospike buffer layer 18c are set smaller than the conventional doping density of $1 \times 10^{18}$ cm$^{-3}$, for example, there appears a saturation of resistivity when the thickness of the heterospike buffer layer 18c has reached 30 nm. Thus, in the case at least one of the layers constituting the distributed Bragg reflector has the doping density of $1 \times 10^{18}$ cm$^{-3}$ or less, it is possible to decrease the resistance effectively by using the heterospike buffer layer having a thickness in the range of 30–50 nm.

Of course, the foregoing thickness of the heterospike buffer layer 18c is effective also in the distributed Bragg reflector having a larger doping density and may be used in the case all of the layers constituting the distributed Bragg reflector has a doping density of $1 \times 10^{18}$ cm$^{-3}$ or more. On the other hand, it is especially advantageous to use the doping density of $1 \times 10^{18}$ cm$^{-3}$ or less in combination with the heterospike buffer layer having a thickness appropriately chosen from the range of 30–50 nm in view of the fact that both the absorption loss and the resistance are reduced.

By using the distributed Bragg reflector of the embodiment of FIG. 22 for the reflector in the surface-emission laser diode, it is possible to obtain a surface-emission laser diode having a superior characteristic. As noted before, it has been difficult to realize the thickness of 30–50 nm for the heterospike buffer layer in the conventional distributed Bragg reflector tuned to the 0.85 μm wavelength. The heterospike buffer layer of this thickness became possible for the first time in the distributed Bragg reflector tuned to the wavelength of 1.1 μm.

In the distributed Bragg reflector of the present invention, it is also possible to set the difference of Al content between the low refractive index layer 18a and the high refractive index layer 18b of the distributed Bragg reflector to be less than 0.8 by constituting the layers 18a and 18b by any of AlAs, GaAs and AlGaAs mixed crystal.

When the difference of Al content between the high refractive index layer 18b and the low refractive index layer 18a is less than 0.8 in the distributed Bragg reflector constituted of a semiconductor material of the AlGaAs system and tuned to the design wavelength of 1.1 μm or longer, it is possible to reduce the electric resistance while maintaining a high reflectance.

In a mixed crystal of AlGaAs, it should be noted that the valence band energy decreases monotonously with the increase of Al content therein, and the band discontinuity of the valence band at the interface to a GaAs crystal increases with increasing Al content in the AlGaAs mixed crystal Thereby, there is formed a large potential barrier at the hetero interface, and this potential barrier has been the cause of the high resistance of the distributed Bragg reflector. Further, it should be noted that the decrease of the valence band energy is generally proportional to the Al content, and the band discontinuity between the semiconductor layers having different Al compositions correspond to the Al compositional difference.

Figure 23:
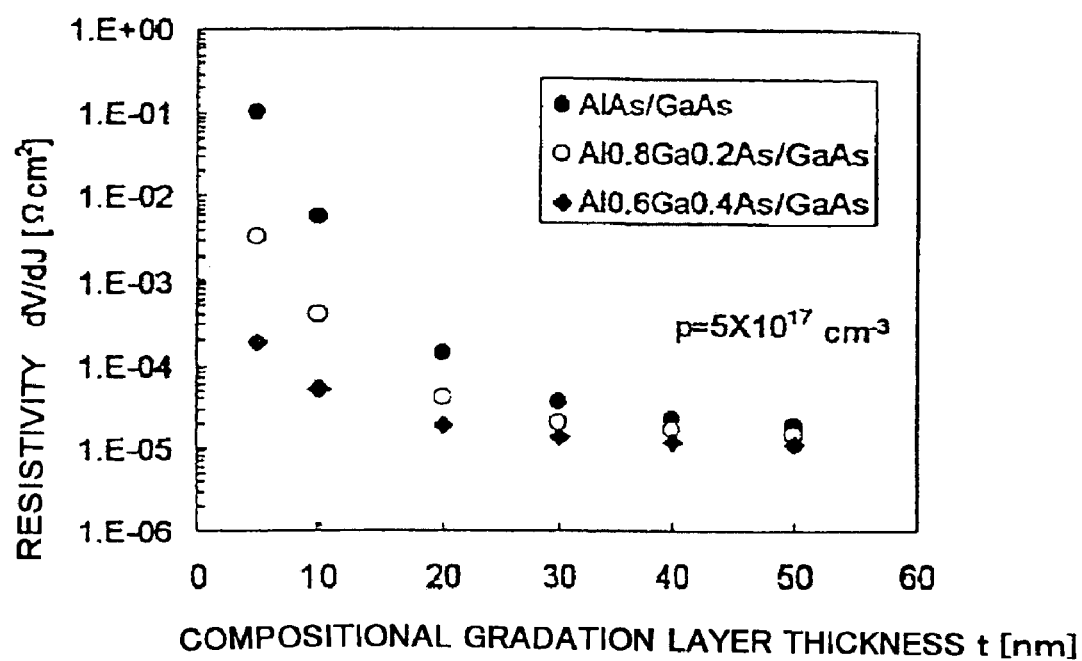
FIG. 23 is a diagram showing the relationship between the resistance of various distributed Bragg reflectors and the-thickness of the heterospike buffer layer.
Figure 24:
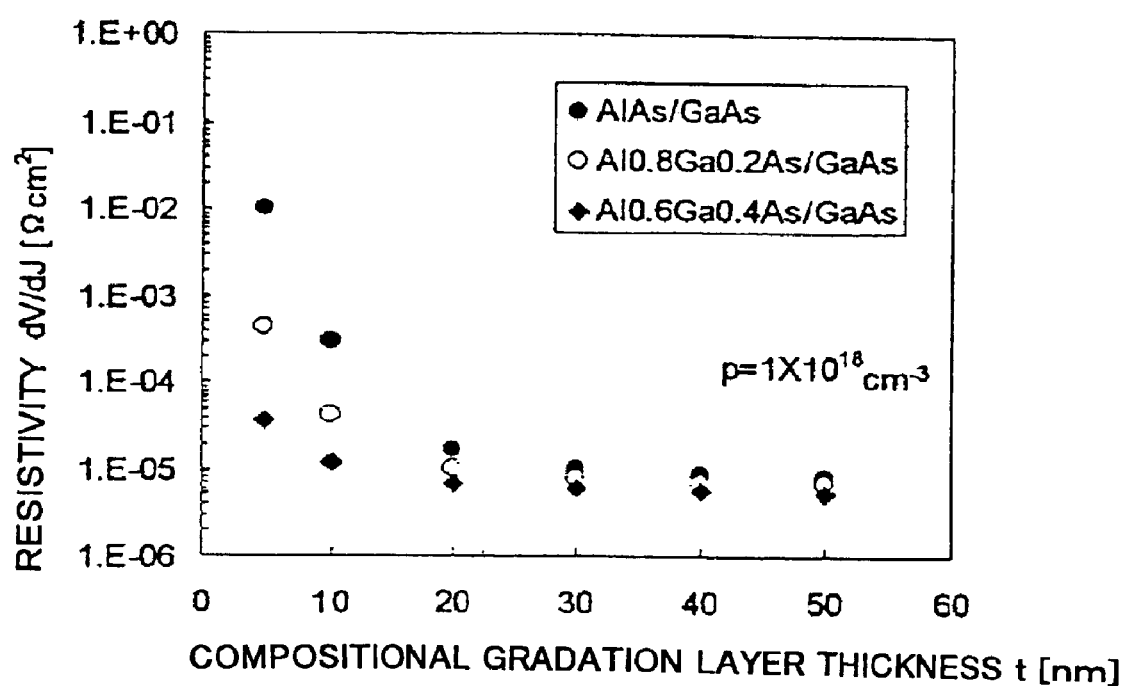
FIG. 24 is another diagram showing the relationship of the resistance of various distributed Bragg reflectors and the thickness of the heterospike buffer layer.

FIGS. 23 and 24 show the resistivity of the p-type distributed Bragg reflector tuned to the design wavelength of 1.3 μm and including 4 pairs of high refractive index layer 18b and low refractive index layer 18a for various thicknesses of the heterospike buffer layer. In FIGS. 23 and 24, it should be noted that the distributed Bragg reflector uses GaAs for the high refractive index layer 18b and AlAs, Al$_{0.8}$Ga$_{0.2}$As and Al$_{0.6}$Ga$_{0.4}$As have been used for the low refractive index layer. Further, each of the layers has been formed to have a thickness tuned to ¼ the design wavelength while taking into consideration of the refractive index of the respective layers. Further, the doping density is set to $5 \times 10^{17}$ cm$^{-3}$ throughout the layers in FIGS. 23 and $1 \times 10^{18}$ cm$^{-3}$ throughout the layers in FIG. 24. It should be noted that the doping density of $1 \times 10^{18}$ cm$^{-3}$ is used commonly in the doping of the conventional p-type distributed Bragg reflector.

From FIGS. 23 and 24, it can be seen that the resistivity of the distributed Bragg reflector increases with increasing Al content in the AlGaAs layer and decreasing thickness of the heterospike buffer layer, and that it is necessary to provide a thick heterospike buffer layer in order to reduce the resistivity of the distributed Bragg reflector to the bulk resistivity level. In the case of the distributed Bragg reflector that uses Al$_{0.6}$Ga$_{0.4}$As and GaAs as the low refractive index layer 18a and the high refractive index layer 18b, for example, there appears a band discontinuity of about 300 meV, while the band discontinuity increases to about 400 meV when $Al_{0.8}Ga_{0.2}As$ is used for the low refractive index layer 18a and GaAs is used for the high refractive index layer 18b.

From the results of FIGS. 23 and 24, it is concluded that the thickness of 20 nm or more is preferable for the heterospike buffer layer 18c in order to reduce the resistivity of a distributed Bragg reflector formed of AlAs layers and GaAs layers in order to reduce the resistivity of the distributed Bragg reflector effectively, although this would also depend on the doping density. Thus, in the case the band discontinuity is 400 meV or less, in other words the Al compositional difference is less than 0.8, it can be seen that the resistivity of the heterospike buffer layer can be reduced effectively by increasing the thickness of the heterospike buffer layer to 20 nm or more.

Actually, the increase of resistance of the distributed Bragg reflector caused by the band discontinuity depends not only on the barrier height and barrier thickness but also on the effective mass of holes used for the carriers. However, there is no large difference in the effective mass for heavy holes between AlGaAs, AlGaInP and GaInAsP, and the band discontinuity can be regarded as the index of the heterointerface resistance. Thus, in the case the valence band discontinuity is less than 400 meV, and hence the Al compositional difference is less than 0.8, it is possible to reduce the resistance of the distributed Bragg reflector by using the heterospike buffer layer having a thickness of 20 nm or more.

With regard to the upper limit of the heterospike buffer layer 18c, the thickness of the heterospike buffer layer 18c should be chosen, in view of the tuned wavelength of the distributed Bragg reflector, such that no remarkable decrease of reflectance occurs. By doing so, a distributed Bragg reflector having excellent electrical and optical characteristics is obtained.

In the distributed Bragg reflector having a structure shown in FIG. 3, it is possible to use any of AlAs, GaAs and AlGaAs mixed crystal for the low refractive index buffer layer 18a and the high refractive index layer 18b such that the Al compositional difference between the layers 18a and 18b is 0.8 or more.

In this embodiment, it is also possible to reduce the resistance of the distributed Bragg reflector effectively while maintaining a high reflectance.

When AlAs and GaAs are combined for the low refractive index layer 18a and the high refractive index layer 18b, it should be noted that there appears a band discontinuity of about 500 meV in the valence band, and thus, it is necessary to provide a thick heterospike buffer layer for reducing the resistivity of the distributed Bragg reflector, although the thickness of the heterospike buffer layer may depend on the doping density. In such a case, it is concluded, in view of the results of FIGS. 23 and 24, that the heterospike buffer layer 18c has a thickness of 30 nm or more. Thus, from the view point of band discontinuity of the semiconductor materials constituting the distributed Bragg reflector, it becomes possible to reduce the resistance of the distributed Bragg reflector by setting the thickness of the heterospike buffer layer to be 30 nm or more in the case there exists a band discontinuity is 400 meV or more.

Thus, there holds a relationship explained with reference to FIGS. 23 and 24 between the Al compositional difference and the valence band discontinuity, and the valence band discontinuity of 400 meV corresponds to the Al compositional difference of 0.8 or more. Thus, in the case the Al compositional difference is 0.8 or more, the thickness of 30 nm or more is needed for the heterospike buffer layer 18c so as to reduce the resistance effectively By providing such a heterospike buffer layer as such, it is possible to reduce the resistance of the distributed Bragg reflector effectively.

With regard to the upper limit of the heterospike buffer layer, the thickness of the heterospike buffer layer 18c is chosen in view of the tuned wavelength of the distributed Bragg reflector such that there occurs little decrease of reflectance Thereby, it becomes possible to realize a distributed Bragg reflector having excellent characteristics both in terms of electric properties and optical properties.

Figure 25:
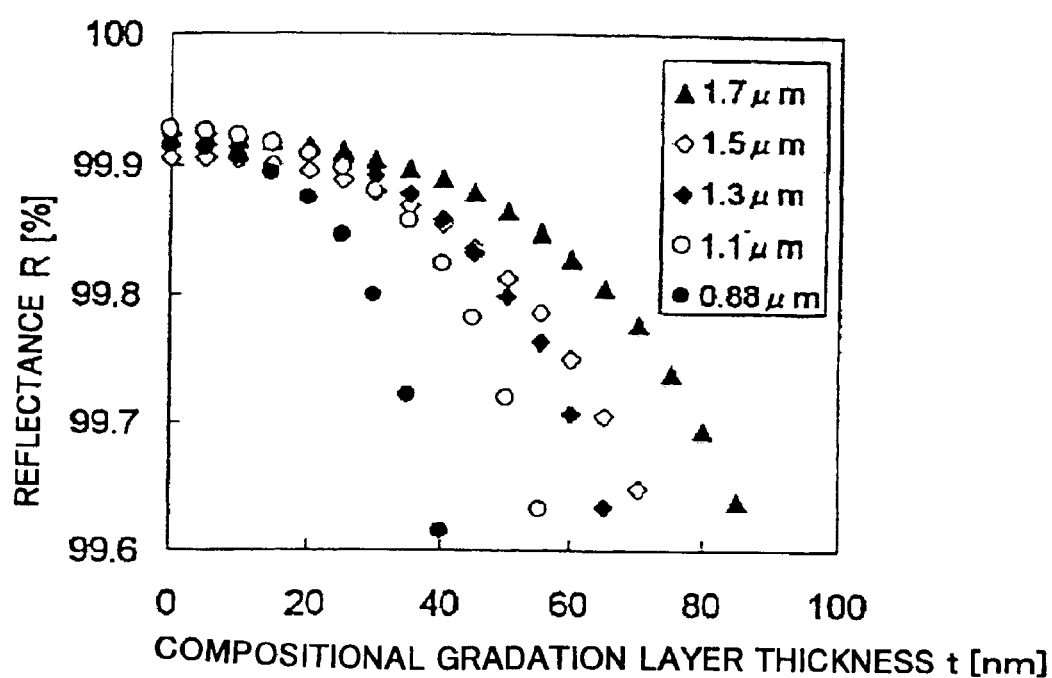
FIG. 25 is a diagram showing the relationship between the reflectance of various distributed Bragg reflectors and the thickness of the heterospike buffer layer.

In the distributed Bragg reflector of the present invention tuned to the design wavelength of 1.1 μm, it is also possible to set the thickness of the heterospike buffer layer 18c with respect to the tuned wavelength $\lambda$ [nm] to be equal to or smaller than $(50\lambda-15)$ [nm]. In such a case, too, it is possible to reduce the resistance of the distributed Bragg reflector while maintaining high reflectance. FIG. 25 shows the relationship between the thickness of the heterospike buffer layer and reflectance of the distributed Bragg reflector tuned to the wavelength of 1.1–1.7 μm. It should be noted that the distributed Bragg reflector has a structure explained with reference to FIG. 3 and uses GaAs for the high refractive index layer 18b and AlAs for the low refractive index layer 18a. The layers 18a and 18b are repeated with the number determined such that the reflectance exceeds 99.9% at each of the tuned wavelengths. Thus, in the case of the reflector is tuned to 0.88 μm, the layers 18a and 18b are repeated 18 times, while in the case of the reflector is tuned to 1.1 μm, the layers 18a and 18b are repeated 22 times. Further, in the case the reflector is tuned 1.3 micron, the layers 18a and 18b are repeated 23 times while in the case the reflector is tuned to 1.5 μm, the layers 18a and 18b are repeated 23 times. Further, in the case the reflector is tuned to 1.7 μm, the layers 18a and 18b are tuned to 24 times.

Figure 26:
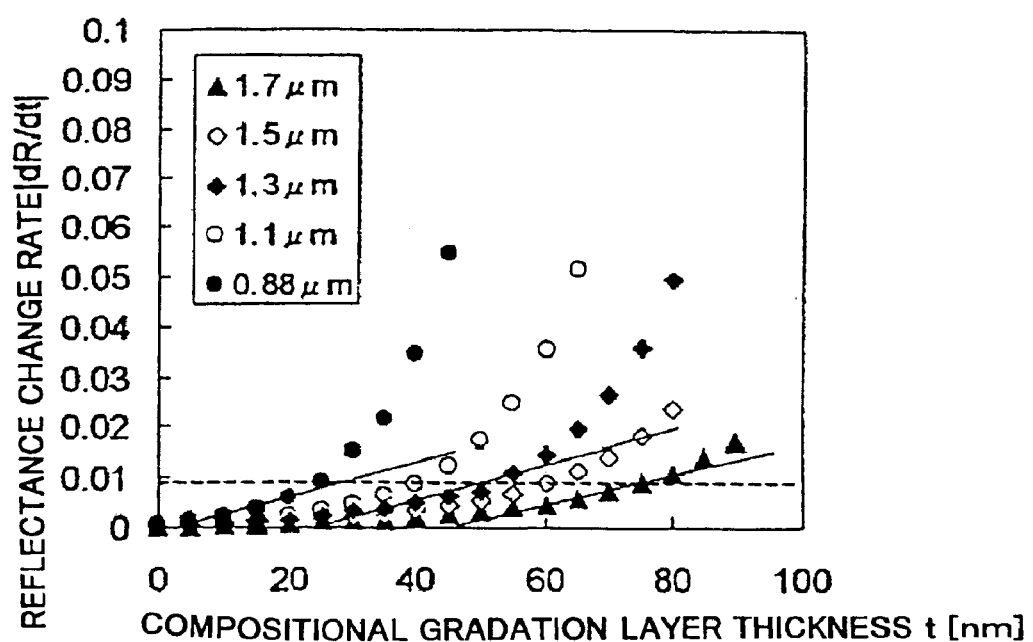
FIG. 26 is another diagram showing the relationship between the reflectance of various distributed Bragg reflectors and the thickness of the heterospike buffer layer.

FIG. 26 shows a change rate of the resistivity of the distributed Bragg reflector shown in FIG. 25 (dR/dt) with the thickness of the heterospike buffer layer.

From FIG. 25, it can be seen that reflectance of the reflector decreases with increasing thickness of the heterospike buffer layer. Further, FIG. 26 shows that the decrease of the reflectance increases suddenly at a certain thickness of the heterospike buffer layer. For the sake of facilitating understanding of this situation, FIG. 26 shows lines drawn as a tangential for each of the curves as the reference reflectance change rate. For example, in the distributed Bragg reflector tuned to 1.3 μm, it can be seen from FIG. 26 that the change rate of the reflectance increases sharply when the thickness of the heterospike buffer layer 18c has exceeded 50 nm. In correspondence thereto, there occurs a sharp drop in the reflectance of the distributed Bragg reflector. Thus, in the surface-emission laser diode having such a distributed Bragg reflector for the reflector, the threshold current of laser oscillation increases sharply at the foregoing thickness of the heterospike buffer layer 18c Further, it should be noted that the thickness of the heterospike buffer layer 18c corresponding to such a sharp change of reflectance changes depending on the design wavelength of the laser diode. Thus, longer the design wavelength of the laser diode, the thickness of the semiconductor layers constituting the reflector is increased, and the effect of the heterospike buffer layer is reduced.

Thus, the thickness of the heterospike buffer layer corresponding to such a sudden increase of change rate of the reflectance changed depending on the design wavelength, while the threshold of the change rate corresponding to the onset of the sudden growth does not change with the design wavelength and maintains the value of about 0.9 as can be seen from FIG. 26.

Table 2 below summarizes the threshold thickness for each wavelength shown in FIG. 25.

TABLE 2

| design wavelength | 1.1 μm | 1.3 μm | 1.5 μm | 1.7 μm |
|---|---|---|---|---|
| threshold thickness | 40 nm | 50 nm | 60 nm | 70 nm |

From Table 2, it can be seen that the design wavelength and the threshold thickness are in a generally linear relationship and there holds a relationship between the threshold thickness t [nm] and the design wavelength λ [nm] of the distributed Bragg reflector as follows:

$$t=0.05\lambda-15 \qquad (1)$$

Thus, by providing the heterospike buffer layer 18c in the distributed Bragg reflector tuned to the wavelength of 1.1 μm or more with the thickness not exceeding the thickness t given by Equation (1), it is possible to realize a low-resistance distributed Bragg reflector having a high reflectance.

In the example above, it was assumed that the heterospike buffer layer has a linear compositional graduation profile. However, it is also possible to use non-linear profile. In this case, too, similar results and effects are achieved.

In the present invention, it is possible to increase the thickness of the heterospike buffer layer to be 20 nm or more in the distributed Bragg reflector having a thickness of 1.1 μm. In this case, too, it is possible to reduce the resistance of the mirror while maintaining a high reflectance.

As explained before, there holds a relationship of Equation (1) between the thickness of the heterospike buffer layer and the design wavelength of the distributed Bragg reflector that can maintain a high reflectance.

With regard to the electric properties of the distributed Bragg reflector, it is possible to reduce the effect of the hetero interface by increasing the thickness of the heterospike buffer layer as noted before, and a distributed Bragg reflector having a reduced resistance is obtained. Further, the effect of the resistance reduction by the heterospike buffer layer id determined by the materials used for the distributed Bragg reflector and the doping density and further by the compositional profile. Essentially, it does not depend on the reflection wavelength. Thus, it is concluded that there exists a lower limit in the thickness of the heterospike buffer layer in which the resistance of the distributed Bragg reflector is decreased sufficiently. In order to provide a distributed Bragg reflector having a sufficiently low resistance, it is necessary to provide the heterospike buffer layer with a thickness exceeding a predetermined thickness.

In the example of the distributed Bragg reflector of FIG. 24 in which the semiconductor layers are doped uniformly to the doping density of $1\times10^{18}$ cm$^{-3}$, it can be seen that the resistivity of the distributed Bragg reflector increases in terms of orders when the thickness of the distributed Bragg reflector is les than 20 nm. When the thickness of the heterospike buffer layer has exceeded the value of 20 nm, on the other hand, it is preferable to use the thickness of 20 nm or more for the heterospike buffer layer, provided that the semiconductor layers constituting the distributed Bragg reflector has the foregoing doing density.

From the description noted above, it is concludes that a distributed Bragg reflector having a sufficiently low resistance and simultaneously maintaining a high optical reflectance is obtained by choosing the thickness t [nm] of the heterospike buffer layer with regard to the design wavelength λ of the distributed Bragg reflector so as to satisfy the relationship 20≦t≦50λ−15.

In the distributed Bragg reflector of this embodiment, it is also possible to set the thickness of the heterospike buffer layer to be 30 nm or more. Even in such a case, it is possible to decrease the resistance of the reflector effectively while maintaining a high reflectance at the tuned wavelength or design wavelength of 1 μm or longer.

In semiconductor materials, there is a tendency that optical absorption increases also for the photons having energy smaller than the bandgap with increase of free carriers. Further, in the case of the p-type semiconductor materials, there arises conspicuous optical absorption caused as a result of the valence band to valence band absorption with the increase holes acting as the carriers. As the problem of the valence band to valence band absorption becomes conspicuous with increasing optical wavelength, this problem becomes a serious problem in the distributed Bragg reflector having a long wavelength of 1.1 μm or more. It should be noted that such optical absorption becomes the cause of decreasing the reflectance of the distributed Bragg reflector. In the case of the laser diode using such a reflector, there arises a problem of increase of threshold current caused by optical absorption and decrease of efficiency. Thus, from the view point of decreasing the optical absorption, it is preferable that the doping density of the semiconductor layers is set as small as possible. However, with the decrease of the doping density, there arises a problem of increase of thickness of the heterointerface, and the effect of the interface potential is increased, thus leasing to the problem of increase of resistance of the distributed Bragg reflector.

Thus, in the case of the semiconductor distributed Bragg reflector having the reduced doping density, it is necessary to use a thicker heterospike buffer layer for reducing the resistivity. In the case of doping the semiconductor layers constituting the distributed Bragg reflector to the doping density of $5\times10^{17}$ cm$^{-3}$, it can be seen from FIG. 23 that the resistivity is reduced to the level of the bulk material when the thickness of the heterospike buffer layer is increased to 30 nm or more.

With regard to the doping density and profile, there are numerous combinations, while there arises a similar tendency when the doping density of one of the semiconductor layers is less than $1\times10^{18}$ cm$^{-3}$. This is because the potential barrier formed at the hetero interface has the height and thickness depending on the doping density of the semiconductor layer adjacent to the hetero interface. Lower the doping density, as in the case of the doping density having a value of $1\times10^{18}$ cm$^{-3}$, larger the influence of the hetero interface. Further, the electric property of the distributed Bragg reflector is mainly determined by the hetero interface where the doping density is small. Thus, the present invention is effective also in the case in which at least one of the semiconductor layers constituting the distributed Bragg reflector has a doping density of less than $1\times10^{18}$ cm$^{-3}$.

It should be noted that a similar tendency appears also in the case of the distributed Bragg reflector doped to the order of $1\times10^{17}$ cm$^{-3}$. Of course, it is possible to reduce the doping density further, provided that the thickness of the heterospike buffer layer is increased to 30 nm or more within the upper limit noted before.

Thus, according to the present embodiment, it is possible to obtain a distributed Bragg reflector having a sufficiently low resistance and high optical reflectance by choosing the thickness t [nm] of the heterospike buffer layer with regard to the design wavelength λ of the laser diode so as to fall in the range of $30 \leq t \leq 50\lambda - 15$.

In the conventional laser diode operable at the wavelength band of 0.85 μm, there has been a study to provide a heterospike buffer layer as noted above. On the other hand, such a heterospike buffer layer is most effectively used in the long-wavelength surface-emission laser diode operable at the wavelength of 1.1–1.7 μm. In the 1.1–1.7 μm band, for example, it is possible to set the thickness of the material layer constituting the heterospike buffer layer about twice the thickness for the case of the 0.85 μm band, in order to obtain the same reflectance (99.5% or more, for example). Thereby, the resistance of the semiconductor Bragg reflector is reduced, and the operational voltage, oscillation threshold current, and the like, are likewise reduced. Thereby, advantageous features such as suppression of heating, stable laser oscillation and low energy drive is obtained for the laser diode.

Thus, the provision of such a heterospike buffer layer to the semiconductor Bragg reflector according to the present invention is deemed an advantageous improvement especially in the case of the long-wavelength surface-emission laser diode operable in the laser oscillation wavelength of 1.1–1.7 μm.

For example, in the case of the surface-emission laser diode operable at the wavelength band of 1.3 μm and having a semiconductor Bragg reflector in which a low refractive index layer of AlxGa1-xAs (x=1.0) and a high refractive index layer of AlyGa1-yAs (y=0) are stacked for 20 periods, a reflectance of 99.7% or less is obtained, provided that the thickness of the heterospike buffer layer AlzGa1-zAs ($0 \leq y<z<x \leq 1$) is set to 30 nm. Further, a reflectance of 99.5% or more is obtained when the heterospike buffer layer has a thickness of 53 nm. Thus, a film thickness control of ±2% is sufficient when the distributed Bragg reflector is designed to have a reflectance of 99.5% or more In the experiments, distributed Bragg reflectors were produced with the thickness of 10 nm, 20 nm and 30 nm for the heterospike buffer layer. It turned out that a reflectance sufficient for practical use was achieved in any of these experiments. In this way, a 1.3 μm band surface-emission laser diode having a reduced resistance for the semiconductor Bragg reflector was realized and laser oscillation was achieved. The remaining structural feature of the laser diode thus produced will be explained later.

In a multilayer reflector, there exists a band of high reflectance in the designed wavelength band (assuming that complete film thickness control is achieved). This is called high reflectance band, wherein the high reflection band may include also the wavelength band in which a reflectance exceeding a target value is achieved for a target wavelength. In the high reflectance band, the reflectance becomes largest at the designed wavelength, while the reflectance falls off but only slightly as the deviates from the designed wavelength. When the deviation exceeds a certain limit, the reflectance falls off sharply.

Thus, in a multilayer reflector, it is necessary to control the thickness of the multilayer reflector completely with atomic layer level so that a reflectance exceeding the necessary reflectance is that achieved at the target wavelength. In practicer a deviation of about ±1% is inevitable for the film thickness, and thus, it is a common place that the target wavelength and the wavelength in which the reflectance is maximized are different. In the case the target wavelength is 1.3 μm, for example, the wavelength providing the maximum reflectance is deviated by 13 μm when there is an error of ±1% in the film thickness control. Therefore, it is desirable that this high reflectance band has a wide bandwidth. Here the high reflectance band is defined as the wavelength band in which a reflectance exceeding a necessary reflectance is obtained for a target wavelength.

Thus, in the long-wavelength surface-emission laser diode oscillating at the wavelength of 1.1–1.7 μm, it is possible to reduce the resistance value of the semiconductor Bragg reflector while maintaining high reflectance, by optimizing the constitution of the reflector. Thereby, the operating voltage, oscillation threshold current, and the like, of the laser diode are successfully reduced, and heat generation is suppressed effectively. As a result, stable laser oscillation is realized and low energy driving of the laser diode becomes possible.

Once again FIG. 1 is referred to.

It can be seen that a p-type GaAs layer 19 having a composition represented as AlxGa1-xAs (x=0) is provided on the upper semiconductor Bragg reflector 18 as a contact layer (p-contact layer), so as to achieve a contact with the p-side electrode 20.

In the constitution of FIG. 1, it should be noted that the In content x of the quantum well active layer is set to 39% (Ga 0.61In0.39As). Further, the thickness of the quantum well active layer is set to 7 nm. The quantum well active layer thus formed accumulates a compressional strain of about 2.8% with respect to the GaAs substrate.

In the surface-emission laser diode of FIG. 1, the deposition of the semiconductor layers is conducted by an MOCVD process. In this case, no lattice-relaxation phenomenon was observed. Each of the semiconductor layers of the laser diode may be formed by using TMA (trimethyl aluminum), TMG (trimethyl gallium) TMI (trimethyl indium), $AsH_3$ (arsine), $PH_3$ (phosphine) as source materials, together with a carrier gas of $H_2$. In the case of growing the active layer (the quantum well active layer) in the form of highly strained layer as in the case of the device of FIG. 1, it is preferable to use a low temperature growth process that realizes a non-equilibrium growth. In the present case, the GaInAs layer 15a (quantum well active layer) is grown at 550° C. It should be noted that the MOCVD process used herein is characterized by high degree of supersaturation and is suited for the crystal growth of highly strained active layer. Further, the MOCVD process does not require high vacuum environment as in the case of MBE process. Further, the MOCVD process is suitable for mass production, as the process control is achieved by merely controlling the supply rate or supply duration of the source gases.

In the illustrated laser diode, there is formed a high resistance region 15F outside the current path by means of ion implantation of protons (H+) as a current confinement structure.

In the constitution of FIG. 1, it should be noted that there is formed a p-side electrode 20 on the p-type contact layer formed in turn on the uppermost part of upper part reflector 18 and constituting a part thereof, except for an optical exit part 20A. Also there is formed an n-side electrode 21 at the rear surface of the substrate.

In the present embodiment, it should be noted that the active region including the upper part and lower part spacer layers 14 and 16 in addition to the multiple quantum well active layer 15 and forming the resonator between the upper and lower reflectors 12 and 18, in which the career recombination is caused upon injection of carriers, is formed of a material not containing Al (the proportion to the group III element(s) is 1% or more). Furthermore the low refractive index layers constituting the lower is part reflector 12 and also the upper part reflector 18 closest to the active layer is formed of the non-optical recombination elimination layers 13 and 17 each having a composition of GaxIn1−xPyAs1−y (0<x≦1, 0<y≦1), in which the compositional parameters x and y are chosen appropriately. More specifically, GaInP or GaInPAs or GaPAs is used for the non-optical recombination elimination layer. The material constituting the non-optical recombination elimination layer thus has a composition of GaxIn1−xPyAs1−y (0<x≦1, 0<y≦1), wherein the non-optical recombination layer may be added further with a trace amount of element(s) other than Al.

In such a structure, the careers are confined between the low refractive index layer of the upper part reflector and the low refractive index layer of the lower part reflector that are located nearest to the active layer and formed of a wide gap material In such a structure, there occurs non-optical recombination of carriers even when the active region is formed of the layer not containing Al (the proportion of Al with regard to group III elements is 1% or less) upon injection of the careers, as there occurs non-optical recombination of carriers at the interface between the active layer and the low refractive index layer of the upper or lower reflector, as long as the foregoing low refractive index layer (wide gap layer) contains Al. When the non-optical recombination of carriers takes place, the efficiency of optical emission is deteriorated. Therefore it is desirable to form not only the active region but also the low refractive index layers adjoining thereto by a material not containing Al.

Further, the non-optical recombination elimination layer having the primary composition of GaxIn1−xPyAs1−y (0<x≦1, 0<y≦1) has a lattice constant smaller than the lattice constant of the GaAs substrate. Thus, the layer accumulates a tensile strain.

In an epitaxial growth process, the growth is made while reflecting the information of the foundation layer on which the growth is made. Thus, when there are defects on surface of the foundation layer, the same defects crawl up to the growth layer. On the other hand, it is known that such a crawling up of the defects can be suppressed by interposing a strained layer on the path of the defects.

In the case an active layer accumulates therein a strain, there sometimes occurs a problem in that growth of the active layer with desired thickness is difficult because of the reduced critical thickness. Particularly, there arises a problem in that the film growth does not take place at all even if a low temperature growth process or non-equilibrium growth process is employed, due to the existence of defects. This problem occurs particularly when the active layer accumulates a compressive strain of 2% or more, or when growing the active layer beyond the critical thickness thereof.

On the other hand, when there exists a strained layer adjacent to the active layer, such a crawling up of the defects is intercepted and the efficiency of optical emission is improved. Further, it becomes possible to grow the active layer even in the case the active layer accumulates a compressive strain of 2% or more. Further, it is possible to grow the strained layer beyond the critical thickness.

It should be noted that the GaxIn1−xPyAs1−y (0<x≦1, 0<y≦1) layers 13 and 17 adjoin the active region and function so as to confine the careers into the active region. On the other hand, the GaxIn1−xPyAs1−y (0<x≦1, 0<y≦1) layers 13 and 17 also have the feature in that the bandgap energy can be increased by decreasing the lattice constant. In the case of GaxIn1−xP (y=1), for example, there occurs an increase of the lattice constant when the compositional parameter x has increased and the film composition has approached the composition GaP. Associated therewith, there occurs an increase of bandgap. It should be noted that the bandgap energy Eg is given as Eg (⌈)=1.351+0.643x+0.786x$^2$ in the case of direct transition and Eg (X)=2.24+0.02x in the case of indirect transition. Therefore, the hetero barrier height between the active region and the GaxIn1−xPyAs1−y (0<x≦1, 0<y≦1) layer 13 or 17 is increased and the degree of career confinement is improved. Thereby, the threshold current is reduced and the temperature characteristics are improved.

Furthermore, it should be noted that the non-optical recombination elimination layer 13 or 17 having the composition GaxIn1−xPyAs1−y (0<x≦1,0<y≦1) has a lattice constant larger than the lattice constant of the GaAs substrate. Also the lattice constant of the active layer is larger than the lattice constant of the GaxIn1−xPyAs1−y (0<x≦1, 0<y≦1) layer 13 or 17. Thus, these layers accumulate compressional strain therein. As the direction of the strain accumulated in the GaxIn1−xPyAs1−y (0<x≦1,0<y≦1) layer is the same as the direction of the strain accumulated in the active layer, the substantial amount of the compressional strain that the active layer senses is reduced. Larger the strain, the influence of external factor is also large. Thus, the construction of the present invention is especially effective in the case that the active layer accumulates a large compressional strain of 2% or more, or the critical film thickness has been exceeded.

It is preferable to form a surface-emission laser diode of the 1.3 μm band on a GaAs substrate. Further, there are many cases in which a semiconductor multilayer reflector is used for the resonator In such a case, it is necessary to grow 50 to 80 semiconductor layers with a total thickness of 5–8 μm. (In the case of an edge-emission type laser diode, on the other hand, the total thickness before growth of the active layer is about 2 μm, and itg is sufficient to grow just about three layers.)

Thus, even if a high quality GaAs substrate is used, increase of defect density of the surface on which the growth of the active layer is made, in the sate immediately before the growth of the active layer growth is inevitable. Once formed, the defects thus formed crawl up in the direction of the crystal growth. Further, there may be additional defect formation at the hetero surface. On the other hand, measures such as provision of strain layer before the growth of the active layer or reduction of the substantial strain which the active layer senses, are effective for reducing the influence of the defects on the surface on which the growth of the active layer is made in the state immediately before the growth of the active layer.

In this embodiment, Al is expelled from the active layer and further from the interface region between the active region and the reflector. Thus, the problem of non-optical recombination of carriers originating from the crystal defects and caused by Al at the time of career injection is successfully removed.

As noted before, while it is preferable to provide the non-optical recombination elimination layer not containing Al at the interface of both of the reflectors 12 and 18, beneficial effect can be obtained also in the case the non-optical recombination elimination layer is provided to only one of the reflectors. In the illustrated example, both of the upper and lower reflectors 12 and 18 are formed of the semiconductor Bragg reflector. However, it is possible to form one of the reflectors by the semiconductor Bragg reflector and form the other reflector by a multilayer dielectric reflector.

In the foregoing example, only the low refractive index layer closet to the active layer forms the GaxIn1–xPyAs1–y (0<x≦1,0<y≦1) non-optical recombination elimination layer 13 or 17 in any of the reflectors 12 and 18. However, it is possible to form the non-optical recombination elimination layer 13 or 17 by a plurality of GaxIn1–xPyAs1–y (0<x≦1,0<y≦1) layers.

In this embodiment, the above concept is applied particularly to the lower reflector 12 located between the GaAs substrate and the active layer, and the problem of crawling up of crystal defects originating from Al at the time of the growth of the active layer and the adversary influence thereof, are suppressed successfully As a result, the active layer can be grown with high quality, and a highly reliable surface-emission laser diode oscillating with high efficiency and sufficient for practical use-is obtained. In the present embodiment, the Al-free, GaxIn1–xPyAs1–y (0<x≦1, 0<y≦1) layer is used only for the low refractive index layer located closest to the active region in the semiconductor Bragg reflector. Therefore, it is possible to achieve the foregoing effect without increasing the number of stacks of the reflector.

The surface-emission laser diode thus produced oscillated successfully at the wavelength of about 1.2 μm. While the wavelength of GaInAs formed on a GaAs substrate increases with increase of In content therein, such an increase of the In content is accompanied with an increase of strain. Thus, it has been thought that the wavelength of 1.1 μm would be the limit of the increase of laser oscillation wavelength in the laser diode that uses GaInAs. See IEEE Photonics. Technol. Lett. Vol.9 (1997) pp.1319–1321.

In the present invention, the inventor could successfully achieve the laser oscillation at 1.2 μm by using highly non-equilibrium growth processes conducted at low temperature of 600° C. or less. By using such a process, it became possible to achieve a coherent growth of the highly strained GaInAs quantum well active layer with large thickness not possible before. Meanwhile, this wavelength is transparent with respect to a Si semiconductor substrate. Thus, the laser diode of the present invention can be used to construct a circuit chip that uses optical transmission through the Si substrate, by integrating an electronic device and an optical device commonly on a Si substrate.

From the explanation noted above, it was discovered that a long-wavelength surface emission laser diode can be constructed successfully on a GaAs substrate by using a highly strained GaInAs layer containing a large amount of In and hence a large amount of compressive strain for the active layer.

As noted before, such a surface-emission laser diode can be formed by using an MOCVD process. However, it is also possible to use an MBE process or other growth process for this purpose. In the embodiment described heretofore, a triple quantum well structure (TOW) was used for the active layer. However, it is also possible to use a structure having different number of quantum well layers (SQW, MQW).

Further, it should be noted that the laser diode may also have a different structure. Further, the resonator length is not limited to λ but may have a length of integer multiple of λ/2 or preferably λ.

In the embodiment described heretofore, the laser diode was constructed on the GaAs substrate. However, it is also possible to use an InP substrate. Further, the period of repetition of in the reflectors may be changed.

In the embodiment described heretofore, the active layer of GaxIn1–xAs (GaInAs active layer) containing Ga, In and As as the major element is used in this example. On the other hand, it is possible to add N to the active layer of the laser diode. In this case, the active layer contains Ga, In, N and As as major elements (GaInNAs active layer), and the laser diode can oscillate at further longer wavelengths.

By changing the composition of the GaInNAs active layer, it is possible to achieve laser oscillation at any of the 1.3 μm band and 1.55 μm band. By choosing the composition of the active layer appropriately, it is also possible to realize a surface-emission laser diode laser oscillating at further longer wavelengths such as 1.7 μm.

It is also construct a surface-emission laser diode operable at the wavelength of 1.3 μm band on a GaAs substrate by using GaAsSb for the active layer.

Conventionally, there has been no material suitable for realizing a laser diode operable at the wavelength of 1.1–1.7 μm. By using a highly strained layer of GaInAs, GaInNAs or GaAsSb for the active layer, and by using a non-optical recombination elimination layer, the present invention successfully realized a highly efficient surface-emission laser diode operable in the long wavelength region of a/the 1.1–1.7 μm band.

[Second Embodiment]

Next, the constitution of another long-wavelength surface-emission laser diode applicable to an optical transmission/reception system of this invention as a light-emitting device that is will be described by using FIG. 27. In the drawing, those parts corresponding to the parts described previously are designated by the same reference numerals and the description thereof will be omitted.

Figure 27:
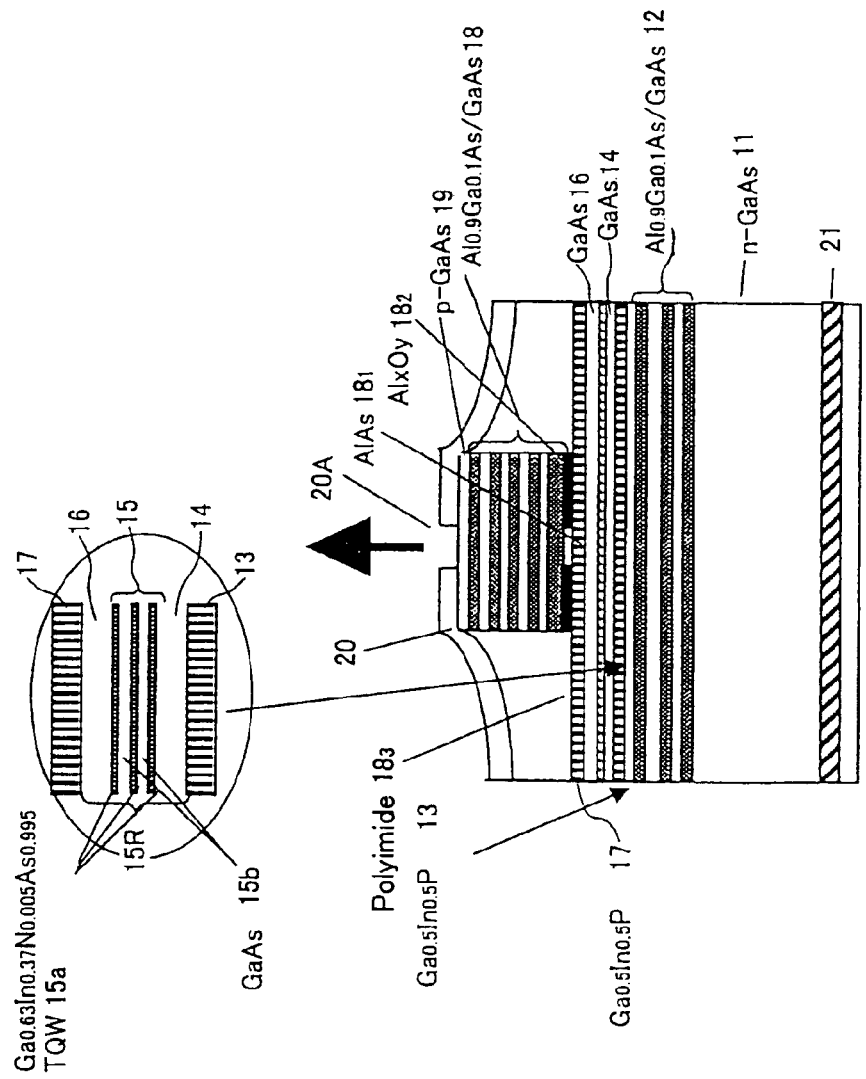
FIG. 27 is a sectional view showing the constitution of the long-wavelength surface-emission laser diode according to a second embodiment of the present invention.

FIG. 27 is referred to.

Similarly to the previous embodiment of FIG. 1, this embodiment also uses an n-type GaAs substrate 11 having a surface orientation of (100).

On the GaAs substrate 11, it can be seen that the n-type semiconductor Bragg reflector ($Al_{0.9}Ga_{0.1}As$/GaAs lower part reflectors) 12 is formed by alternately depositing the n-type AlGaAs having a composition of AlxGa1–xAs (x=0.9) and an n-type GaAs having a composition of AlxGa1–xAs (x=0) alternately for 35 periods, each with a thickness of ¼ times the oscillation wavelength λ in each medium (thickness of λ/4). Further, the n-type InGaP layer 13 is formed on the lower Bragg reflector 12 with a composition of GaxIn1–xPyAs1–y (x=0.5, y=1) and a thickness of λ/4. Thereby, the n-type GaxIn1–xPyAs1–y (x=0.5, y=1) layer 13 forms one of the low refractive index layers constituting a part of the lower part reflector 12.

On the InGaP layer 13, the multiple quantum well active layer 15 is formed by stacking the undoped lower GaAs spacer layer 14 and further the GaxIn1–xNyAs1–y quantum well active layer 15a three times on the spacer layer 14, with the GaAs barrier layer 15b of 15 nm thickness interposed therebetween to form a triple quantum wells (TQW) structure. Further, the undoped upper GaAs spacer layer 16 is formed on the multiple quantum well active layer 15 thus formed, wherein the lower spacer layer 14, the multiple quantum well active layer 15 and the upper GaAs spacer layer 16 constitute together a resonator 15R having a thickness of one wavelength (λ) of the oscillation wavelength in the medium. The resonator 15R constitutes the active region of the surface-emission laser diode.

Further, the p-type semiconductor Bragg reflector (the upper part reflector) 18 is formed on the resonator 15R.

It should be noted that the upper part reflector 18 includes a low refractive index layer having a thickness of 3λ/4 formed of an AlAs layer $18_1$ used for a selective oxidizing layer, wherein the foregoing low refractive index layer is sandwiched by the GaInP layer 17 and an AlGaAs layer. The GaInP layer 17 is doped with C has a composition represented as $Ga_xIn_{1-x}P_yAs_{1-y}$ (x=0.5, y=1), wherein the GaInP layer 17 is formed to have a thickness of λ/4–15 nm. On the other hand, the AlAs layer constituting the selective oxidizing layer is doped with C and has a composition represented as $Al_zGa_{1-z}As$ (z=1) and a thickness of 30 nm. Further, the foregoing AlGaAs layer is a C-doped AlGaAs layer having a composition represented by $Al_xGa_{1-x}As$ (x=0.9) and a thickness of 2λ/4–15 nm.

On the foregoing low refractive index layer, a GaAs layer having a thickness of λ/4 is formed for one period, and a p-type AlGaAs layer, doped with C and having a composition of expressed with $Al_xGa_{1-x}As$ (x=0.9) and a p-type GaAs layer doped with C and having a composition represented by $Al_xGa_{1-x}As$ (x=0), are stacked 22 periods each with a thickness of ¼ times the laser oscillation wavelength in each medium. Thereby a periodic stack structure constituting the essential part of the upper part reflector 18 is formed.

In this embodiment, too, the heterospike buffer layer 18c of intermediate refractive index is provided in the semiconductor Bragg reflector 18 by an $Al_zGa_{1-z}As$ ($0 \leq y<z<x \leq 1$) layer between the low refractive index layer 18a and the high refractive index layer 18b as already explained with reference to FIG. 2. In FIG. 27, illustration of the heterospike buffer layer 18c will be omitted for the sake of simplicity.

In this embodiment, the p-type GaAs layer having the composition of $Al_xGa_{1-x}As$ (x=0) and constituting the uppermost part of the semiconductor Bragg reflector 18 functions as a contact layer (p-contact layer) that secures electrical contact to the electrode.

In the surface-emission laser diode of this embodiment, the In content x of the quantum well active layer 15a is set to 37% and the N (nitrogen) content is set to 0.5%. The thickness of the quantum well active layer 15a is set to 7 nm.

In this embodiment, the growth of the semiconductor layers constituting the said surface-emission laser diode was conducting by using an MOCVD process. More specifically, TMA (trimethyl aluminum), TMG (trimethyl gallium), TMI (trimethyl indium), AsH3 (arsine) and PH3 (phosphine) are used respectively as the source materials of Al, Ga, In, As and P. Further, DMHy (dimethyl hydrazine) was used as the source material of nitrogen. DMHy decomposes at a low temperature and is suited for a low temperature growth process conducted at 600° C. or less. Particularly, it is suited to grow a quantum well layer of large strain, which needs a low temperature growth process. In the MOCVD process, $H_2$ is used for the carrier gas. Further, the growth of the GaInNAs layer (quantum well active layer) was conducted at 540° C.

It should be noted that MOCVD process is characterized by large degree of supersaturation and is suited for the crystal growth of a material that contains N and simultaneously other group V elements. Further, the MOCVD process does not require the high vacuum environment, contrary to the MBE process. Further, it is suitable for mass production, as it is only sufficient to control the supply rate and supply time of the source gases.

In this embodiment, a predetermined part of the stacked structure thus formed is etched until it reaches the p-type $Ga_xIn_{1-x}P_yAs_{1-y}$ (x=0.5, y=1) layer 17. Thereby, there is formed a mesa structure that exposes the p-$Al_zGa_{1-z}As$ (z=1) selective oxidizing layer $18_1$ at the sidewall thereof. Furthermore, said $Al_zGa_{1-z}As$ (z=1) layer $18_1$ thus exposed is oxidized from the mesa sidewall by water vapor, and there is formed a current confinement layer 182 having a composition represented as $Al_xO_y$.

Finally, the part removed with the mesa etching process previously is filled by polyimide to form a planarized structure, and the polyimide film covering the upper part reflector is removed. With this, there is formed a polyimide region $18_3$. Furthermore the p-side electrode 20 is formed on the p-type contact layer except for the optical exit part, and an n-side electrode 21 is formed on the rear side of the GaAs substrate 11.

In this embodiment, the $Ga_xIn_{1-x}P_yAs_{1-y}$ ($0<x \leq 1$, $0<y \leq 1$) layer 17 is inserted below the selective oxidizing layer $18_1$ as a part of the upper part reflector 18. In the case a wet etching process by using a sulfuric acid etchant is employed in the formation of the mesa structure, the etching stops spontaneously at the $Ga_xIn_{1-x}P_yAs_{1-y}$ ($0<x \leq 1$, $0<y \leq 1$) layer 17, as a material of the GaInPAs system functions as an etching stopper layer to the etching process of a material of the AlGaAs system. Thus, by using a wet etching process by a sulfuric etchant for the formation of the mesa structure, it is possible to control the height of the mesa structure rigorously.

Because of this, the homogeneity and reproducibility are improved substantially for the surface-emission laser diodes that are formed simultaneously on a substrate and the production cost is reduced. This feature is particularly advantageous when producing a laser diode array in which a number of surface-emission laser diodes are integrated in one-dimensional or two-dimensional array.

In the embodiment of FIG. 27, it is noted that the $Ga_xIn_{1-x}P_yAs_{1-y}$ ($0<x \leq 1$, $0<y \leq 1$) layer 17 that acts also as an etching stopper layer is provided on the side of upper part reflector 18. Further, a similar GaInP layer 13 is provided on the lower part reflector 12.

In this embodiment, too, the active region 15 sandwiched between the upper and lower reflectors 12 and 18 and cause recombination upon injection of carriers is formed of a material free from Al. Further, the low refractive index layer of the lower and upper reflectors 12 and 18 closest to the active layer 15 is formed of the non-optical recombination elimination layer 13 or 17 having a composition represented by $Ga_xIn_{1-x}P_yAs_{1-y}$ ($0<x \leq 1$, $0<y \leq 1$). Thus, Al is not contained at the interface between the active region 15 and the reflector 12 or 18, and the problem of non-optical recombination caused by the crystal defects, which in turn are caused by Al, is effectively eliminated.

While such a construction of using an Al-free material at the interface between the reflector and the active region is preferably provided to both of the upper and lower reflectors 12 and 18, the advantageous effect of the present invention is obtained also in the case such a construction is used on only one of the upper and lower reflectors 18 and 12. Further, it is also possible to use a semiconductor Bragg reflector in only one of the reflectors and form the other reflector by a dielectric reflector.

As the lower part reflector 12 provided between the GaAs substrate 11 and the active layer 15 is constructed similarly to the case of FIG. 1 in the present embodiment, the adversary effects of crawling up of the crystal defects, originating from Al, into the active layer is effectively suppressed. Thereby, the active layer 15 can be formed with high quality.

It should be noted that such a non-optical recombination elimination layer 13 or 17 constitutes a part of the semiconductor Bragg reflector 12 or 18 in any of the constitution of FIG. 1 or 27, and thus, the thickness thereof is set to ¼ the oscillation wavelength λ as measured in the medium (λ/4). It is also possible to provide such a non-optical recombination elimination layer in plural numbers.

In the example above, the non-optical recombination elimination layer 13 or 17 is provided to a part of the semiconductor Bragg reflector 12 or 18. On the other hand, it is also possible to provide such a non-optical recombination elimination layer inside the resonator 15. In the case the resonator 15 is formed of the active layer 15 consisting of the GaInNAs quantum well layer 15a and the GaAs barrier layer 15b, for example, it is possible to use the GaAs layer as the first barrier layer and the non-optical recombination elimination layer of GaInPAs, GaAsP or GaInP as the second barrier layer. Thereby, it is possible to set the thickness of the resonator to one wavelength. In this case, because of the large bandgap of the non-optical recombination elimination layer as compared with the first GaAs barrier layer, the active region in which carrier injection takes place is substantially limited up to the region of the GaAs barrier layer.

In the case that the process of removing the residual Al source material or Al reactant, Al compound or Al during the fabrication process of the laser diode, it is possible to provide such a process during the step of forming the non-optical recombination elimination layer. Alternatively, the removal of residual Al may be conducted in a process of growing a GaAs layer interposed between the process of forming the Al-containing layer and the process of forming the non-optical recombination elimination layer.

According to the present embodiment, it becomes possible to form a highly efficient, reliable surface-emission laser diode. Thereby, it is possible to achieve the foregoing advantageous effect of the present invention without increasing the number of stacks in the reflector, as the non-optical recombination elimination layer formed of the Al-free GaxIn1-xPyAs1-y (0<x≦1,0<y≦1) layer is used in only the low refractive index layer located closet to the active region in the semiconductor Bragg reflector 12 or 18.

Further, it should be noted that filling of polyimide is easily made, and thus, it is possible to provide interconnection wiring forming the p-side electrode, without risking the disconnection of the wiring at the stepped part. Thereby, the reliability of the device is improved further.

It was confirmed that the surface-emission laser diode thus produced oscillates at the laser oscillation wavelength of about 1.3 µm.

In the present embodiment, it became possible to construct a surface-emission laser diode of long wavelength band on the GaAs substrate 11 by using a GaInNAs layer containing Ga, In, N and As for the major element. By forming a current confinement structure by applying a selective oxidation process to the AlAs layer $18_1$ to form the oxide current confinement layer $18_2$, the threshold current of laser oscillation is reduced effectively. In such a current confinement structure, formed of the AlAs layer $18_1$ in which the selective oxidation layer $18_2$ is formed, it is possible to provide the current confinement structure close to the active layer, and lateral diffusion of the injected electric current is suppressed effectively. As a result of use of such a current confinement structure, it becomes possible to confine the careers effectively into a minute region not exposed to the atmosphere. The foregoing current confinement structure has another advantageous feature in that the Al oxide constituting the layer 182 has a low refractive index and the efficiency of carrier confinement is increased further. Thereby, the efficiency of laser oscillation is improved furthermore and the threshold electric current is reduced. Further, the current confinement structure has an advantageous feature in that formation thereof is made easily and the production cost is reduced.

From the explanation noted above, the laser diode of FIG. 27 oscillates efficiently at the wavelength of 1.3 µm similarly to the case of FIG. 1. The laser diode of FIG. 27 also has advantageous feature of small power consumption and low production cost.

The surface-emission laser diode of FIG. 27 can be formed also by an MOCVD process, similarly to the case of FIG. 1. However, it is also possible to use an MBE process or other growth process. Further, it is possible to use nitrogen or a nitrogen compound such as NH3 in an activated state.

Furthermore, it is possible to replace the triple quantum well structure (TQW) in the active layer 15 with another structure including different number of quantum wells such as an SQW structure, DQW structure or an MQW structure. Further, it is possible to use a laser diode of different structure.

By adjusting the composition of the GaInNAs active layer 15a in the surface-emission laser diode of FIG. 1, it becomes possible to realize a surface-emission laser diode of the 1.55 µm band and further the 1.7 µm band. In the present invention, the GaInNAs active layer may contain other III-V elements such as Tl, Sb, P, and the like. Further, it is also possible to construct a surface-emission laser diode of 1.3 µm band on a GaAs substrate by using GaAsSb for the active layer.

In the description heretofore, it was assumed that the active layer contains Ga, In and Ss as the major elements (GaInAs active layer) or Ga, In, N and As as the active layer (GaInNAs active layer). Further, the active layer may be formed of any of GaNAs, GaPN, GaNPAs, GaInNP, GaNAsSb, and GaInNAsSb. The present invention is particularly effective also in these cases in which the active layer contains N.

Figure 28:
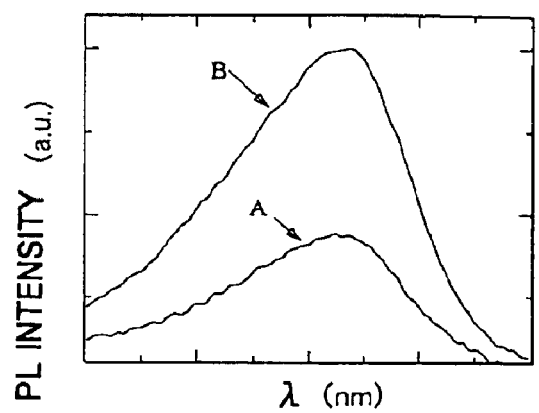
FIG. 28 is a diagram showing a room temperature photoluminescence spectrum of the active layer formed of a GaInNAs/G s double quantum well structure.

FIG. 28 shows the room temperature photoluminescence spectrum obtained for the active layer that includes a GaInNAs/GaAs double quantum well structure formed by a GaInNAs quantum well layer and a GaAs barrier produced by an MOCVD process. Further, FIG. 29 shows the structure of the sample used for the measurement.

Figure 29:
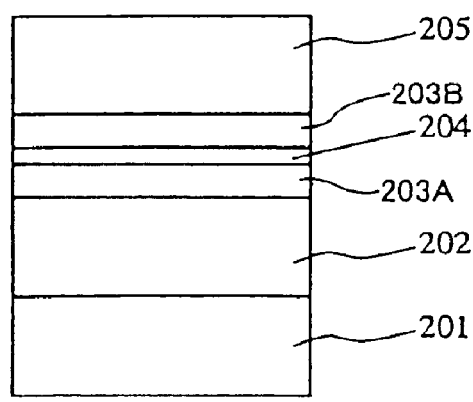
FIG. 29 is a diagram showing a sample structure.

FIG. 29 is referred to.

It can be seen that there are formed a lower part cladding layer 202, an intermediate layer 203A, an active layer 204 containing therein nitrogen, another intermediate layer 203B, and an and an upper part cladding layer 205 consecutively on the GaAs substrate 201.

Next, FIG. 28 is referred to.

The curve A shows the result with regard to the sample that uses an AlGaAs layer as the cladding layer 202 and the double quantum well structure is formed while interposing a GaAs layer similar to the intermediate layer 203A or 203B between the quantum wells. The curve B, on the other hand, shows the measurement result with regard to the sample that uses a GaInP layer as the cladding layer 202 and the double quantum well structure is formed continuously while interposing a GaAs layer similar to the intermediate layer 203A or 203B.

As can be seen in FIG. 28, the photoluminescence intensity of the sample A has fallen off by one-half or more with respect to the photoluminescence intensity of the sample B. This means that there arises a problem of decrease of photoemission efficiency of the active layer when the active layer containing nitrogen therein such as GaInNAs is grown continuously on a semiconductor layer that contains Al as constituent element such as AlGaAs while using a single MOCVD apparatus. Because of this, the threshold current density of the GaInNAs laser diode formed on an AlGaAs cladding layer is increased by twice or more as compared with the case in which the same laser diode is formed on an GaInP cladding layer.

The inventor of this invention conducted through investigation of this problem and obtained a knowledge explained below.

Figure 30:
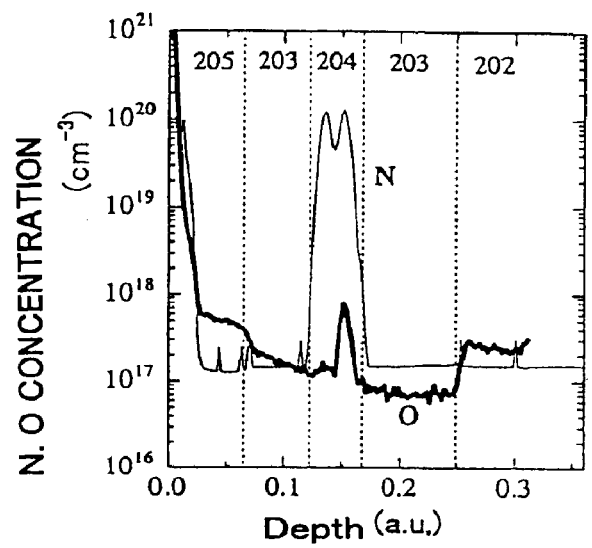
FIG. 30 is a diagram showing a depth profile of nitrogen and oxygen.

FIG. 30 shows the depth profile of nitrogen and oxygen in the device for the case the cladding layers 202 and 205 are formed by an AlGaAs layer, the intermediate layers 203A and 203B are formed of GaAs, and the active layer is formed of the GaInNAs/GaAs double quantum well structure and the device is formed by using a single MOCVD apparatus. It should be noted that the measurement of FIG. 30 was conducted under the measurement condition summarized in Table 1 by secondary ion mass spectrometry.

TABLE 3

| first ion specie | Cs+ |
|---|---|
| first acceleration voltage | 3.0 kV |
| sputter rate | 0.5 nm/s |
| measurement area | 160 × 256 μm² |
| degree of vacuum | <3E-7Pa |
| polarity of measured ion | − |

FIG. 30 is referred to.

It can be seen that there appear two nitrogen peaks in the active layer 204 in correspondence to the GaInNAs/GaAs double quantum well structure. Further, it is also noted that an oxygen peak is detected in the active layer 204. On the other hand, the oxygen concentration in the intermediate layers 203A and 203, which are free from N and Al, is lower in terms of one order as compared with the oxygen concentration in the active layer 204.

Further, the depth profile of oxygen measured about the sample having a constitution in which the active layer 204 including therein the GaInNAs/GaAs double quantum well structure is formed on the cladding layer of GaInP together with the GaAs intermediate layers 203A and 203B, has revealed that the oxygen concentration in the active layer 204 is in the background level.

Thus, it was confirmed experimentally that the problem of oxygen incorporation into the active layer 204 occurs singularly in the case in which the laser diode has the nitrogen-containing active layer 204 in the state that the active layer 204 is separated from the substrate by the semiconductor layer 202 containing Al and the growth of the layers constituting the device is conducted by a single MOCVD apparatus while using a nitrogen compound source material and an organic Al source material. The oxygen atoms thus incorporated into the active layer form a non-optical recombination state therein and cause a decrease of luminous efficacy of the active layer.

Thus, from the result of FIG. 30, it is concluded that oxygen incorporated into the active layer is the cause the problem of decease of optical emission efficiency in the device in which the Al-containing layer is provided between the substrate and the N-containing active layer. It is conceivable that the origin of this oxygen contamination would be the oxygen-containing material that has captured residual oxygen in the deposition apparatus or the impurity contained in the nitrogen compound source material.

Next, the mechanism of oxygen incorporation into the active layer 204 will be examined.

Figure 31:
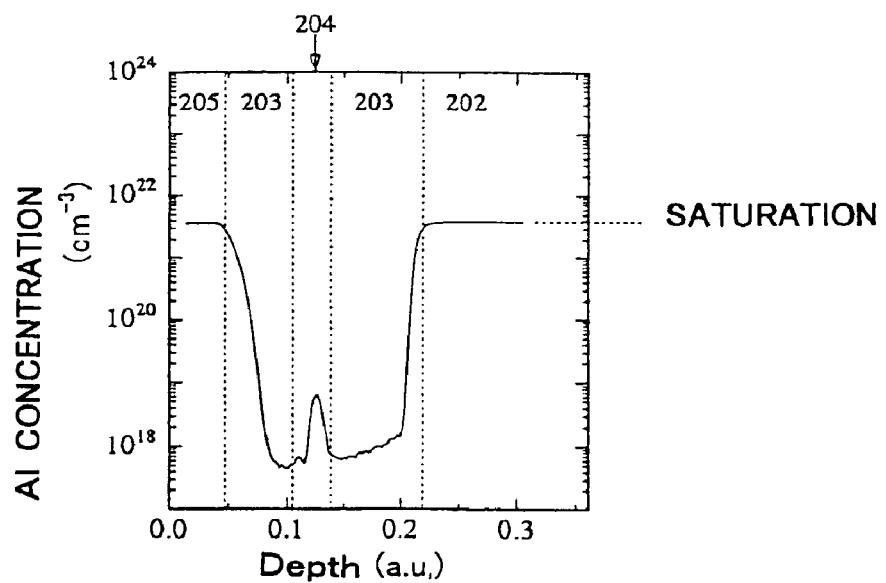
FIG. 31 is a diagram snowing a depth profile of Al.

FIG. 31 shows the depth profile of Al obtained for the same sample of FIG. 30. The measurement was conducted by the secondary ion mass spectroscopy similarly to the case of FIG. 30 under the measurement condition shown in Table 2.

TABLE 4

| first ion specie | O2+ |
|---|---|
| first acceleration voltage | 5.5 kv |
| sputter rate | 0.3 nm/s |
| measurement area | 60 μm φ |
| degree of vacuum | <3E-7OPa |
| polarity of measured ion | + |

FIG. 31 is referred to.

It can be seen that Al is detected in the active layer 204, which was formed without introducing an Al source material. Further, it is noted that the Al concentration in the GaAs intermediate layer 203A or 203B formed adjacent to the Al-containing cladding layer 202 or 205 is lower than the Al concentration in the active layer 204 by the order of one. This indicates that Al in the active layer 204 has caused diffusion from the Al-containing cladding layer 202 or 205 and has substituted Ga in the active layer 204.

On the other hand, Al was not detected in the active layer in the case that the N-containing active layer was grown on a semiconductor layer free from Al such as GaInP.

From this, it is concluded that Al detected in the active layer 204 originates from residual Al such as residual Al source material or residual Al reactant or residual Al compound or residual Al remaining in the growth chamber or gas supply line and has been incorporated into the active layer as a result of coupling with the nitrogen source compound or the impurity such as water contained in the nitrogen source compound. Further, it is concluded that the Al incorporation into the N-containing active layer is inevitable when a semiconductor light emitting device having an Al-containing layer between the substrate and the N-containing active layer is grown continuously by a single epitaxial apparatus.

By comparing FIG. 31 with FIG. 30, it is noted further that the two oxygen peaks in FIG. 30 corresponding to the double quantum well do not coincide with the two nitrogen peaks but coincide with the peak profile of Al shown in FIG. 31. This results indicates that oxygen in the GaInNAs quantum well layer has been incorporated into the active layer not with the nitrogen source but with Al in the form coupled with residual Al that has been incorporated into the quantum well layer.

More specifically, the residual Al source material or residual Al reactant or residual Al compound or residual Al in the MOCVD chamber is thought to cause a coupling with water contained in the nitrogen source compound or oxygen-containing material remaining in the gas line or reaction chamber and is incorporated into the active layer in the form coupled with oxygen or water.

Thus, it was clarified by the inventor of the present invention that, in the surface-emission laser diode of a conventional GaAs system, there occurs oxygen incorporation into the active layer and oxygen thus incorporated has caused the problem of decrease of efficiency of optical emission.

The foregoing discovery provides a clue to the improvement of efficacy of the surface-emission laser diode of the GaAs system in that it is necessary to remove the impurity at least from the part of the deposition apparatus used for the production of the laser diode and may have a chance to make a contact with the nitrogen compound source material in the deposition chamber or the impurity contained in the nitrogen compound source material.

Thus, by providing a step of removing the residual Al after the growth of the Al-containing layer but before the growth of the N-containing active layer, it becomes possible to reduce the concentration of Al and oxygen impurity incorporated into the active layer. By doing so, the concentration of residual Al source material or Al reactant or Al compound or Al concentration is already reduced when the nitrogen compound source material is supplied for the growth of the N-containing active layer, and the reaction between the residual Al and the nitrogen source compound or the impurity contained in the nitrogen source compound is successfully suppressed.

It is further advantageous to remove the residual Al before the end of the growth of the non-optical recombination layer. By doing so, it is possible to suppress the non-optical recombination of carriers in the active layer at the time carriers are injected into the active layer by way of current injection.

For example, it became possible to carry out a continuous oscillation of the surface-emission laser diode of the GaAs system at room temperature environment by reducing the Al concentration in the N-containing active layer to $1 \times 10^{19}$ $cm^{-3}$ or less. Further, by reducing the Al concentration in the N-containing active layer to $2 \times 10^{18}$ $cm^{-3}$ or less, optical emission characteristics substantially equal to the case when the active layer is grown on an Al-free semiconductor layer is obtained.

The removal of the residual Al source material or residual Al reactant or residual Al compound or residual Al from the part of the deposition chamber that may have a chance to make a contact with the nitrogen compound source material or the impurity contained in the nitrogen compound source material, can be advantageously conducted by a purging process that uses a carrier gas as the purge gas. Here, the time of the purging process is defined as the time after the supply of the Al source material into the deposition chamber is stopped in correspondence to completion of the growth of the Al-containing layer but before the start of supply of the nitrogen compound source material to the deposition chamber for the start of growth of the N-containing semiconductor layer. It is also possible to interrupt the growth of the intermediate layer, which is free from any of Al and nitrogen, and conduct a purging process by using the carrier gas as a purging gas. In this case, the interruption of the growth process of the intermediate layer may be achieved after the start of growth of the Al-containing layer until the midway of the growth of the non-optical recombination layer.

Figure 32:
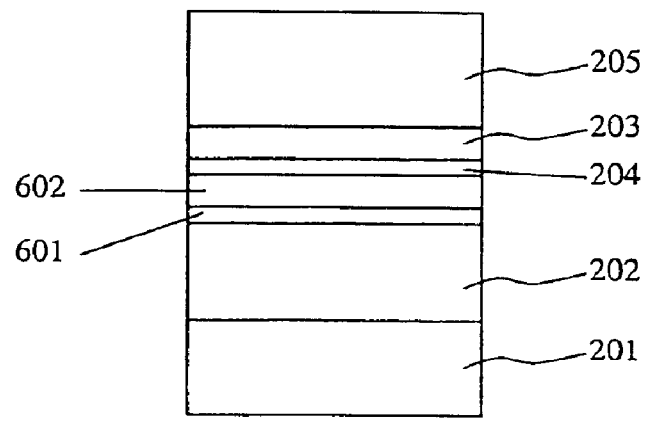
FIG. 32 is a diagram showing the structure obtained for a case in which growth interruption process is used in the form of a carrier gas purging process.

FIG. 32 shows an example of the semiconductor light-emitting device formed by providing such a carrier purging process. In FIG. 32, those parts corresponding to the parts described previously are designated by the same reference numerals and the description thereof will be omitted.

Thus, it can be seen that the Al-containing first semiconductor layer 202, the first lower part intermediate layer 601, the second lower part intermediate layer 602, the N-containing active layer 204, the upper part intermediate layer 203, and the second semiconductor layer 205 are stacked consecutively the on substrate 201 in FIG. 32.

In forming the structure of FIG. 32, the crystal growth is carried out by an epitaxial growth apparatus by using an organic-metal Al source and an organic nitrogen source material. In the case, the growth interruption process is provided before the start of growth of the second lower part intermediate layer 602 but after the growth of the first lower part intermediate layer 601. During the growth interruption process, the part of the growth chamber that may make a contact with the nitrogen compound source material or the impurity in the nitrogen compound source material is purged by a hydrogen gas used as the carrier gas, such that the residual Al source material or residual Al reactant or residual Al compound or residual Al is removed.

Figure 33:
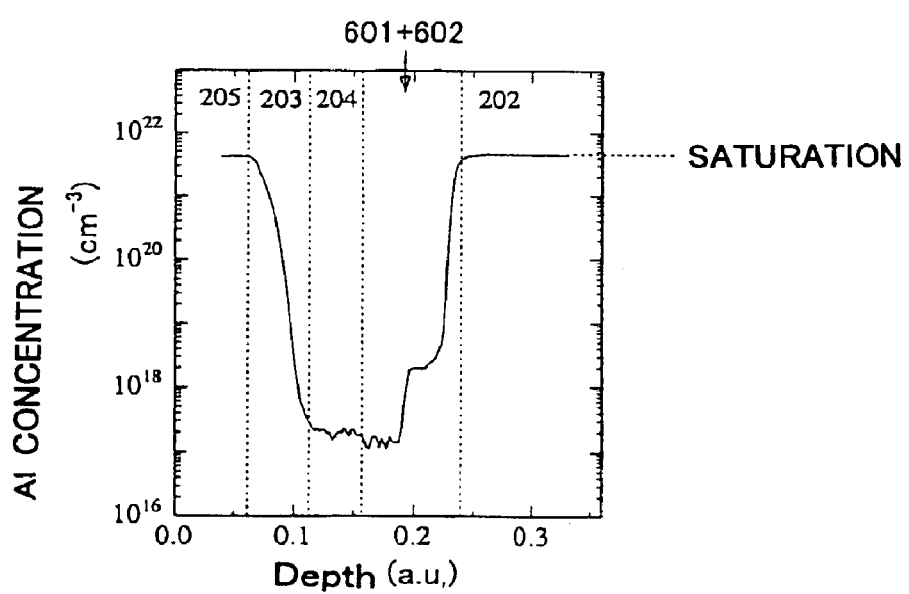
FIG. 33 is a diagram showing a depth profile of the Al for the case in which a growth interruption process is provided and purging is conducted by using a hydrogen gas.

FIG. 33 shows the result of measurement of the depth profile of Al concentration on a semiconductor light-emitting device in which there has been provided a growth interruption between the first lower part intermediate layer 601 and the second lower part intermediate layer 602 and a purging process was conducted for 60 seconds.

FIG. 33 is referred to. It can be seen that the Al concentration in the active layer 204 is reduced to $3 \times 10^{17}$ $cm^{-3}$ or less as a result of such a growth interruption process and purging process. This value of Al concentration is the same degree as the Al concentration in the intermediate layers 601 and 602.

Figure 34:
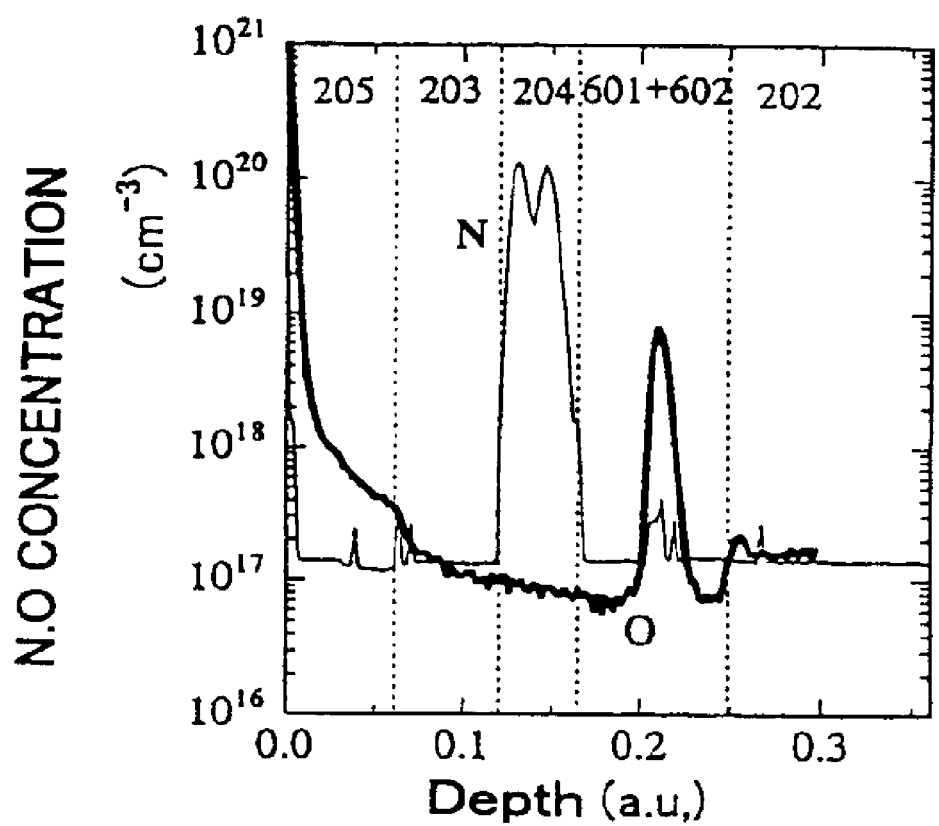
FIG. 34 is a diagram showing a depth profile of nitrogen and oxygen for the case in which a growth interruption process is provided and purging is made with a hydrogen gas.

FIG. 34 shows the depth profile of nitrogen and oxygen for the device of FIG. 32.

FIG. 34 is referred to. It can be seen that the oxygen concentration in the active layer 204 is reduced to $1 \times 10^{17}$ $cm^{-3}$, which is a background level. The oxygen peak appearing in the lower part intermediate layer 601 or 602 in FIG. 34 is interpreted as showing oxygen segregation to the growth interruption interface as a result of interruption of growth. Thus, it is preferable to conduct the growth interruption period after the termination of the growth of the semiconductor layer containing Al but before the growth termination of the non-optical recombination elimination layer, in the case there is provided a growth interruption and purging process. In the non-optical recombination elimination layer, it is possible to increase the bandgap energy as compared with the quantum well active layer or barrier layer, and the adversary effect of the non-optical recombination caused by the oxygen segregated to the growth interruption interface is effectively suppressed when career injection is made into the active layer. The constitution that uses the non-optical recombination elimination layer provides a particularly advantageous effect in the case of using an active layer containing nitrogen.

In the semiconductor light-emitting device of FIG. 32, the impurity concentration level of Al and oxygen in the nitrogen-containing active layer 204 is reduced successfully by interrupting the growth process between the first lower part intermediate layer 601 and the second lower part intermediate layer 602 and by conducting a purging process for 60 minutes. In this way, the optical efficacy of the active layer 204 was effectively improved.

Further, it is also possible to carry out the Al removal process while heating the susceptor during the purging process conducted with a carrier gas. By doing so, the Al source material or reaction product adsorbed on the susceptor or the region near the susceptor is effectively decoupled and removed. In the case of conducting such a heating of the substrate during the purging process, it is necessary to supply the group V source gas such as AsH3 or PH3 so as to avoid thermal decomposition of the uppermost semiconductor layer.

It is also possible to transport the substrate to a chamber different from the growth chamber when conducting the purging process with a carrier gas in an MOCVD apparatus. In the case that the substrate is transported to another chamber from the growth chamber, it is not necessary to keep supplying the group V source gas such as $AsH_3$ or $PH_3$ to the growth chamber. Thereby, the efficiency of thermal decomposition of the Al reactant deposited on the susceptor or the region surrounding the susceptor is substantially facilitated and the efficiency of removal of Al is improved.

Further, it is also possible to carry out the purging process while continuing the growth of the intermediate layer. In the constitution of FIG. 27, for example, the non-optical recombination elimination layer 13 is provided between the N-containing active layer 15 and the reflector 12 formed of the AlGaAs material containing Al. Thereby, the distance between the N-containing active layer 15 and the Al-containing layer is increased, and it is possible to increase the duration of the purging process in the case the purging process is conducted simultaneously to the growth. In such a case, it is advantageous to decrease the growth rate and increase the purging time.

Further, it is also possible to carry out the growth of the Al-containing reflector 12 of AlGaAs material and the N-containing active layer 15 in respective, separate apparatuses. In this case, too, the impurity concentration level of Al or oxygen in the active layer 15 can be reduced, by setting the regrowth interface below the non-optical recombination elimination layer 13.

In the case that the surface emission laser diode is produced with the crystal growth process that does not use an organic-metal Al source or nitrogen compound source material such as an MBE process, there is no report about the degradation of the optical efficiency in the semiconductor light-emitting device in which N-containing active layer is provided on the Al-containing semiconductor layer. In case of an MOCVD process, on the other hand, degradation of optical efficacy of the GaInNAs active layer formed on the Al-containing semiconductor layer is reported.

In Electron. Lett., 2000, 36 (21), pp. 1776–1777, for example, there is a report that the photoluminescence intensity deteriorates remarkably when a GaInNAs quantum well layer is grown continuously on an AlGaAs cladding layer in the same MOCVD growth chamber, even when an intermediate layer of GaAs is provided on the AlGaAs cladding layer. In the foregoing report, the GaInNAs active layer is grown in a MOCVD chamber different from one used for growing the AlGaAs cladding layer so as to improve the photoluminescence intensity.

Thus, it is believed that the aforementioned problem arises more or less when growing a crystal layer by an organic-metal Al source and a nitrogen compound source, as in the case of an MOCVD process.

In the MBE process, the crystal growth is carried out under a ultra low-pressure environment (high vacuum state) On the other hand, an MOCVD process is conducted under a process pressure of several ten Torr to the atmospheric pressure. Thus, the mean free path of the gaseous molecules is overwhelmingly short in an MOCVD process as compared with the MBE process. Because of this, it is conceivable that the source gas molecules or the carrier gas molecules make a contact with various parts of the gas line, reaction chamber, and the like.

Thus, in the case of the growth process that uses a relatively high pressure for the reaction chamber or gas line as in the case of the MOCVD process, it becomes possible to eliminate the incorporation of oxygen into the N-containing active layer, by providing a removal step for removing the residual Al source material or Al reactant or Al compound or Al from the location of the reaction chamber, in which the reaction chamber may make a contact with the nitrogen compound source material or the impurity contained in the nitrogen compound source material. Such a removal step should be conducted after the growth of the Al-containing semiconductor layer but before the start of growth of the N-containing active layer. More preferably, the removal process should be carried out after the growth of the Al-containing semiconductor layer but before the end of the growth of the non-optical recombination elimination layer.

For instance, it is possible to evacuate the gas line or the growth chamber with a vacuum evacuation process after the growth of the Al-containing semiconductor layer but before the growth of the N-containing active layer. In this case, it is preferable to carry out the evacuation process in the state that the substrate is heated.

Also, it is possible to remove the residual Al after the growth of the Al-containing semiconductor layer but before the growth of the N-containing active layer by supplying an etching gas. For example, an organic compound gas may be used as the etching gas that reacts with the Al-containing residue.

For example, it is possible to cause a reaction in the Al-containing residue by supplying a DMHy gas, which is one of the organic compound gases, S at the time of the growth of the active layer from a DMHy cylinder. Therefore it is possible to remove these Al-containing residue by causing a reaction between the Al-containing residue remaining on the reaction chamber surface, heating zone, or jigs used for supporting the substrate, and the organic compound gas by supplying the organic compound gas from a gas cylinder, after the growth of the Al-containing semiconductor layer. By a method, too, it is possible to suppress the incorporation of oxygen is into the active layer. Particularly, by using the same gas as the gas used for the nitrogen source it is possible to avoid the problem of providing a special gas line. This process can be carried out while interrupting the growth or growing a dummy layer containing nitrogen such as GaNAs, GaInNAs, GaInNP separately from the growth of the active layer.

By doing conducting the Al removal process simultaneously to the crystal growth process, it is possible to reduce the time loss as compared with the case of interrupting the growth process, and the throughput of the semiconductor device production is improved.

By using GaInAs in the active layer of laser diode, it became possible to realize a laser diode oscillating at the wavelength of 1.2 $\mu$m by growing a highly strained GaInAs quantum well active layer by using a low temperature growth process of 600° C. This wavelength value is substantially longer than the wavelength of 1.1 $\mu$m, which has been conceived as the upper limit of laser oscillation wavelength. Conventionally, there was no material suitable for the laser diode of 1.1–1.7 $\mu$m. On the other hand, it became possible to realize a highly efficient surface-emission laser diode operable in the wavelength band of 1.1–1.7 $\mu$m, by using a highly strained active layer of GaInAs, GaInNAs or GaAsSb together with the use of the non-optical recombination elimination layer. With this, the possibility of applications to the optical-fiber telecommunication systems was opened.

[Third Embodiment]
[Third Embodiment]

Figure 35:
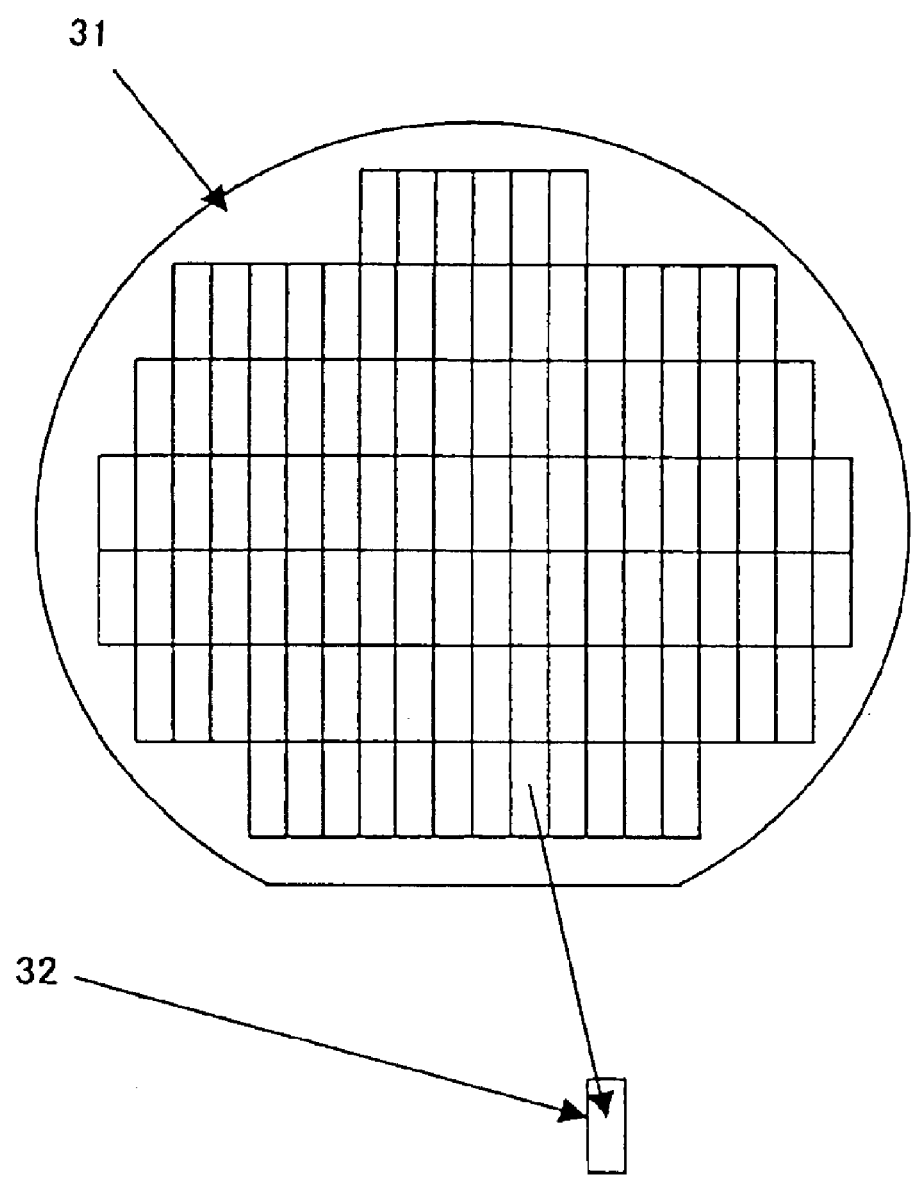
FIG. 35 is a plane view showing a wafer and a laser diode chip in-which the long-wavelength surface-emission laser diode of this invention is formed.

FIG. 35 shows a laser diode chip 32 including the long-wavelength surface-emission laser diode of FIG. 1 or FIG. 27 explained previously. The example that formed on an n-type GaAs wafer 31 of a surface orientation (100) is shown.

FIG. 35 is referred to.

It can be seen that a number of laser diode chips 32 are formed on the GaAs wafer, and each of the laser diode chips 32 carries thereon n laser diodes each having a construction explained before. The number n and arrangement thereof are decided according to the use of laser diode chip 32.

Figure 36:
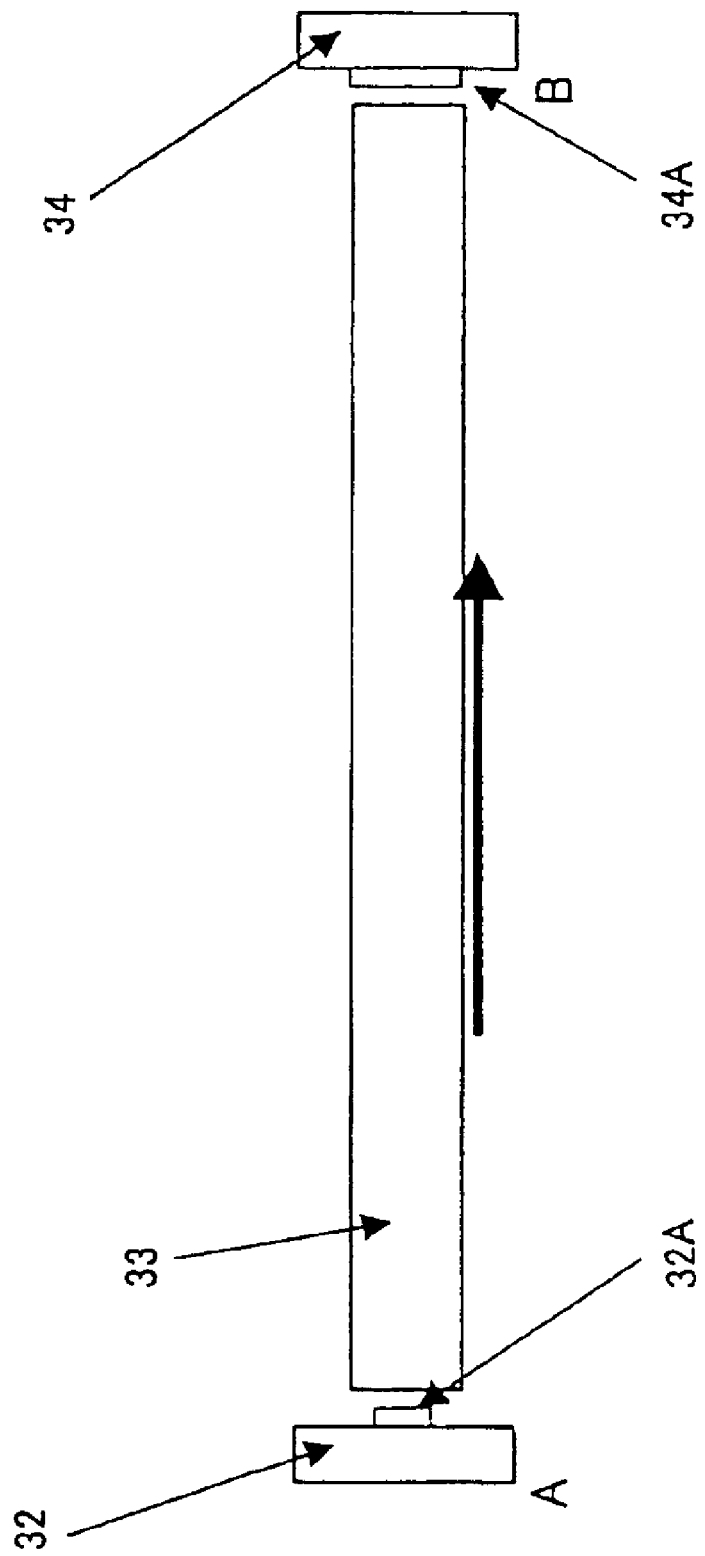
FIG. 36 is a diagram showing an example of optical transmission/reception system that connects an optical source and a photodetection unit by a straight the transmission path.

FIG. 36 shows the example of the optical transmission/reception system using the long-wavelength surface-emission laser diode having the laser oscillation wavelength of 1.1–1.7 μm band. Those parts explained previously are designated by the same numerals and explanation is omitted.

FIG. 36 is referred to.

The surface-emission laser diode chip 32 is provided at the A point as an optical source such that the emission part 32A of the laser diode chip 32 makes an optical coupling with the optical fiber 33. The optical signal emitted from the emission part 32A of the laser diode chip 32 is injected into the optical fiber 33. The optical signal is transferred in the direction shown with the thick arrow in FIG. 36. The end point of the optical fiber 33 is located at the B point. The photodiode or other suitable photodetection device 34, which constitutes the photodetection unit is provided in the B point, and the optical detection part 34A thereof is coupled optically to and the optical fiber 33. Thus, the optical transmission/reception system is composed.

In this example, the location B for the photodetection unit and the location A for the optical source are tied with a straight line by the optical fiber 33.

Figure 37:
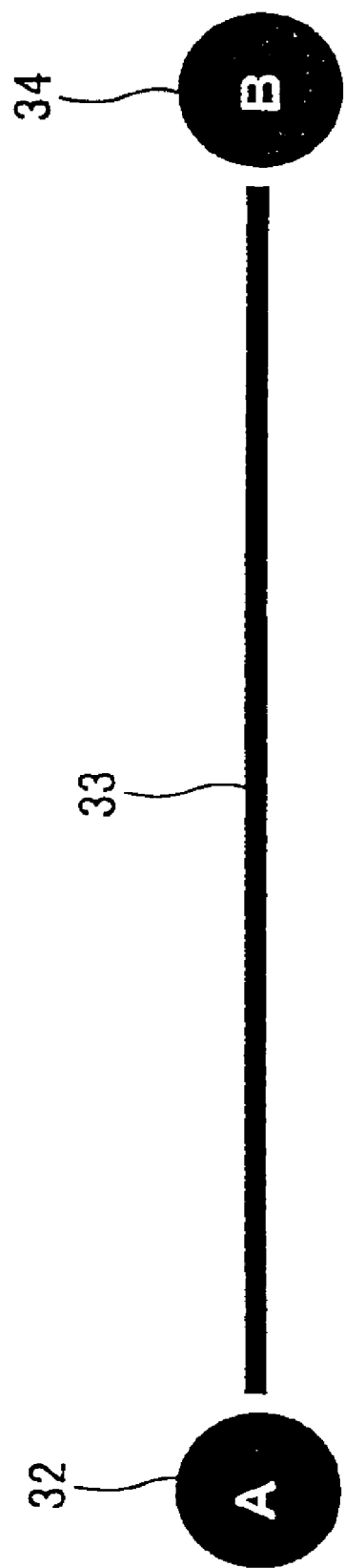
FIG. 37 is a diagram showing an overall view of the above optical transmission/reception system.

FIG. 37 shows the construction of FIG. 36 schematically.

FIG. 37 is referred to.

The black circles A, B in the figure show the location of the optical source 32 and the photodetection unit 34 respectively. A black thick line shows the optical fiber 33.

Conventionally, optical source 32 and photodetection unit 34 are connected optically with optical fiber 33 that provides the transmission path and constitute an optical transmission/reception system. The transmission path is formed extending from several tens of meters to several tens of kilometers in the optical transmission/reception system with the long-wavelength surface-emission laser diode of laser oscillation wavelength 1.1–1.7 μm band of this invention. Thereby, there may be obstacles between the points A and B.

Figure 38:
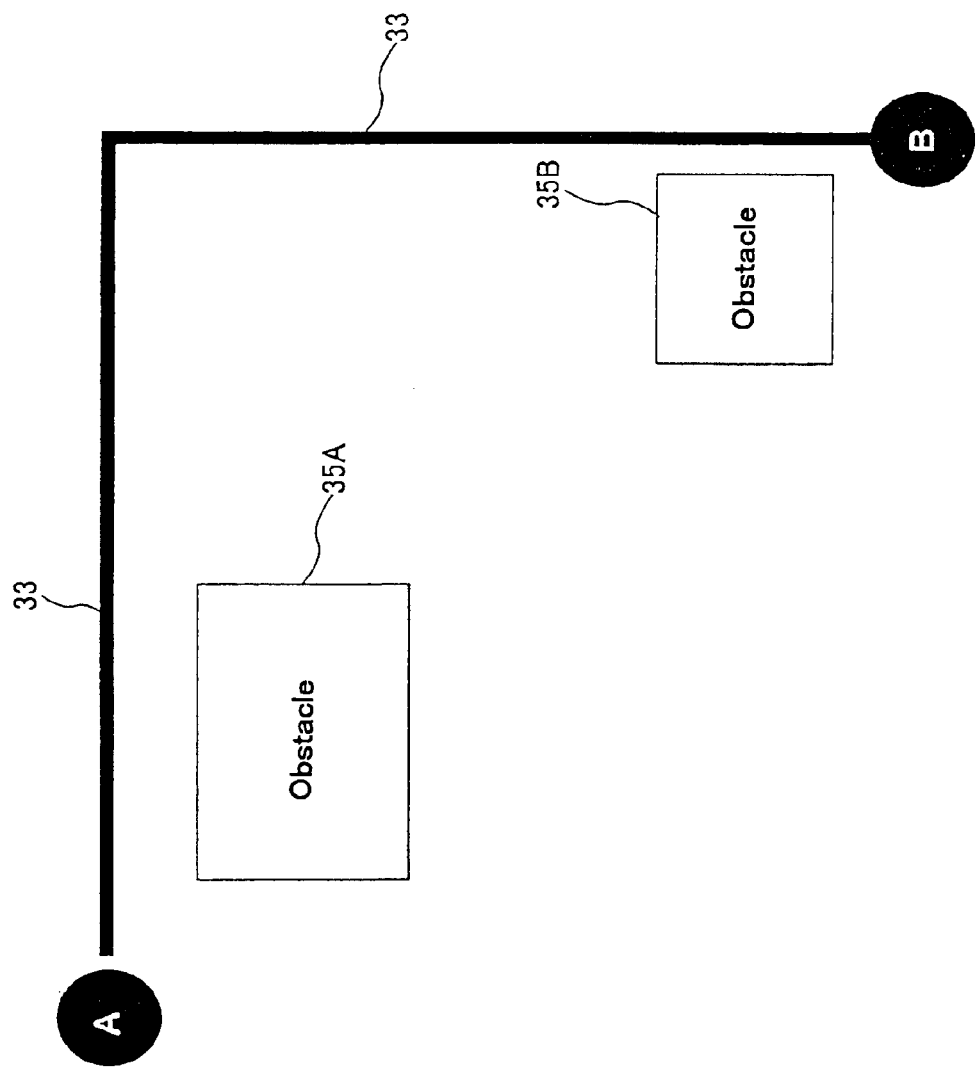
FIG. 38 is a diagram showing an example of bending the transmission path connecting an optical source and a photodetection unit at a right angle for avoiding an obstacle.

For example as for FIG. 38, obstacles 35A and 35B exist between the points A and B. Thus, the point B for the location of the photodetection unit and the point A for the location of the optical source cannot be connected with the transmission path 33 of a straight line. Thus, FIG. 38 shows the example of bending the transmission path by a right angle.

When the optical fiber 33 is bent at the point where the transmission path is bent by a right angle with the same angle as in the case of FIG. 38, the optical fiber 33 is damaged and stops functioning as a transmission path. It is possible to provide a reflection part in the bending part of the transmission path so as to deflect the optical beam. The use of the reflection part in such a bending part of the transmission path increases the cost.

Thus, the present invention proposes an approach to bend the optical transmission path without providing a reflection part and without spoiling the functioning of the optical fiber 33 as a transmission path.

Figure 39:
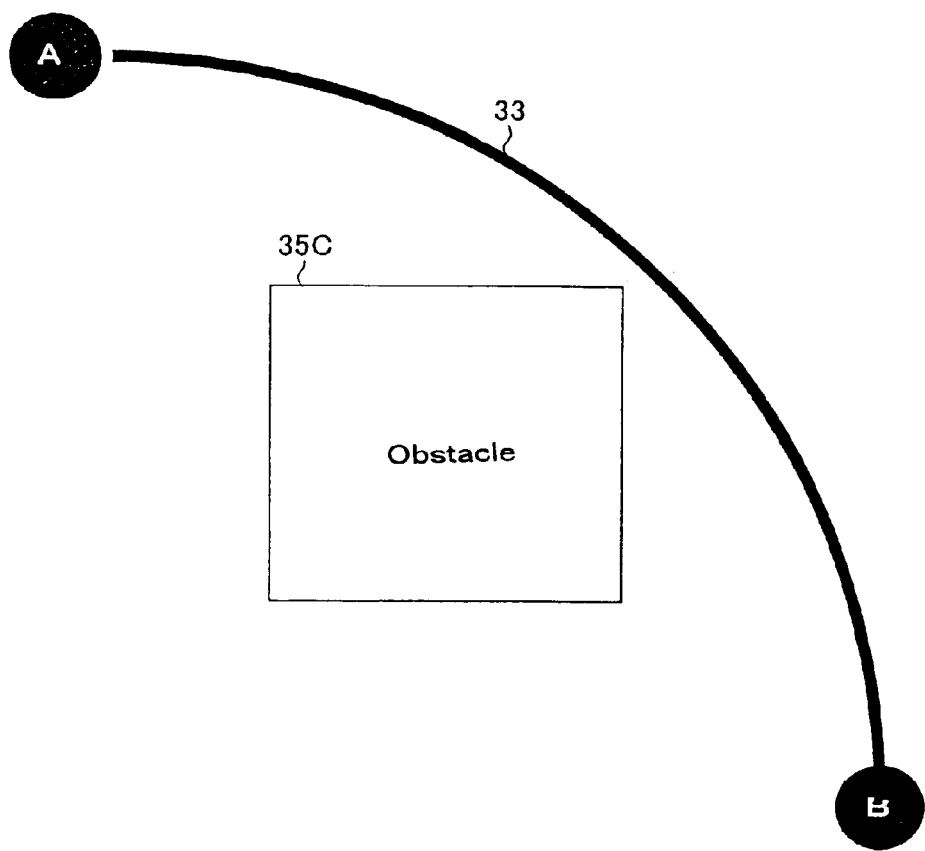
FIG. 39 is a diagram showing an example of the optical transmission/reception system of this invention that avoids an obstacle by bending the transmission path between an optical source and a photodetection unit.

FIG. 39 shows a third embodiment of this invention. Those parts explained previously are designated by the same reference numerals and explanation is omitted.

FIG. 39 is referred to. Obstacle 35C exists between the A point and B point. The location B and the location A for the photodetection unit and the optical source 32, respectively, can not be connected by a transmission path of straight line. However, as shown in this embodiment, the location B for the photodetection unit 34 and the location A for the optical source 32 are connected by bending optical fiber 33, which composes a transmission path without causing a local angle. Thus, the optical fiber 33 composing the transmission path is not damaged by the bending, and it is possible to avoid the obstacle 35C. According to the present invention it is possible to construct a fine optical transmission/reception system even when obstacles must be avoided.

Figure 40:
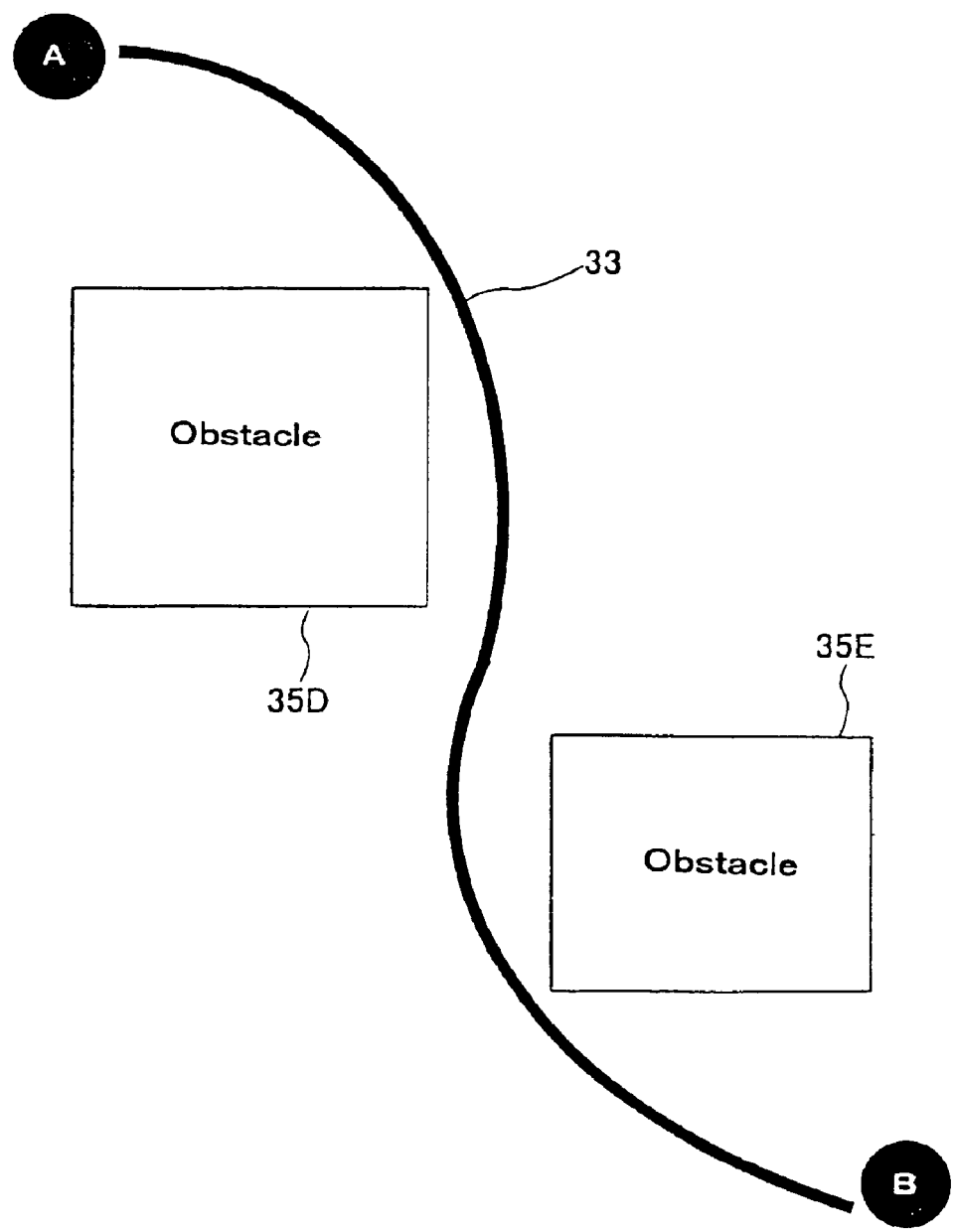
FIG. 40 is a diagram showing another example of optical transmission/reception system of this invention that avoids an obstacle between the optical source and the photodetection unit by bending the transmission path.

FIG. 40 is another example according to this invention. In this case obstacles 35D, 35E exist between the points A and B. Location B and location A of photodetection unit 34 and optical source 32, respectively, can not be connected with a straight line transmission path.

However, by bending the optical fiber 33 of the transmission path, without causing a local angle, as shown in this example of this invention it is possible to connect the location B for the photodetection unit and the location A for the optical source As a result, the transmission path is bent continuously in this example of the present invention. It-is not formed step-like and a local angle is not required.

Furthermore the above explanation pertains to the optical transmission/reception system using the long-wavelength surface-emission laser diode with laser oscillation wavelength of 1.1–1.7 μm band to suitably provide middle to long distance telecommunication systems. According to this invention it is possible to deploy this system inside of a building, for example, even in the case of constructing an optical transmission/reception system with a length of several centimeters to several meters. Even in this case, the transmission direction of the optical beam can be changed in all directions without providing reflection part, by bending the optical fiber along the transmission path, without causing a local angle therein. According to evaluations conducted by the inventor of the present invention, there was not any case wherein the function of a transmission path failed due to the optical fiber 33 being bent, even in the case that the transmission path was bent continuously as indicated in FIG. 40. There was no damage to the transmission paths such as those shown in FIG. 39 and FIG. 40, as long as the diameter of the curvature of the transmission path does not exceed 20 cm. To put it differently, the transmission path can be arranged to avoid obstacles such as shown in FIG. 40, even if reflection part or the like, that changes the direction is not provided, if the diameter of the transmission path curvature does not exceed 20 cm. Thus, the present invention provides a fine optical transmission/reception system that functions with high reliability at a low cost.

[Fourth Embodiment]

Next the fourth embodiment of this invention is explained.

Figure 41:
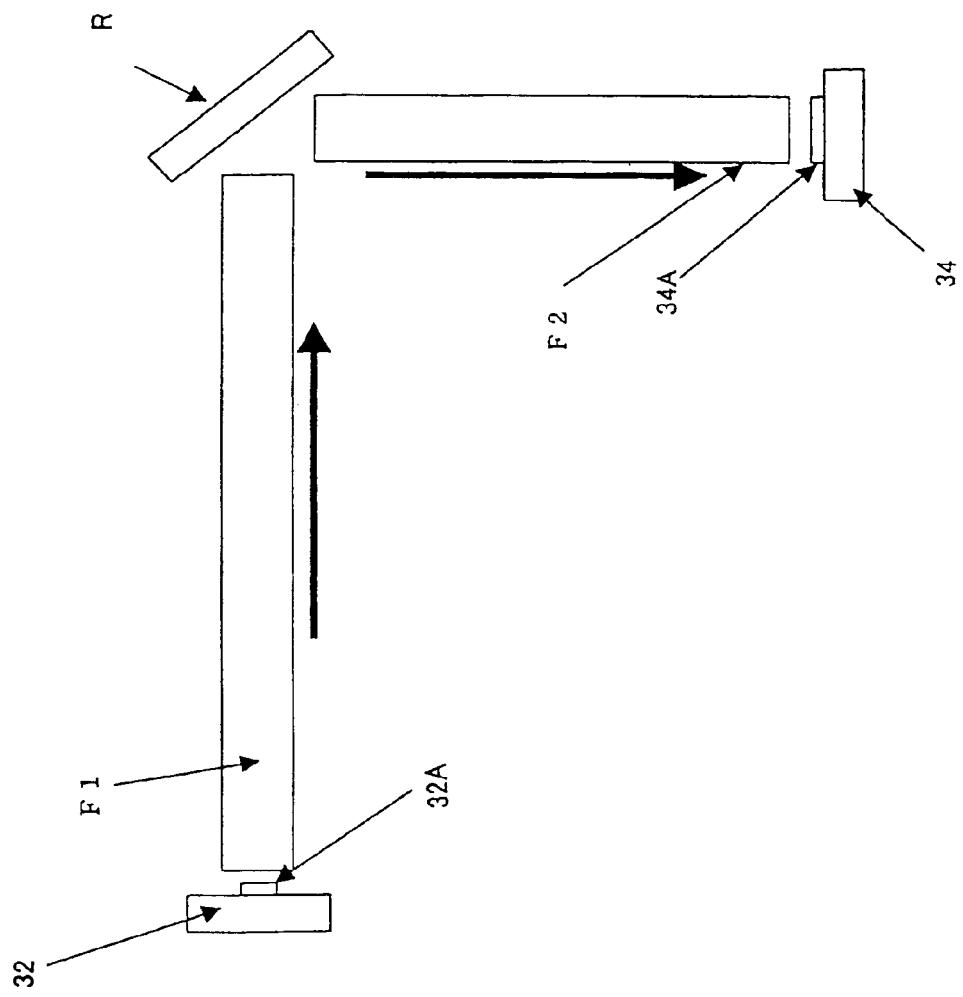
FIG. 41 is a diagram showing an example of an optical transmission/reception system that uses a long-wavelength surface-emission laser diode of this invention as the optical source.

FIG. 41 shows another example of an optical transmission/reception system using the long-wavelength surface-emission laser diode with laser oscillation wavelength of 1.1–1.7 μm band. Those parts explained previously are designated by the same reference numerals and explanation is omitted.

FIG. 41 is referred to. In this example the laser diode emission part 32A is coupled optically to an optical fiber F1. The laser beam that is emitted from the laser diode emission part 32A is transferred in the direction of the thick arrow in FIG. 41. The laser beam that was transmitted through the optical fiber F1 is then bent 90 degrees by a reflection part R. The laser beam then enters optical fiber F2. Optical fiber F2 at the end point couples optically to the light detector part 34A of the photodetection device 34 such as a photodiode. Thus the optical transmission/reception system is composed.

It should be noted that the foregoing description is merely for the exemplary purpose of the optical transmission/reception system of this invention. Thus, only one laser diode emission part 32A is shown in the present example. However, it also is possible to construct, by using the advantageous feature of the long-wavelength surface-emission laser diode of the present invention, to construct a large capacity optical transmission/reception system of the multiple laser array type, in which a number of laser diodes 32A are formed on one laser diode chip 32A and the optical transmission/reception system is constructed by using a number of optical fibers F1 and photodetection devices 34 coupled optically to the laser diodes 32A.

Figure 42:
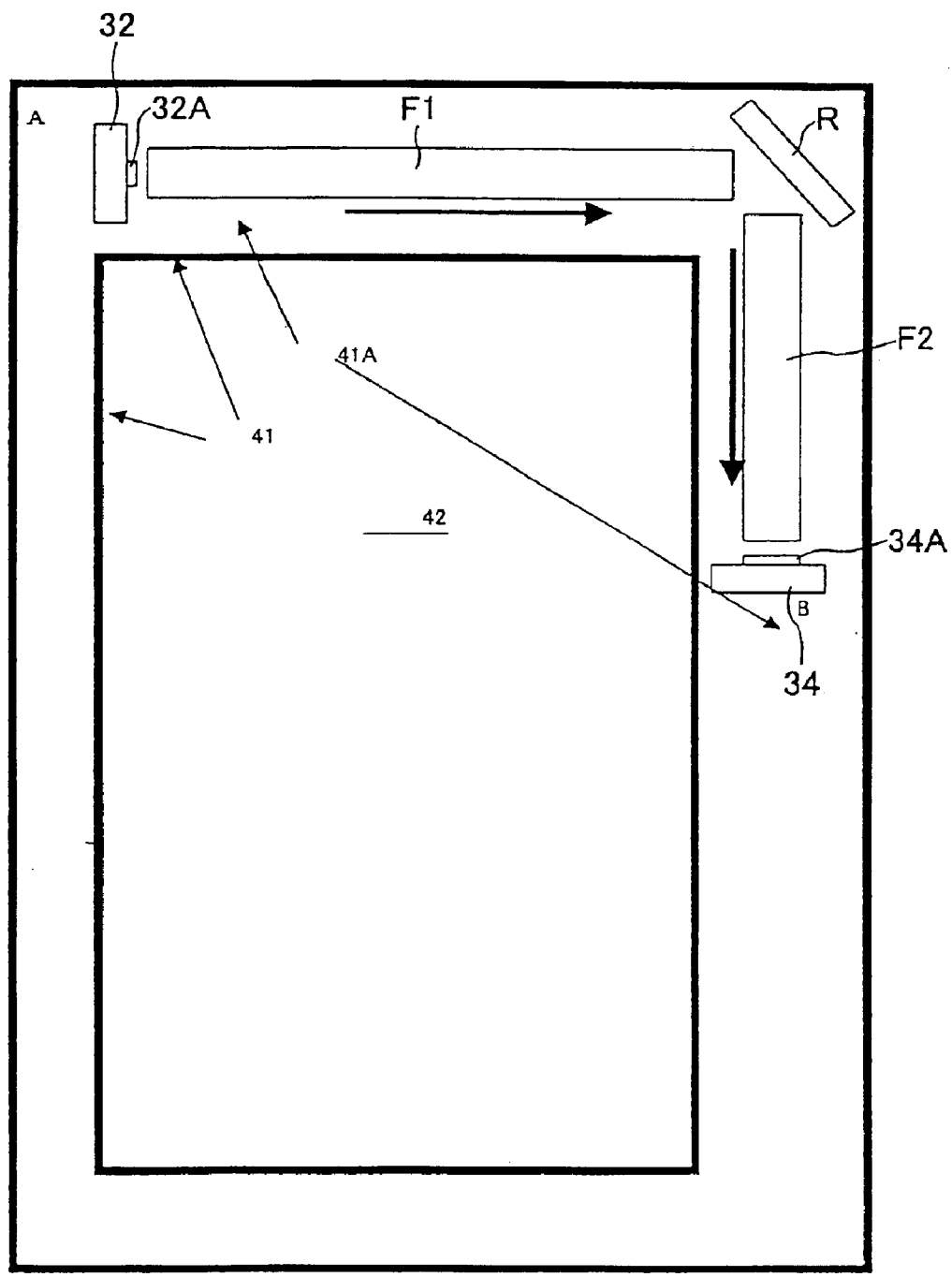
FIG. 42 is a plane view showing an example of a room in which the optical transmission/reception system of this invention is provided.

FIG. 42 shows another arrangement of the optical transmission/reception system of FIG. 41. The optical transmission/reception system of FIG. 41 may be a yard, whereas in FIG. 42 it is arranged inside a wall of a building. Those parts explained previously are designated by the same reference numeral and explanation is omitted.

FIG. 42 is referred to.

A room 42 is defined with a wall 41 by which the building is formed. Within a space 41A inside the wall 41, a long-wavelength surface-emission laser diode chip 32 having laser oscillation wavelength of the 1.1–1.7 $\mu$m band is provided at the A point as an optical source. Further, The photodiode that constitutes the photodetection unit 34 is provided in the B point. Also the reflection part R is provided in the space 41A so as to deflect the transmission path between the A point and the B point. FIG. 42 shows the plan view of the room and the optical transmission/reception system merely for the purpose of explanation. Because of this, the room or the wall and the optical transmission/reception system are not drawn to scale.

Furthermore, though not indicated by FIG. 42, in each optical transmission/reception unit 32 and 34 at the points A and B, there maybe other connect instruments or connectors. These may be in the internal space 41A of the wall 41, or may be in the room 42.

Figure 43:
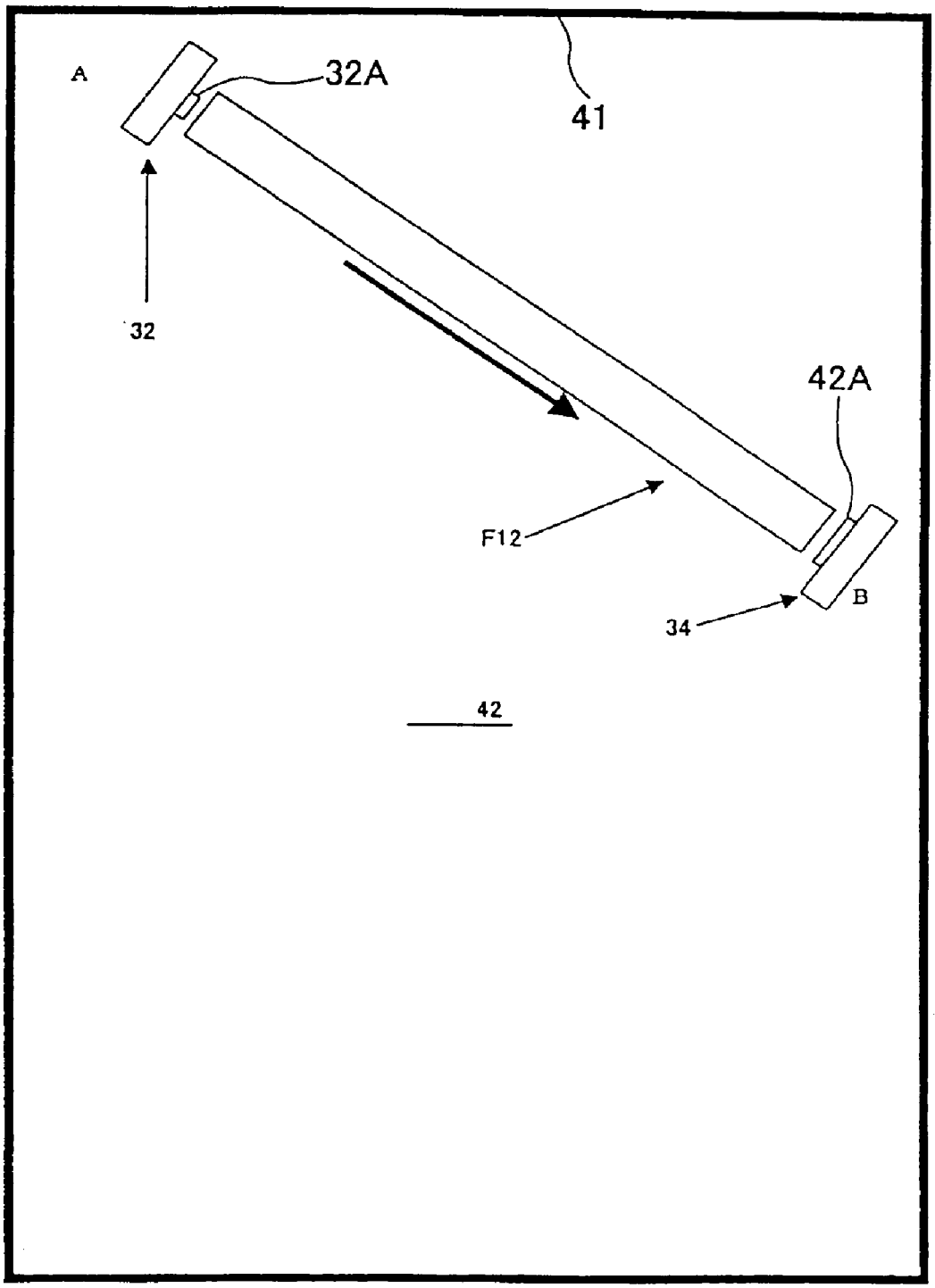
FIG. 43 is a plane view showing an example of a room in which a conventional optical transmission/reception system is provided.

FIG. 43 shows the plan view of an optical transmission/reception system in the room 42. Those parts explained previously are designated by the same reference numerals and explanation is omitted.

FIG. 43 is referred to. The laser diode 32 and the photodiode 34 are tied with one straight line by the optical fiber F12 crossing the inside of room 42. Therefore the optical transmission/reception system is arranged on the floor, under the floor, or in the ceiling of the room.

Figure 44:
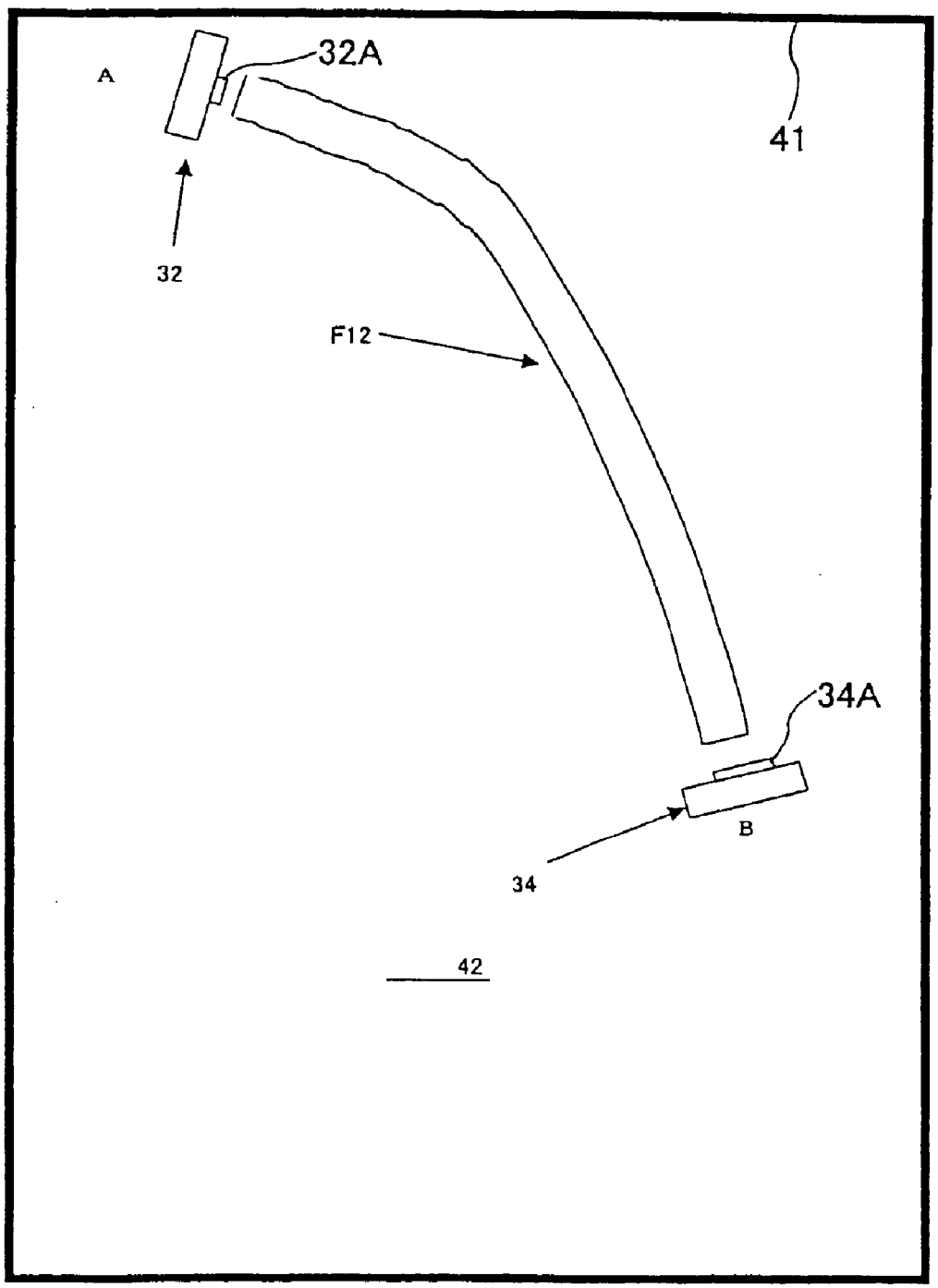
FIG. 44 is a plane view showing a further example of a room in which a conventional optical transmission/reception system is provided.

FIG. 44 shows another example of the optical transmission/reception system in the room 42. Those parts explained previously are designated by the same reference numerals and explanation is omitted.

FIG. 44 is referred to.

In this case the laser diode 32 and the photodiode 34 are tied by the optical fiber F12 by curving the optical fiber F12 while utilizing the flexibility of the optical fiber.

However, the optical fiber F12 has to be arranged so as to cross the room 42, but it can change the direction of the transmission path only with big curvature even if it uses the flexibility of optical fiber. However, the optical fiber has to be bent with a large radius of curvature, and the optical transmission/reception system has to be constructed to or under the floor or in the ceiling of room 42 in the state that the optical fiber 12 crosses the room 42. Thus, it is necessary to dispose the optical fiber under the floor or on the floor or on the ceiling.

In the arrangement shown in FIGS. 26 and 27 the optical fiber has to be arranged so as to cross the room 42. Therefore, the optical fiber on the floor, under the floor or in the ceiling of the room is arranged in a very complicated and disorderly manner. It gets more complicated when a plural optical transmission/reception system is arranged. Then there are the problems of intertwisting, and maintenance after installation become difficult. Especially, such an arrangement is very dangerous in the case the optical fiber F12 is arranged on the floor where a pedestrian can hook the foot.

The optical fiber transmission path of this embodiment of the present invention is well-suited to the wall 41 or pillar or other parts of the building, because the optical fiber transmission path can be bent 90 degrees by using the reflection part R as shown in FIG. 42 and is otherwise arranged beautifully in appearance, even if it is arranged in a place where it is not inside of wall 41 and can be seen by the eye. It gets complicated if a plural optical transmission/reception system is arranged, but there is not a problem of the optical fibers intertwisting. The maintenance after installation can be done easily.

The reflection part R for the deflection of the transmission path is provided, in constructing such a peripheral (out of sight) optical transmission/reception system in this embodiment. By using the reflection part R, the transmission path is able to be arranged effectively. Instead of exposing the transmission path unnecessarily, the reflection part material R puts the transmission path inside the ceiling, under the floor or in the wall of a building. The transmission path does not occupy area needlessly. The building design comes to be produced effectively. The degree of freedom for an aesthetic design increases.

Furthermore the reflection part R is not necessarily restricted to 90 degrees, in the case that the direction of the transmission path is bent by reflection part material R. However, in the normal case, a building is executed/designed, unless there is a demand for a special design, for pillars, walls, floors, and ceilings to provide many cases where one straight line crosses another straight line at 90 degrees. In such normal cases it is desirable for reasons of esthetic beauty and of efficiency, when the optical fiber transmission path changes 90 degrees, for it to be arranged along a pillar, wall, floor, ceiling and the others.

Also, exposing the optical fiber transmission path to the eye unnecessarily be avoided in constructing such an optical transmission/reception system, by using the reflection part material R for changes in direction of the transmission path so that the transmission path does not occupy area needlessly inside the ceiling, under the floor or in the wall of a building. Thereby the building design comes to be produced effectively and the degree of freedom for aesthetic design increases.

Figure 45:
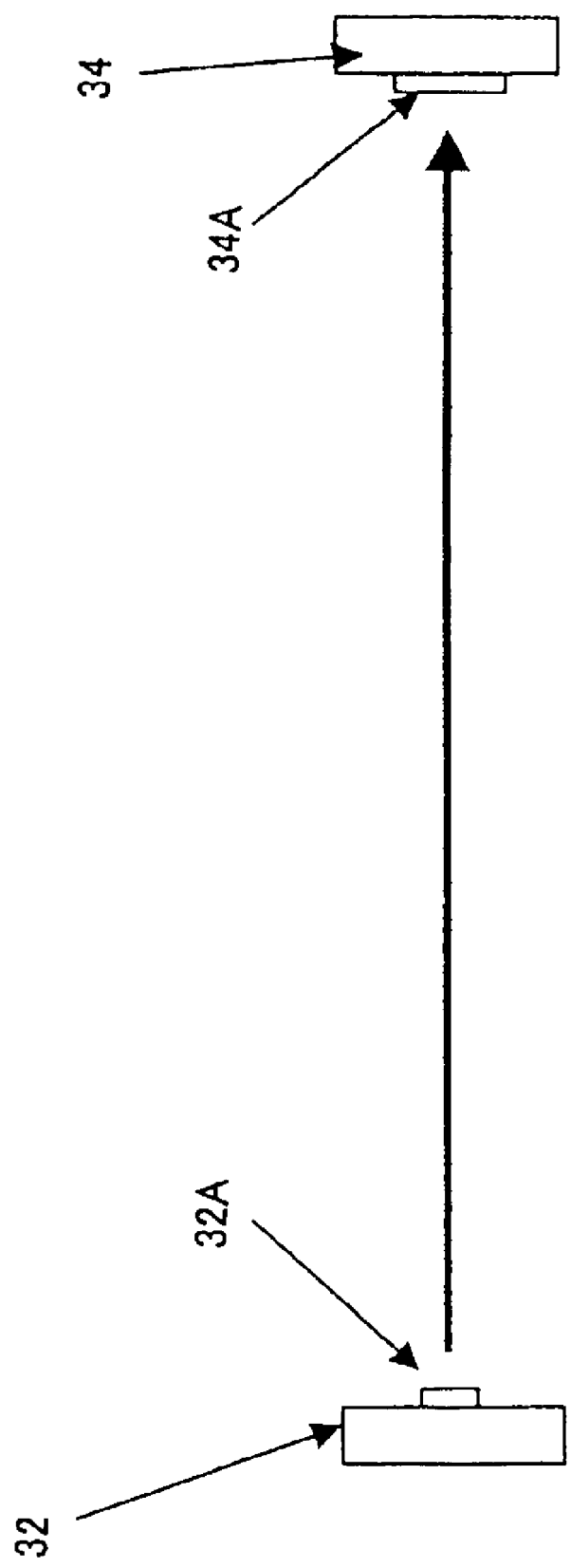
FIG. 45 is a schematic diagram showing an example of the optical transmission/reception system of this invention.

FIG. 45 shows an example of another optical transmission/reception system of this embodiment. The optical signal emitting from the emission part 32A of the laser diode 32, in this example, is transferred in space. It goes straight along the arrow of FIG. 45. It is received with the light detector part 34A comprised of a photodiode and other photodetection devices 34.

As explained according to the embodiments of the present invention previously, it is preferable to use a surface-emission laser diode equipped with the improved semiconductor Bragg reflectors 12 and 18 further with the non-optical recombination elimination layer and having the laser oscillation wavelength band of 1.1–1.7 $\mu$m for the laser diode, in view point of reliability, low power driving, and low production cost. The foregoing wavelength was not possible before in a surface emission laser diode.

The following description will be made for the construction in which there is only one laser diode. However, it should be noted that, in the case of the long-wavelength surface-emission laser diode of the 1.1–1.7 $\mu$m band, a number of laser diodes are formed on a single chip with low cost, and it is easy to construct a multiple laser array system. Thereby, a large capacity telecommunication system us realized.

Figure 46:
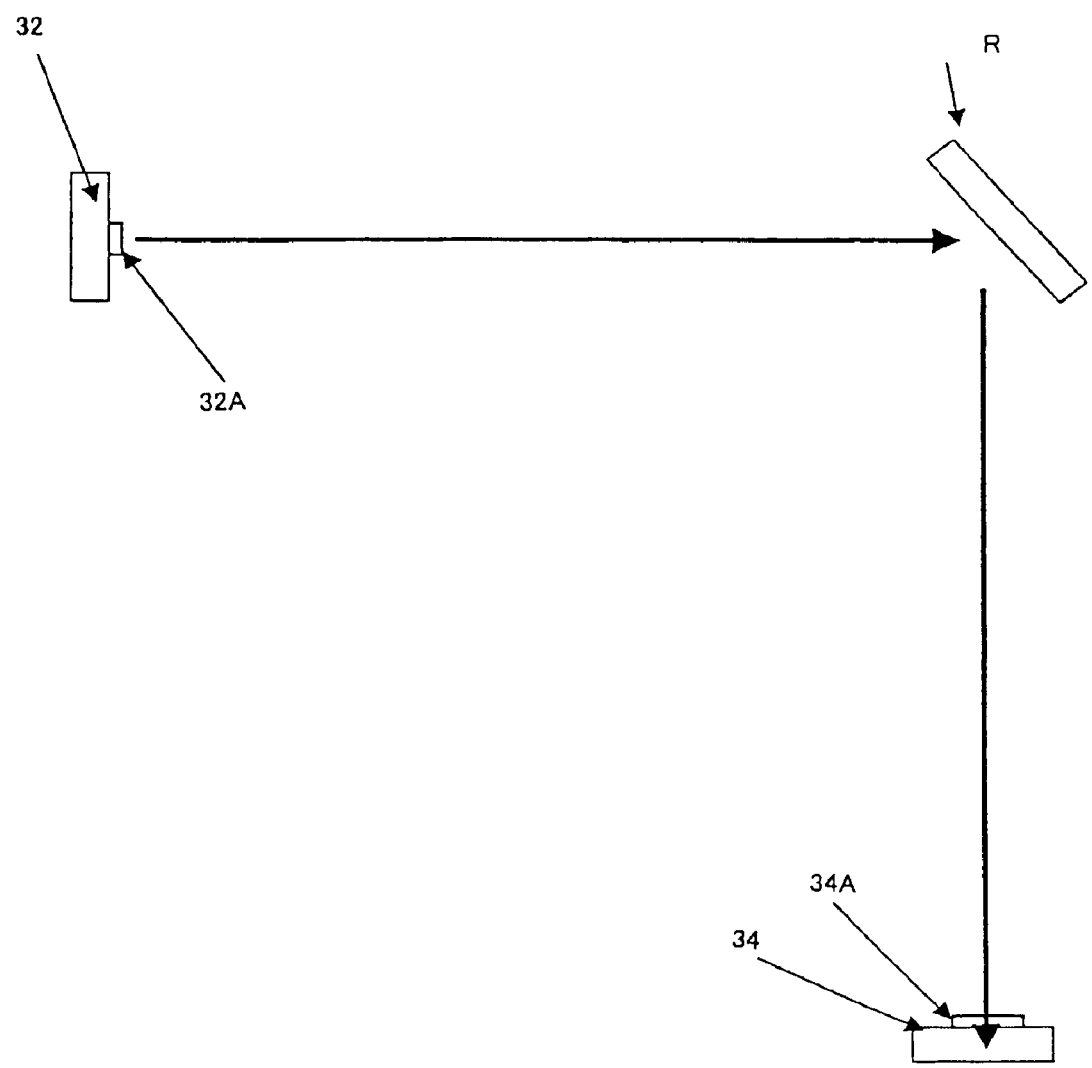
FIG. 46 is a schematic diagram showing another example of the optical transmission/reception system of this invention.

FIG. 46 is another example of the optical transmission/reception system of this embodiment. Those parts explained previously are designated by the same reference numerals and explanation is omitted.

FIG. 46 is referred to.

The optical signal emitted from the emission part 32A of laser diode 32 is transferred through space. It goes straight in the direction of the arrow in FIG. 46. The progress direction of the optical path is bent by a midway, for example by the reflection part R. The optical signal is received with the light detector part 34A comprising the photodetection devices 34 such as a photodiode, and the like.

[Fifth Embodiment]

Conventionally the signal transmission of inside an electronic apparatus has been achieved by using a conductor cable in the form of electrical signals. Therefore numerous conductor cables are connected inside various electronic apparatuses. The arrangement/processing of the conductor cable was complicated, presenting problems in the design stage and with the assembling stage at the factory.

Thereupon, instead of exchanging of the signals by such conductor cable, in this embodiment of this invention the electrical signals are substituted for with optical signals by the optical transmission/reception system as shown in FIG. 45 or FIG. 46. The optical signal that is substituted is transferred through space. Such substitution omits or decreases conductor cable. The conductor cable inside the instrument is decreased as much as possible. Internal wiring is simplified. By simplifying the internal wiring of the electronic apparatus the complexity of the layout and processing of conductor cable is reduced. Reducing or eliminating the complexity can increase the degree of freedom of each part/unit and other layout items inside the apparatus.

Electronic apparatuses for which the optical transmission/reception system of this embodiment of this invention is incorporated include, for example, recording apparatuses such as a copying machine or laser printer that uses electrophotography, ink-jet recording apparatus, or recording apparatus using a silver salt photography process. In addition, the present invention can be used in computers, video apparatuses, television sets.

Figure 47:
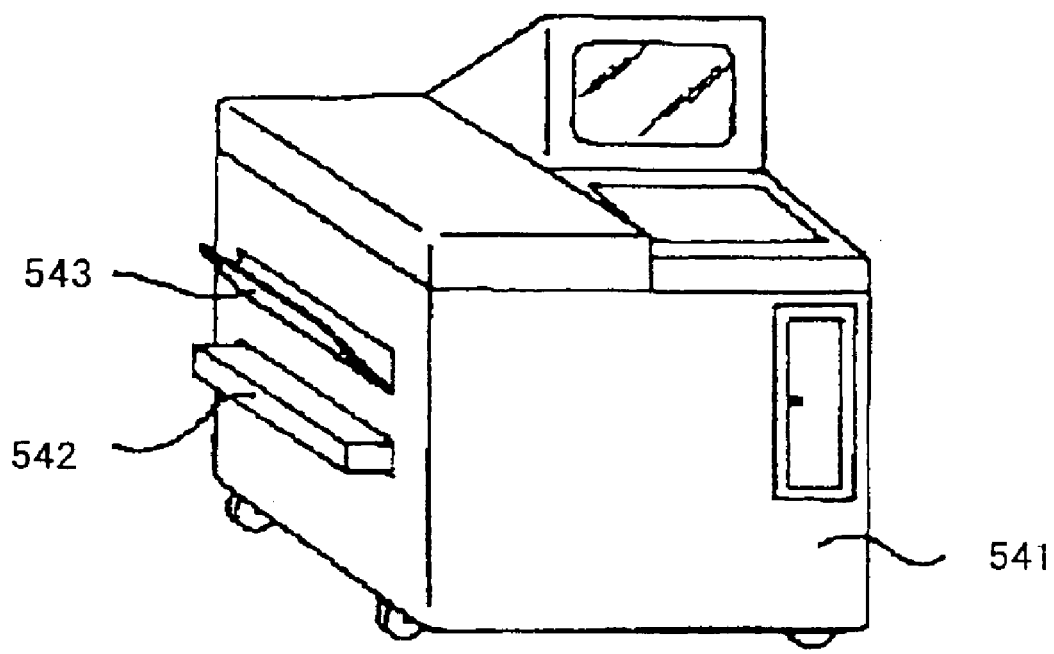
FIG. 47 is a diagram showing an example of the electrophotographic copying machine to which the present invention is applied.
Figure 48:
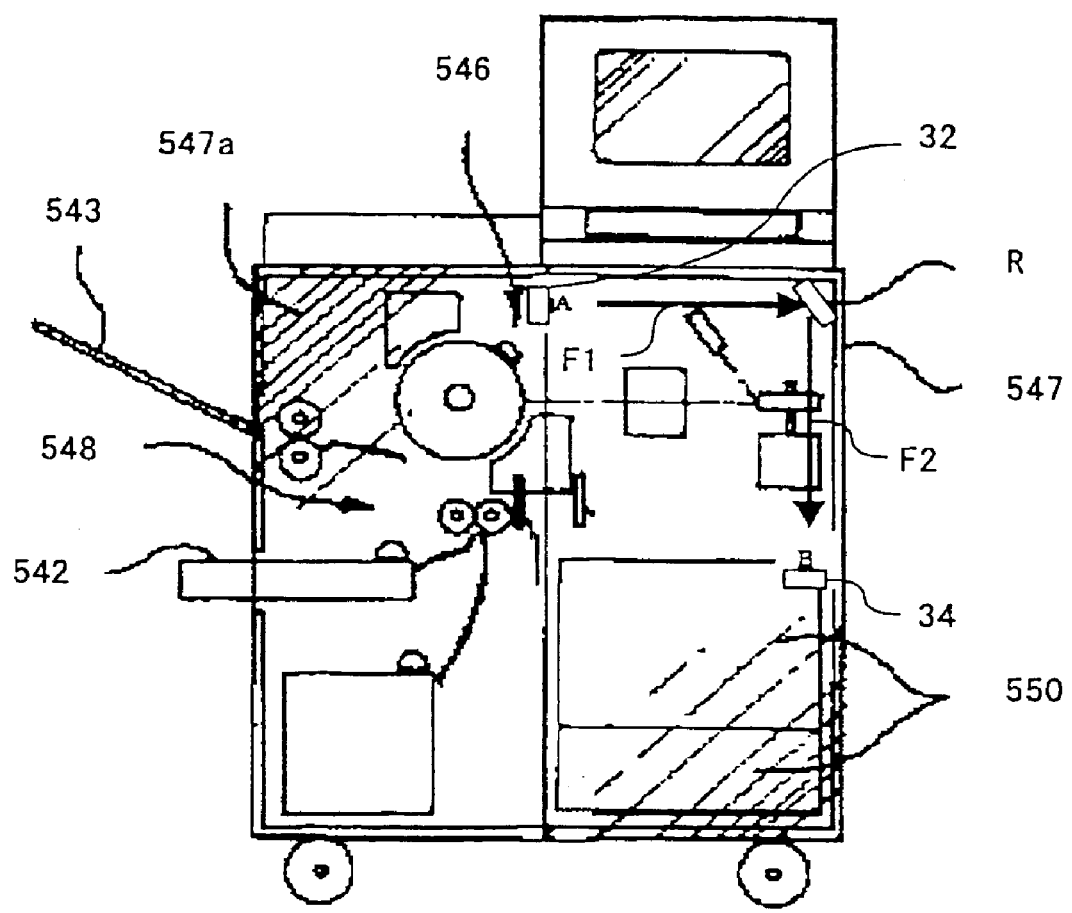
FIG. 48 is a diagram showing an example of an electrophotography copying machine that uses an optical transmission/reception system of this invention.

As for FIG. 47, the figure shows an electrophotographic copying machine 541 to which this embodiment is applied. FIG. 48 enlarges FIG. 47.

FIG. 48 shows the internal structure of the electrophotographic copying machine 541 schematically. Those parts explained previously are designated by the same reference numerals and explanation is omitted.

FIGS. 47 and 48 are referred to.

The electrophotography copying machine 541 has a sheet feed cassette 542 and a sheet recovery tray 543. Furthermore wiring board 550 and image formation mechanism 549 including sheet feed mechanism 548 and photosensitive drum 546 are connected by electrical circuit and included in the main body case that is closed with cover 547a and fitted to the case 547.

And also the photodiode 34 and the laser diode 32 are located in the case 547 respectively at the point A and the point B, all previously explained.

The laser diode 32 and photodiode 34 are connected optically, by the construction explained with FIG. 41 previously and use optical fiber F1, the mirror R and optical fiber F2.

Figure 49:
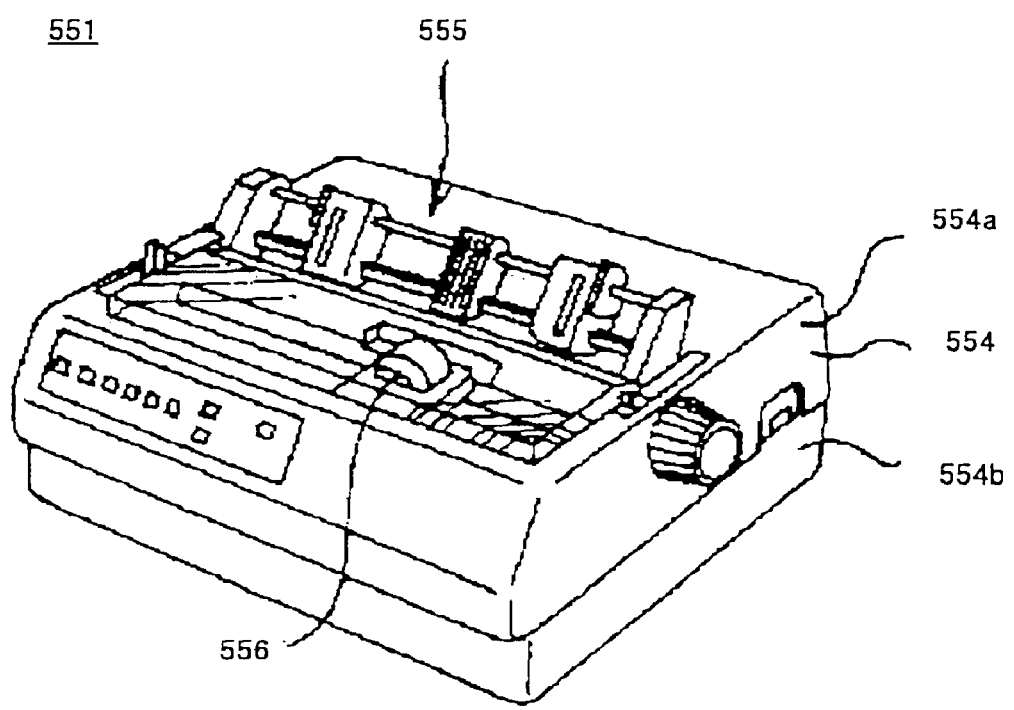
FIG. 49 is a diagram showing an example of an ink jet record apparatus to which the present invention is applied.
Figure 50:
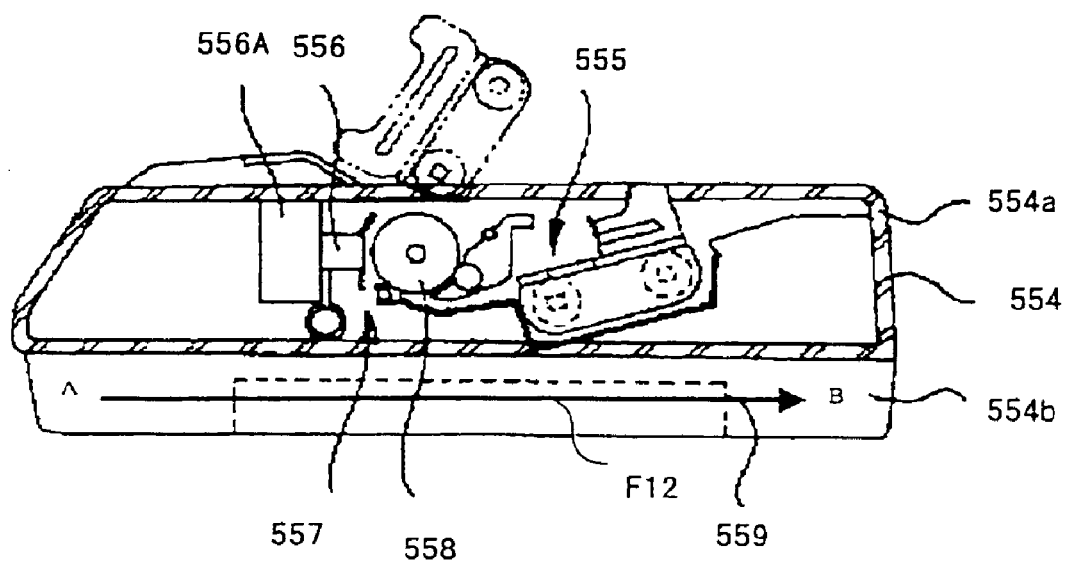
FIG. 50 is a diagram showing an example of the ink jet record apparatus that includes an optical transmission/reception system of this invention.

FIG. 49 shows an ink-jet recording apparatus 551, as another example to which the present invention is suitably applied. FIG. 50 is the figure that enlarges FIG. 49 and schematically shows the internal structure.

FIGS. 49 and 50 are referred to.

The ink-jet recording apparatus 551 has a case 554 comprising a lower part case 554b and an upper part case 554a. A sheet feed mechanism 555 and is an ink-jet recording head 556 are provided on the upper part case 554a.

FIG. 50 is referred to. The ink-jet recording head 556 is provided so as to move right and left on a carriage 556A. Image formation is performed on the recording sheet that is pressed on platen roller 558 by recording part 557.

Wiring board 559 provides an electronic circuit in the lower part case 554b. Optical fiber F12 similar to the embodiment explained above is provided between the A point and B point in the wiring board 559. Optical fiber 12 transfers the optical signal to the photodetection device 34 at the B point from the optical source of the laser diode chip 32 provided at the A point.

According to this embodiment of the present invention, conductor cable in the electronic apparatuses is eliminated or reduced. Conductor cable is replaced inside the instrument by an optical transmission/reception system. The examples of an electrophotography copying machine and ink-jet recording apparatus were shown in FIGS. 47–50, as the electronic apparatuses to which this embodiment is applied. This invention is not restricted to these apparatuses.

[Sixth Embodiment]

In the recording apparatuses such as an ink-jet recording apparatuses or recording apparatus of silver salt photography or an electrophotographic recording apparatus, there arises a problem in that toners Or ink or liquid developer form a mist. Further, dust particles such as paper dust may float inside the apparatus. Thus, the inside of such apparatuses is not an ideal environment for an optical transmission/reception system of this invention.

Figure 51:
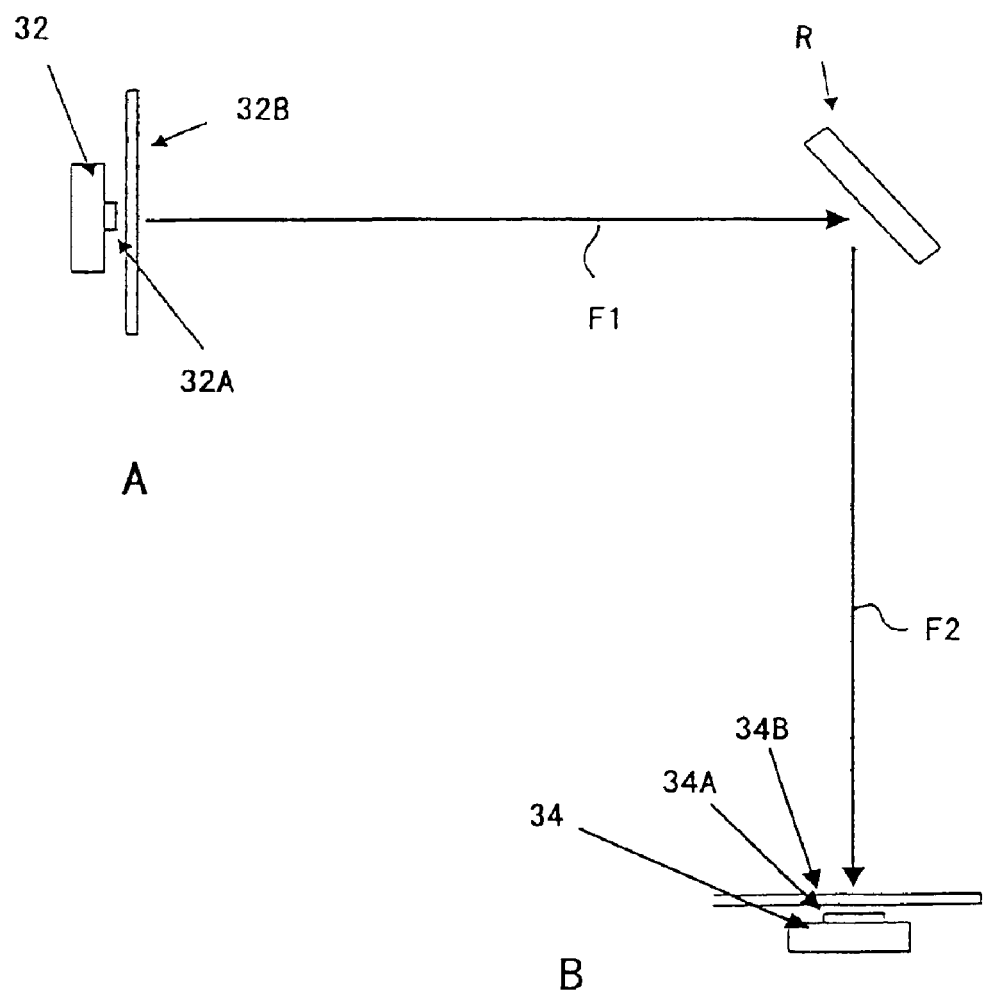
FIG. 51 is a diagram showing further example of the optical transmission/reception system of the present invention.

In consideration this problem, the sixth embodiment of this invention shown in FIG. 51 provides a cover member 32B covering the laser diode chip 32 or a cover member 34B covering the photodiode 34. For example, these cover members 32B and 34B are formed by a transparent glass-like member. In FIG. 51, those parts explained previously are designated by the same reference numbers, and explanation thereof will be omitted.

It is possible to use a high-precision plastic member, from which strain is removed, in addition to a glass, for the cover members 32B and 34B. Such a cover member provides physical and chemical protection of the laser diode and the photodetection device used in this invention that are produced by a sophisticated process.

Furthermore the toner, ink or paper dust and other foreign matter cannot be allowed to adhere to the laser diode chip of this invention and spoil the function of the optical transmission/reception system, such as shading of the laser beam. Therefore it is desirable to form these cover members detachable. By making the cover members detachable, the cover members may be removed right away anytime that foreign matter adheres. Furthermore a cover is not provided to reflection member R in FIG. 51. As occasion demands a cover can be provided also to the reflection member R.

Considering the contamination originating from toner and paper dusts, it is thought that it would be more effective to provide such a cover member 32B or 34B in the apparatuses such as a printer or copying machine than a computer or a video apparatus or a television set.

[Seventh Embodiment]

Figure 52:
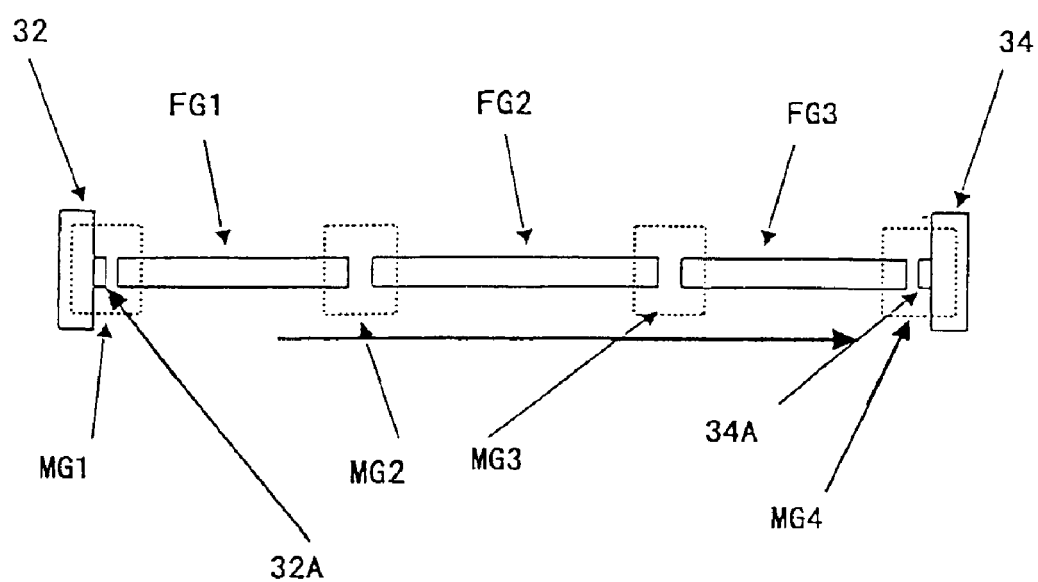
FIG. 52 is a diagram showing an example of optical-fiber telecommunication system to which a long-wavelength surface-emission diode according to an embodiment of this invention is connected.

FIG. 52 shows an example another optical transmission/reception system that uses the long-wavelength surface-emission laser diode having the laser oscillation wavelength of 1.1–1.7 $\mu$m band. Those parts explained previously are designated with the same reference numerals and explanation is omitted.

FIG. 52 is referred to. This embodiment concatenates and connects plural optical fibers along the optical transmission path in the construction of FIG. 36 This embodiment enables an optical transmission path of long distance. There are three optical fibers in this example.

The optical telecommunication system was previously studied with the wavelength of 0.85 $\mu$m. However, the transmission loss of the optical fiber was large at this wavelength and it was not practical. On the other hand, it has been difficult previously to compose the surface-emission laser diode oscillating stably at a practical long wavelength band in which the transmission loss becomes minimum in the optical fiber.

In accordance with this invention, the surface-emission laser diode that oscillating at the wavelength band of 1.1–1.7 $\mu$m is realized by improving the semiconductor Bragg reflector 12 or 18 and providing the non-optical recombination elimination layers 13 and 17. Thus a practical long-wavelength band optical telecommunication system is now possible.

In the illustrated example, the laser beam that emitted from the laser diode emission part 32A of the long-wavelength surface-emission laser diode chip 32 is injected into a first optical fiber FG1 for transmission, and the laser beam exited the first optical fiber FG1 is injected to a second optical fiber FG2 for further transmission. Furthermore, the laser beam that exited this second optical fiber FG2 is injected into a third optical fiber FG3 for transmission, wherein a the photodiode chip 34 having the photodetector part 34A is coupled to the third optical fiber FG3 for detection Thus, the optical fibers FG1, FG2 and FG3 are disposed along the transmission path of the laser beam.

Between the laser diode chip 32 and the first optical fiber FG1, there is provided an optical connection module MG1 for connecting the laser diode and optical fiber. Similarly, optical connection modules MG2, MG3 and MG4 are provided between the optical fibers or between the optical fiber and the photodiode chip for optical coupling.

Figure 53:
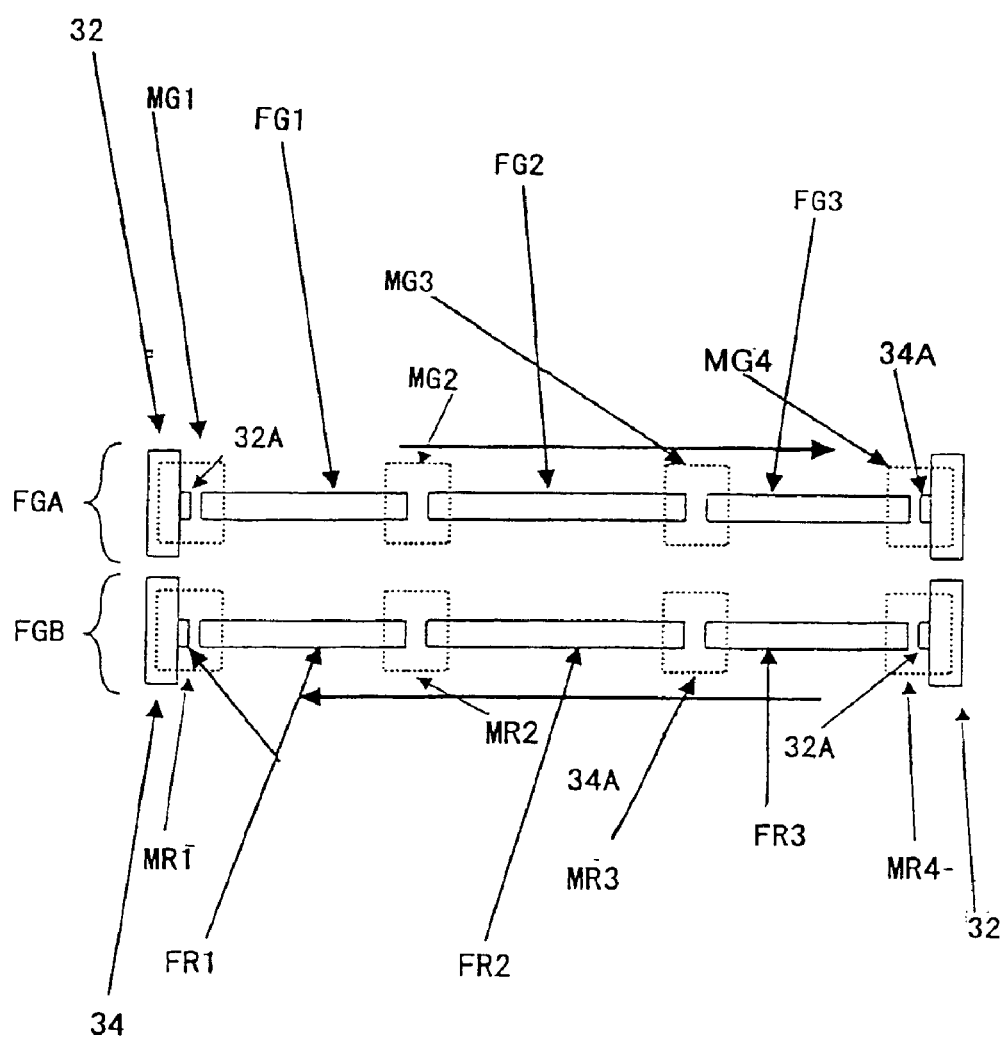
FIG. 53 is a diagram showing a bi-directional system constructed by using the long-wavelength surface-emission laser diode of an embodiment and an optical-fiber telecommunication system connected thereto.

FIG. 53 shows the bi-directional optical transmission/reception system that has the construction that provides transmission system FGA corresponding to the system of the above FIG. 52 and transmission system FGB inverted to the system of the FIG. 52. For the parts in the FIG. 53 that are the same as those explained above with the same reference numerals, explanation is omitted.

FIG. 53 is referred to.

The transmission system FGB includes, from the right to the left, a third optical fiber FR3 transmitting the laser beam emitted from the laser diode part 32A of the surface-emission laser diode chip 32, a second first optical fiber FR2 transmitting the laser beam emitted from the optical fiber FR3, a first optical fiber FR1 transmitting the laser beam emitted from the optical fiber FR2, and the light detector part 34A of the photodiode chip 34 is coupled optically to the first the optical fiber FR1.

A connect module MR4 is provided between the laser diode chip 32 and the third optical fiber FR3 in the transmission system FGB, wherein the connect module MR4 couples optically the laser diode chip 32 and the optical fiber FR3. Similarly, there are provided connect modules MR1, MR2 and MR3 are for optical couplings respectively between the optical fibers FR3 and FR2, between the optical fibers FR2 and FR1, and between the optical fiber FR2 and the photodiode chip 34.

Figure 54:
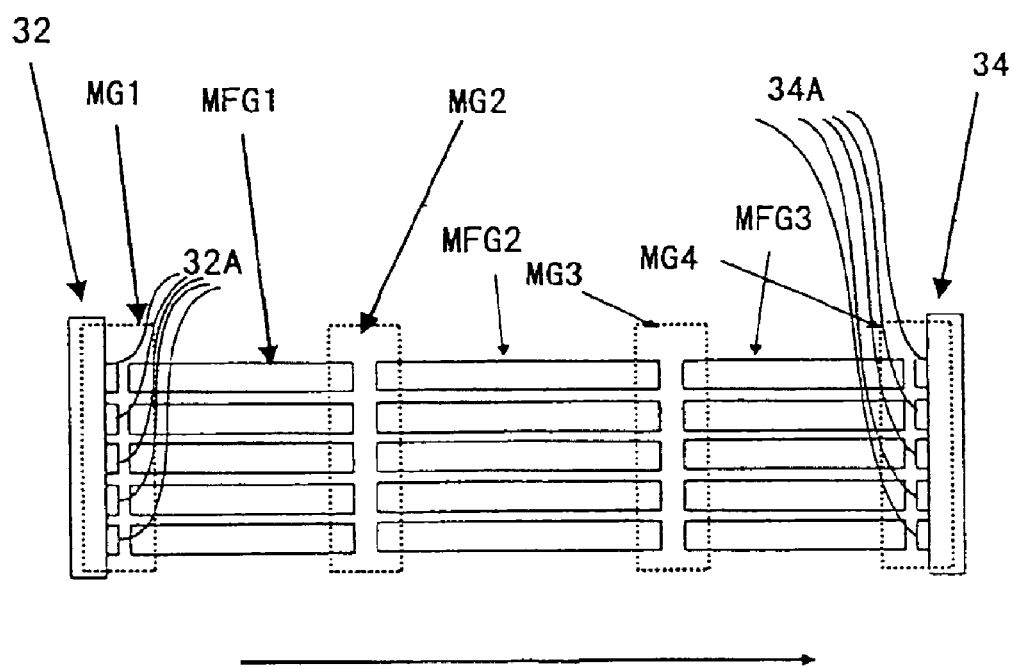
FIG. 54 is a diagram showing an example of large capacity optical-fiber telecommunication system that uses plural optical fiber groups in which the long-wavelength surface-emission laser diode of this invention is used.

FIG. 54 shows an example of parallel optical telecommunication system in which n optical transmission/reception systems each having the construction of FIG. 52 are arranged in parallel.

FIG. 54 is referred to.

The plural laser emission part 32A is provided on a laser diode chip 32. Further, first, second and third optical fiber groups MFG1, MFG2 and MFG3 are constructed by a number of optical fibers each corresponding to one of the plural optical emission parts 32A. Further, there are provided a number of photodetector parts 34A in the photodiode chip 34 in correspondence to the plural laser emission parts 32A.

In the present invention, in which the surface-emission laser diode chip is used, it is easy to provide a number of laser emission parts 32A on the laser diode chip 32. By providing a number of laser emission parts 32A on the laser diode chip, it becomes possible to realize a large capacity telecommunication system easily.

Figure 57:
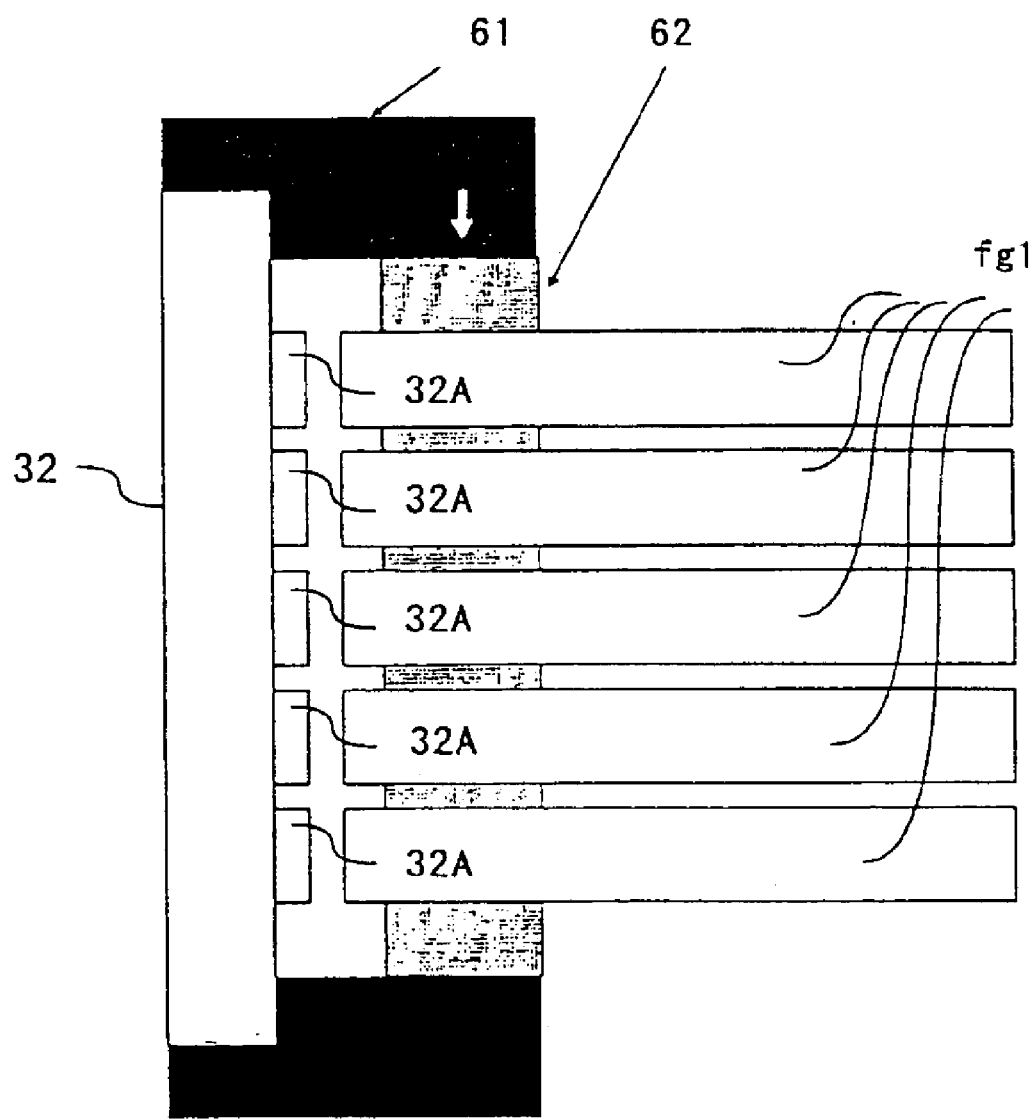
FIG. 57 is another diagram showing the constitution of an optical connection module used in an optical-fiber telecommunication system together with a long-wavelength surface-emission laser diode according to an embodiment of this invention.

Furthermore it is possible to construct a large capacity bi-directional optical transmission/reception system that expands the optical transmission/reception system of FIG. 54, in accordance with the construction of the bi-directional optical transmission/reception system of FIG. 53 and using the optical fibers of plural groups in parallel, although FIG. 57 does not indicate a bi-directional system.

[Eighth Embodiment]

Next another embodiment of this invention will be explained

Figure 55:
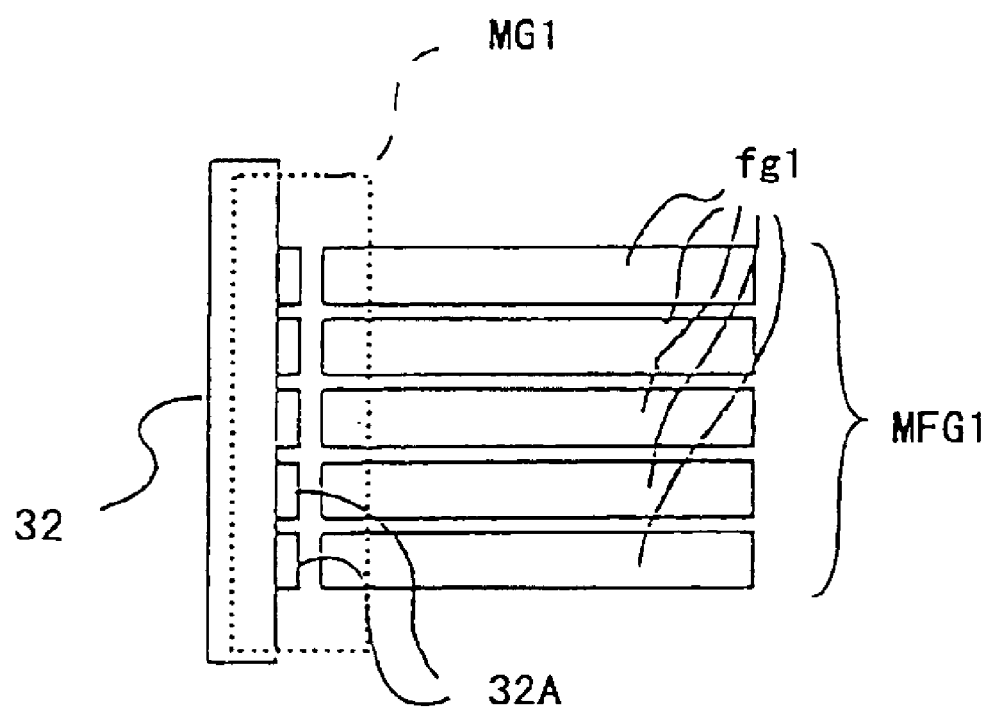
FIG. 55 is a diagram showing a long-wavelength surface-emission laser diode and an optical-fiber telecommunication system connected thereto according to an embodiment of this invention.

FIG. 55 shows the construction of an optical connection module MG1 that is used to optically couple the surface-emission laser diode chip 32 and the first optical fiber group MFG1 in the left part of FIG. 54. FIG. 55 shows optical connection module MG1 schematically with a rectangular dotted line.

Detailed construction of the optical connection module MG1 will be explained hereinafter with reference to FIGS. 39–59. Those parts explained previously are designated by the same reference numerals and explanation is omitted.

Figure 56:
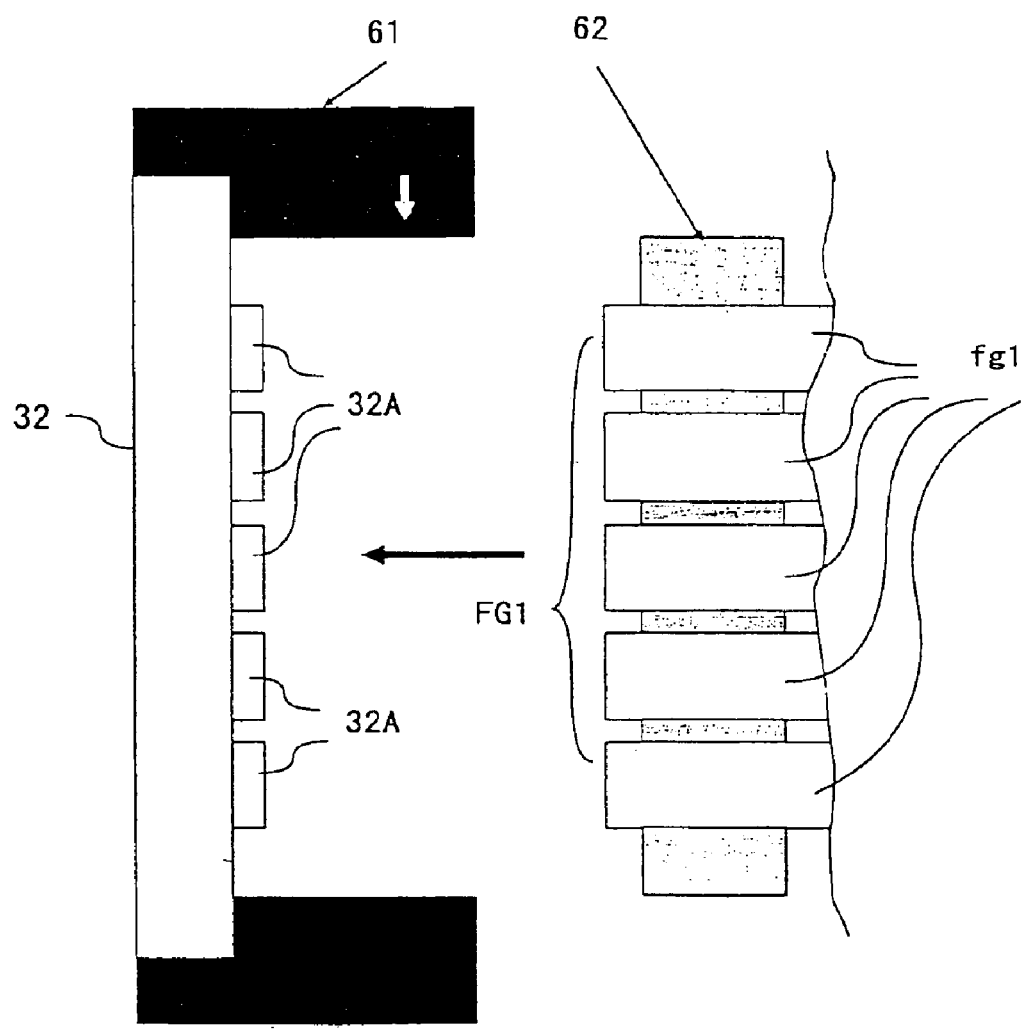
FIG. 56 is a diagram showing the constitution of an optical connection module used in an optical-fiber telecommunication system together with the a -wavelength surface-emission laser diode according to an embodiment of this invention.

FIGS. 56 and 57 show the construction of the surface-emission laser diode chip 32 and the optical fiber group MFG1 respectively in the state before they are coupled and the state after they are coupled.

FIG. 56 is referred to.

Optical connection module MG1 shown by a rectangular dotted line part schematically in FIG. is formed of a fiber holder 61 and a fiber holder 62 that holds each of the optical fibers fg1 that constitutes the optical fiber group FG1. The Fiber holder 62 is inserted into chip holder 61 as shown in FIG. 57 with arrows so as to face each other. Thus, the optical coupling is achieved between each of the laser diode emission parts 32A and the edge surface of the corresponding optical fiber fg1. Thereby the desired optical coupling is achieved.

In the case of this invention, the holders 61 and 62 are provided with discrimination means such that each of the laser diode emission part 32$s$ A and each of the optical fiber fg1 face with each other in one-to-one relationship, without ambiguity in the lateral or vertical directions. For this purpose, an arrow mark is provided to each of the laser diode chip holder 61 and the fiber holder 62 in the example of the drawing. Thereby, optical connection can be performed very efficiently, because of the ability to discriminate the direction of holders 61 and 62 correctly and instantaneously at the time of the connection between laser diode chip 32 and optical fiber group FG1, at the time the optical transmission/reception system of the present invention is constructed.

Furthermore, the discrimination means is not restricted to the arrow mark but it is also possible to use a different color. Furthermore, the discrimination means is not necessarily restricted to the ones that can be visually recognized. It is possible to have a discrimination means using the tactile sense by utilizing the unevenness and other features of form. It is possible to discriminate the direction of holders 61, 62 briefly even in the case of construction work in darkness or nighttime, in the case that discrimination means able to discriminate by the tactile sense is used.

Figure 58:
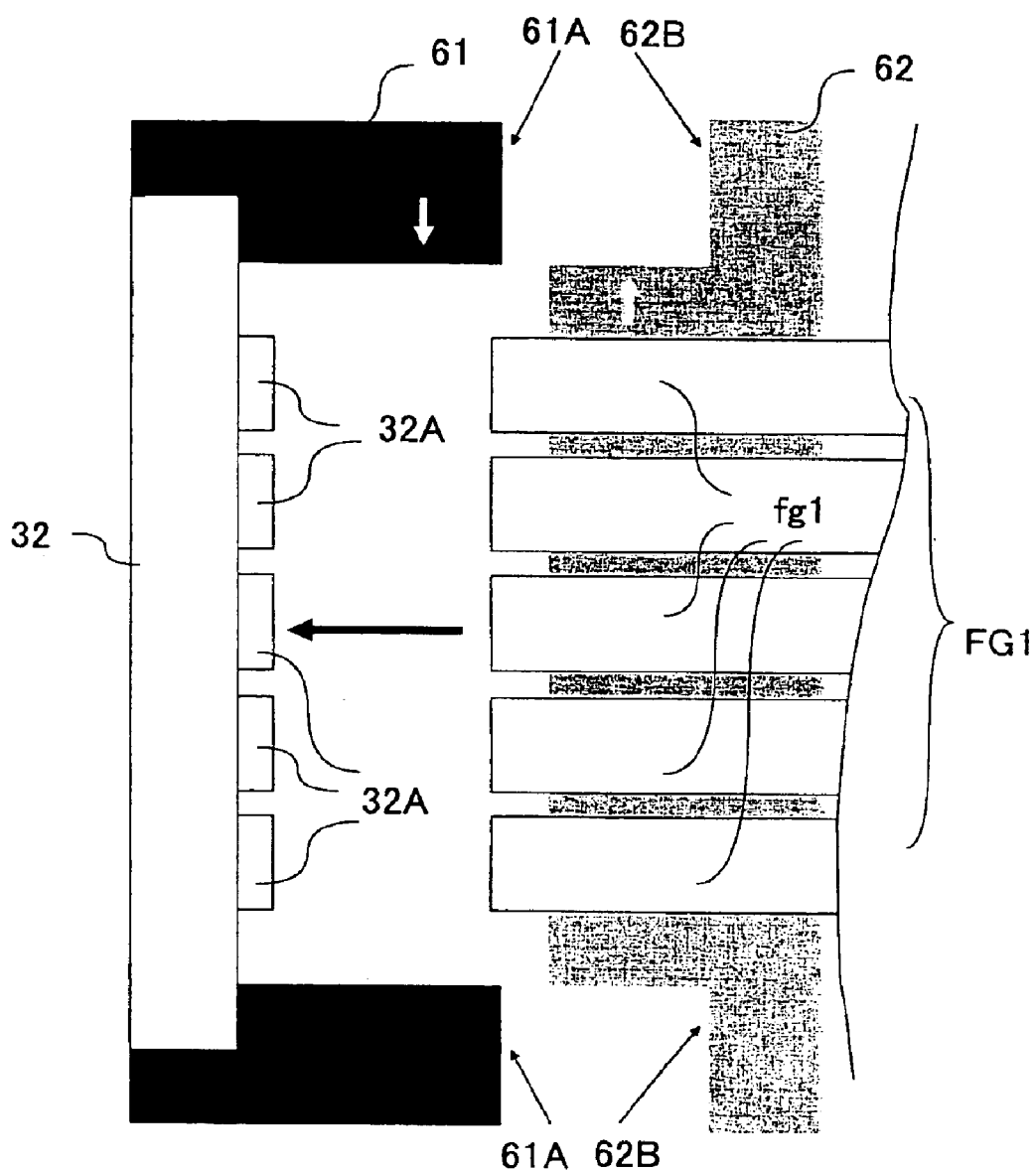
FIG. 58 is a diagram showing another constitution of an optical-fiber telecommunication system that uses a long-wavelength surface-emission laser diode according to an embodiment of this invention.
Figure 59:
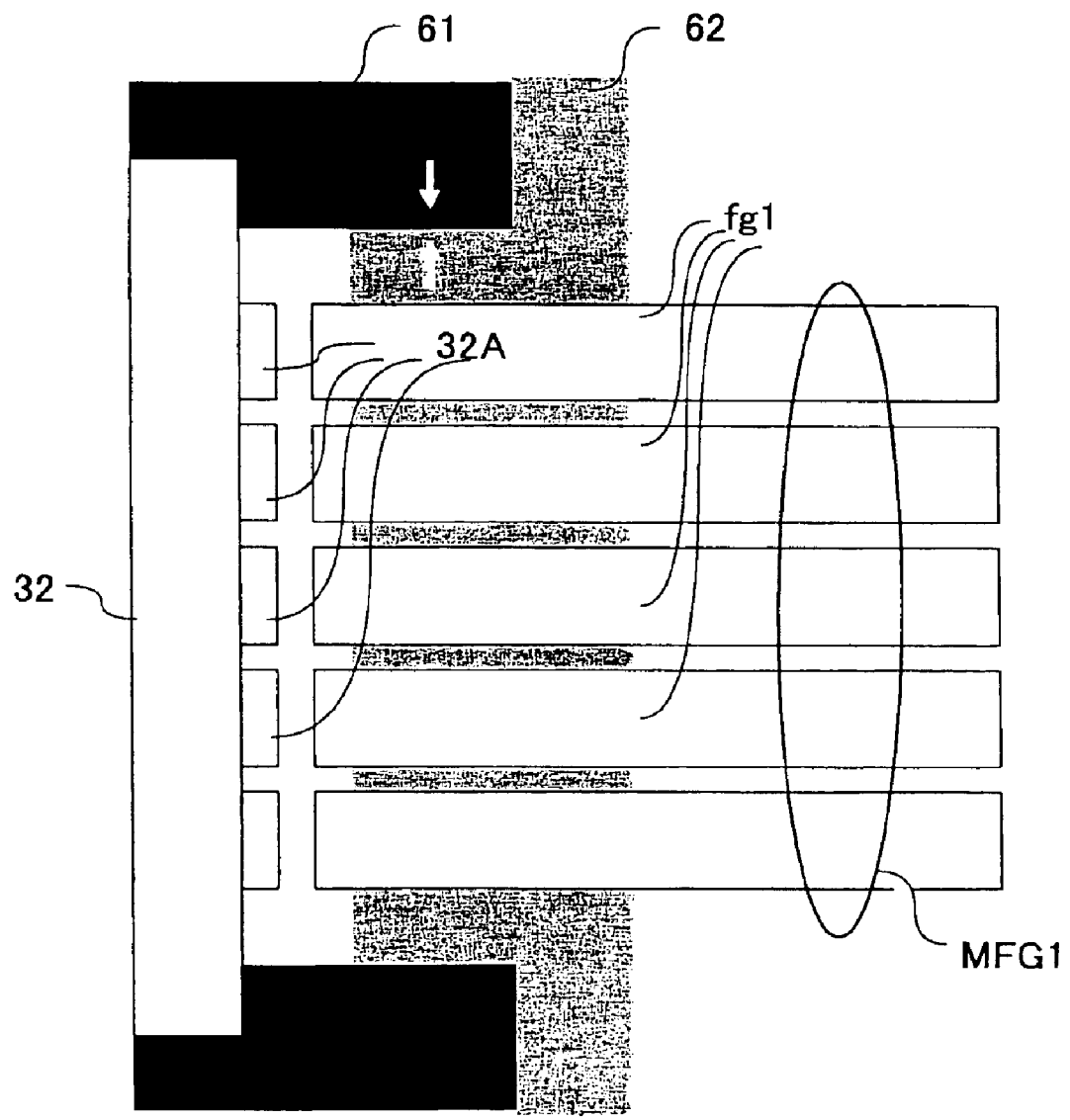
FIG. 59 is a diagram showing the constitution of another optical-fiber telecommunication system that uses a long-wavelength surface-emission laser diode according to an embodiment of this invention.

FIGS. 58 and 59 show a different example of the optical connection module MG1 that consists of the combination of laser diode chip holder 61 and fiber holder 62.

FIGS. 58 and 59 are referred to With the case as shown in FIGS. 39 and 40 this embodiment provides discrimination means to each of laser diode chip holder 61 and fiber holder 62 similarly. So that it is possible to connect and locate both holders accurately, in this embodiment a flange surface is additionally formed so as to allow the edge part of laser diode chip holder 61 engage the fiber holder 62. The flange surfaces 61A and 62B are shown in FIG. 58.

Next is explained another feature of this invention with regard to the discrimination means, the location/connection means shown in FIGS. 56–59, and the optical connection module MG1 that causes coupled light between the surface-emission laser diode chip and the 1st optical fiber group. Yet the concept of this invention is not only applied to optical connection module MG1 that couples optically the surface-emission laser diode chip and the first optical fiber group MFG1 but it is also applied to the optical connection module MG2 so that connects the first optical fiber group MFG1 and the second optical fiber group MFG2 optically.

Figure 60:
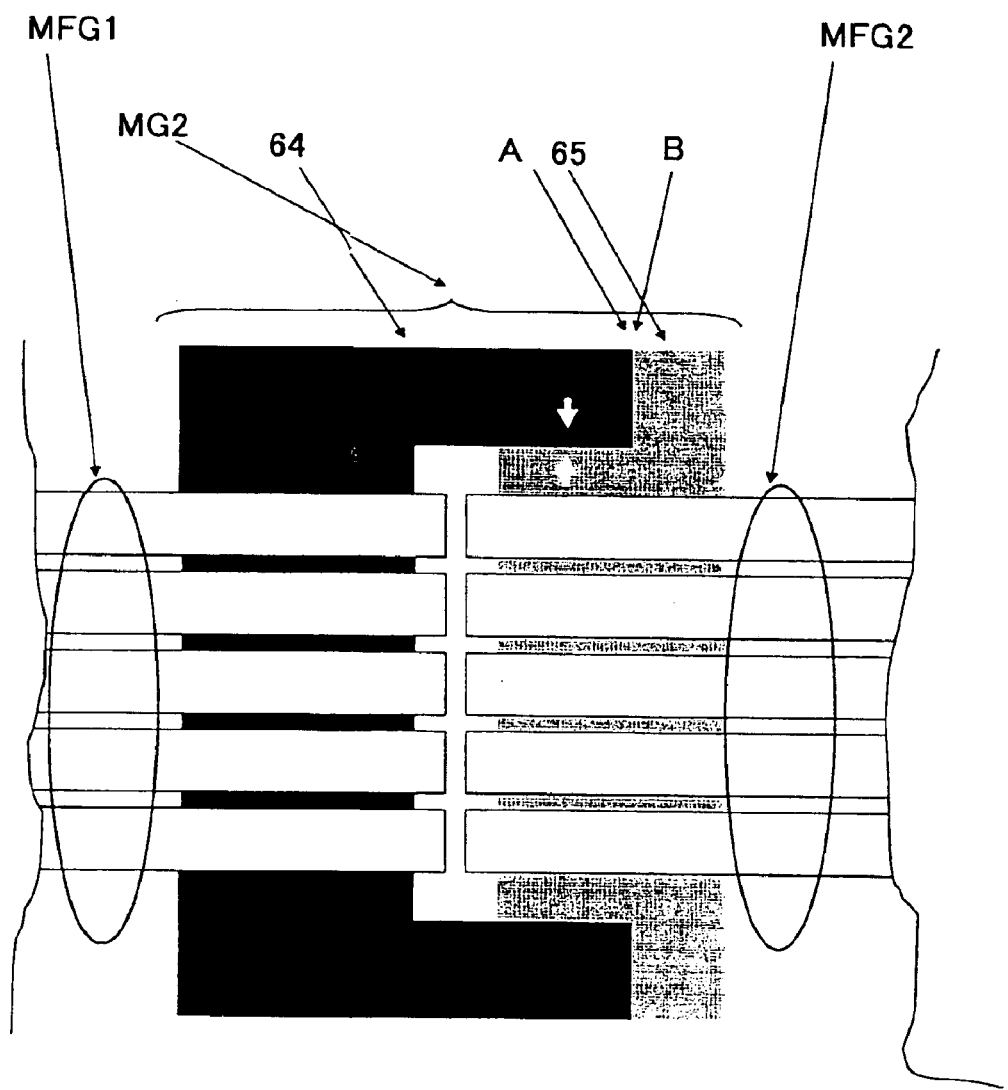
FIG. 60 is a diagram explaining the constitution of an optical connection module used in an optical-fiber telecommunication system together with a long-wavelength surface-emission laser diode according to an embodiment of this invention.

FIG. 60 shows an example of optical connection module MG2 that couples optically such an optical fiber group to a different optical fiber group.

FIG. 60 is referred to.

In this case, the means for discriminating the direction is provided on the fiber holders 64 and 65 in the form of arrow mark such that that each optical fiber fg1 of the first optical fiber group MFG1 couples properly to the corresponding optical fiber fg2 in the second optical fiber group MFG2. By providing such discrimination means it becomes possible to discriminate the a mutual direction instantaneously at the time of the connection between the first optical fiber group MFG1 and the second optical fiber group MFG2, as the optical transmission/reception system is constructed in accordance with the present invention.

Furthermore, FIGS. 39–59 are examples of the discrimination means and the present invention is not limited to such an arrow mark. The discrimination means might well use the difference of color. The discrimination means might well be able to use the tactile sense that senses the unevenness and others of a certain form. By using the discrimination means that is able to use the tactile sense, the advantage is being able to feel the direction of the fiber holder in the case of working during darkness, or even in the case of performing construction work at night.

In the construction of FIG. 60, not only the discrimination means is provided to each of the first fiber group holder 64 and the second fiber group holder 65, but there are formed the flange surfaces on the edge part of the first fiber group holder 64 (A part of FIG. 60) and on the edge of the second fiber group holder 65 (B part of FIG. 60) such that the flange surfaces engage with each other in the state that there is an optimum optical coupling.

Furthermore, such discrimination means and the location/connection means can be used also in the optical connection module MG3 that couples the second optical fiber group MFG2 and the third optical fiber group MFG3 optically or in the optical connection module MG4 that couples optically the third optical fiber group MFG3 and the photodiode chip 34. When the optical transmission/reception system is constructed according to this invention, the mutual orientation can be discriminated between the optical fiber groups or between the optical fiber group and the photodiode chip instantaneously and exact positioning and optical coupling is achieved.

[Ninth Embodiment]

Furthermore, the optical connection module according to another embodiment of the present invention is accomplished by using plural optical fibers in parallel. It should be noted that the reason it has become possible to construct the large-capacity optical transmission/reception system for a distance from several centimeters to several hundred kilometers is that stable laser oscillation of surface-emission laser diode at the wavelength of $1.1$–$1.7$ $\mu$m wavelength has become possible as a result of the present invention as noted before. By using the surface-emission laser diode of the $1.1$–$1.7$ $\mu$m oscillation wavelength, the inspection of laser elements in the laser diode array is substantially facilitated. Further, the productivity of the optical transmission/reception system is improved remarkably. Construction of such an optical transmission/reception system was not possible in the conventional surface emission laser diode of 0.85 $\mu$m wavelength band. By using the surface-emission laser diode the present invention, it became for the first time possible to realize a commercial base optical transmission/reception system.

Figure 61:
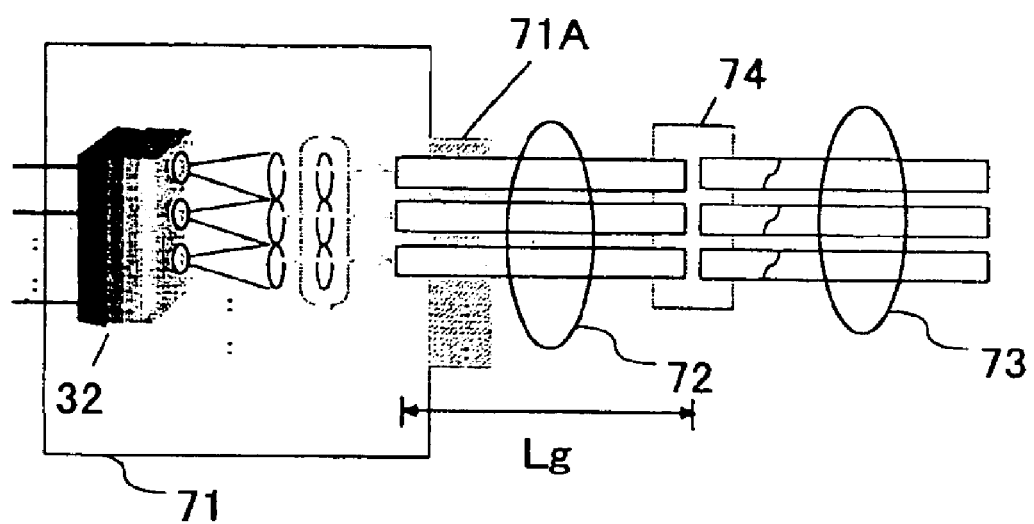
FIG. 61 is a diagram showing the constitution of an optical-fiber telecommunication system that uses a long-wavelength surface-emission laser diode according to an embodiment of this invention.

FIG. 61 shows another example of the telecommunication system that uses a long-wavelength surface-emission laser diode. It should be noted that FIG. 61 shows an optical fiber 72 drawn out from a module package 71 in which a surface-emission laser diode chip is accommodated and an optical fiber 73 for telecommunication that is connected to the optical fiber 72. In FIG. 61, those parts explained previously are designated by the sane reference numerals and explanation is omitted.

FIG. 61 is referred to.

The optical fiber 72 drawn out from module package 71 via the connector 71A is connected by welding or other methods to the optical fiber 73 for telecommunication at fiber connection part 74. In this case, a predetermined connection margin is required. With regard to the optical fiber cable 72 drawn out from the module package 71, when the optical fiber length Lg shown in FIG. 61 is too short, a very fine work is needed to assemble the module package 71. Thereby, the production cost is increased. Also it becomes difficult to produce a high-precision module.

The optical fiber used in the telecommunication systems of this invention is a very minute thing. The diameter is only a 50 $\mu$m or 62.5 $\mu$m in the typical case. When assembling the module package 71 by using such an optical fiber, for example, it is unnecessary to hold the optical fiber 72 extending from the module package 71 by using a pair of tweezers. Thereby, it is difficult to hold the optical fiber 72 unless the length Lg of the optical fiber 72 is less than a certain length.

Much of the assembling work can be done by an automation apparatus. Even in such a case, a tool is necessary for holding such a minute optical fiber. In consideration of easiness of holding the distal end part of the optical fiber by the holding tool, it is necessary to secure a certain length Lg for the optical fiber 72.

The inventor of the present invention, recognizing the importance of doing the assembly work smoothly, conducted and evaluated extensive assembly of optical fiber systems. Through various kinds of experimental production operations, it was determined that length Lg shown in FIG.

61 must be at least 1 mm. In other words, the length Lg.(the guide optical fiber length Lg shown in FIG. 61) of the optical fiber 72 drawn out from the Module package 71, in which the surface-emission laser diode chip is accommodated, has to be set to one or more millimeters.

In the case the length of this part is reduced to the order of microns comparable to the optical fiber diameter, assembling work has to be done under a microscope, using equipment that is expensive and high-precision and highly mechanized. Such work is unrealistic from industrial view point.

It should be noted that such a guide optical fiber 72 is connected to the optical fiber constituting a part of the optical telecommunication system shown in FIG. 61 by welding. Thereby, there is a need to secure a welding margin (margin Gm shown in FIG. 62) in view of melting of the fiber edge of the guide optical fiber 72. The welding margin would be the order of millimeters.

Figure 62:
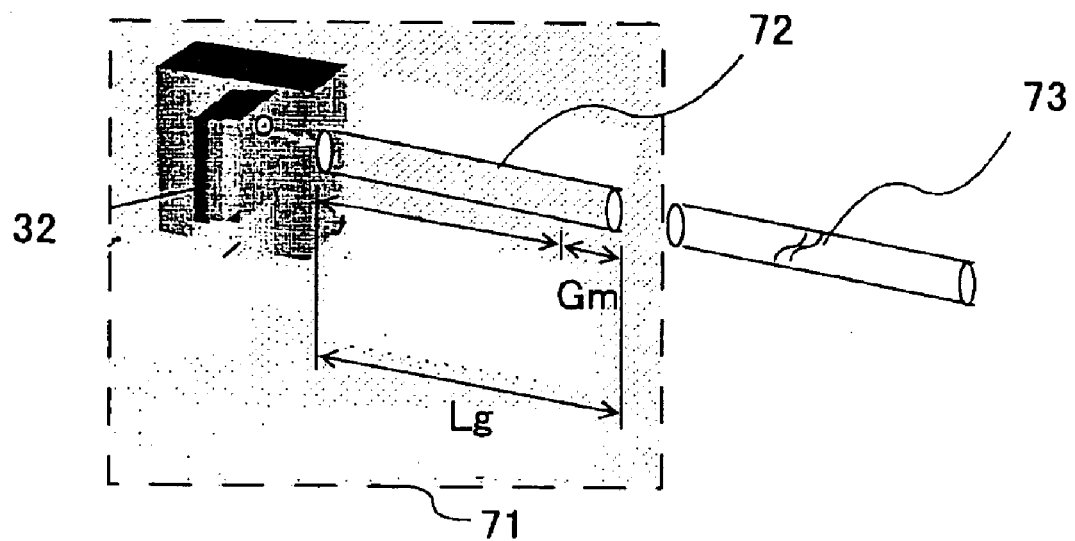
FIG. 62 is a diagram showing length setting of optical fiber for guiding in an optical-fiber telecommunication system that uses a long-wavelength surface-emission laser diode according to a first embodiment of this invention.

The inventor of the present invention conducted welding experiments and evaluated the necessary length of the welding margin Gm of FIG. 62.

In the case that guide optical fiber length Lg is in the order of microns, it was discovered that the fiber edge of the optical fiber 71 melts excessively. For example, in the case the length Lg is 200 $\mu$m, 500 $\mu$m or 900 $\mu$m, the edge surface of optical fiber 71 melted excessively and a fine joint was not obtained. On the other hand, it was confirmed that a fine joint can be obtained in the case the length Lg is made to be one millimeter or more, such as 1 mm or 3 mm.

In summary, it is concluded that assembling of then module package 71 requires that the length Lg be one or more millimeters in order to connect with the optical fiber of the optical telecommunication system to the guide optical fiber.

With regard to the upper limit of the guide optical fiber 72, it is sufficient for module assembly work to secure the length of 20 mm for the guiding purpose. In the case the optical fiber 7 is too long, the excessive optical fiber can be cut after the assembling of the optical module 71 to a suitable length.

Next is an explanation about another aspect of this embodiment.

The above explanation discussed the relation with the surface-emission laser diode 32 acting as the optical source and the guide optical fiber 72, while the same relation holds also at the detecting side.

While illustration is omitted, it is, possible to realize a photodetection unit by replacing the surface emission-laser diode 32 of FIGS. 61 and 62 with the photodetection device 34 such as photodiode. Thereby, there is an optical fiber corresponding to the guide optical fiber 72 of FIGS. 61 and 62 in direct contact with the photodetection device 34.

The same thought is necessary with regard to the module assembling and connection to the optical telecommunication system in the side of the photodetection device.

In the present invention, a highly reliable and practical assembling of the photodetection unit is achieved by setting the length of the guide optical fiber connected directly with the photodetection device 34 (corresponding to the guide optical fiber 72 of FIGS. 61 and 62) to one millimeter or more. Further, a reliable connection is achieved with the optical fiber of the optical telecommunication system.

With regard to the upper limit, a length of 20 mm is sufficient similarly to the module package for the optical source side.

[Tenth Embodiment]

Figure 63:
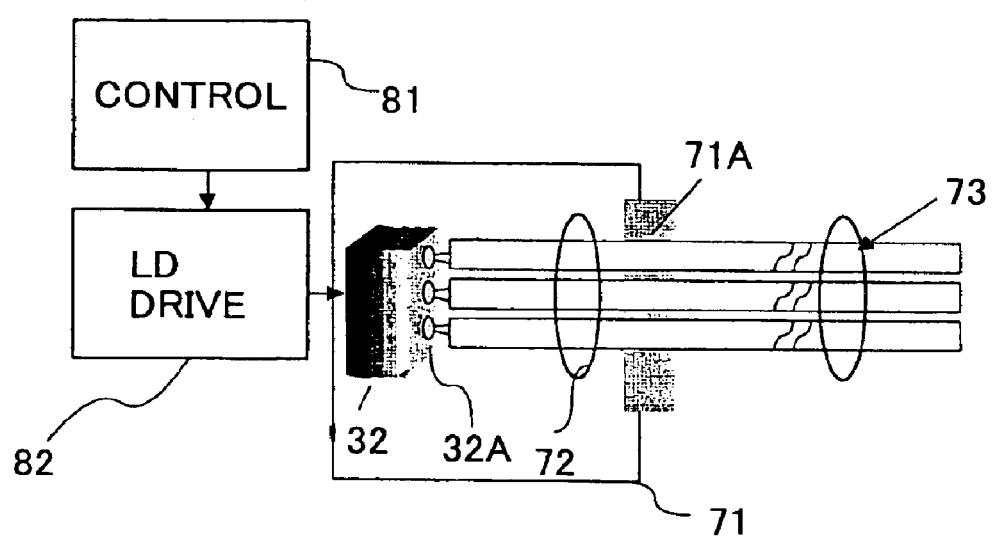
FIG. 63 is a diagram showing the constitution of an optical-fiber telecommunication system that uses a long-wavelength surface-emission laser diode and plural optical fibers according to an embodiment of this invention.

FIG. 63 shows the example of a telecommunication system that uses the long-wavelength surface-emission laser diode chip 32 with the laser oscillation wavelength 1.1–1.7 $\mu$m band with plural optical fibers. Those parts explained previously in the FIG. 63 are designated with the same reference numerals and explanation is omitted.

In the construction of FIG. 63, the laser diode 32A in the laser diode chip 32 is driven by a communication control unit 81 via a laser diode driver circuit 82. The optical signal is supplied to the optical fibers 72 and 73 in the form of an optical beam.

Conventionally, an optical telecommunication system was studied by using the laser oscillation wavelength of 0.85 $\mu$m. However, because of the large transmission loss in the optical fiber, it was not practical for long distance telecommunication. Further, in the case of the telecommunication system that uses the plural optical fibers in combination of conventional edge-emission type laser diodes, there is a need of adjusting the optical coupling for each the optical fibers with each of the laser diodes. Thus, the adjustment process was complicated. Further, it was difficult to connect the laser diodes directly to form a two dimensional array. Further, in an edge-emission laser diode, the emission angle of the laser beam is large and the laser beam generally has a large aspect ratio. Thus, it has been provide a coupling lens between the emission part and the optical fiber for better optical coupling efficiency.

Contrary to the prior art, a stable drive is realized with low energy and low heating by using the long-wavelength surface-emission laser diode of 1.1–1.7 $\mu$m band according to this invention.

Figure 64:
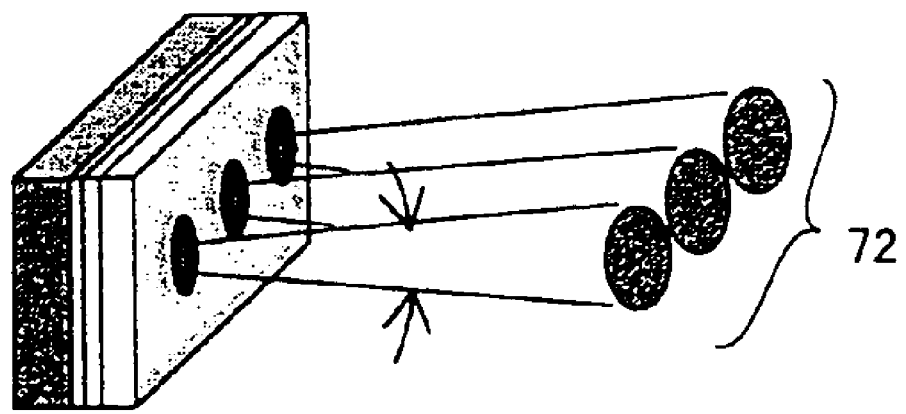
FIG. 64 is a diagram showing an emission angle of an optical beam emitted from a long-wavelength surface-emission laser diode according to an embodiment of the present invention.

FIG. 64 shows the construction of the surface-emission laser diode of the 1.3 $\mu$m band according to this invention. The emission angle of the laser beam in such a surface-emission laser diode is smaller as compared with an edge-emission laser diode and takes the value of about 15 degrees in both the vertical and horizontal directions. The laser beam form is circular, and there is no need of shaping the laser beam.

Thus, individual laser diodes 32A can be connected with corresponding optical fibers 72 without using a coupling lens, as long as the irradiation diameter of the laser diode is smaller than the core diameter of the optical fiber 72. The same is true also in other long-wavelength bands.

Thus, by using a surface-emission laser diode according to the present invention, the difference between the irradiation diameter of the laser diode 32A and the optical fiber core diameter provides a tolerable margin, and it becomes possible to adjust plural optical fibers altogether.

As shown in FIG. 64, the laser beam that is emitted from an emission part, in other words, the laser diode 32A, is injected with high efficiency into the core at the edge surface of the optical fiber The optical signal thus injected into the optical fiber is transmitted over a long distance with little transmission loss due to the long the wavelength of the optical signal. By using plural optical fibers, a very high quality optical telecommunication system of practical value is materialized. The laser diodes 32A can form in arbitrary two-dimensional arrangement in the surface-emission laser diode chip 32 as long as they do not cause interference.

Figure 65A:
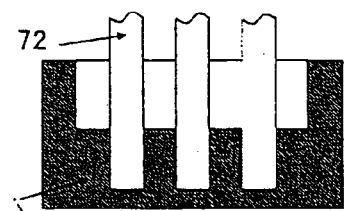
FIGS. 65A–65C are diagrams showing the process of fixing plural optical fibers with a resin according to an embodiment of this invention.
Figure 65C:
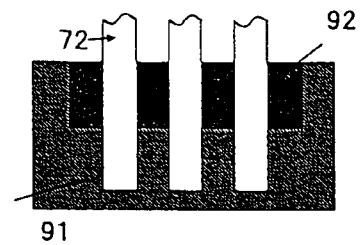
Figure 65B:
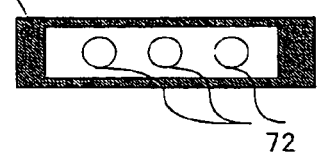

The plural optical fibers 72 are fixed with each other by using a jig 91 shown in FIGS. 65A–65C, in which each of the optical fibers is provisionally fixed by the jig 91 and pouring a resin 92 into the jig as represented in FIG. 65C. Thereby, the positional adjustment can be omitted at the time of system construction, by providing a positioning guide in the connector connection part 71A. Thus, it becomes possible to easily construct an optical telecommunication system while using plural optical fibers.

Meanwhile, the number of the optical fibers used in an optical telecommunication system changes depending on the system. Thus, it is advantageous to design the system such that the number of optical fibers can be changed flexibly.

Figure 66A:
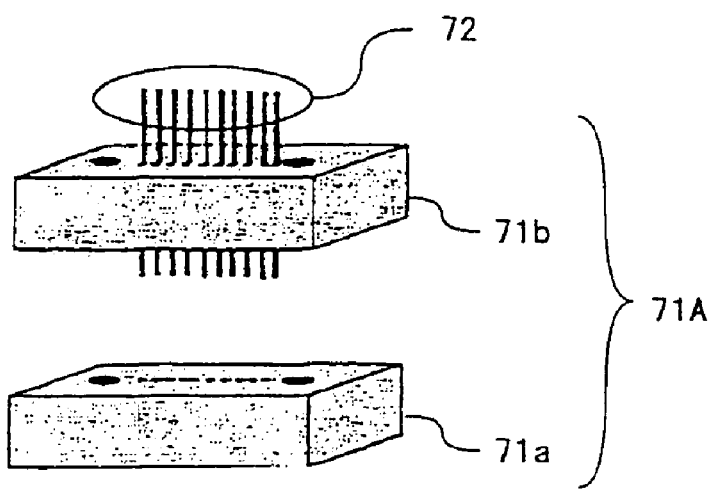
FIGS. 66A–66C are diagrams showing a the connect mode of a long-wavelength surface-emission laser diode to plural optical fibers according to an embodiment of this invention.
Figure 66B:
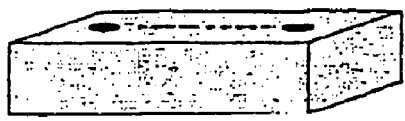
Figure 66C:

Thus, as shown in FIG. 66B, a number of openings having the size of the optical fiber diameter are formed on the connector connection part 71a, and the connector connection part 71a is attached on the surface-emission laser diode chip 32 of FIG. 49C with an adjustment. Further, several kinds of connectors 71b carrying plural optical fibers as shown in FIG. 66A are provided, and one of the connectors 71b is selected and inserted into the connector connection part 71a. By using such a construction, waste of optical fibers in the optical connector 71A is eliminated, and it becomes also possible to add optical fibers later according to the needs. Thereby, it becomes possible to increase the degree of freedom of design of the optical telecommunication system.

Figure 67:
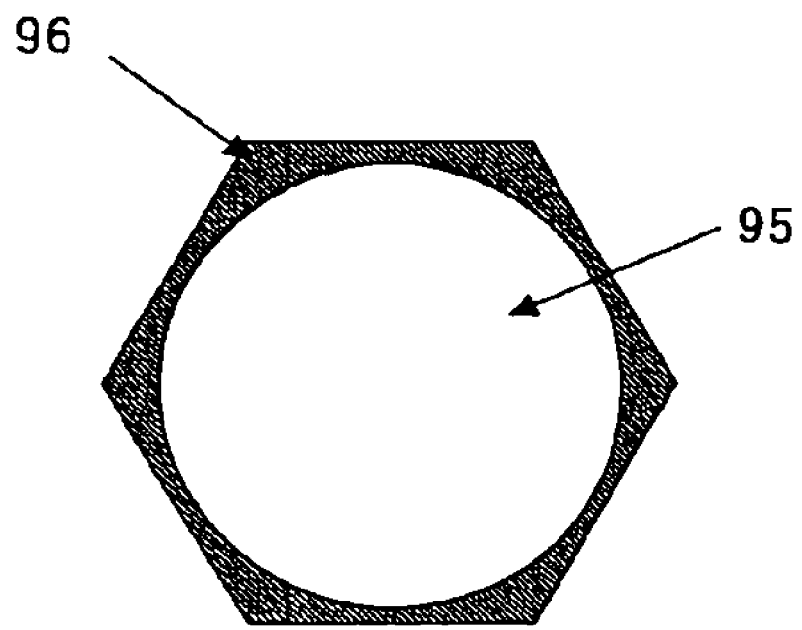
FIG. 67 is a diagram showing possible locations of optical fibers in a closely packed state according to an embodiment of this invention.
Figure 68:
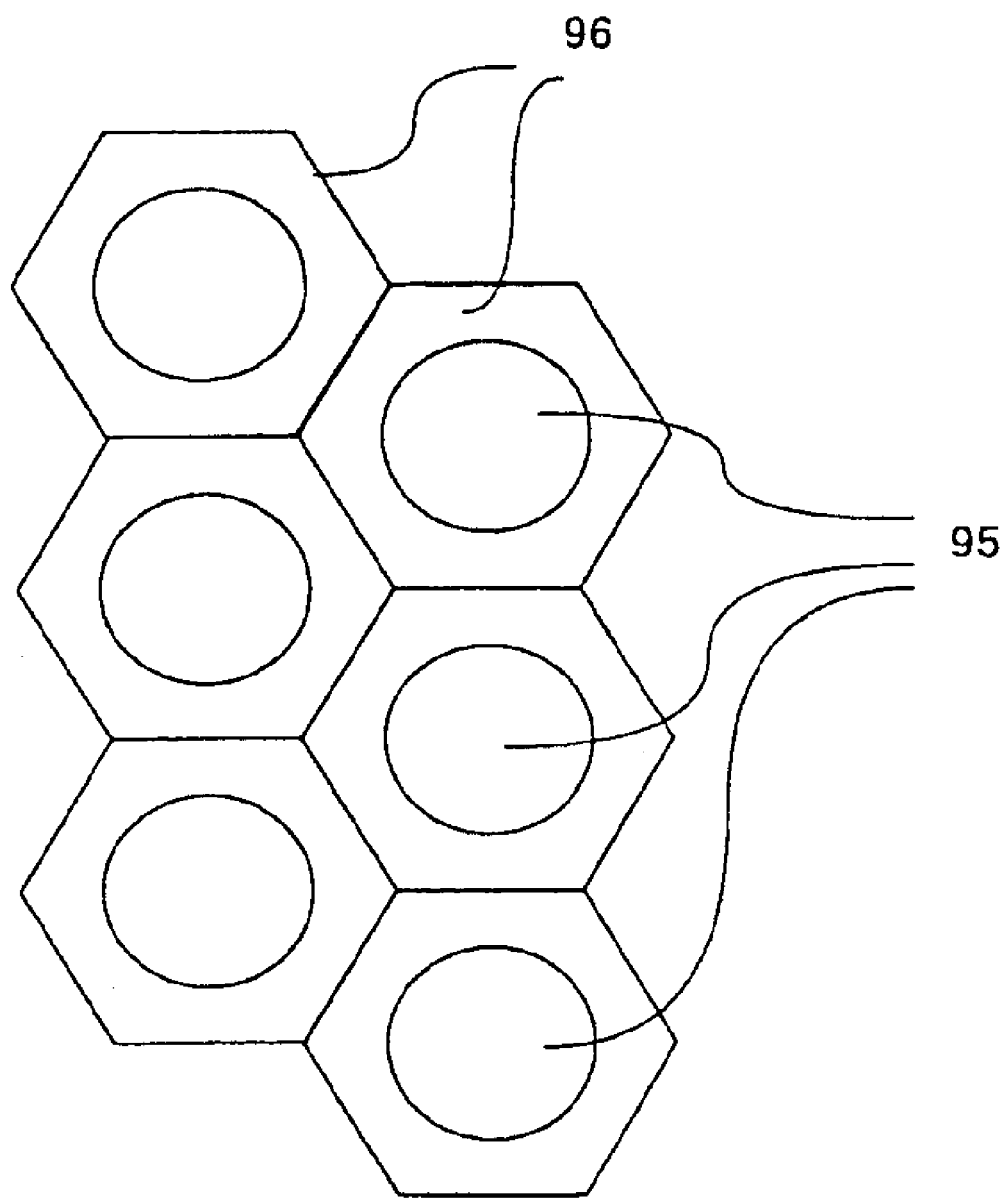
FIG. 68 is a diagram showing an example of arranging plural optical fibers with a closest packed state according to an embodiment of this invention.

Furthermore, in long-wavelength surface-emission laser diode chip 32 of 1.1–1.7 μm band of this invention, the laser diode elements constituting the emission part 32A can be arranged in two-dimensional array. In view of this, each optical fiber 95 is provided with a resin coating 96 having a hexagonal cross section as shown in FIG. 67 such that the two-dimensionally arranged optical fibers do not contact directly with each other Thereby, an optical cable having a closest packing structure for the optical fibers is realized as represented in FIG. 68. In the optical fiber cable of FIG. 68, the cross-sectional area of the optical fibers is minimized because of the closest packing arrangement of the optical fibers.

In the construction of FIG. 67, it is also possible to use a fixing member of a resin having a number of holes of hexagonal arrangement for holding the optical fibers, in place of providing a resin coating 96 outside the optical fiber 95.

[Eleventh Embodiment]

Figure 69:
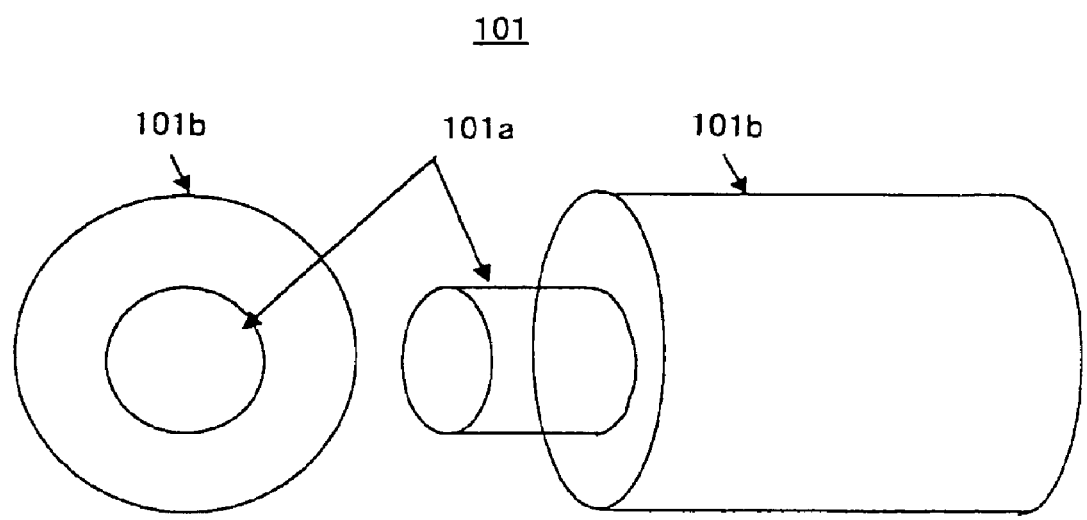
FIG. 69 is a cross-sectional view showing the constitution of an optical fiber connected to a long-wavelength surface-emission laser diode according to an embodiment of this invention.

FIG. 69 shows an example of the optical fiber 101 used in a telecommunication system that uses a long-wavelength surface-emission laser diode. Those parts explained previously are designated by the same reference numerals and the description thereof will be omitted.

FIG. 69 is referred to. The optical fiber 101 is injected with the laser beam emitted from the laser diode emission part 32A. The optical fiber 101 consists of cladding 101B enclosing a core 101A, and the core 101A transmits the laser beam thus injected. The diameter D of the core 101A is determined with regard to the length L so as to satisfy the condition $105 \leqq L/D \leqq 109$.

Conventionally, an optical telecommunication system was studied by using the laser oscillation wavelength of the 0.85 μm band. However, the transmission loss of the optical fiber was too large and there was no practical value. Also there was no laser diode that can oscillate stably in the long-wavelength band, in which the transmission loss is minimum, was not realized. In accordance with the present invention, a surface-emission laser diode oscillating stably at the laser oscillation wavelength of 1.1–1.7 μm band is materialized as a result of improvement of the semiconductor Bragg reflectors 12 and 18 and by the provision of the non-optical recombination elimination layers 13 and 17. As a result, a practical long wavelength band optical telecommunication system became possible.

Figure 70:
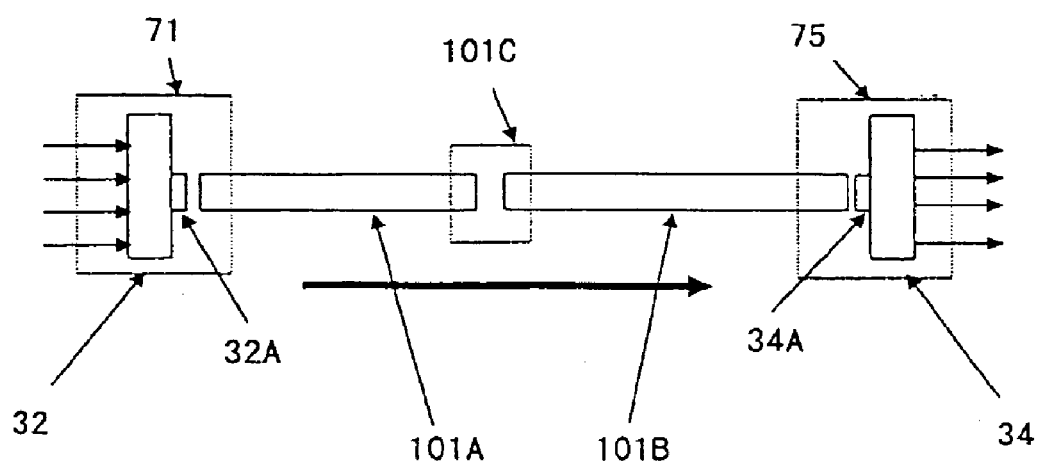
FIG. 70 is a plane view showing the constitution of the optical-fiber telecommunication system that uses a long-wavelength surface-emission laser diode and an optical fiber connected thereto according to an embodiment of this invention.

FIG. 70 shows the construction of a long distance optical telecommunication system using the above long-wavelength surface-emission laser diode chip 32 and the optical fiber 101.

FIG. 70 is referred to. The long distance optical telecommunication system uses the long-wavelength surface-emission laser diode chip 32. The optical fiber is injected with the laser beam that is emitted from the laser diode emission part 32A of the laser diode chip 32. Further, the optical telecommunication system includes a first optical fiber 101A having the core diameter D of 50 μm and the length L of 5 km and second optical fiber having the core diameter D of 50 μm and the length L of 5 km injected with the laser beam emitted from the optical fiber 101A, wherein the optical telecommunication system further includes the photodiode chip 34 including the photodetector part 34A injected with the laser beam emitted from the second optical fiber 101B.

Between the laser diode chip 32 and the first optical fiber 101A, the connection module 71 is provided, and a similar connection module 75 is provided between the second optical fiber 101B and the photodiode chip 34. Furthermore a repeater 101C is provided between the first optical fiber 101A and the second optical fiber 101B for amplification and the repeating of the optical signal.

In the constitution of FIG. 70, it should be noted that the first and second optical fibers 101A and 101B are produced usually with several thousand kilometers as a unit. However, a length of several hundred kilometers becomes the unit of the optical fiber product due to existence of pores or other defects that occur during the production process. In consideration of transmission loss, the practical length of the optical fiber to the repeater 101C is 5–50 km in the case the optical fiber has a core diameter of 50 μm. The optical fiber of this length is used for the optical fiber telecommunication.

In the case the transmission length is longer than 50 km, it is necessary to provide a relay point for signal amplification in view of the transmission loss. When the distance is shorter than 5 m, various telecommunication means are available other than the optical telecommunication system.

For optical fiber 101 used with this embodiment, a quartz glass optical fiber having a core diameter D of several microns, or a plastics optical fiber having a core diameter D of several hundreds microns may be used. These optical fibers can be used alone or in the form of a bundle.

Figure 71:
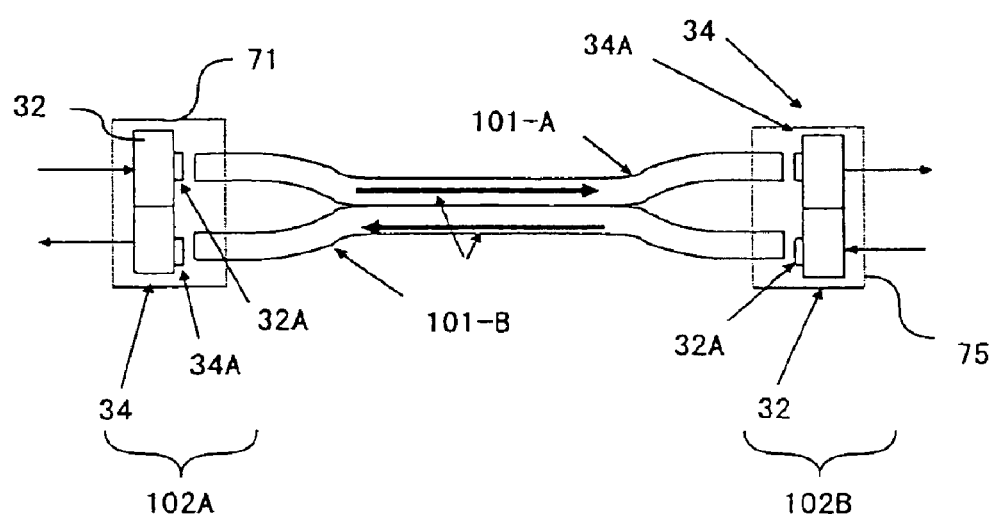
FIG. 71 is plane view showing the constitution of a bi-directional optical-fiber telecommunication system that uses a long-wavelength surface-emission laser diode and an optical fiber connected thereto according to an embodiment of this invention.

FIG. 71 shows an optical telecommunication system for bi-directional optical telecommunication by using a bundle of quartz glass optical fibers 101-A and 101-B each having a diameter D of 50 μm and a transmission length L of 500 m, wherein in these optical fibers are separated from each other at the photodetection end and the optical source end.

FIG. 71 is referred to.

There can be seen that optical transmission/reception parts 102A and 102B are provided in the present invention in which the long-wavelength surface-emission laser diode chip 32 and the photodiode chip 34 form a pair. Thus, the first optical fiber 101A is coupled to the emission part 32A of laser diode chip 32 in the optical transmission/reception part 102A, and the optical fiber 101A is further coupled optically to the optical detection part 34A of photodiode chip 34 in the optical transmission/reception part 102B. Similarly the second optical fiber 101B is coupled optically to the emission part 32A of the laser diode chip 32 in the optical transmission/reception part 102B, and the optical fiber 101B is coupled optically to the optical detection part 34A of photodiode chip 34 in the optical transmission/reception part 102A. Thereby, the laser diode chip 32 and the photodiode chip 34 constituting the optical transmission/reception part 102A form the connection module 71. Also, the laser diode chip 32 and the photodiode chip 34 constituting the optical transmission/reception part 102B form the connection module 75.

By expanding the foregoing construction of using the long-wavelength surface-emission laser diode chip 32 and the photodetector chip 34 as a pair for the case in which a number of laser diode elements 32A are formed on the laser diode chip 32 and a number of photodiode elements are formed on the photodetector chip 34, it is possible to realize a large capacity optical telecommunication system.

Figure 72:
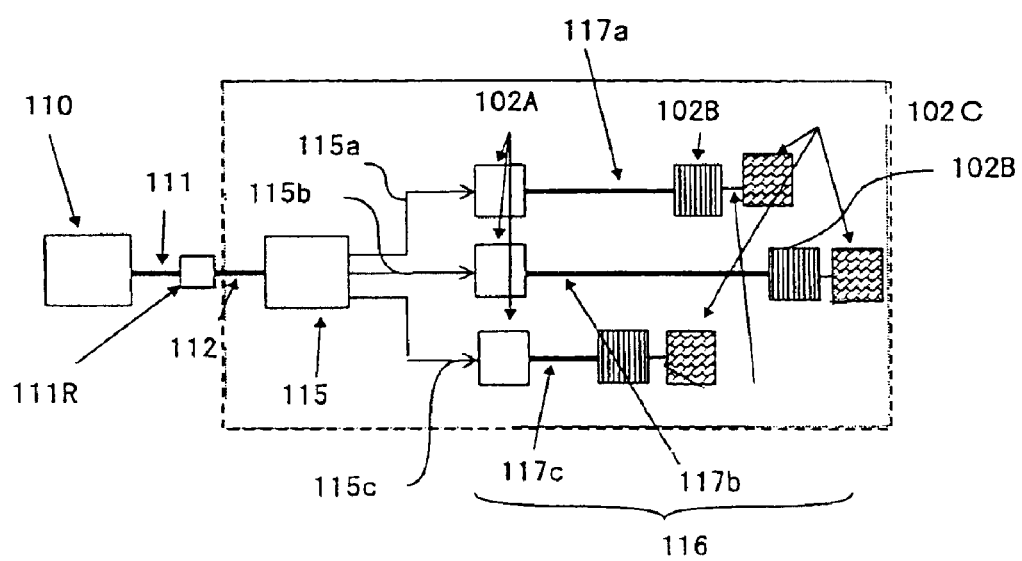
FIG. 72 is a plane view showing the constitution of LAN in a building in which the function of a long-wavelength surface-emission laser diode and the function of an optical fiber connected thereto are separated.

FIG. 72 shows the case of applying the present invention to a high speed multimedia network that uses a fluorinated plastic optical fiber having a core diameter of 100 µm and the transmission length of less than 100 m.

FIG. 72 is referred to.

A first optical fiber 111 having a core diameter D of 50 µm extends from a station-side apparatus 110 and a second optical fiber 112, formed by bundling 50 optical fibers each having a core diameter D of 50 µm and a length of 1 km, is connected to the optical fiber 111. As a result, there is formed a the high speed optical transmission system capable of transmitting information with the speed of the order of Gbps with a total distance of 100 km. In the example of FIG. 72, the optical repeater 111R is provided between the optical fiber 111 and optical fiber 112, to compensate for the damping of the signal by the propagation loss of quartz glass optical fiber.

The optical signal transmitted through the second the optical fiber 112 enters into a network terminator 115 at first and converted to an electric signal. Further, the electric signal is distributed to necessary lines 115a–115c, and the electric signal thus supplied to each line is transmitted further in the form of the optical signal by an optical telecommunication system 116 that includes the optical transmission/reception parts 102A and 102B explained to with reference to FIG. 71. The optical signal thus transmitted is supplied to a corresponding optical output port. In the optical telecommunication system 116, an optical fiber 117a having a core diameter of 100 µm and a length of 10 m is used for the optical transmission to the optical output port corresponding to the line 115a, while an optical fiber 117b having a core diameter of 100 µm and a length of 50 m is used for the optical transmission to the optical output port-corresponding to the line 115b. Further, an optical fiber 117c having a core diameter of 100 µm and a length of 100 m is used for optical transmission to the optical output port corresponding to the line 115c. The optical signals thus transmitted are converted to electric signals by the optical transmission/reception part 102B in each optical output port and is supplied to corresponding terminal devices 102C.

Further, the transmission from each terminal device 102C is transmitted to the optical transmission/reception part 102A in the form of an optical signal through the optical fibers 117a–117c and reaches the station-side apparatus 110.

In this embodiment, the core diameter of the optical fibers 117a–117c has a large value of 100 µm, and high-precision alignment by using a high-precision lens system is not necessary. Thus, it becomes possible to achieve optical connection to various apparatuses in a home or office quite extremely.

In the present embodiment, too, the relationship of $10^5 \leq L/D \leq 10^9$ is maintained between the length L and core diameter D of the optical fibers. When the transmission distance is longer than 100 km, no substantial transmission is possible due to the transmission loss, and thus, it is necessary to provide a relay point for amplification and repeating. In the case the transmission distance is shorter than 10 m, such an optical telecommunication system is not always necessary and may be replaced with other means.

Figure 73A:
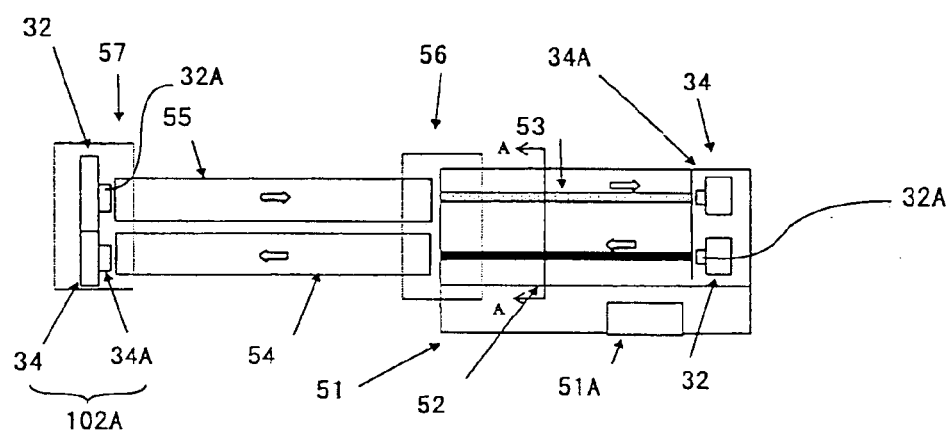
FIGS. 73A and 73B are respectively a plan view showing a long-wavelength surface-emission laser diode and an integral optical fiber telecommunication apparatus and a cross-sectional view of an optical waveguide according to an embodiment of this invention.
Figure 73B:
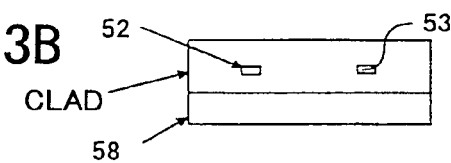

FIGS. 73A and 73B show the application of the long-wavelength surface-emission laser diode of the present invention to a hybrid optical integrated circuit device, respectively in a plane view and a cross-sectional view.

FIGS. 73A and 73B are referred to. The long-wavelength surface-emission laser diode chip 32 and the photodiode chip 34 are carried on a ceramic substrate 51 in this embodiment. Further, the ceramic substrate 51 carries thereon a first optical waveguide 52 having a rectangular cross-section of 7×7 µm and a length of 1 cm for guiding the laser beam emitted from the laser diode 32A. Further, the ceramic substrate 51 carries a second optical waveguide 53 having a rectangular cross-section of 7×7 µm and a length of 1 cm similar to the optical waveguide 52 in optical coupling with the photodetector part 34A of the photodiode chip 34 for supplying the optical signal to the photodetector part 34B. Further, a preamplifier 51 for amplifying the output electric signal of the photodetector chip 34 is provided on the ceramic substrate 51.

Further, an optical fiber 54 having a core diameter D of 100 µm and a length of 100 m is provided in optical coupling with the first optical waveguide 52 via a connection module 56, and a second optical fiber 55 having a core diameter D of 100 µm and a length of 100 m is provided in optical coupling with the second optical waveguide 53.

Further, a connection module 57 equipped with the surface-emission laser diode chip 32 and the photodiode chip 34 is provided at the other end of the optical fibers 54 and 55 such that the optical fiber 54 is coupled with the photodetector part 34A of the photodiode chip 34 and the optical fiber 55 is coupled with the laser diode 32A of the laser diode chip 32.

The optical waveguides 53 and 54 are formed on a silicon substrate 58 by the steps of forming the respective cores and the claddings that cover the cores by a photolithographic process, and the silicon substrate 58 is provided on the ceramic substrate 51 commonly with the preamplifier 51A.

[Twelfth Embodiment]

FIGS. 74A and 74B show an example of a laser diode chip 120 that is used with the optical telecommunication system in which the long-wavelength surface-emission laser diode of the present invention is used, wherein FIG. 74A shows a plane view while FIG. 74B shows a cross-sectional view taken along a line A–A'. It should be noted that the scale FIG. 74A is not identical with the scale of FIG. 74B. In the drawings, those parts explained previously are designated by the same reference numerals and the description thereof will be omitted.

FIGS. 74A and 74B are referred to.

It can be seen that the long-wavelength surface-emission laser diode 32A and the photodetection device 34A are formed to monolithically on a laser diode chip 120.

The photodetection device 34A has a stacked structure similar to the stacked structure of the long-wavelength surface-emission laser diode 32A and is formed simultaneously with the process of forming the surface-emission laser diode 32A. The structure thus formed can be used as a photodetection device, by applying with a reverse bias or using without a bias. This photodetection device 34A has sensitivity to the oscillation wavelength of the surface-emission laser diode 32A and can detect the optical emission of the laser diode 32A.

As will be understood from the plane view of FIG. 74A, the photodetection device 34A is formed in such a form to surround the long-wavelength surface-emission laser diode 32A. On the top surface of the laser diode 32A, an upper electrode 121 is formed and a lower electrode 123 is formed on the bottom surface of the laser diode chip 120. Also another upper part electrode 122 is formed on the top surface of the photodetection device 34A. An optical window is formed in the upper part electrode 121 of the laser diode 32A for taking out the optical output. Such a window is not formed in upper part electrode 122 the of photodetection device 34A.

Figure 75:
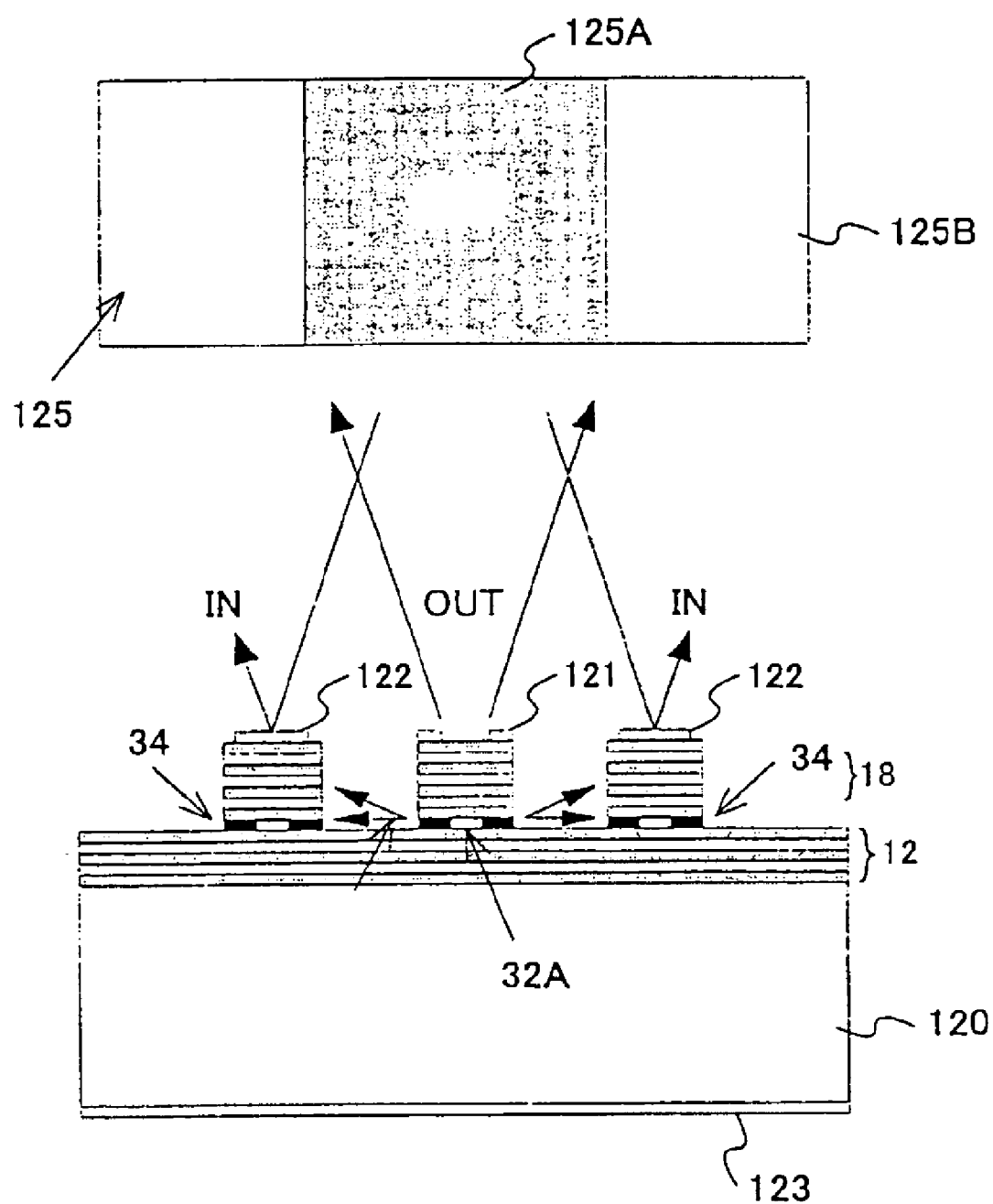
FIG. 75 is a diagram explaining the operation of a semiconductor laser diode chip of FIGS. 74A and 74B.

FIG. 75 is the figure that explains the operation of the laser diode chip 120 shown in FIG. 74.

FIG. 75 is referred to.

The laser diode 32A in the surface-emission laser diode chip 120 is positioned so as to face the end surface of an he optical fiber 125, and the optical beam emitted from the surface-emission laser diode 32A is injected into the core of the optical fiber. Thereby, there occurs a leakage light in the lateral direction from the sidewall of the surface-emission laser diode 32A, and the leakage light is detected by the photodetection device 34A provided adjacent to the laser diode. While the amount of the leakage light from the sidewall of the surface-emission laser diode 32A is not much, nevertheless the leakage light is detected by the photodetection device 34A, as the photodetection device 34A is formed so as to surround the surface-emission laser diode 32A in the construction of FIG. 75.

Furthermore, it should be noted that the semiconductor Bragg reflector 18 and the upper part electrode 122 are formed on the photodetection device 34A in FIG. 75. Therefore, the optical signal and the like transmitted from another party via the optical fiber 125 is reflected at the surface of the photodetection device 34A as shown with the arrow in the drawing. Thereby, the photodetector 34A does not detect such an optical signal.

As it will be clear from the aforementioned explanation, the present invention forms the photodetection device for detecting the output detection of the surface-emission laser diode integrally on the surface-emission laser diode chip. By integrating such a laser diode chip on a ceramic substrate 111, it becomes possible to construct the optical telecommunication system having a hybrid constitution.

Figure 76A:
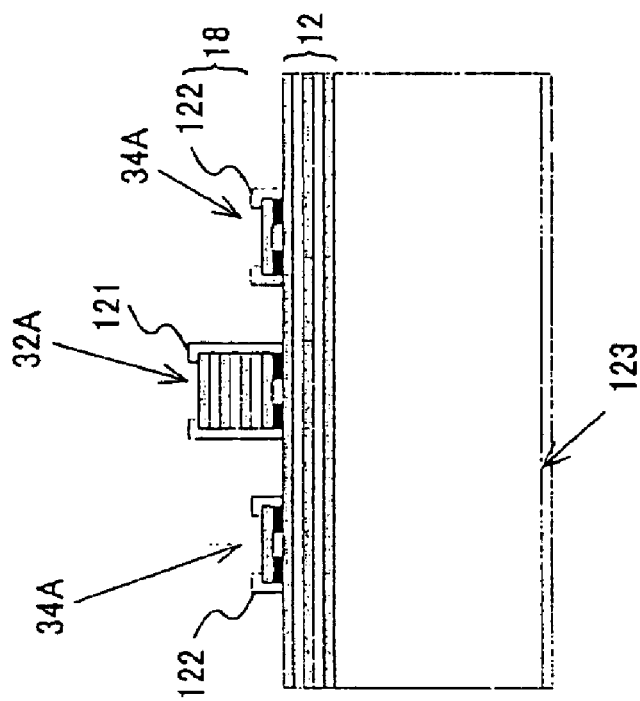
FIGS. 76A and 76B are diagrams showing the constitution of a long-wavelength surface-emission laser diode chip according to an embodiment of this invention.
Figure 76B:
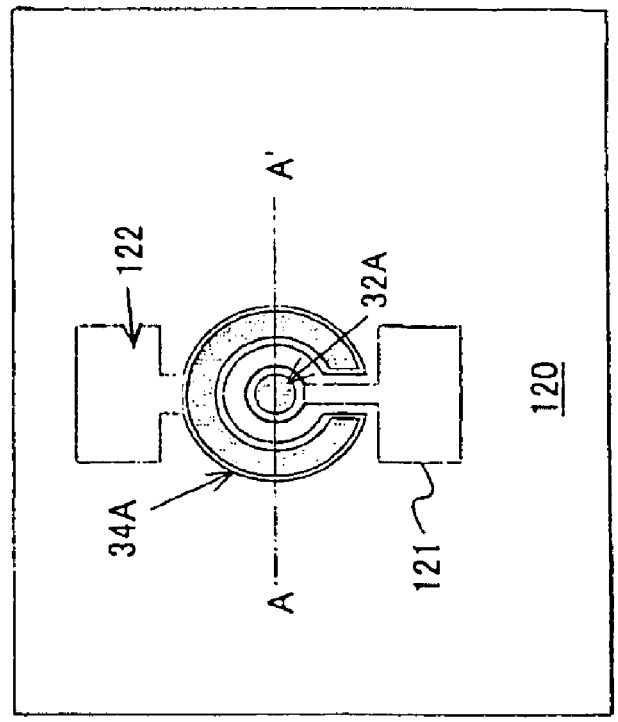

FIGS. 76A and 76B show an example of the semiconductor laser diode chip used with the optical telecommunication system in which the long-wavelength surface-emission laser diode of this invention is used, wherein FIG. 76A shows a plane view while FIG. 76B shows a cross-sectional view that taken along a line A–A'. The scale of FIG. 76A and FIG. 76B are not the same.

FIGS. 76A and 76B are referred to.

The long-wavelength surface-emission laser diode 32A and the photodetection device 34A are integrated monolithically on a laser diode chip, wherein the photodetection device 34A has a stacked structure similar to the stacked structure of the long-wavelength surface-emission laser diode 32A.

Thus, the photodetection device 34A is formed simultaneously with the same process as the one used for forming the surface-emission laser diode 32A The photodetection device 34A thus formed has sensitivity to the wavelength of the surface-emission laser diode 32A and can detect the optical radiation produced by the laser diode 32A.

In the present embodiment, the upper semiconductor Bragg reflector 18 is removed from the photodetection device 34A by an etching process. As can be seen from the plane view of FIG. 76A, the photodetection device 34A is formed so as to surround the long-wavelength surface-emission laser diode 32A, and the devices 32A and 34A have respective top surfaces provided with the upper electrode 121 and the upper electrode 122 formed with the window for optical input/output. Further, the bottom electrode 123 is formed on the bottom surface of laser diode chip 120.

Figure 77:
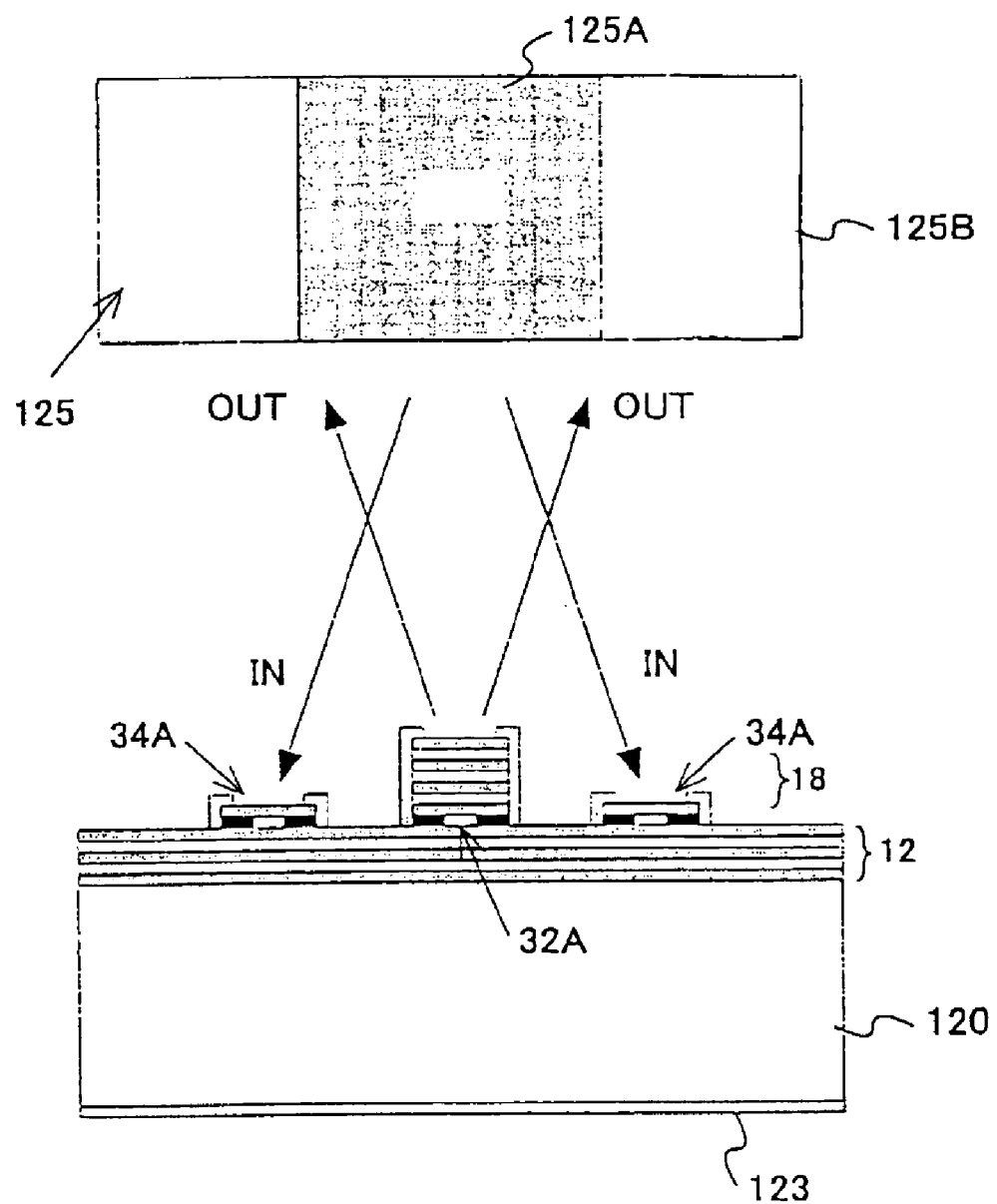
FIG. 77 is a diagram explaining the operation of a laser diode chip shown in FIGS. 59A and 59B.

FIG. 77 explains the operation of the laser diode chip of FIG. 76.

FIG. 77 is referred to.

In the surface-emission laser diode chip 120, the laser diode 32A is positioned so as to face the end surface of the optical fiber 125 such that the optical beam emitted from the surface-emission laser diode 32A enters into the core of optical fiber 125.

In this embodiment, the sidewall of the surface-emission laser diode 32A and the sidewall of the photodetection device 34A are covered with the upper part electrode 121 or 122, and the leakage s light is not formed at the side wall of the laser diode.

Thereupon, when an optical beam carryhinig an optical signal comes in from another party on the line, the optical beam emitted from the end surface of the optical fiber 125 enters into the top surface of the photodetection device 34A while causing spreading as represented by an arrow in the drawing. The optical beam is then detected by the photodetection device 34A formed so as to surround the surface-emission laser diode 32A. On the other hand, the top surface of surface-emission laser diode 32A is covered with the semiconductor Bragg reflector 18, and because of this, no substantial optical beam invades inside the surface-emission laser diode 32A from outside.

Thus, as will be clear from the aforementioned explanation, it becomes possible to construct an optical telecommunication system having an optical transmission/reception unit of hybrid construction in the present embodiment, by forming the photodetection device 34A for monitoring the output of the surface-emission laser diode 32A integrally on the surface-emission laser diode chip 120. Such a laser diode chip 120 can be integrated on the ceramic substrate 111.

Furthermore the combination of the surface-emission laser diode and the photodetection device that explained above is merely for the purpose showing an example, and the present invention also includes the case of forming an array of these devices or the case of combining the monitoring photodetector 34A for monitoring the output of the surface-emission laser diode 32A and the photodetector 34A for detecting the incoming signals are combined. Naturally, the present invention is not limited to the specific mutual positional relationship or shape of the surface-emission laser diode and the photodetector.

[Thirteenth Embodiment]

Next, this invention will be explained about other examples.

It is important to use a highly strained layer of GaInAs, GaInNAs or GaAsSb for the active layer in order to realize the long wavelength surface emission laser diode of 1.1–1.7 $\mu$m. In order to achieve this, it is necessary to minimize the mechanical stress applied to the laser diode. Such a mechanical stress may result from the thermal stress caused between the laser diode and the mount substrate as a result of the operational temperature environment or due to the heating of the laser diode or driver circuits. Such a thermal stress is caused in a structure in which materials of different linear thermal expansion coefficients are fixed, due to the tendency of the structure that tends to maintain original shape. Thus, the thermal stress depends on the temperature change, the coefficient of linear thermal expansion, Young modulus, and the like. It is possible to eliminate the thermal stress by controlling the temperature of the whole module including the laser diode. However, such a measure of providing a temperature regulating mechanism is difficult in view of the increased cost. Further, it is difficult to control the temperature completely constant.

Thus, it is desirable, in order to provide a highly reliable system with low cost, to use a material having a coefficient of linear thermal expansion close to that of the laser diode for the mount substrate so as to reduce the influence of the thermal stress on the laser diode as small as possible.

In this embodiment, various mount substrates were produced by using various materials having different coefficients of linear thermal expansion and evaluation was made about the influence of the thermal stress on the output characteristic of the laser at the time of the laser oscillation. The surface-emission laser diode used in the experiment has the structure explained with reference to FIG. 1 and the laser oscillation wavelength was 1.3 μm. Further, a chip size of 5 mm×10 mm (thickness 0.6 mm) was used in which 20 laser diodes were aligned with a pitch of 300 μm. The size of the mount substrate made was 10 mm×20 mm (thickness 2 mm).

The result is shown in Table 5. In Table 5, ○ represents the sample in which a stable output was obtained in the operational environment of 0–70° C. while X represents the sample in which no stable output was obtained and hence not suitable for practical use.

TABLE 5

| material | linear thermal expansion coefficient | laser output |
| --- | --- | --- |
| quartz glass | $0.3 \times 10^{-6}/K$ | X |
| smicrystal | $2 \times 10^{-6}/K$ | X |
| CVD diamond | $2 \times 10^{-6}/K$ | X |
| Si | $4 \times 10^{-6}/K$ | ○ |
| SiC | $4 \times 10^{-6}/K$ | ○ |
| AlN | $5 \times 10^{-6}/K$ | ○ |
| GaAs | $6 \times 10^{-6}/K$ | ○ |
| Al—Si$_{(60Al—40Si)}$ | $15 \times 10^{-6}/K$ | X |
| Cu | $17 \times 10^{-6}/K$ | X |

The coefficient of linear thermal expansion of the laser diode of this invention is $6 \times 10^{-6}/K$. From the above results, it can be seen that the thermal stress is reduced and a stable laser output is obtained when the difference of the linear thermal expansion coefficient between the laser diode and the mount substrate within about $2 \times 10^{-6}/K$. Particularly, the materials such as Si, SiC, GaAs, AlN are easily available and are easily processed and handled for the mount substrate.

Further, by choosing the heat radiating member on which the mount substrate is mounted such that the material of the heat radiating member has a linear thermal expansion coefficient close to that of the laser diode, the stress to the mount substrate is minimized and the mechanical stress applied to the laser diode is reduced as a result. Further, the material constituting the heat radiation member is required to have a high thermal conductivity.

In the present invention, various heat radiating members are formed by using various materials having different linear thermal expansion coefficients and the effect of heat generated at the time of the laser oscillation on the laser output characteristics is evaluated.

The laser diode used for the evaluation was the same as the one used in the evaluation of Table 5. In this experiment, an SiC substrate having the same size as in the previous experiments was used for the mount substrate.

Table 6 shows the results, wherein ○ in Table 4 represents the sample in which a stable output was obtained in the operational environment of 0–70° C., while X represents the case in which no stable output was obtained.

TABLE 6

| material | thermal conductivity | laser output |
| --- | --- | --- |
| SiO2 | about 8 W/mK | X |
| Al2O3 | about 17 W/mK | X |
| Cobar | about 17 W/mK | X |
| AlN | about 200 W/mK | ○ |
| Cu/W | 180–200 W/mK | ○ |
| W | about 170 W/mK | ○ |
| Mo | about 160 W/mK | ○ |
| Cu | about 390 W/mK | ○ |

The thermal conductivity of the laser diode of this invention is 55 W/mK. Thus, from the results noted above. it can be seen that a preferable result is obtained when the thermal conductivity of the heat radiating member is larger than the thermal conductivity of the laser diode. Thus, the heat generated at the time of the laser oscillation is transferred to the mount substrate and then to the heat radiation member without returning to the laser diode when the thermal conductivity of heat radiating member is larger than the thermal conductivity of the laser diode of this invention. Thus, the output fluctuation of the laser accompanied by the effect of heat accumulation does not result and a stable characteristic suitable for practical use is obtained. Particularly, the materials such as AlN, Cu/W, W, Mo, Cu are easily available and can be processed easily to form a heat radiating member.

Figure 79:
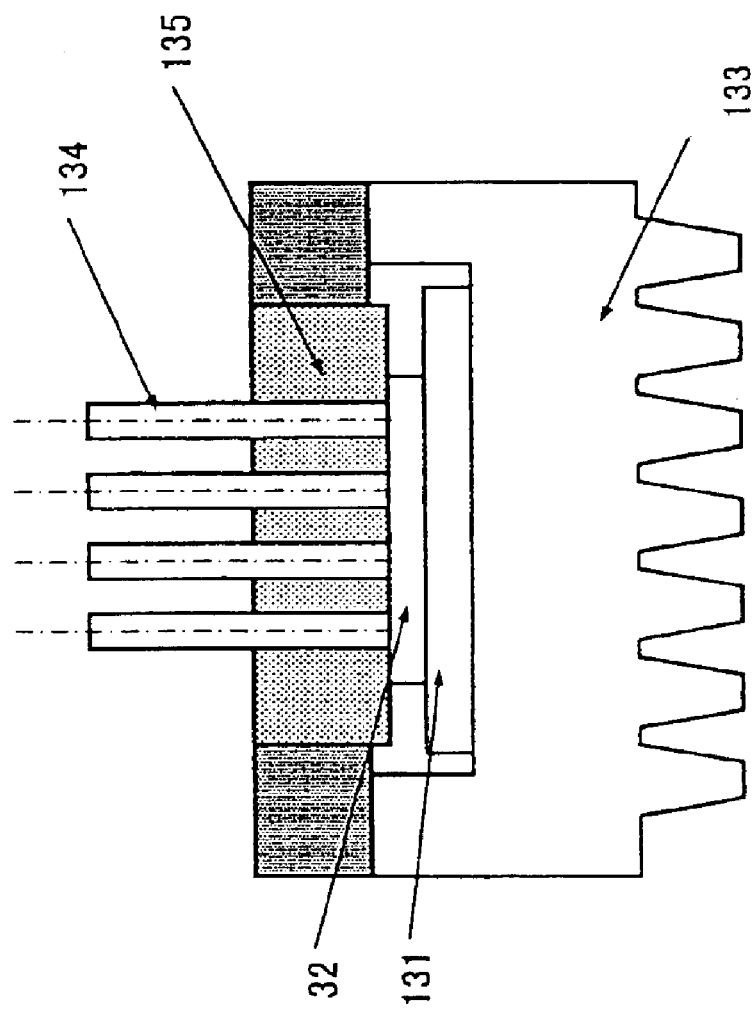
FIG. 79 is a diagram showing an optical transmission part of a telecommunication system in which the long-wavelength surface-emission laser diode of an embodiment of this invention is used.

Especially the use of Cu/w is advantageous as it allows control of the thermal conductivity by controlling the compositional ratio and can be used as a he package substrate to be explained later with reference to FIG. 79.

Hereinafter, an optical telecommunication system of the present embodiment that uses such a member will be explained.

The telecommunication system is composed of the optical fiber or optical waveguide that operates as the transmission path between the photodetection part including a surface photodetection device and a driver circuit thereof and the optical transmission part including a surface-emission laser diode and a driver circuit.

The driver circuit of the laser diode or the photodetector is formed on the same mount substrate commonly with the laser diode of the photodetector to which the drive circuit cooperates, Alternatively, the driver circuit is formed on the laser diode substrate by a wafer process simultaneously to the process of forming the respective devices to which the driver circuit cooperates. Further, the optical telecommunication system performs the bi-direction telecommunication by providing the optical transmission part and the photodetection part at both ends of the optical transmission path.

Figure 78:
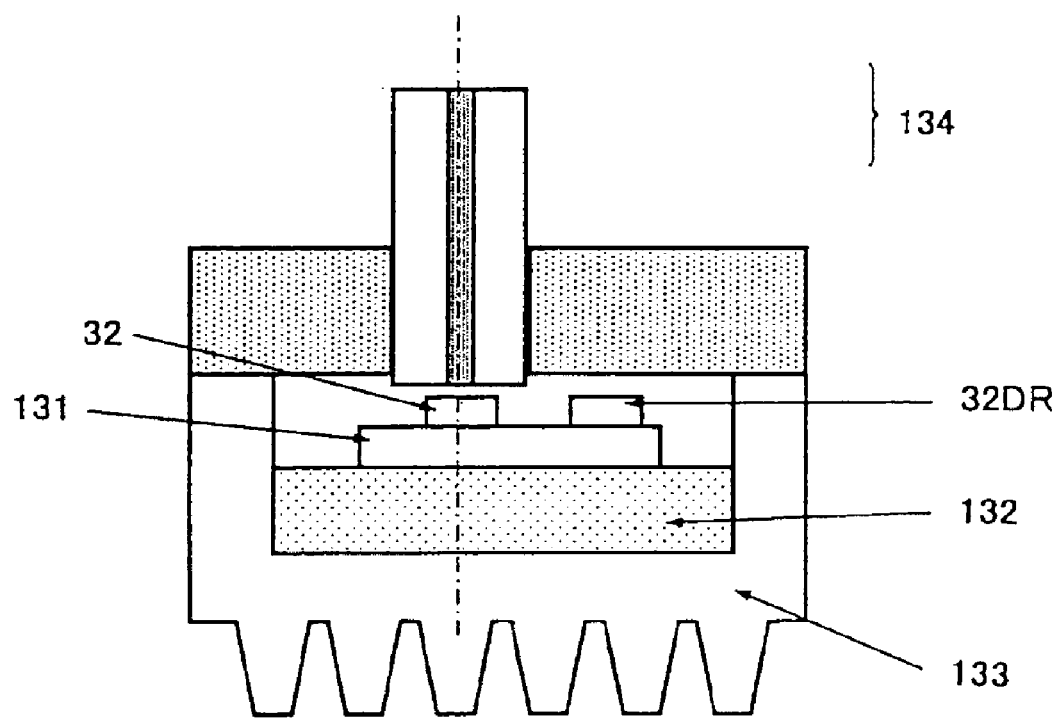
FIG. 78 is a diagram showing an optical transmission part of a telecommunication system in which the long-wavelength surface-emission laser diode according to an embodiment of this invention is used.

FIG. 78 shows an example of the optical transmission part of such an optical telecommunication system. In the drawing, those parts explained previously are designated by the same reference numerals and the description thereof will be omitted.

FIG. 78 is referred to.

The optical transmission part includes the surface-emission laser diode chip 32 and a driver circuit 320R driving the laser diode chip 32, a mount substrate 131 on which the laser diode chip 32 and the driver circuit 32DR are mounted, a heat radiation member 132 adjustably supporting the mount substrate 131 and for radiation of the heat, and a metal package 133 holding the heat radiation member 132 and acting as the heat sink or heat radiation fin, and an optical transmission 134 acting as the optical path. The metal package 133 and heat radiation member 132 and also mount substrate 131 are connected mechanically and thermally with each other by a solder or a resin. Also, the laser diode 32 and the driver circuit 32DR are connected electrically by wire bonding, and the like.

For example, the laser diode chip 32 includes the laser diode of FIG. 1, wherein the laser diode may be the one that oscillates at the wavelength of 1.2 μm. As for the mount substrate 131, on the other hand, a Si substrate having the the coefficient of linear thermal expansion of $4 \times 10^{-6}$/K can be used. In this case, the laser diode 32 is die-bonded with an AuSn solder on the mount substrate 131. Thereby, electrode and electric mechanical connection are achieved.

It should be noted that an $SiO_2$ film 200 nm thickness is formed on the surface of the Si substrate 131. This $SiO_2$ film may be formed by a thermal oxidation process or a CVD process or an SOG process. The foregoing oxide film is used for insulation, but the heat radiation characteristic of such a film is inferior to Si. Therefore, it is preferable that the insulation film has as small thickness as possible within the range of providing sufficient electric insulation. The oxide film may be omitted if it is possible. The driver circuit 32DR that drives the laser diode chip 32 is mounted on the same mount substrate 131 together with the laser diode chip 32. A thermal conductive AlN substrate (coefficient of linear thermal expansion $5 \times 10^{-6}$/K, thermal conductivity 200 W/mK) may be used as the heat radiating substrate that carries the mount substrate. The AlN substrate has excellent compatibility with regard to the coefficient of linear thermal expansion. Further, a powder mold product of Cu/W may be used for the metal package 133. For example, the molded of Cu/W product forming the metal package 133 may have the composition of 89W-11Cu and a linear thermal expansion coefficient of $6.5 \times 10^{-6}$/K and a thermal conductivity of 180 W/mK. By using such a powder mold product, a highly precision product is obtained with low cost. Further, it is possible to form heat radiation fins easily and efficient heat radiation becomes possible.

In the example of FIG. 78, a multiple mode optical fiber having a core diameter of 50 μm is connected optically as the optical fiber 134 with the laser diode 32A in the laser diode chip 32. The stability of such an optical telecommunication system was evaluated in the operational environment of 0–70° C. from and it was confirmed that the laser output is stable No change of output characteristics was observed. Further, there was no lifetime degradation. Thus, it was found that an excellent optical telecommunication system can be constructed.

Furthermore, It is possible to use a GaAs (coefficient of linear thermal expansion $6 \times 10^{-6}$/K) or AlN (coefficient of linear thermal expansion $5 \times 10^{-6}$/K) or SiC (coefficient of linear thermal expansion $4 \times 10^{-6}$/K) for the substrate as the mount substrate 133 instead of the Si substrate. Because these substrates are an insulating substrate, formation of oxide film is not necessary when these substrates are used Otherwise, the same structure may be used. In view of the cost and easiness of handling, the use of AlN is most preferable.

Also, good results were obtained when Cu/W (coefficient of linear thermal expansion is $6-8 \times 10^{-6}$/K, thermal conductivity is 180–200 W/mK) such as 89W-11Cu, 85W-15Cu or 80W-20Cu, or the metals of W, Mo, Cu are used for the heat radiation member in place of AlN.

In the example of FIG. 78, it was explained based on the construction that there is only one laser diode in the laser diode chip 32 forming the transmission part. However, it is possible to form an array of plural laser diodes also in the laser diode chip 32 or, by forming the array of the laser diode chip 32. Thereby, a large capacity optical telecommunication system is constructed.

For example, in the case of the multiple laser array chip in which plural laser diodes 32A are formed on a single chip 32, the laser diodes 32A come close with each other and the fluctuation of the laser output characteristic may be influenced by the thermal stress caused by the heat generation and accumulation of the heat thus generated. Furthermore the laser diode driver circuit 32DR is often formed also on such a chip. Thus, the heat from such a driver circuit 32DR is superimposed. In this, embodiment, the laser output that stabilized without bringing about such a problem by choosing the material of the mount substrate 131 or the heat generation part 132 appropriately.

Formerly, the surface-emission laser diode having the oscillation wavelength of 1.1–1.7 microns did not exist. Therefore, the technological problems with regard to the optical telecommunication system or mounting of the surface-emission laser diode chip of such a long-wavelength band have not been announced. This time, the inventor of this invention recognized the concrete technological problems for the first time by this invention and provided the resolution.

In the explanation above, a multimode optical fiber was used for the optical transmission path coupled optically to the laser diode chip 32. However, the optical transmission path may also be a single mode optical fiber or a plastic optical fiber. The laser diode of the present invention does not need expensive cooling device such as a Peltier device. But the present invention does not exclude the use do such a cooling device.

Next, another embodiment of the present invention will be explained with reference to FIG. 79, wherein those parts corresponding to the parts described previously are designated by the same reference numerals and the description thereof will be omitted.

Referring to FIG. 62, the present embodiment also shows the optical transmission part of the optical telecommunication system. In the present embodiment, the heat radiating member 132 functions also as the metal package 133.

It should be noted that the illustrated optical transmission part includes the laser diode chip 32 in which a number of laser diodes 32A are arranged in the form of laser array, the driver circuit 32DR driving the laser diodes 32A, a mount substrate on which the laser diode chip 32 and the driver circuit 32DR are mounted, a metal package 133 supporting the mount substrate 131 and functioning as the heat sink and also a heat radiating fin, an optical fiber 134 constituting the optical transmission path, and a ferule fixing the optical fiber 134. A solder or a resin connects the metal package 133 and the mount substrate 131 mechanically and thermally. Further, the laser diode chip 32 and the driver circuit (not shown) are connected electrically by using a bonding wire.

In the illustrated example, the laser diode of FIG. 27 having the oscillation wavelength of 1.3 μm is used, and four devices are arranged with a pitch of 250 μm, which is the pitch identical with the pitch of the corresponding optical fibers. Similarly to the previous embodiments, a Si substrate was used for the mount substrate and the laser diode was die bonded on the mount substrate by using an AuSn solder. Further, the electrodes are connected mechanically and electrically.

It should be noted that the surface of the Si substrate is formed with an SiO2 film having a thickness of 200 nm by a thermal oxidation process. However, such an oxide film may be formed by a CVD process or an SOG process. Further, in view of the heat radiating performance of the SiO₂ film, it is preferable to form the SiO2 film with a thickness as small as possible. The SiO2 film may be omitted if it is possible. Similarly, the driver circuit (not shown) that drives the laser diode is formed also on the common mount substrate.

As the metal package supporting the mount substrate and acting also as the heat radiating member, a powder mold product of Cu/W is used For example, the molded of Cu/W product forming the metal package may have the composition of 89W-11Cu and a linear thermal expansion coefficient of 6.5×10⁻⁶/K, which is close to the linear thermal expansion coefficient of the laser diode. Further, the metal package has a thermal conductivity of 180 W/mK. By using such a powder mold product, a highly precision product is obtained with low cost. Furthers it is possible to form heat radiation fins easily and efficient heat radiation becomes possible.

In the present embodiment, an array of multimode optical fibers in which the optical fibers each having a core diameter of 50 μm are arranged with a pitch of 250 μm is used. In the temperature range of 0–70° C., there occurs no change of laser output and no lifetime degradation. Thus, excellent optical telecommunication becomes possible. As the metal package functions also as the heat radiating member, the number of parts can be reduced and the efficiency of heat radiation is maximized.

A similar result is obtained also when a GaAs substrate or AlN substrate is used in place of the Si substrate. In the case of the AlN substrate or SiC substrate, they are insulating substrates and the formation of the oxide film is not necessary. Otherwise, the foregoing description applies and further explanation will be omitted.

In the present embodiment, four laser diodes and four optical fibers are used However, the present invention is by no means limited to this specific construction but the present invention is applicable also to the case in which the number of the laser diode is one and the number of the optical fiber is one, or the number of the laser diodes is 8, 12, 16 and there are 8, 12, 16 optical fibers in correspondence thereto.

In the case of the multi-laser diode array chip in which a plurality of laser diodes are formed on a common chip by exploiting the feature of the surface-emission laser diode of the present invention, a large number of laser diodes can be formed easily and is ideal for large capacity telecommunication. On the other hand, in the case of such a multi-laser array chip, heat dissipation of the laser diodes becomes an important issue. By using the material of the mount substrate and the heat radiating member as set forth in the present embodiment, it becomes possible to operate the laser diode array without causing problems. Thereby, a stable laser output can be obtained.

In the present embodiment, a multimode optical fiber was used also for the optical transmission path. However, this is not a mandatory condition and it is possible to use an optical waveguide, single mode optical fiber, plastic optical fiber, and the like.

[Fourteenth Embodiment]

Figure 80:
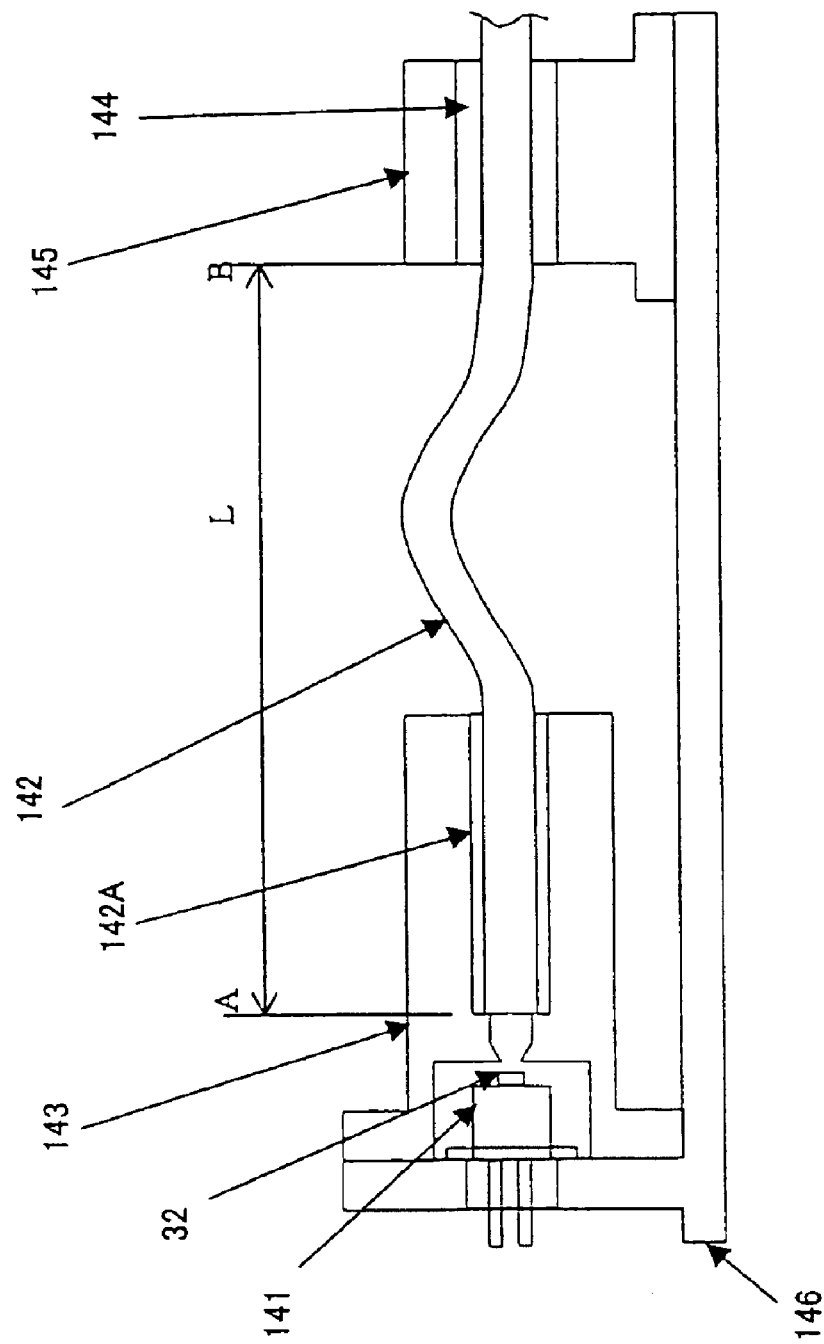
FIG. 80 is a cross-sectional view showing an optical coupling device used in a long-wavelength surface-emission laser diode according to an embodiment of this invention.

Next a telecommunication system according to another embodiment of the present invention that uses the long-wavelength surface-emission laser diode of the present invention will be explained with reference to FIG. 80. In FIG. 80, those parts corresponding to the parts described previously are designated by the same reference numerals and the description thereof will be omitted.

Referring to FIG. 80, the telecommunication system that uses the long-wavelength surface-emission layer diode includes a laser diode module 141 carrying thereon the laser diode chip 32, a ferule 142A fixing the optical fiber 142, an adapter housing 143 accommodating the ferule 142A together with the optical fiber 142, a bush 144 fixing the optical fiber 142, a housing 145 accommodating the bush 144, and the base 146 that holds the laser module 141 and the housing 143 as an integral body; In the construction of FIG. 63, the length of the optical fiber 142 from the point A to the point B is set longer than the distance L (fixed distance) between the end surface of the adapter housing 143 at the side of the laser diode chip 32 and the end surface of the housing 145.

More particularly, in the case the fixed length L is set to 1 in FIG. 80, the length A-B of the optical fiber 142 is set to 1.05. Thereby, the optical fiber 142 is provided with a bend, and the resilience associated with the bend causes the optical fiber 142 to be urged in the axial direction toward the optical emission part 32A (left direction in the drawing). Thereby, the mechanical connection is stabilized and an excellent optical coupling can be realized. Here, a plastic optical fiber is used as the optical fiber 142 but the present invention is by no means limited to such a specific case and it is possible to use a quartz glass fiber having a plastic coating.

Figure 81:
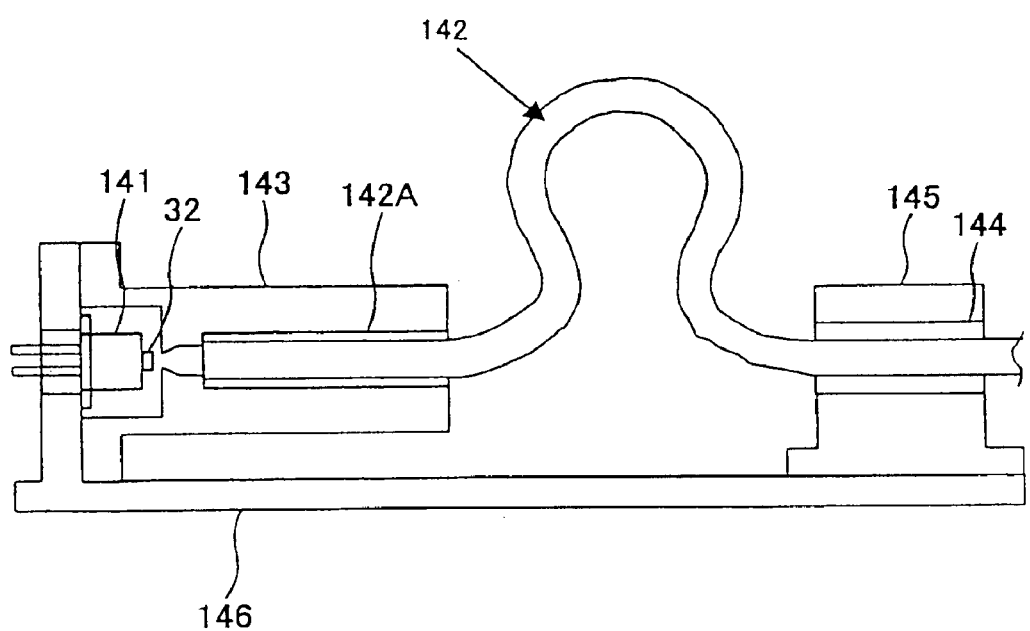
FIG. 81 is a cross-sectional view showing the optical coupling device of FIG. 63.

FIG. 81 shows the case in which the length L of FIG. 80 is set to 1 and the length A-B of the optical fiber is set to 2. Other conditions are identical with the case of FIG. 80. In the present embodiment, a larger resilient force is obtained as compared with the case of FIG. 80 and the connection between the laser diode and the optical fiber becomes more reliable.

Figure 82:
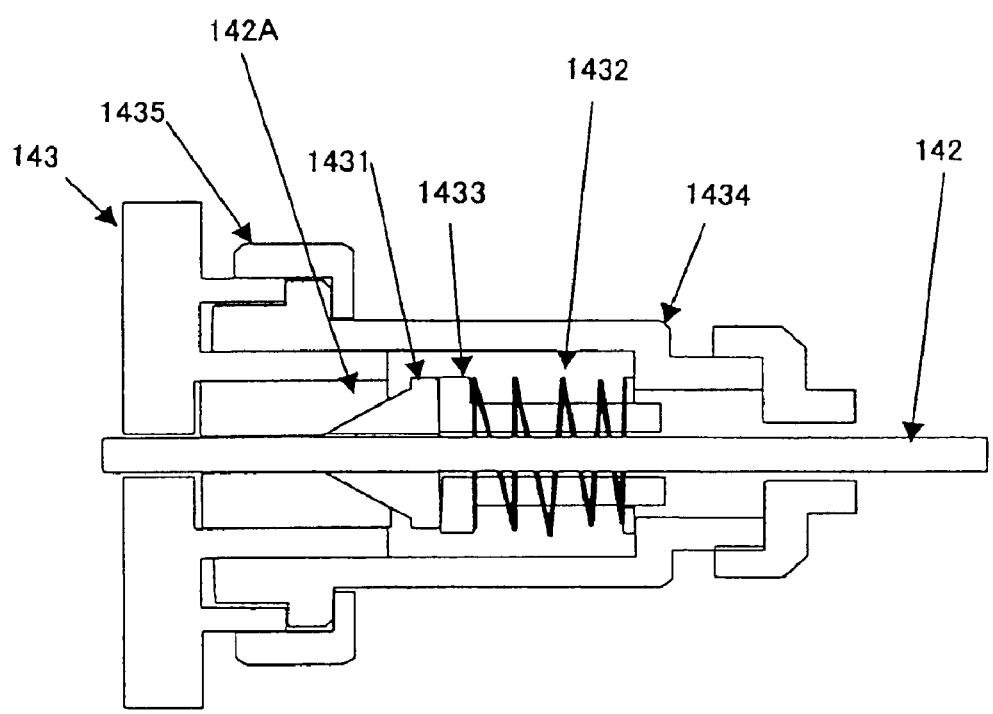
FIG. 82 is a cross-sectional view showing an optical coupling device that couples with a long-wavelength surface-emission laser diode according to an embodiment of this invention.

FIG. 82 shows the cross-sectional view of the adapter housing 143 used in the optical telecommunication system of FIG. 80 or 81.

Referring to FIG. 82, the adapter housing 143 includes a tapered split sleeve 1431, a ferule 142A fixing the optical fiber 142, a coil spring 1432 of a shape-memory alloy exerting a force in the axial direction, a collar 1433 cooperating with the coil spring 1432 and a plug housing 1434 accommodating therein the split sleeve 1431, the coil spring 1432 and the collar 1433, and a connecting member 1435 for connecting the plug housing 1434 to the adapter housing 143.

The coil spring 1432 exerts a resilient force at the ordinary temperature or heated state determined by the initial shape. Thus, with cooling, the coil spring may extend and urge the ferule 142A in the axial direction thereof. Depending on the design of the connecting member 1435, it is possible to memorize the shape such the coil spring 1432 extends at the high temperature side.

Figure 83:
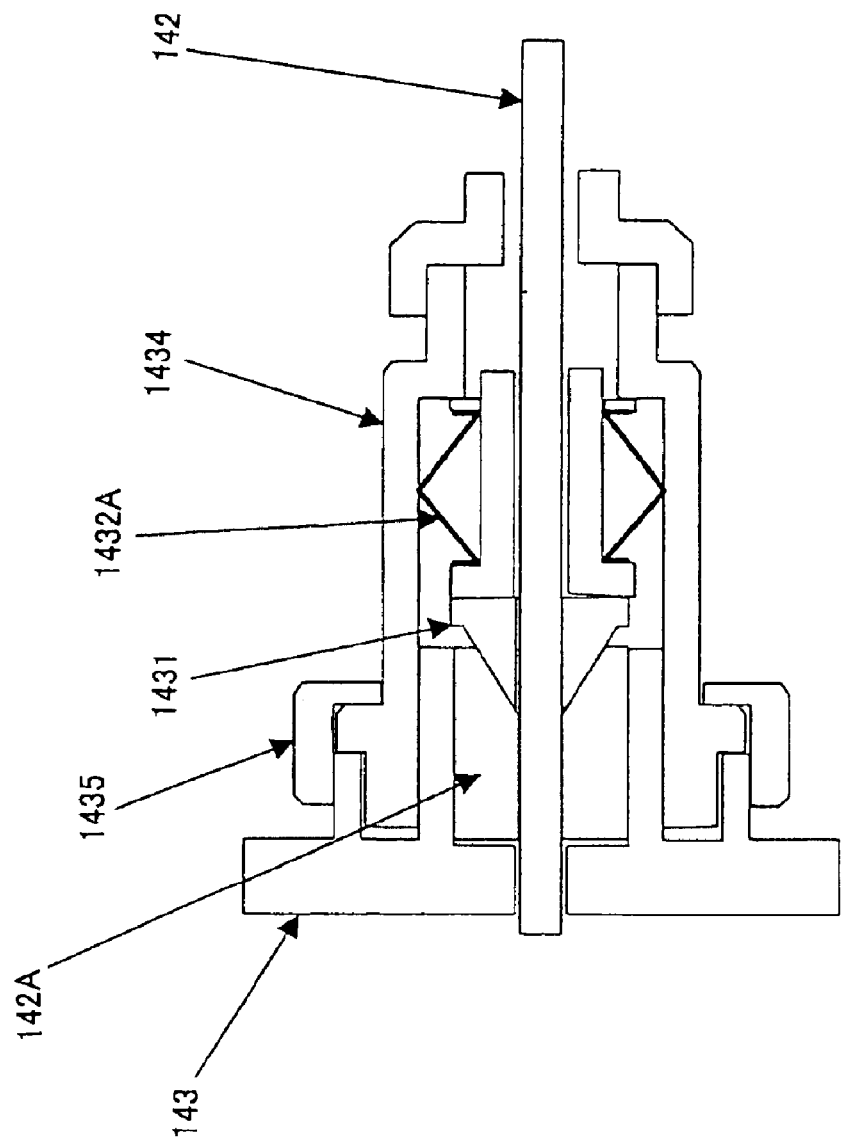
FIG. 83 is a cross-sectional view showing an optical coupling device that couples optically with a long-wavelength surface-emission laser diode according to an embodiment of this invention.

FIG. 83 shows a modification of FIG. 82, wherein those parts corresponding to the parts described previously are designated by the same reference numerals and the description thereof will be omitted.

Referring to FIG. 83, the coil spring 1432 of the shape-memory alloy is replaced with a leaf spring 1432A of a shape-memory alloy and the leaf spring exerts a resilient force at the ordinary temperature or at the heated state determined by the initial shape of the spring. Thus, the leaf spring 1432A may extend with cooling and urge the optical fiber 142 in the axial direction thereof. Depending on the design of the connecting member 1435, the leaf spring 1432A may extend at the high temperature side.

It should be noted that the spring 1432 or 1432A is not limited to a shape-memory alloy but may be formed of a shape-memory plastic. In such a connection module, there exists a temperature difference between the temperature in which the optical telecommunication system is assembled (generally higher than the room temperature) and the temperature (room temperature) in which the system is used.

Because of this temperature difference, the shape-memory material changes the shape thereof and generates a resilient force in the state that the member is assembled in a structural body. It should be noted that the sense of temperature change (between the state in which the system is assembled and the state in which the system is used) may be reversed.

Figure 84:
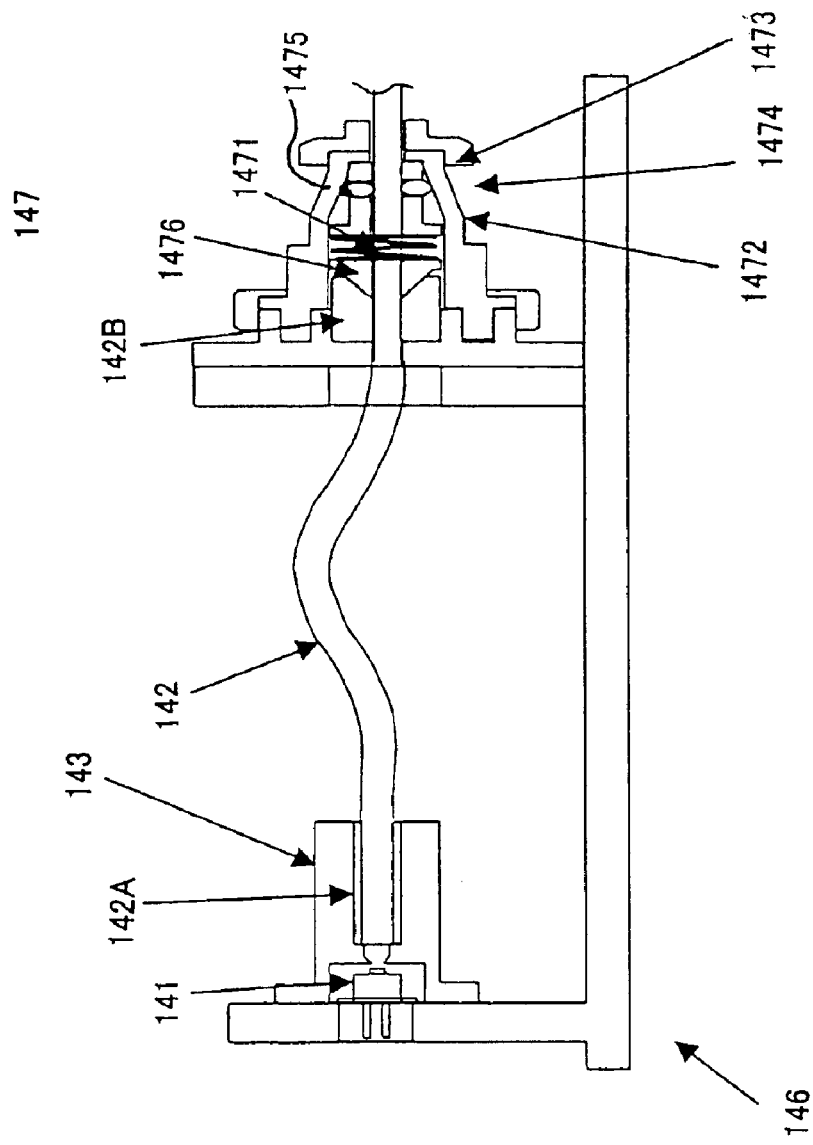
FIG. 84 is a cross-sectional view showing an optical fiber fixation apparatus used with a long-wavelength surface-emission laser diode according to an embodiment of this invention.

FIG. 84 shows another example of the telecommunication system that uses the long-wavelength laser diode according to the present invention, wherein those parts corresponding to the parts described previously are designated by the same reference numerals and the description thereof will be omitted.

Referring to FIG. 84, the telecommunication system of the present embodiment is formed of a laser module 141 carrying the laser diode chip 32, a ferule 142A for fixing the optical fiber 142, an adapter housing 143 accommodating the ferule 142A therein together with the optical fiber 142, a fixing apparatus 147 holding and fixing a part of the optical fiber 142, and a base 146 fixing the adapter housing 143 and the fixing apparatus 147 and the laser module 141 as an integral body. Thereby, the telecommunication system of FIG. 67 provides a bend to the optical fiber 142 between the adapter housing 143 and the optical fiber fixing apparatus 147.

The optical fiber fixing apparatus 147 is a device that uses a frictional grip compression and includes a shape-memory alloy compressional spring 1471, a collar 1472 cooperating with the spring 1471, another collar 1473, a ball 1474 disposed between the collars 1472 and 1473, and a housing 1475 having a conical surface in contact with the ball 1474. In the housing 1475, the ferule 142B holding the optical fiber 142 and the split sleeve 1476 are accommodated in the state that the shape-memory alloy spring 1471 intervenes between the collar 1472 and the split sleeve 1476.

In the optical telecommunication system of such a construction, the fiber 142 urges a force acting in the left and right directions upon thermal deformation, while such an urging force pushes the ball 1474 in the optical fiber fixing apparatus 147 in the right direction by the action of the compressional spring 1471. Thus, the optical fiber 142 cannot move in the right direction and exerts a force to the side of the adapter housing at the opposite side.

In the example of FIG. 63, the optical fiber 142 is provided with a bend and the optical fiber 142 urges the optical fiber 142 in the direction of the laser diode chip 32 as a result of the resilient force associated with the bend of the optical fiber 142. In the example of FIG. 84, the resilient force of the optical fiber 142 is boosted with the superimposed resilient force of the spring 147 of the shape memory alloy, and the optical fiber 142 is urged more effectively to the direction of the laser diode chip 32.

Figure 85:
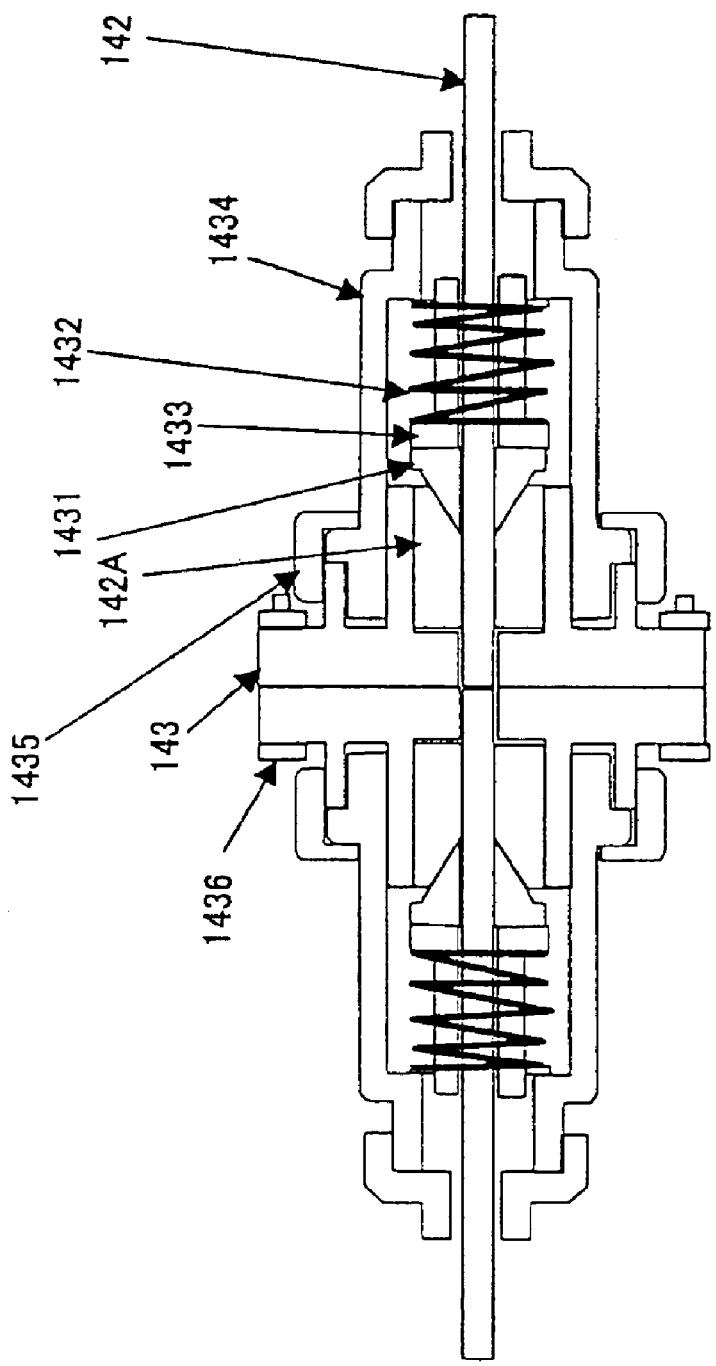
FIG. 85 is a cross-sectional view showing the structure of an optical coupling device.

FIG. 85 shows the optical connector formed of the tapered split sleeve 1431, the ferule 142A holding the optical fiber 142, the coil spring 1432 applying an axial urging force to the ferule 142A, the collar 1433, a plug housing 1434 accommodating therein the split sleeve 1431, the coil spring 1432 and the collar 1433, and the adapter housing accommodating the ferule 142B and the plug housing 147, wherein the optical connector having such a construction is connected with another optical connector by connecting the respective connector housings 143 with each other by way of a connecting screw 1436.

In the construction of FIG. 65, it should be noted that the coil spring 1432 exerts an urging force at the normal temperature as a result of the initial shape thereof. Thus, the coil spring 1432 is extended at the normal temperature change, and the ferule 142A is urged in the direction of the axis of the optical fiber 142. Thereby, two optical fibers are connected effectively. In this example, too, it is possible to use various shape memory alloys and shape memory plastics. In the example noted above, the present invention was explained with reference to the example that uses a shape-memory alloy for the spring. However, it is possible to use an ordinary resilient material such as copper bronze or urethane foam. By using such well-known art, it is possible to reduce the cost of the module.

[Fifteenth Embodiment]

Next, a further embodiment of the present invention will be explained.

Figure 86:
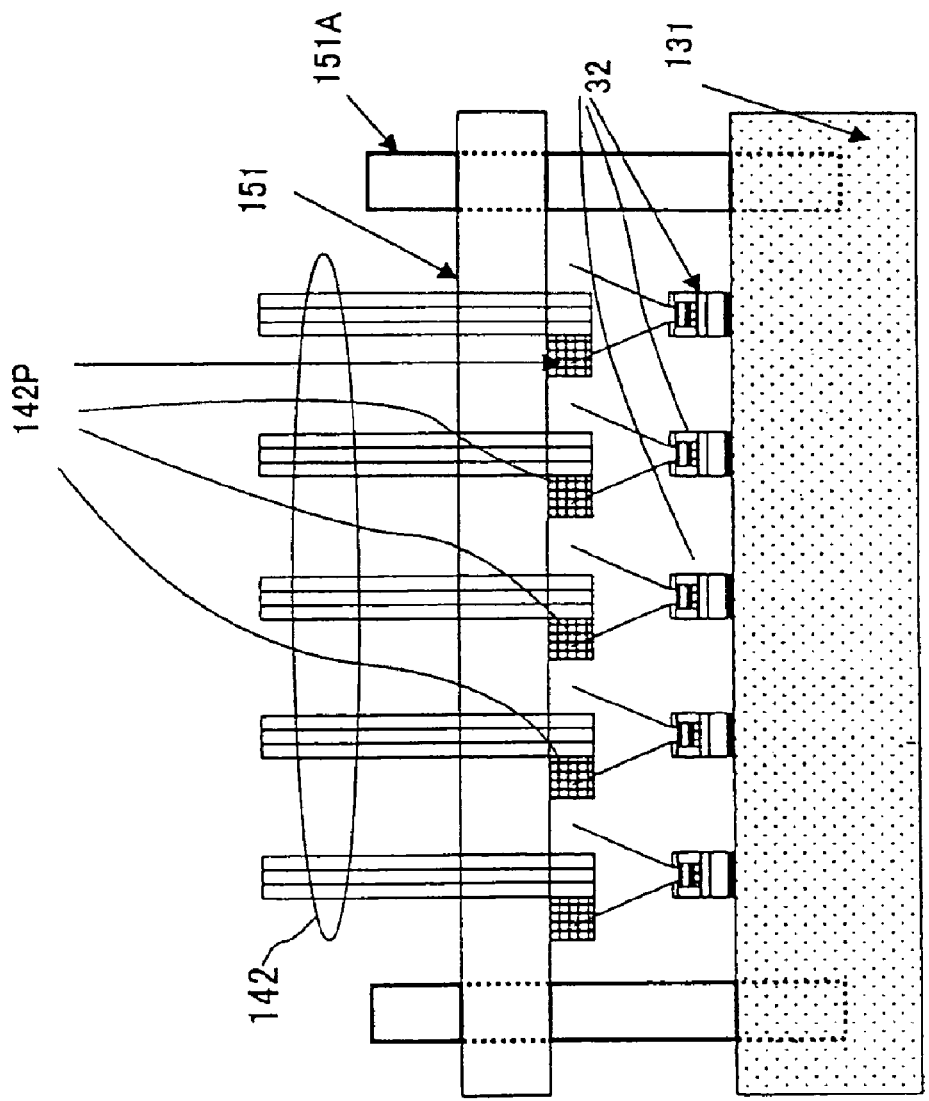
FIG. 86 is a diagram showing a positional relationship between a monitor photodetection device and a surface-emission laser diode in an optical-fiber telecommunication system that uses the long-wavelength surface-emission laser diode according to an embodiment of this invention.

FIG. 86 shows an example of the construction of the optical transmission part that is provided with the optical telecommunication system that uses the surface-emission laser diode of the present invention. In FIG. 86, those parts explained previously are designated by the same reference numerals and the description thereof will be omitted.

FIG. 86 is referred to.

In the present embodiment, a connector substrate 151 holding plural optical fibers 142 on the mount substrate 131 is provided such that each of the plural surface-emission laser diodes 32 forming a part of the array opposes with a corresponding one the plural optical fibers 142. Further, plural photodetection devices 142P are provided on the connector substrate 151 so as to monitor the optical power of the surface-emission laser diodes 32, such that the photodetection devices 142P correspond respectively to the plural optical fibers 142. Each of the photodetection device 142P is provided as it face the corresponding surface-emission laser diode 32 for detecting the optical beam emitted therefrom.

In FIG. 86, it can be seen that the laser diode chips 32, the optical fibers 142 and the monitoring photodetectors 142P are arranged to form a one-dimensional array. However, a similar effect is achieved also when the photodetectors 142P are disposed in a two-dimensional array. In this drawing, each of the laser diodes is represented as an independent chip 32. However, the laser diodes may be the one formed on a common chip 32.

In FIG. 86, illustration of the driver circuit of the surface-emission laser diode 32 or the laser output control circuit for feedback control of the laser output based on the signals acquired from the driver circuit or monitoring photodetection device is omitted for the sake of simplicity.

In the example of FIG. 86, the connector substrate 151 holds the optical fiber 142 and is mounted on the mount substrate 131 by using a connector guide 151A.

Each of the optical fibers is held in a penetrating hole provided in the connector substrate surface 151 so that the end surface of the optical fiber faces a corresponding laser diode element 32A in the laser diode chip 32. Further, each laser diode elements 32A and the corresponding optical fiber 142 are aligned optically. Further, there is provided a monitoring photodetector 142P in the vicinity of the optical fiber insertion hole of the connector substrate 151.

Here, the majority of the laser beam emitted from the surface-emission laser diode is infected into the optical fiber 142 aligned to the laser diode. On the other hand, the part of the laser beam failed to enter the optical fiber 142 is detected by the photodetection device 142P.

Figure 87:
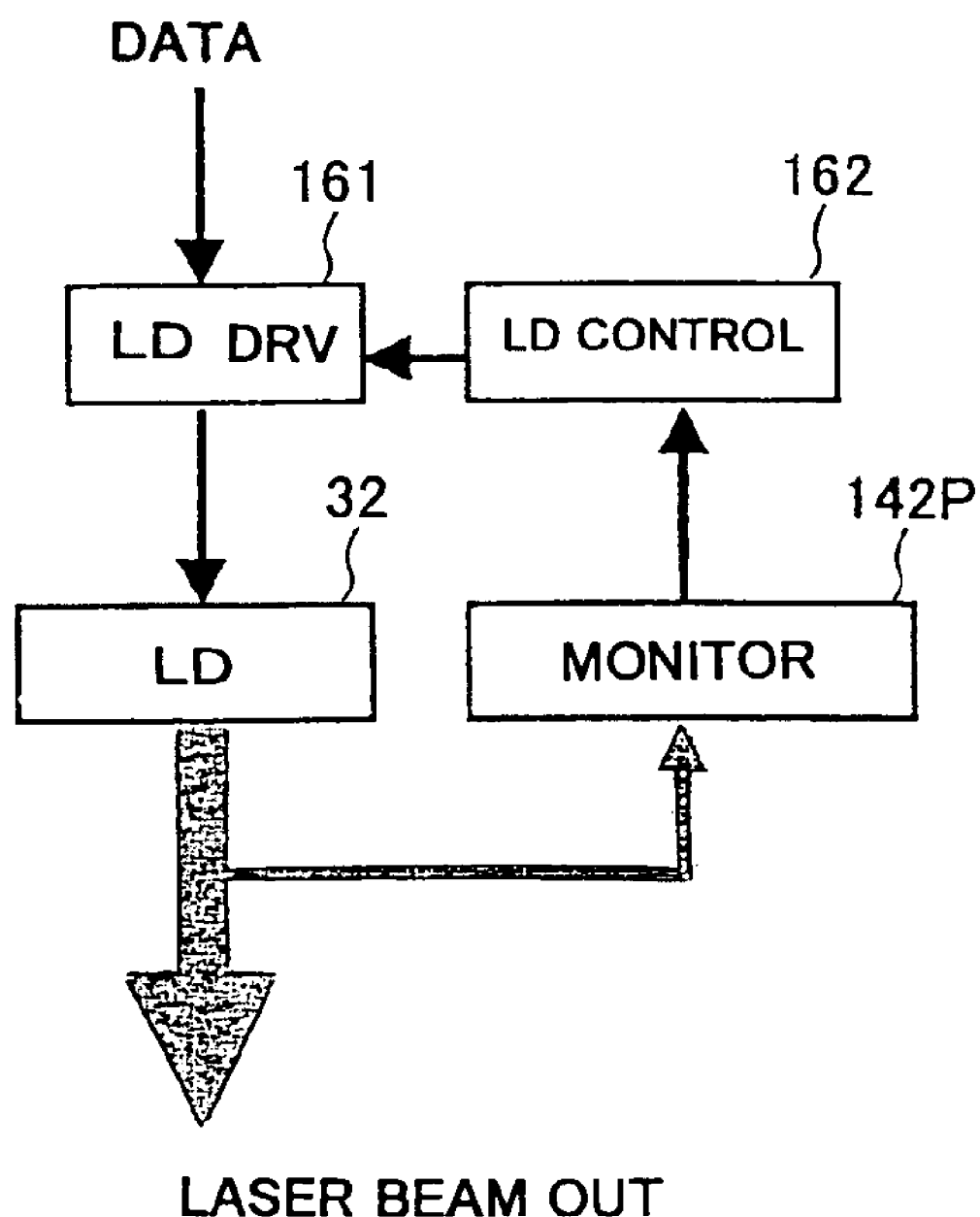
FIG. 87 is a block diagram showing the constitution of a control circuit that controls output of a surface-emission laser diode according to an embodiment of this invention.

FIG. 87 shows the block diagram of the control system that stabilizes the output of the surface-emission laser diode 32 by using the monitoring photodetector 142P shown in FIG. 86.

Referring to FIG. 87, the surface-emission laser diode 32 is driven by a laser drive circuit 161 to which the data signal (electrical signal) is supplied, and there is formed a laser bean as a result. A part of the laser beam thus formed is detected as the leakage light, and the output electrical signal of the photodetector 142P is supplied to a feedback control circuit 162. The feedback control circuit 162 in turn controls the laser driver circuit 161 so as to compensate for the change of the output electrical signal of the photodetection device 142.

It should be noted that no strong optical power is needed for the laser beam detected by the monitoring photodetector 142P, as the monitoring photodetector merely detects the change of the laser output for feedback control. From the viewpoint of long range optical telecommunication, it is preferable that most of the optical power is injected into the optical fiber, while the system of using the feeble leakage light at the incident end of the optical fiber 142 is sufficiently practical.

Figure 88:
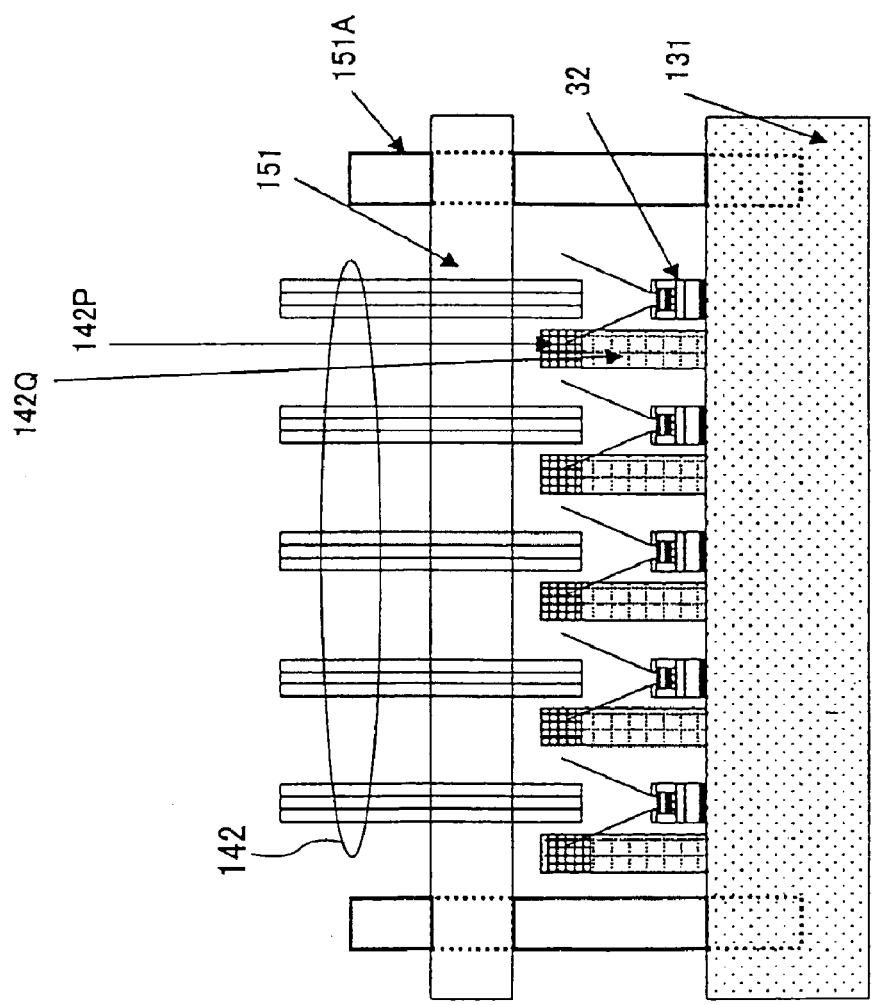
FIG. 88 is a diagram showing the constitution of an optical-fiber telecommunication system that uses a long-wavelength surface-emission laser diode according to an embodiment of this invention.

FIG. 88 shows another embodiment of the present invention.

Referring to FIG. 88, the monitoring photodetector 142P is formed between the surface emission laser diode chip 32 and the connector substrate 151 in the vicinity of the incident end of the optical fiber 142 facing the laser diode chip 32. Similar to FIG. 86, the laser diodes 32, the optical fibers 142 and the photodetection devices 142P are arranged in a one-dimensional array, while the present invention is not limited to such a specific case but is applicable also to the case in which there is formed a two-dimensional array on the mount substrate 131. Similarly to the explanation above, each of the laser diodes is represented as a chip, while it is also possible to form a number of laser diode emission parts 32A on a single chip 32 monolithically as a laser diode element. In view of simplicity of illustration, the driver circuit and the laser output control circuit are not illustrated.

In the example of FIG. 88, the monitoring photodetector 142P is provided between the substrate 131 and the connector substrate 151 in the form supported on a support member 142W, contrary to the case of FIG. 86.

Figure 89:
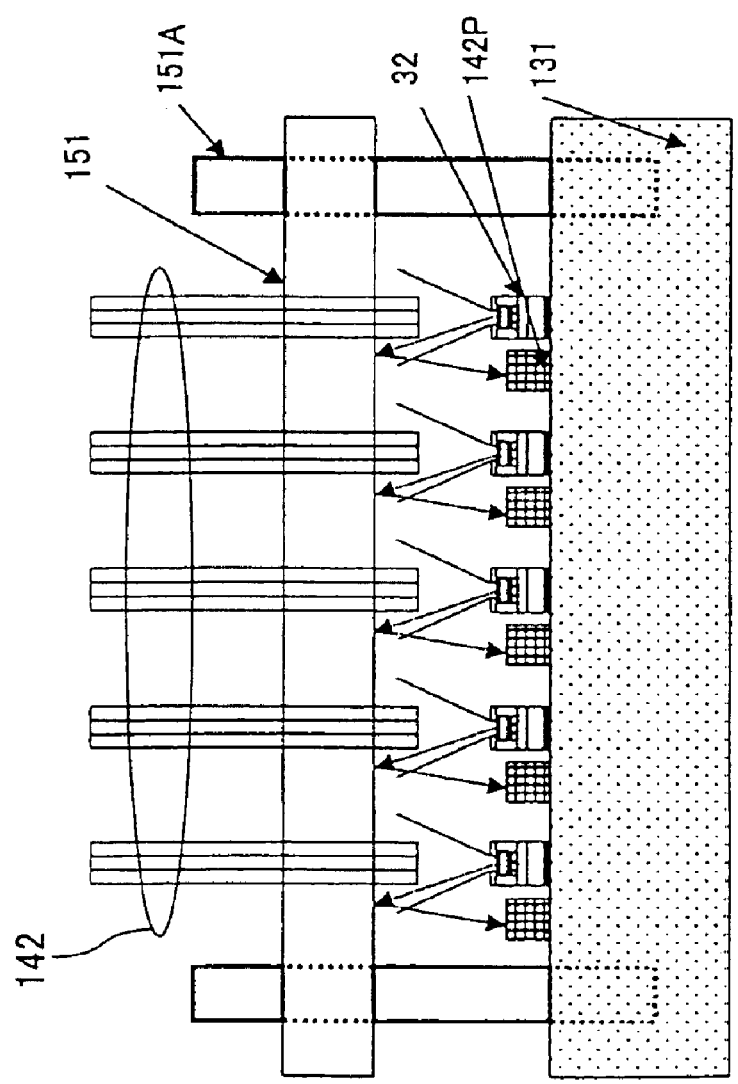
FIG. 89 is a schematic diagram showing the constitution of an optical-fiber telecommunication system that uses a long-wavelength surface-emission laser diode according to an embodiment of this invention.

FIG. 89 shows a further embodiment of the present invention.

Referring to FIG. 89, the monitoring photodetectors 142P are disposed on the mount substrate 131 together with the surface-emission laser diode chip 32 and detects a part of the optical beam reflected by the connector substrate 131. In this embodiment, too, it is possible to form a number of laser diode elements 32A in a laser diode chip 32 and form the photodetectors 142P also on the chip 32 monolithically adjacent to the laser diode elements 142P.

According to the latter construction, the laser diode elements 32A and the photodetectors 142F are formed simultaneously and with high precision. Further, the cost of assembling is reduced. In FIG. 89, too, the illustration of the driver circuit of the laser diode 32 or the output control circuit is omitted for the sake of simplicity.

In the present embodiment, most of the laser beam emitted from the surface-emission laser diode 32 is injected into the optical fiber 142 coupled optically to the laser diode 32. Thereby, the part of the laser beam failed to enter the optical fiber 142 is reflected at the bottom surface of the connector substrate and enters the photodetection device 142P. Thus, in the present embodiment, too, it is possible to control the output of the laser diode 32 by using the leakage light at the incident end of the optical fiber 142.

Next, another embodiment of the present invention will be described with reference to FIG. 90.

Figure 90:
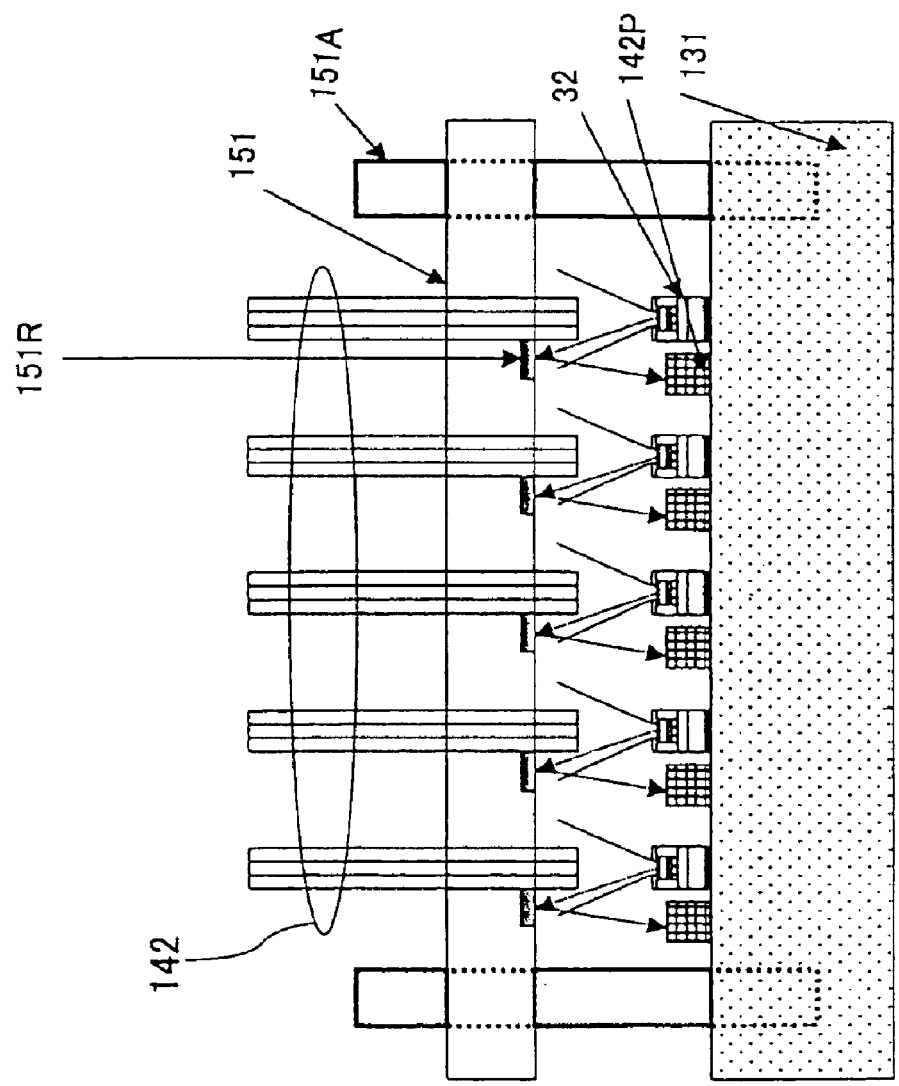
FIG. 90 is a diagram showing a monitor photodetection device, a reflection surface and a surface-emission laser diode of an optical-fiber telecommunication system that uses the long-wavelength surface-emission laser diode according to an embodiment of this invention.

Referring to FIG. 90, it can be seen that the relationship between the laser diode 32 and the monitoring photodetector 142P is the same as in the case of FIG. 89 except that there is provided a reflector 151R at the bottom surface of the connector substrate 151 for improving the efficiency of reflection.

Such a reflector 151R can be formed by providing a metal film of Al, Ag or Au on the bottom surface of the connector substrate 151 that faces the laser diode 32. In order to reflect the optical beam of long wavelength, it is preferable to use a metal film of Au.

In the present embodiment, too, it is possible to control the laser output of the surface-emission laser diode by using a leakage light which has failed to enter the optical fiber in the vicinity of the optical fiber, similarly to the previous embodiments. As a result of the use of reflector, the optical output control is achieved with improved precision with weaker power of the reflection light.

[Sixteenth Embodiment]

Next, a further embodiment will be described.

Figure 91:
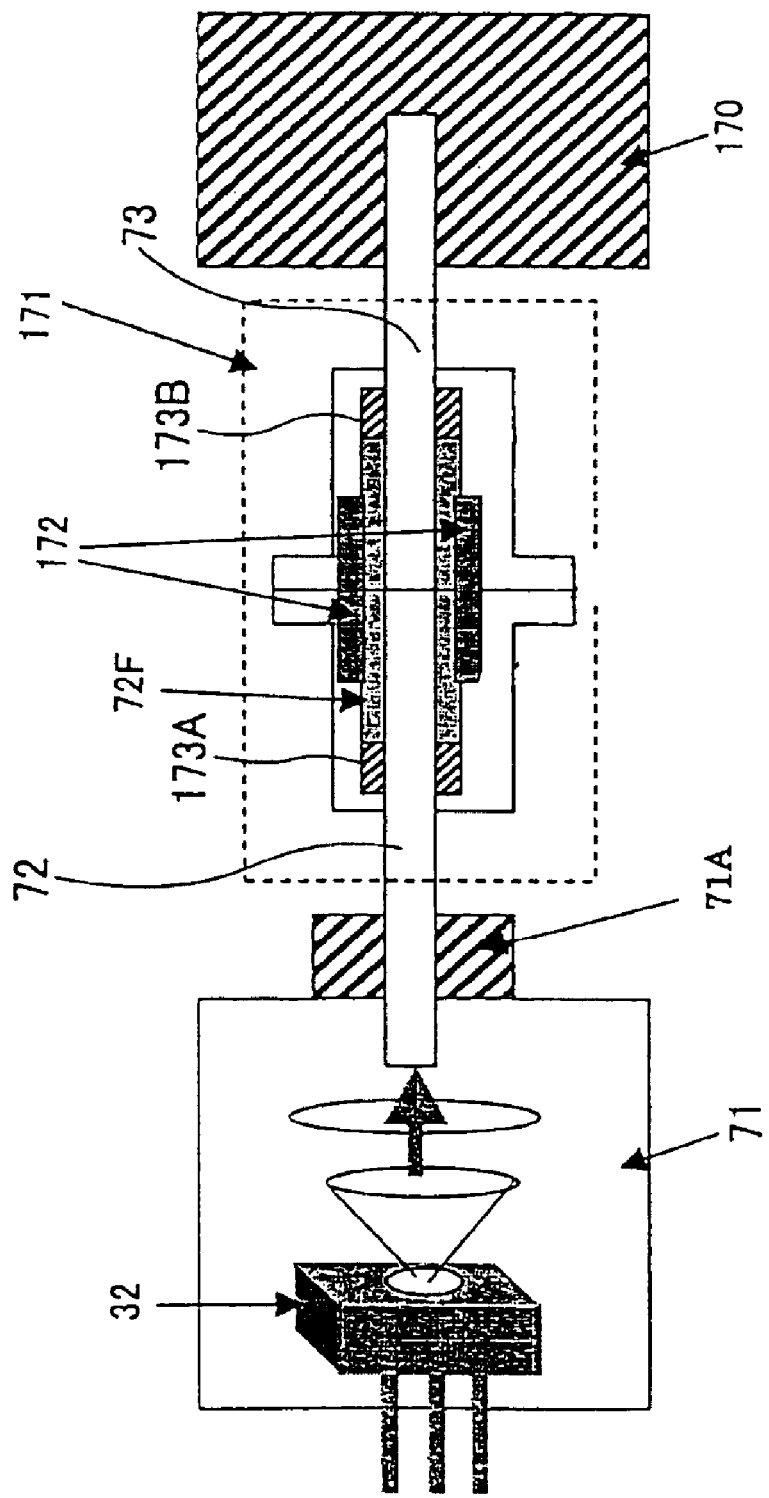
FIG. 91 is a diagram showing then constitution of an optical-fiber telecommunication system formed of a long-wavelength surface-emission laser diode, an optical fiber and an optical connector according to an embodiment of this invention.

FIG. 91 shows an example of the optical telecommunication system that uses a long-wavelength laser diode of the present invention. More specifically FIG. 91 shows the construction in which the optical fiber 72 extending out from the module package 71, in which the laser diode chip 32 is accommodated, is connected to the optical fiber 73 of the optical telecommunication system. In FIG. 91, those parts corresponding to the parts described previously are designated by the same reference numerals and the description thereof will be omitted.

Referring to FIG. 74, the optical fiber 72 drawn out from the module package 71 is connected to the optical fiber 73 used for optical telecommunication at the optical connector 171. When there exists air at the connection part, there arises a reflection of the optical beam in view of the difference of refractive index of the air with respect to the refractive index of the optical fiber 72 or 73. In order to suppress such a fluctuation of refractive index a the optical fiber connection part, there are proposals to inject a refractive index is matcher in the form of a gel so as to suppress the fluctuation of the refractive index or to achieve a complete attachment of the optical fibers (PC: physical contact). The present invention uses this PC technology for the connection of the optical fibers.

As represented in FIG. 91, the optical fibers 72 and the optical fibers 73 are held in the connector 171 respectively by a ferule 72F and a ferule 73F for preventing damaging of the optical fibers. The ferules 72F and 73F are formed of a cylindrical body of a zirconia ceramic that has a large mechanical strength. Thereby, the optical fibers are inserted into the central hollow part, and fixed therein by using an adhesive. Further, the ferules 72F and 73F are held in the optical connector 171 by a pair of split sleeves 172.

Figure 92:
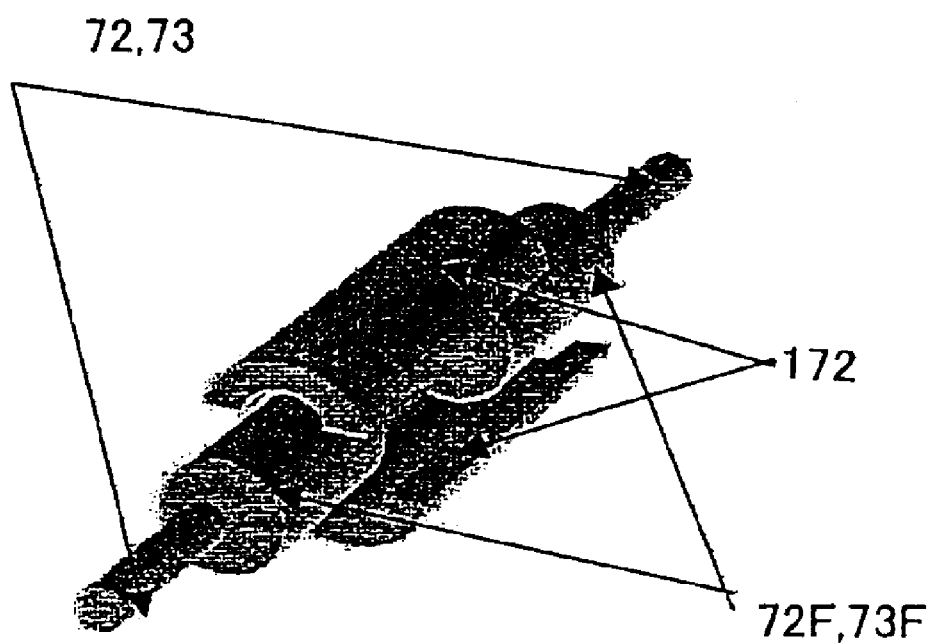
FIG. 92 is a diagram showing the positional relationship between an optical fiber, a ferule and divided sleeves according to an embodiment of this invention.

FIG. 92 shows the relationship between the optical fibers 72 and 73, the ferules 72F and 73F and the split sleeve 172.

Referring to FIG. 92, the split sleeve 172 consists of a pair of members formed of a copper bronze and having the shape of being split from a hollow cylinder.

As represented in FIG. 92, a pair of split sleeve members 172 holds the ferules 72F and 73F, and the ferules 72F and 73F are urged with each other by respective springs 173A and 173B with a predetermined force. Thereby, there is formed the desired PC connection. In the present embodiment, it is possible to construct a rigid and highly reliable optical connection.

Generally, a laser diode is provided with a safety standard for preventing damages to human body. In the case of the surface-emission laser diode of 1.1–1.7 $\mu$m, it is possible to satisfy the safety standard while operating the laser diode with a large output power as compared with the laser diode having the oscillation wavelength in the visible wavelength band (0.4–0.7 $\mu$).

[Seventeenth Embodiment]

Next, another feature of the present invention will be described of the coupling between the laser diode and optical fiber or laser diode and optical waveguide.

Figure 93:
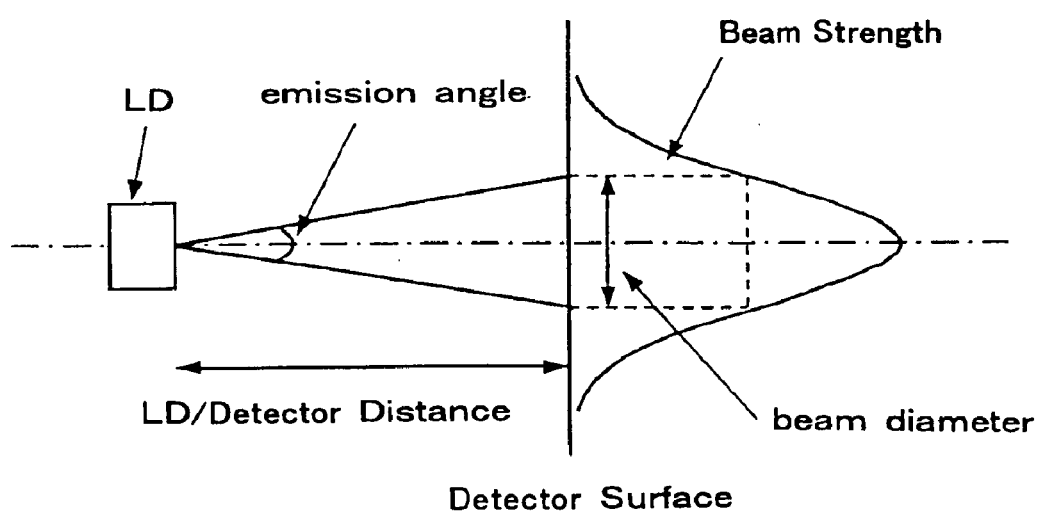
FIG. 93 is a diagram showing the relationship between a light emission angle and beam diameter in a long-wavelength surface-emission laser diode according to an embodiment of this invention.

As represented in FIG. 93, the laser beam of the surface emission laser diode emitted perpendicularly to the substrate has a optical intensity distribution generally close the Gauss distribution profile in the plane perpendicular to the optical axis.

Assuming that the beam diameter is equal to the FWHM (full-width half-height) value of the beam profile, it is possible to evaluate the emission angle $\theta$ of the optical beam from the beam diameter and the distance between the laser diode and the detection surface.

As a result, it turned out that the emission angle $\theta$ of the surface-emission laser diode of the present invention is generally symmetric about the optical axis and takes a value of 5–10 degrees.

In contrast to this, conventional laser diode of the edge-emission type having the same oscillation wavelength of 1.1–1.7 $\mu$m has a much larger emission angle $\theta$ and a very large aspect ratio. Typically, the optical emission angle $\theta\perp$ has a value of about 35 degrees in the direction vertical to the plane of the substrate and the optical emission angle $\theta//$ parallel to the place of the substrate takes the value of about 25 degrees. Thus, it has been necessary to use an optical element such as a microlens for realizing high efficiency optical coupling.

In contrast to this, in the case of the surface-emission laser diode of the present invention, is the angle of optical emission $\theta$ is very small as noted above, and the spreading of the optical beam is minimized even in the case there is a large distance between the laser diode and the optical fiber or between the laser diode and the optical waveguide. Thereby, it becomes possible to eliminate the microlens, while the removal of the microlens provides an beneficial effect in that the distance between the laser diode and the optical fiber is reduced. Further, even in the case the distance between the laser diode and the optical fiber or the laser diode and the optical waveguide is large, the spreading of the optical beam is small and an efficient optical coupling becomes possible without providing an intervening lens.

Figure 94:
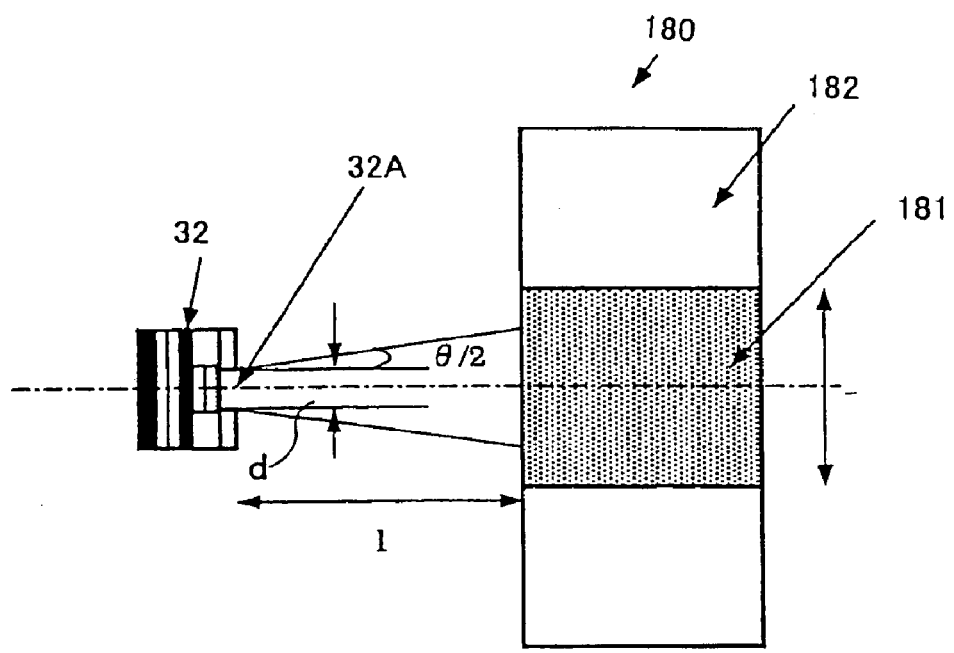
FIG. 94 is a diagram showing the relationship between beam spreading and a core diameter and an optical path length of a long-wavelength surface-emission laser diode according to an embodiment of this invention.
Figure 95:
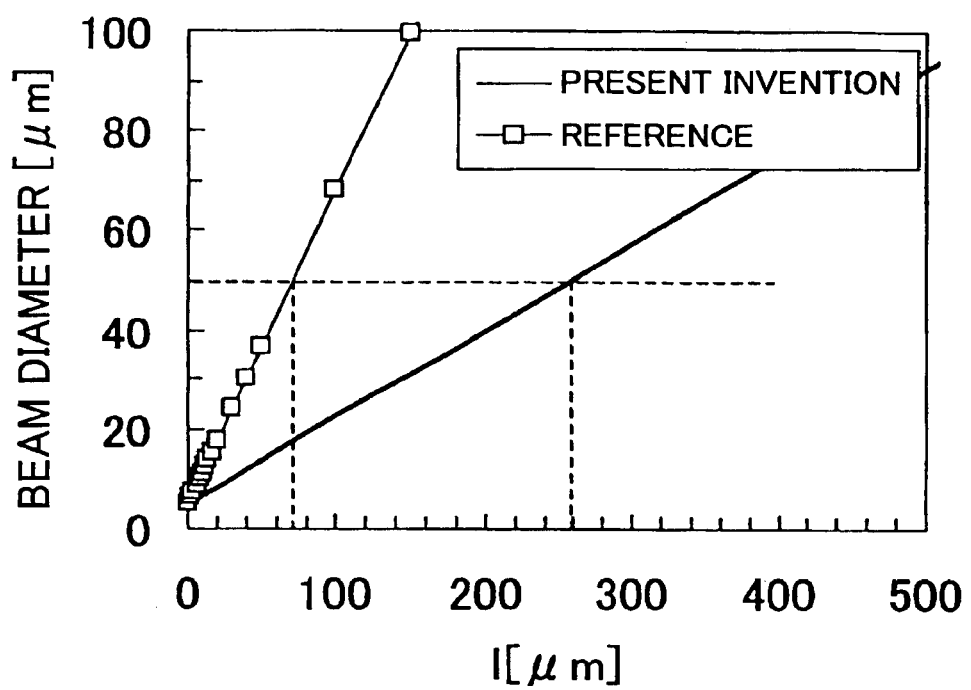
FIG. 95 is a diagram showing a calculation example of a relationship between a beam diameter and an optical path length of a long-wavelength surface-emission laser diode according to an embodiment of this invention.

FIG. 94 shows a schematic diagram with regard to spreading of the laser bean in the laser diode 32 of the present invention and FIG. 95 shows an example of calculation of beam spreading.

Referring to FIG. 94, the laser emission part 32A of the laser diode 32 has an aperture size d [$\mu$m] and the laser beam is emitted from the laser emission part 32A with an emission angle $\theta$. Further, there is provided an edge surface of the optical beam 180 at the position separated from the laser diode 32 with an optical length l [$\mu$m]. The optical fiber 180 includes a core 181 having a diameter X [$\mu$m] and a cladding 182 surrounding the core, and the optical fiber 180 is provided so as to align the laser diode optically such that the optical axis of the optical fiber 180 and the optical axis of the laser diode coincide with each other. Here, it should be noted that the diameter d of the aperture represents the diameter itself when the diameter has a circular shape, while in the case the diameter has a square shape, the diameter d represents the length of one edge. Further, when the opening has other shape such as a rectangle, the diameter d represents the diameter of a circle having an area of an ellipse inscribing the rectangular opening.

The reason that the optical path length between the laser diode and the optical fiber edge or optical waveguide edge is to include the case of using a mirror for deflecting the optical beam to be described later with reference to FIG. 97. When there is no such a deflection of the optical path and the optical beam propagates straight, the optical path length from the laser diode to the optical fiber edge or the optical waveguide edge becomes identical with the distance from the laser diode to the optical fiber edge or the optical waveguide edge. In the case of an optical waveguide, it is general that the core cross-section is not a circle but a square or rectangle. Thus, in the case of a square core, the edge size is set as X [$\mu$m], while in the case of a rectangular core, the size of the shorter edge is defined as X [$\mu$m].

In FIG. 94, it can be seen that the beam size of the optical beam emitted from the laser diode perpendicularly to the epitaxial layers therein, the beam diameter of the laser beam increases with the optical path length L and the optical emission angle $\theta$ until it reaches the edge surface of the optical fiber or optical waveguide. Thereby, the beam size at the optical fiber edge or the optical waveguide edge is given as $$d+2l\,\tan(\theta/2).$$

Thus, when this beam size falls in the core diameter X of the optical fiber or the optical waveguide, excellent optical coupling is achieved.

Based on the above equation, FIG. 95 shows the relationship between the optical path length l and the beam diameter for the case of the aperture diameter of 5 $\mu$m and the optical emission angle of 10 degrees, in comparison with the conventional case of an edge-emission type laser diode having an optical emission angle of 35 degrees.

Referring to FIG. 95, it can be seen that the spreading of the beam diameter is substantially small as compared with the conventional case and that it is possible to coincide the core diameter X and the beam diameter in the case a commonly used multimode optical fiber having a core diameter of 50 $\mu$m (cladding diameter of 125 $\mu$m) is used for the optical fiber, provided that the optical path length l is set to 260 $\mu$m.

As long as the optical path length l is smaller than the foregoing length in which the core diameter X coincide with the beam diameter, it is possible to achieve an excellent optical coupling with little optical loss. From the result of FIG. 95, it is concluded that the optical alignment between the laser diode and the optical fiber or optical waveguide is not critical in the axial direction in the case of the laser diode of the present invention, and a very coarse alignment is sufficient for achieving the necessary optical coupling. In the case of a plastic optical fiber having a core diameter of 100 $\mu$m is used, the optical path length l in which the laser beam diameter coincides with the core diameter increases further to 550 $\mu$m. Thereby, it is possible to provide the optical fiber with a separation from the laser diode package.

Figure 96:
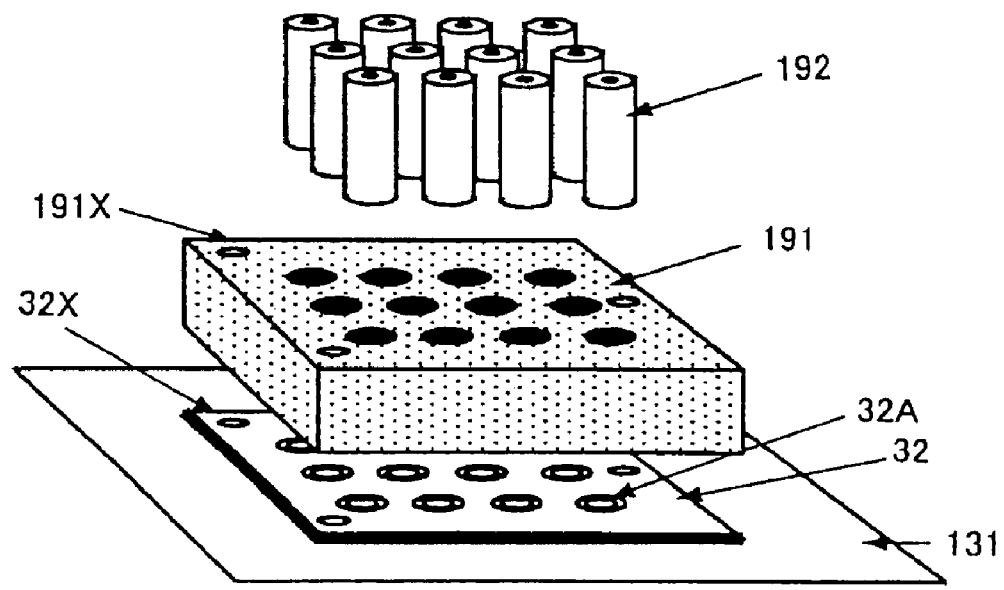
FIG. 96 is a diagram showing the constitution of a connection part of a laser diode and an optical fiber of an optical-fiber telecommunication system that uses a long-wavelength surface-emission laser diode according to an embodiment of this invention.

FIG. 96 shows an example of coupling an optical fiber of an optical telecommunication system with the surface-emission laser diode of the present invention. In FIG. 96, those parts corresponding to the parts described previously are designated by the same reference numerals and the description thereof will be omitted.

Referring to FIG. 96, the telecommunication system includes the mount substrate 131 carrying thereon the surface-emission laser diode chip 32 in which the laser diodes 32A are formed as a two-dimensional array, and the mount substrate 131 further carriers a driver circuit of the laser diode not illustrated. Further, there are provided a two-dimensional array of photodetectors (not shown) as well as the driver circuit not illustrated cooperating with the photodetectors, wherein an optical fiber array including optical fibers 191 is provided on the laser diode chip 32 such that each of the optical fibers 191 face a corresponding laser diode 32A. It is also possible to use an optical waveguide array in place of the optical fiber array in the construction of FIG. 96. Further, the optical telecommunication system of FIG. 96 may be a bi-directional optical telecommunication system. In this case, the optical transmission part and photodetection part are provided at both ends of the optical fibers.

Referring to FIG. 96, the mount substrate 131 is formed of a thermally conductive Si substrate and the laser array chip 32 is mounted on the mount substrate 131. The laser array chip 32 may contain the laser diode of FIG. 1 as a laser diode element constituting the array. In the illustrated example, the laser diodes having an oscillation wavelength of 1.3 $\mu$m is used, wherein each of the laser diodes 32A has an aperture having the diameter of 10 $\mu$m for optical output. Twelve laser diodes 32A are formed on the mount substrate 131 with a pitch of 200 $\mu$m.

On the mount substrate 131, there is provided a hole array member 191 having a number of penetrating holes with a pitch of 200 $\mu$m in correspondence to the pitch of the laser diodes 32A on the chip 32, wherein each of the holes has a diameter of 125 $\mu$m in correspondence to the diameter of the multimode optical fibers. The hole array member 191 may be formed of AlN and carries a guide 191X in correspondence to a marker 32X provided on the laser diode chip 32. Thereby, the hole array member 191 is mounted on the laser diode chip 32 such that the guide 191X coincides with the marker 32X. The hole array member 191 has an excellent thermal conductivity of about 300 Wm$^{-1}$K$^{-1}$ and is used as an effective heat radiation part when it is provide close to the laser diode chip 32. Thereby, a stable optical telecommunication system is realized by dissipating the heat associated with the laser oscillation efficiently.

In each of the penetrating holes of the hole array member 191, a multimode optical fiber 192 is inserted and the optical fiber is fixed therein by an adhesive in the state that the optical fiber engages the laser diode chip 32. With such a construction, it is possible to achieve an exact alignment between the laser diode element 32A and the optical fiber 1691 in the direction perpendicular to the optical axis direction.

As noted above, the optical fiber 191 is merely contacted with the chip 32 and the accuracy of optical alignment in the axial direction is poor. There can be a case in which a space of 0–20 $\mu$m may be formed between the laser diode and the optical fiber. However, because of the very small emission angle $\theta$ of the laser diode of 8 degrees in the present example, and in view of the large diameter d of 10 $\mu$m for the laser diode 32A, the optical beam diameter is only 17 $\mu$m at the distance of 50 $\mu$m from the surface of the laser diode chip 32. Thus, the beam diameter is still much smaller than the core diameter of 50 $\mu$m for the multimode optical fiber 192, and excellent optical coupling is maintained. Further, there is no need of providing a coupling lens between the laser diode 32A and the optical fiber 191.

In the experiment conducted on the construction of FIG. 96 in which the optical fiber 191 is pulled out gradually after being contacted with the laser diode chip 32 by using a micrometer, it was confirmed that the laser diameter becomes 66 $\mu$m when the distance between the laser diode and the optical fiber is 66 $\mu$m. In this case, the optical beam diameter is larger than the core diameter of the multimode optical fiber 191 and the foregoing relationship is failed. Thus, no sufficient optical coupling would be achieved in this case.

Table 7 below represents the experiments conducted by the inventor.

TABLE 7

| d + 2l tan ($\theta$/2) [$\mu$m] | X ($\mu$m) | remarks |
| --- | --- | --- |
| 10 | 50 | ○ |
| 20 | 50 | ○ |
| 30 | 50 | ○ |
| 40 | 50 | ○ |
| 50 | 50 | ○ |
| 60 | 50 | Δ |
| 70 | 50 | X |
| 80 | 50 | X |
| 10 | 62.5 | ○ |
| 20 | 62.5 | ○ |
| 30 | 62.5 | ○ |
| 40 | 62.5 | ○ |
| 50 | 62.5 | ○ |
| 60 | 62.5 | ○ |
| 70 | 62.5 | X |
| 80 | 62.5 | X |

○ good optical coupling, sufficient for practical use
Δ slightly degraded optical coupling, difficult for practical use
X poor optical coupling, cannot be used for practical applications From the result of above, it can be seen that a practical optical coupling cannot be achieved unless the core diameter X is larger than the term given as d+2l tan($\theta$/2), where $\theta$ is the emission angle of the optical beam and l represents the optical path length from the laser diode to the optical fiber, d represents the diameter of the laser diode opening.

In the explanation above, it should be noted that the number of the optical fibers is not limited to 12 but there may be only one optical fiber or there may be 4, 8, 16 optical fibers. Further, the present invention is not limited to a multimode fiber 191b but a single mode optical fiber may also be used for long distance transmission Further, it is possible to use a plastic optical fiber (POF), which is advantageous to construct a short distance, low const optical telecommunication system. In such a system, it is preferable to provide an anti-reflection coating on the edge surface of the optical fiber. In the present embodiment, it is also possible to use Si or C or alumina ceramics for the hole array member 191. As the hole array member 191 functions also as a heat radiation part, it is preferable to use a material having a high thermal conductivity.

[Eighteenth Embodiment]

Next, another feature of the present invention will be described of the coupling between the laser diode and optical fiber or laser diode and optical waveguide.

The construction of the present invention is similar to that of FIG. 96 except that the lser diode chip 32 and the optical fiber are contacted with each other and the distance between the laser diode chip 32 and the optical fiber 191 or optical waveguide is set to almost zero. Here, the representation "contact" also includes a separation of 0–10 $\mu$m by taking into consideration of the error at the time of the assembling process.

In the present embodiment, a Si substrate having good thermal conductivity is used for the mount substrate 131 and the laser array chip 32 including an array of surface-emission laser diodes 32A is mounted on the mount substrate 131. The laser diode 32A used in the present embodiment has a laser oscillation length of 1.3 $\mu$m.

In the present embodiment, the diameter of the laser diode is set to 10 $\mu$m and 12 laser diodes 32A are formed with a pitch of 200 $\mu$m.

Next, the multimode optical fibers 192 are inserted into the holes in the hole array member 191 having the penetrating holes of 125 μm diameter with the corresponding pitch of 200 μm. Thereby, the tip ends of the optical fibers 192 are projected slightly from the hole array member 191 such that the tip end of the optical fiber makes an engagement with the laser array chip 32.

Next, the tip end part of the optical fiber is polished, and the tip end of the optical fibers is aligned at the side of the hole array member 191 that makes a contact with the laser diode chip 32. After this, the marker X and the guide 191X are matched and the optical alignment is achieved between each of the laser diodes 32A and the corresponding optical fiber 192. The laser array chip 32 and the hole array member 191 are then fixed in this state, and the laser diode chip 32A and the optical fiber 192 are coupled with each other.

According to the present embodiment, an optical coupling better than the previous embodiment is achieved. Thus, in the present embodiment, there occurs little spreading of the optical beam and the laser beam diameter is more or less coincident with the diameter d of the aperture forming the laser diode 32A. Thus, the diameter of the laser beam is sufficiently smaller than the core diameter of the optical fiber 191 and the alignment margin in the axial direction is increased further. Thereby, it becomes possible to construct an optical system using a 1.3 μm surface emission laser diode with low cost.

[Nineteenth Embodiment]

FIGS. 97A and 97B are diagrams showing the coupling of the laser diode and an optical wave guide according to another embodiment of the present invention, wherein FIG. 97A shows an oblique view while FIG. 97B shows a cross-sectional view.

In the present embodiment, the laser beam emitted from a laser diode 32A is deflected by a mirror 301. In FIGS. 80A and 80B, those parts corresponding to the parts described previously are designated by the same reference numerals and the description thereof will be omitted.

Referring to FIGS. 97A and 97B, a Si substrate having an excellent thermal conductivity is used for the mount substrate 131, and the laser array chip 32 in which the laser diodes 32A are arranged in the form of an array is mounted on the mount substrate 131. In the present embodiment, each of the laser diodes 32A has an aperture with a diameter of 15 μm, and four laser diodes 32A are formed.

In this embodiment, another mount substrate 131A is provided in which a mirror 301 is formed by mounting a reflecting member or forming a reflecting layer monolithically. Further, an optical waveguide 302 is formed on the mount substrate 131A. For example, the mirror 301 may be formed by applying an anisotropic etching to the Si substrate by using a KOH etchant and by providing an Ag film on the crystal surface formed as a result of the anisotropic etching.

In the present embodiment, an optical waveguide 302 is formed on the mount substrate 131A. The optical waveguide 302 is formed by depositing a lower cladding layer 302A, followed by depositing a s polymethacrylate (PMMA), followed further with a patterning process to form a core pattern 302B. Typically, the core pattern 302B has a cross sectional form of 50×50 μm. Other than PMMA, the optical waveguide layer may be formed also by polyimide or epoxy resin or polyurethane or polyethylene Further, it is also possible to form an inorganic film such as silicon oxide film. Further, these organic films may be formed by a spin-coating process of dip-coating process in combination with a patterning process. Further, it is possible to form the optical waveguide by a resin molding process or molding process.

In the present embodiment, the mount substrate 131 and the mount substrate 131A carrying the optical waveguide 302 are fixed such that the optical axis of the laser diode 32A and the optical axis of the optical waveguide 302 become coincident.

In the experiments conducted by the inventor, a laser diode having an aperture of 15 μm diameter and the optical emission angle θ of 10 degrees is used, and the optical path length l between the laser diode 32A and the optical waveguide 302 is changed by setting the position of the end surface of the optical waveguide 302 to 50 μm, 100 μm and 250 μm As a result, it was confirmed that an excellent result is obtained in the case the optical path length is 50 μm and 100 μm, while no satisfactory optical coupling was achieved in the case the optical path length is set to 250 μm.

Anyway, the present embodiment can eliminate the lens and only a coarse optical alignment is sufficient for the axial direction Thus, by using a surface-emission laser diode of 1.2 μm, it becomes possible to construct an optical alignment having a tolerance with regard to the optical alignment in the axial direction or the direction of the optical axis.

In the present embodiment, the mirror 301 is formed separately to the optical waveguide 302. On the other hand, it is possible to form a 45 degree. surface at the end of the optical waveguide 302 by a dicing blade, and the like, and by depositing a metal film such as Ag on such an oblique surface. Thereby, a mirror integral with the optical waveguide 302 is formed.

In the present embodiment, the diameter of the optical waveguide is set to 50 μm in correspondence to core diameter of the multimode optical fiber. In the case a single mode optical fiber is used, the diameter of the optical waveguide has to be set to about 10 μm. In this case, too, the same fundamental equation holds. Further, it should be noted that the cross sectional form of the core pattern 302B in the optical waveguide 302 is not limited to the square pattern but a rectangular pattern may also be used. Further, it is possible to transmit plural optical signals in a single optical waveguide as in the case of an optical sheet.

[Twentieth Embodiments]

Figure 98:
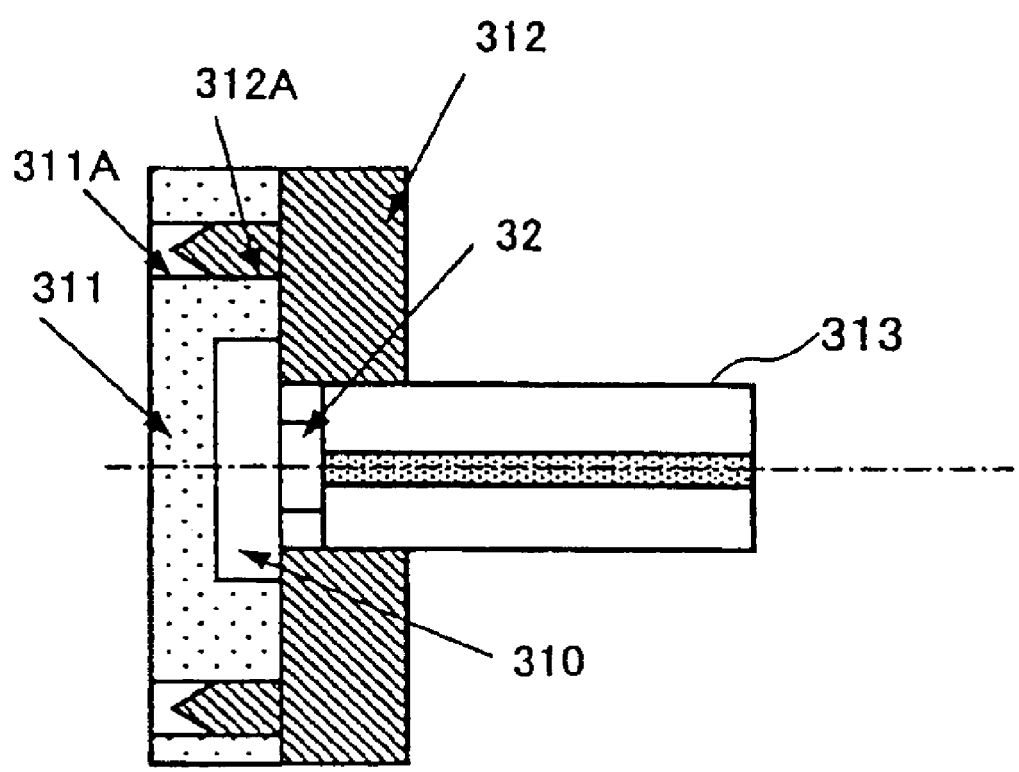
FIG. 98 is a diagram showing the constitution of a connection part of a laser diode and an optical waveguide in an optical-fiber telecommunication system that uses a long-wavelength surface-emission laser diode according to an embodiment of this invention.

FIG. 98 shows the construction of coupling the laser diode chip 32 with the optical waveguide 302 according to another embodiment of the present invention.

Referring to FIG. 98, a Si substrate having excellent thermal conductivity is used for the mount substrate 310 and the laser diode chip 32 carrying the laser diodes 32A of the structure of FIG. 1 is mounted on the substrate 310. In the present embodiment, too, a surface-emission laser diode having an oscillation wavelength of 1.3 μm is used for the laser diode 32A. The laser diode used in the preset embodiment has the aperture diameter d of 7 μm and the optical emission angle θ of 8 degrees. In the present embodiment, the laser diode 32A is used as a single device, not in the form of array.

The mount substrate 310 carrying thereon the laser diode chip 32 is fixed on a package body 311 with positioning. Further, the optical axis of the laser diode 32 is aligned with the optical axis of the single mode optical fiber 313 held on an optical fiber guide 312, by aligning the optical fiber guide 312 and the package 311 in advance by using a guide 311A on the package body 311 and a guide pin 312A on the optical guide 312.

The single mode optical fiber 313 includes a core 313A having a diameter of 10 μm and a clad having a diameter of 125 μm and surrounding the core 313A, wherein the diameter of the optical fiber guide 312 is set so as to coincide with the outer diameter of the cladding of the optical fiber 313.

In the construction of the present embodiment, an excellent optical coupling is achieved by contacting the single mode optical fiber 313 to the laser diode 32. Further, the present invention enables a broadband optical signal transmission by using the single mode optical fiber 313 over a long distance. Thus, according to the present embodiment, it became possible to construct an optical telecommunication system having excellent optical coupling by using the surface-emission laser diode of the 1.3 μm band.

[Twenty-First Embodiment]

Next, another embodiment of the present invention will be described.

Figure 99:
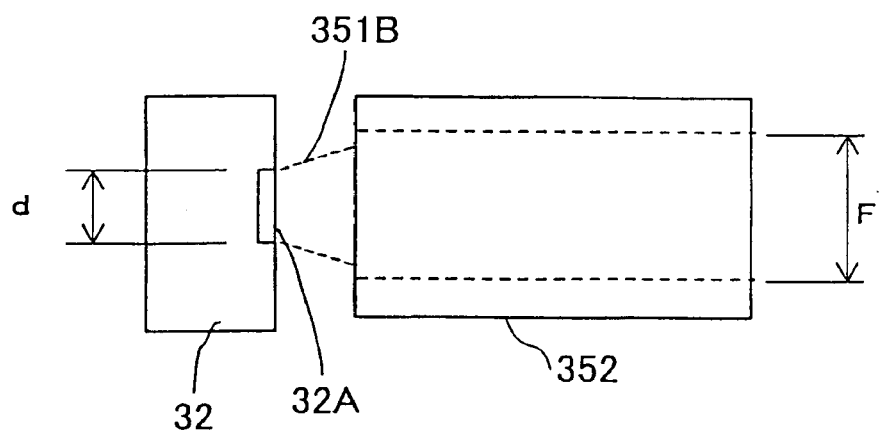
FIG. 99 is a diagram showing the constitution of an optical-fiber telecommunication system that uses a long-wavelength surface-emission laser diode of an embodiment of this invention in which the laser diode and the optical fiber are coupled directly.

FIG. 99 shows an example of the optical telecommunication system that uses a long-wavelength laser diode according to another embodiment of the present invention.

Referring to FIG. 99, the optical transmission system includes a surface-emission laser diode 32 having the emission part 32A and an optical fiber 352, wherein the laser diode 351 and the optical fiber 352 are coupled directly at the laser emission part 32A. Of course, it is possible to achieve the optical coupling by using a lens.

Assuming that the laser emission part 32A of the surface-mission laser diode 32 is d and the core diameter of the optical fiber 312 as F, it can be seen that the laser beam from the laser diode 32 diverges as represented in FIG. 99 by a broken line 351B. In FIG. 99, it should be noted that d represents the diameter of the circle inscribing the polygonal laser emission part 32A. In this case, the emission angle of the laser beam is much smaller than the case of a conventional edge-emission laser diode. Thus, in the case the laser diode 32 is provided near the optical fiber, it should be noted that a high optical coupling can be achieved when the optical axis of the laser diode is perpendicular to the optical fiber end surface and is coincident with the optical axis of the laser diode, and the aperture diameter of the laser diode is equal to or smaller than the core diameter.

As noted before, the surface-emission laser diode used in the present embodiment operates in the wavelength band of 1.1–1.7 μm, and a long distance transmission becomes possible by using the wavelength band of 1.3–1.55 μm due to the small optical loss of the quartz optical fiber in this wavelength band.

Assuming that the laser emission part 32A of the laser diode 32 has the diameter of d (in the case the laser emission part 32A has a polygonal shape, the diameter d is the diameter of a circle inscribing the polygonal laser emission part 32A, it is possible to increase the optical coupling efficiency by setting the foregoing parameters F and d so as to satisfy the relationship of $$F/d \leq 2 \quad (2)$$

In the embodiment of FIG. 99, it should be noted that the laser emission part 32A and the optical fiber 352 are coupled directly and no lens is interposed.

In the conventional optical system that uses an edge emission type laser diode of the 1.3 μm band, there is been a poor optical coupling efficiency between the laser diode and the optical fiber, and it has been difficult to couple these directly. Further, the return beam incident to the laser dude from the optical beam in the backward direction has caused a change oscillation state of the laser diode.

In the case of the present invention, the laser diode is a surface-emission laser diode and operates in the long-wavelength band. Thus, the laser diode has a generally circular beam shape characterized by excellent aspect ratio close to 1. Thereby, the efficiency of the laser diode is improved substantially as compared with the case of the edge-emission type laser diode.

Further, the laser diode of the present invention has the reflector of very high reflectance and the effect of the return beam is successfully suppressed. Thereby, it becomes possible to couple the laser diode and optical fiber directly, and the optical isolator used in the conventional optical telecommunication system can be eliminated.

Designating the diameter of the laser emission part 32A as d and the optical fiber core diameter as F, it is possible to increase the optical coupling efficiency by setting the parameters d and F so as to satisfy the relationship $$0.5 \leq F/d \leq 2 \quad (3)$$

Hereinafter, the reason of this will be explained with reference to Table 8, which summarizes the result of the study of the inventor of the present invention on the optical coupling loss.

TABLE 8

| F/d | coupling loss (dB) | performance |
|---|---|---|
| 0.4 | >5 | X |
| 0.5 | 3–5 | ○ |
| 0.65 | 1 | ○ |
| 2.0 | 3–5 | ○ |
| 2.2 | >5 | X |

○ good
X poor

Referring to Table 8, it can be seen that the efficiency of optical coupling is decreased when the diameter d of the beam emission part 32A has exceeded the core diameter F. On the other hand, it can be seen also that as long as there is a relationship d≦2F (in other words 0.5≦F/d), the optical coupling loss can be suppressed within 3–5 dB. In the case the diameter d of the beam emission part 32A is smaller than the core diameter, a highly efficient optical coupling is achieved in the case the emission angle of the laser diode, determined by the diameter of the circle inscribing the beam emission part 32A and the wavelength, is smaller than the numerical aperture NA for allowing a single mode optical coupling to a single mode optical fiber.

For example, in the case the core diameter is set to 10 μm and the core refractive index is 1.4469 and the clad refractive index if 1.4435, the numerical aperture NA that enables single mode optical coupling becomes 0.0995 at the wavelength of 1.3 μm The diameter d of the beam emission part 32A corresponding to this is about 6.5 μm.

On the other hand, even in the case the diameter of the beam emission part 32A is less than 6.5 μm, it is possible to suppress the optical coupling loss to the level of 3–5 dB when the diameter of the beam emission part 32A is about 5 μm. From this, it is concluded that it is preferable to choose the parameters F and d to satisfy the relationship $$0.5 \leq F/d \leq 2.$$

While the foregoing arguments have been for the case of using a single mode optical fiber, the foregoing condition is applicable also to the case of using a multimode optical fiber coupling a single mode optical fiber via a tapered optical waveguide.

Next, another example of the optical telecommunication system of the present invention will be described with reference to FIG. 100.

Figure 100:
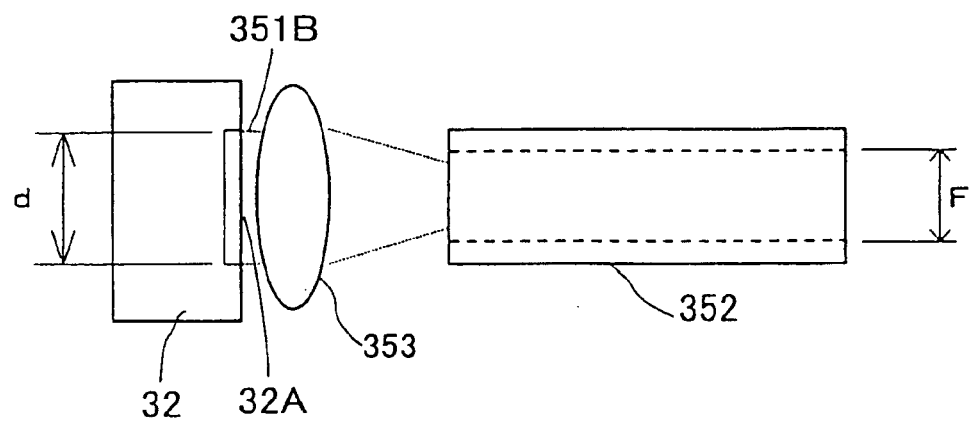
FIG. 100 is a diagram showing the constitution of an optical-fiber telecommunication system that uses a long-wavelength surface-emission laser diode according to an embodiment of this invention.

Referring to FIG. 100, the present embodiment uses a coupling lens 353 between the surface-emission laser diode 32 and the single-mode optical fiber. The lens 353 may be formed of a single lens or a lens system in which a plurality of lenses are combined. In the case of constructing the lens 353 by a single lens, it is preferable to dispose the lens 353 close to the beam emission part 32A of the laser diode chip 32.

In the construction of FIG. 100, it becomes possible to suppress the optical coupling loss effectively even in the case the diameter d of the beam emission part 32A is set larger than the core diameter of the optical fiber 353, by appropriately choosing the lens power of the coupling lens 353.

In the case the core diameter is 10 µm and the diameter d of the emission part 32A is 20 µm, for example, the beam size is reduced by ½ by the lens 353. Thus, designating the focal distance of the lens 353 as f, the laser wavelength as λ, the radius of the beam emission part 32A as ω0 (=10 µm) and the refractive index as n, the focal distance f is obtained by the relationship $$\frac{\frac{\lambda f}{\pi \omega_0^2 n}}{\sqrt{1+\left[1+\frac{\lambda f}{\pi \omega_0^2 n}\right]^2}} = \frac{5}{10}$$

In this case, the focal distance f becomes about 140 µm.

In the case of using a coupling lens, it is possible to achieve an efficient optical coupling when there holds a relationship between the parameters d and f noted before as $d \geq f$, or $F/d \leq 1$.     (4)

Further reference should be made to Table 9 below.

TABLE 9

| F/d | coupling loss (dB) | performance |
|-----|--------------------|-------------|
| 1.2 | >5                 | X           |
| 1.0 | 3–5                | ○           |
| 0.8 | 1                  | ○           |

In the embodiment of FIG. 100, the coupling lens 353 was provided by a single lens. On the other hand, it is possible to construct the lens 353 by a plurality of lenses. For example, as represented in FIG. 101, the lens 353 may be formed of two lenses 353A and 353B.

Figure 101:
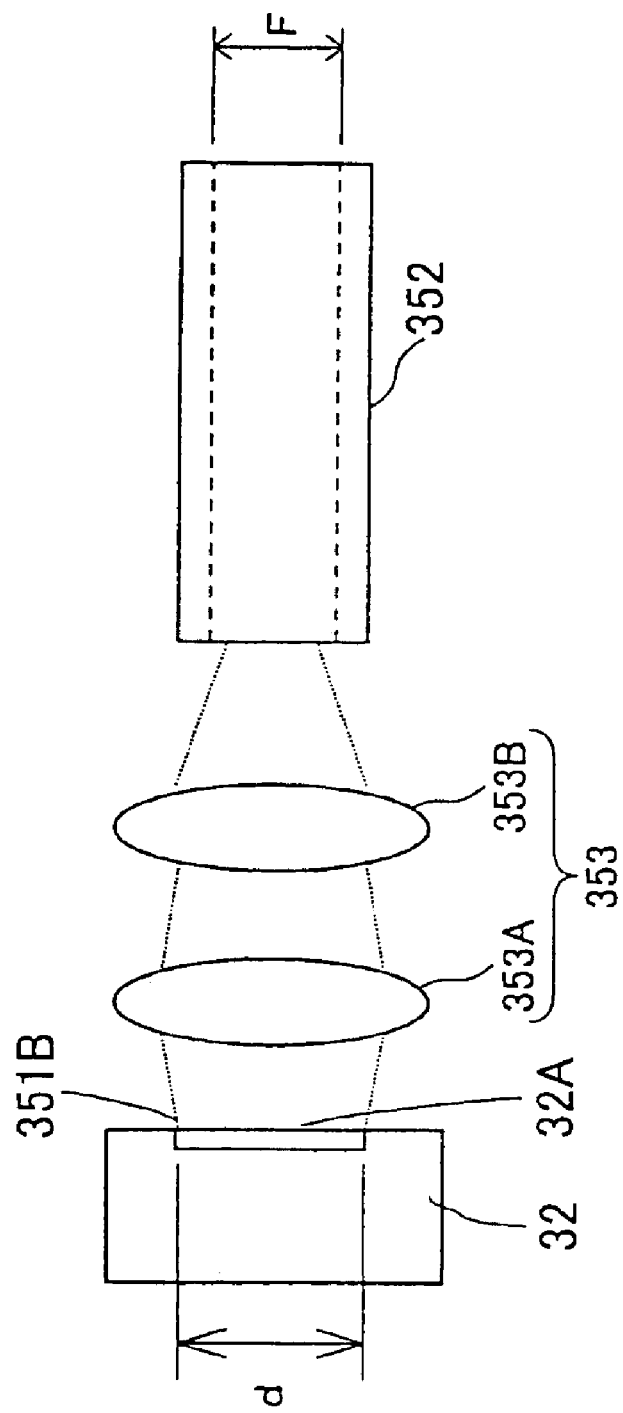
FIG. 101 is a diagram showing the constitution of an optical-fiber telecommunication system that uses a long-wavelength surface-emission laser diode according to an embodiment of this invention.

Referring to FIG. 101, the diverging beam from the beam emission part 32A is focused by the first lens 353A to the second lens 353B, and there is formed a beam waist at the plane of the second lens 353B. The lens 353B functions as the lens 353 of FIG. 100. According to the present embodiment, it becomes possible to maintain a high coupling efficiency in the case a single lens cannot be disposed near the beam emission part of the laser diode or in the case the divergence of the beam is excessive and the optical coupling efficiency is decreased, by constructing the lens 353 by plural lenses.

In the description heretofore, it was assumed that a single mode optical fiber is used for the optical fiber 352. On the other hand a similar effect is achieved also in the case of using a multimode optical fiber or a tapered optical waveguide, as long as the relationship of Equation (4) is satisfied.

In the construction that uses a conventional edge-emission laser diode, there is a possibility that the laser oscillation is influenced by the return beam from the coupling lens, and it has been necessary to provide an optical isolator. In the case of the surface-emission laser diode, there is provided a reflector structure of high reflectance and the effect of the return beam is successfully eliminated. Thus, it becomes possible to eliminate the optical isolator.

Next, another embodiment constructed by a surface-emission laser diode and the optical fiber will be explained with reference to FIG. 102.

Figure 102:
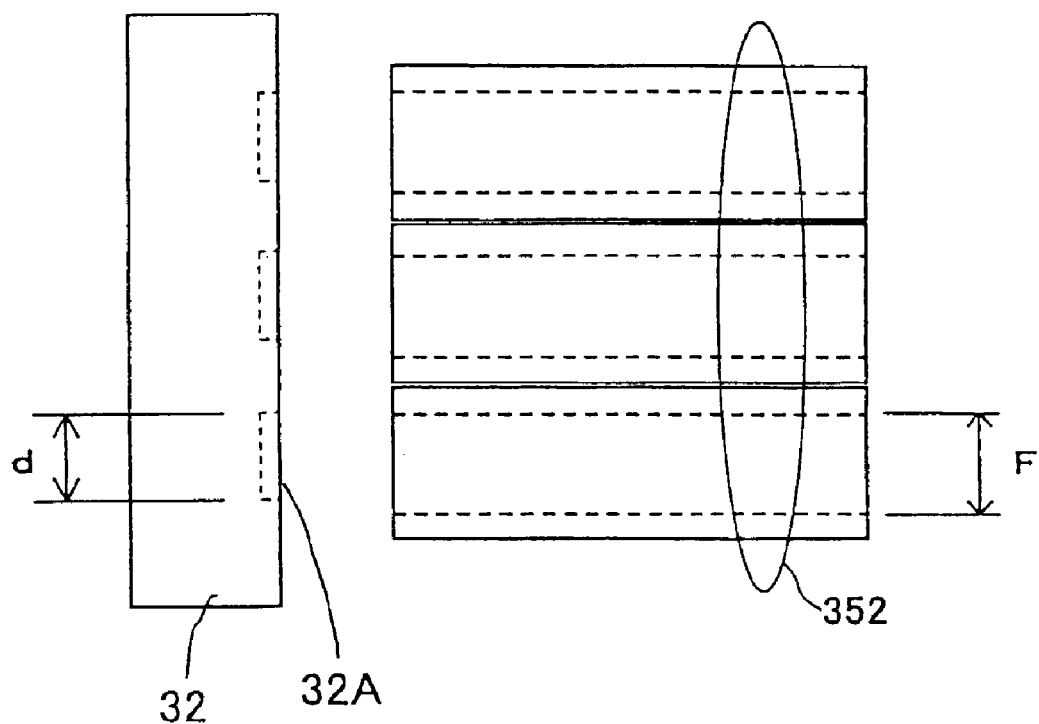
FIG. 102 is a diagram showing the constitution of an optical-fiber telecommunication system that uses a long-wavelength surface-emission laser diode according to an embodiment of this invention.

Referring to FIG. 102, the laser diode chip 32 includes a plurality of beam emission parts 32A arranged in the form of array. Of course, it is possible to dispose the laser diode chips 32 themselves in the form of array. Further, a plurality of laser diode chips may be arranged in the form of array.

In FIG. 102, the optical fiber is coupled directly to the corresponding optical emission part 32A, and thus, it is possible to satisfy the Equation (3) explained before with reference to FIG. 99. Thereby, it becomes possible to construct an optical telecommunication system of large capacity.

Figure 103:
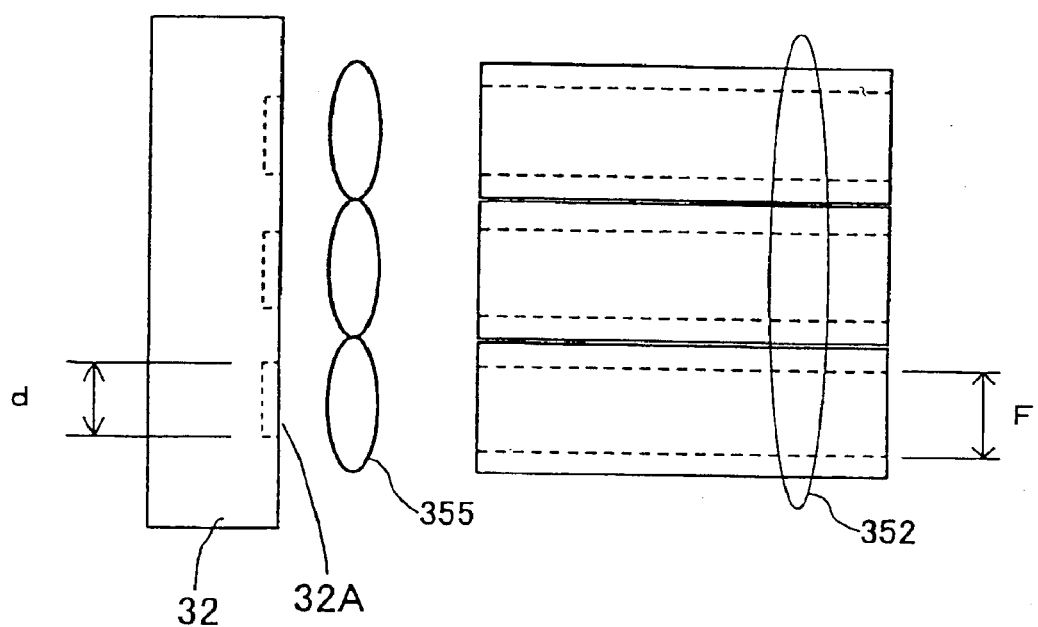
FIG. 103 is a diagram showing the constitution of an optical-fiber telecommunication system that uses a long-wavelength surface-emission laser diode according to an embodiment of this invention.

FIG. 103 is an embodiment in which a coupling lens is provided further to the construction of FIG. 102. In the construction of FIG. 102, too, the relationship between the beam emission part 32A, the lens array and the optical fiber 352 is the same as in the case of FIG. 102. Thus, by satisfying the Equation (4) by choosing the parameters d and F, an efficient optical coupling becomes possible. As the beam emission part 32A is arranged in the form of array, an optical telecommunication system of large capacity is realized. In the present embodiment, it is possible to combine a plurality of lenses in each of the coupling lens 355.

[Twenty-Second Embodiment]

Next, another embodiment of the present invention will be described.

Figure 104A:
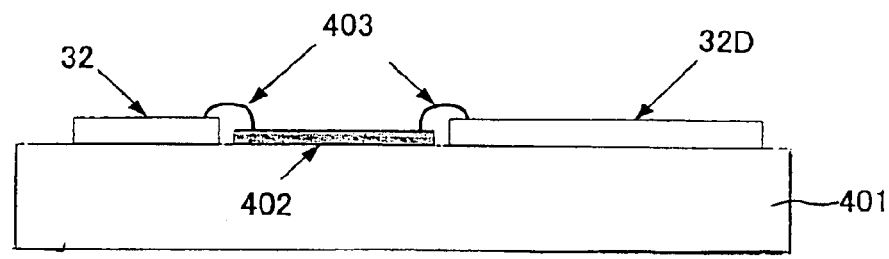
FIGS. 104A and 104B are diagrams showing an example of mounting a long-wavelength surface-emission laser diode of an embodiment of this invention.
Figure 104B:
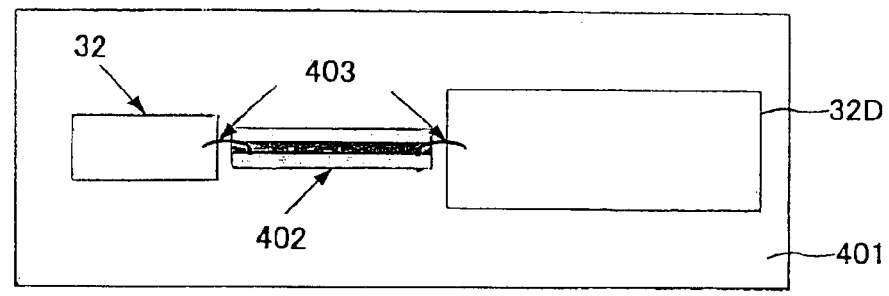

FIGS. 104A and 104B show an example of the optical telecommunication system that uses a long-wavelength laser diode of the present invention as an optical source and shows the state in which the laser diode chip 32 carrying the beam emission part 32A is connected with a laser driver IC 32D including a CMOS circuit, wherein FIG. 104A shows a side view while FIG. 104B shows a plan view.

Referring to FIGS. 104Aa and 104N, the laser diode chip 32 and the laser driver IC 32D are mounted on a conductive submount 401 by a conductive adhesive. Further, the laser diode chip and the laser driver IC 32D are connected by a high-frequency transmission line 402 (microstrip line in the present embodiment), and each chip 32 is connected to this microstrip line 402 by way of a bonding wire 403.

In the case of the surface-emission laser diode for optical telecommunication, it is necessary to carry out a very fast modulation in the order of several hundred MHz to several GHz. Thus, it is preferable to decrease the distance between the laser diode chip 32 and the laser driver IC 32D. On the other hand, there can be a case in which such a construction is not possible because of the layout of the optical system. When an ordinary wiring is used in such a case for connecting the laser diode chip 32 and the laser driver IC 32D, however, there arise s problem of electromagnetic emission from such wiring. In the present embodiment, the laser diode chip 32 and the laser driver IC 32D are connected such that there occurs no such electromagnetic radiation.

By using such a construction, no electromagnetic emission occurs from the wiring part and the need of providing special shielding means is eliminated. Thereby, the cost of the optical telecommunication system is reduced.

In the present embodiment, a microstrip line was used for the high-frequency transmission line 402. However, any of unbalanced transmission line such as coplanar transmission line or triplate line may be used. Further, the connection between the laser diode chip 32 and the laser driver IC 32D is not limited to the bonding wired but flip-chip wiring or TAB bonding or microbump bondin may be used.

[Twenty-Third Embodiment]

In the embodiment of FIG. 52, a system that uses a surface-emission laser diode of long-wavelength band of 1.1–1.7 μm has been explained. Conventionally, an optical telecommunication using the wavelength band of 0.85 μm band is studied. However, in this wavelength band, the optical transmission loss is large in the optical fiber and practical use of such a system was not successful. Further, there has been no stable laser diode device in the long wavelength band in which the optical transmission loss is small. In the present invention, on the other hand, it became possible to construct a surface-emission laser diode operable in the wavelength band of 1.1–1.7 μm by improving the semiconductor distributed Bragg reflectors 12 and 18 and by providing the non-optical recombination elimination layers 13 and 17, such that the laser diode operates stably at low power. Thereby, a practical optical telecommunication system has become the matter of reality.

In the example of FIG. 52, the optical telecommunication system is formed of the long-wavelength surface-emission laser diode chip, the first optical fiber FG1 injected with the laser beam emitted from the beam emission part 32A in the chip 32 and acting as an optical transmission path, a second optical fiber FG2 injected with the laser beam transmitted through the first optical fiber FG1 and functioning as an optical transmission path, a third optical fiber FG3 injected with the laser beam transmitted through the optical fiber FG2 and functioning as an optical waveguide, and a photodetector chip 34 including a photodetection part 34A coupled optically to the optical fiber FG3 for detecting the laser beam transmitted through he optical fiber FG3.

Further, the optical connection module MG1 is provided between the laser diode chip 32 and the first optical fiber FG1, while the optical connection module MG2 is provided between the optical fiber FG1 and FG2. Similarly, the optical connection module MG3 and FG4 are provided between the optical fibers FG2 and FG3 and between the optical fiber FG3 and the photodetector 34.

In the example of FIG. 52, the first optical fiber FG1 is coupled directly to the beam emission part 32A of the laser diode chip 34 without intervening an optical system.

With reference to FIG. 94, a description was made on the relationship that is required between the laser diode of the present invention and the optical fiber.

In the long-wavelength surface-emission laser diode of the present invention, the optical emission angle of the laser beam is about 10 degrees, and the laser diode is use din combination with an optical fiber which may have a core diameter of 50 μm (clad diameter of 125 μm).

In such a combination of the laser diode and the optical fiber, the bean emission part 32A may have a size of 0.005 mm×0.005 mm–0.002 mm×0.002 mm. In terms of area S, these are represented as 0.000025 mm$^2$–0.0001 mm$^2$. In this case, it is possible to achieve excellent optical coupling without the need of providing an intervening optical system. Further, the same result holds also in the case an optical waveguide is used in place of an optical fiber.

In the present invention, the beam emission part 32 is tuned to the wavelength of 1.1–1.7 μm, while the foregoing wavelength band is related to the operational voltage of the laser diode.

Thus, in the present embodiment, a detailed analysis was conducted on the operational voltage of the laser diode 32 suitable for realizing continues oscillation, not just a pulse oscillation.

Table 10 shows the experimental results of the present embodiments.

TABLE 10

| No. | emission size (mm × mm) | area S (mm2) | voltage V | V/s | remarks |
|---|---|---|---|---|---|
| 1 | 0.005 × 0.005 | 0.000025 | 0.2 | 8000 | X |
| 2 | 0.005 × 0.005 | 0.000025 | 0.3 | 12000 | X |
| 3 | 0.005 × 0.005 | 0.000025 | 0.375 | 15000 | ◯ |
| 4 | 0.005 × 0.005 | 0.000025 | 0.4 | 16000 | ◯ |
| 5 | 0.005 × 0.005 | 0.000025 | 0.5 | 20000 | ◯ |
| 6 | 0.005 × 0.005 | 0.000025 | 0.6 | 24000 | ◯ |
| 7 | 0.005 × 0.005 | 0.000025 | 0.75 | 30000 | ◯ |
| 8 | 0.005 × 0.005 | 0.000025 | 0.9 | 36000 | X |
| 9 | 0.005 × 0.005 | 0.000025 | 1.2 | 48000 | X |
| 10 | 0.01 × 0.01 | 0.0001 | 1.2 | 12000 | X |
| 11 | 0.01 × 0.01 | 0.0001 | 1.3 | 13000 | X |
| 12 | 0.01 × 0.01 | 0.0001 | 1.5 | 15000 | ◯ |
| 13 | 0.01 × 0.01 | 0.0001 | 1.7 | 17000 | ◯ |
| 14 | 0.01 × 0.01 | 0.0001 | 1.9 | 19000 | ◯ |
| 15 | 0.01 × 0.01 | 0.0001 | 2.1 | 21000 | ◯ |
| 16 | 0.01 × 0.01 | 0.0001 | 2.3 | 23000 | ◯ |
| 17 | 0.01 × 0.01 | 0.0001 | 2.5 | 25000 | ◯ |
| 18 | 0.01 × 0.01 | 0.0001 | 3 | 30000 | ◯ |
| 19 | 0.01 × 0.01 | 0.0001 | 4 | 40000 | X |
| 20 | 0.01 × 0.01 | 0.0005 | 5 | 50000 | X |
| 21 | 0.02 × 0.02 | 0.0004 | 2 | 5000 | X |
| 22 | 0.02 × 0.02 | 0.0004 | 4 | 10000 | X |
| 23 | 0.02 × 0.02 | 0.0004 | 6 | 15000 | ◯ |
| 24 | 0.02 × 0.02 | 0.00041 | 8 | 20000 | ◯ |
| 25 | 0.02 × 0.02 | 0.0004 | 10 | 25000 | ◯ |
| 26 | 0.02 × 0.02 | 0.0000 | 12 | 30000 | ◯ |
| 27 | 0.02 × 0.02 | 0.00004 | 15 | 37500 | X |
| 28 | 0.02 × 0.02 | 0.00004 | 20 | 50000 | X |

◯ good oscillation
X no oscillation or damage

From the results above, it can be seen that, choosing the operational voltage S such that the ratio of the operational voltage V to the area S of the beam emission part 32A of the laser diode (V/S) falls in the range of 15000–3000, it can be possible to drive the laser diode without causing a damage in the laser diode and the laser diode can be operated continuously. By choosing the drive conduction as such, it is possible to realize a stable optical transmission system having along lifetime.

[Twenty-Fourth Embodiment]

Next, a further embodiment of the present invention will be explained.

Figure 105:
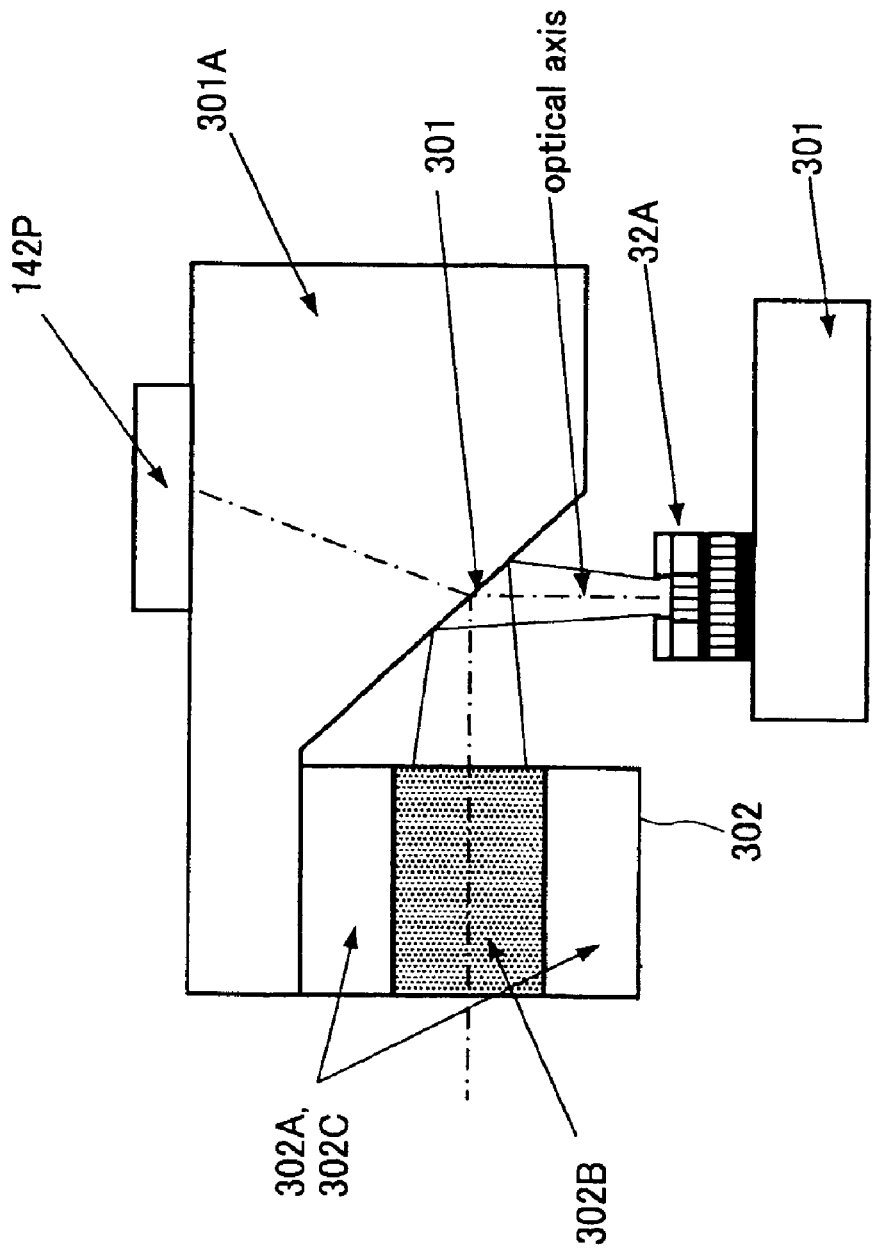
FIG. 105 is a diagram showing the constitution of an optical-fiber telecommunication system that uses a long-wavelength surface-emission laser diode according to an embodiment of this invention.

FIG. 105 shows the construction of an optical telecommunication system using the long-wavelength laser diode according to the present invention, wherein those parts corresponding to the parts described previously are designated by the same reference numerals and the description thereof will be omitted.

Figure 107:
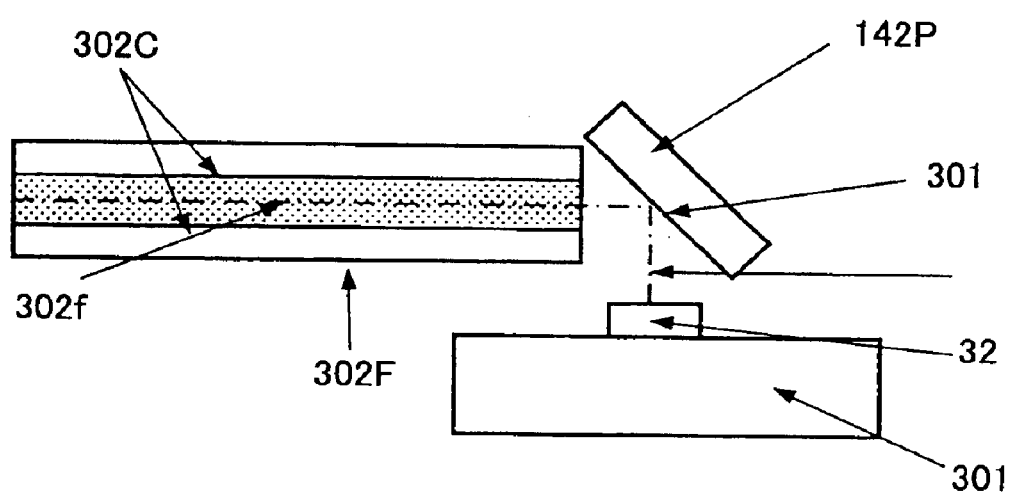
FIG. 107 is a diagram showing the constitution of an optical-fiber telecommunication system that uses a long-wavelength surface-emission laser diode according to an embodiment of this invention.

Referring to FIG. 105, the optical telecommunication system of the present invention has a construction to divide the optical output of the laser diode 32A provided on a mount substrate 301 into an optical beam for optical telecommunication and a monitoring beam by using the mirror 301 provided on the mount substrate 301A, wherein the monitoring beam thus divided is detected by the monitoring photodetector 142P provided on the mount substrate 301A. The monitoring photodetector 142P corresponds to the monitoring photodetector 142P explained previously with reference to FIG. 86. In FIG. 105, as well as in FIGS. 107 and 108 to be described laser, there are formed a laser diode array by the laser diodes arranged in the direction perpendicular to the plane of the drawing. In correspondence to this, there are provided a plurality of optical waveguides.

The optical telecommunication system of the present embodiment is formed of an optical transmission part including the surface-emission laser diode 32 and the driver circuit thereof, the photodetection part including the planar photodetection unit and a drive circuit thereof, and an optical fiber or optical waveguide providing an optical transmission path extending between the optical transmission part and the optical reception part. Although the driver circuit of the laser diode 32 or photodetector 34 is not shown, these can be formed on the substrate of the respective devices. Alternatively, these can be formed integrally with the laser diode device in the device fabrication process. By providing such an optical transmission part and optical reception part at both ends of the optical transmission path, it becomes possible to realize a bi-directional optical telecommunication system.

As represented in FIG. 105, the laser beam emitted from a surface of the long-wavelength laser diode is divided by the mirror 301 and one of the optical beams thus divided is then directed to the optical waveguide 302 provided with an optical alignment. This optical waveguide 302 may be an optical fiber.

On the other hand, the other optical beam divided by the mirror 301 is directed to the monitoring photodetection device 34 provided on the mount substrate 301A. Thus, the mirror 301 is used to divide out the laser beam to be supplied to the monitoring photodetector 34 and it is preferable that such a mentoring optical beam is as weak as possible within the range that a proper control of the laser diode is possible by using such a monitoring device. In view of the power consumption of the optical telecommunication system, it is preferable to provide as much energy as possible to the optical waveguide 302 as an optical signal.

Thus, in the present invention, the thickness of the metal film of Au or Ag or Al used for the mirror 301 such that the transmittance of the mirror 301 is controlled for the wavelength of 1.1–1.7 $\mu$m. Further, it is also possible to provide openings of various shaped in the form of grooves, circles, squares, and the like, so as to control the transmittance of the mirror 301. Thereby, in order to avoid the effect of unwanted optical interference, it is preferable to change the pitch or size or location of the openings at random. Further, it is possible control the transmittance of the mirror 301 by using a dielectric multilayer mirror or semiconductor layered mirror.

As compared with the conventional laser diode of edge-emission type, the surface-emission laser diode used in the optical telecommunication system of the present invention has an advantageous feature of small output dependence on temperature and little degradation with time. While the laser diode of the present invention has such advantageous features, it is nevertheless preferable to control the output thereof by way of feedback control.

In the case of a conventional edge-emission laser diode, such a monitoring of the optical power of the laser diode was made easily by monitoring the laser beam emitted from the rear edge surface of the laser diode. In the case of the surface-emission laser diode, the laser output is obtained only at one side of the laser diode. Thus, the construction of monitoring the laser beam emitted in the backward direction cannot be used in the present invention. Further, the laser diode ahs a relatively narrow angle of optical emission of about 10 degrees. Thus, while there is a possibility of provide the laser diode close to the optical fiber or optical waveguide, there is no room at all for inserting a monitoring photodetector between the laser diode and the optical fiber.

On the other hand, the present invention provides an effective an simple means of obtaining a monitoring laser diode by providing the mirror 301 as noted above. Thereby, the output of the laser diode is monitored with out increasing the optical path, and the output of the laser diode is controlled positively and exactly. As the present invention uses the mirror 301 for deflecting the output optical beam of the laser diode, the optical axis of the reflected signal optical beam becomes parallel to the optical axis of the optical fiber, and thus, it becomes possible to fix the optical fiber or optical waveguide on a plane parallel to the plane of the optical module and the optical waveguide 302 or optical fiber is fixed easily. Thereby, the obtained structure has an improved rigidity. Further, it is also possible to provide a lens before or after the mirror 301.

Although not illustrated, it is possible to use a plurality of laser diodes and corresponding optical waveguides or optical fibers. In this case, the laser diodes are arranged in a direction perpendicular to the sheet of the drawing, and the mirror 301 extending also in the direction perpendicular to the sheet of the drawing is used commonly by the laser diodes forming the array.

Figure 106:
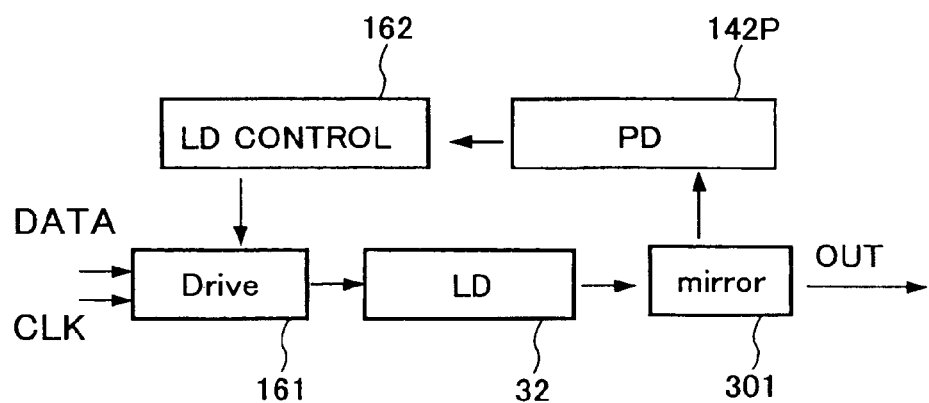
FIG. 106 is a block diagram showing the constitution of a control device used with an optical-fiber telecommunication system according to an embodiment of this invention in which a long-wavelength surface-emission laser diode is used.

FIG. 106 shows the block diagram of the feedback circuit that controls the output of the laser diode 32 by using the divided laser beam.

Referring to FIG. 106, the laser diode 32 is driven by a driver circuit 161 corresponding the driver circuit 161 explained previously with reference to FIG. 87, and a part of the laser beam produced by the laser diode 32 is provided to the monitoring photodetector 142P. The monitoring photodetector 142P detects the output of the laser beam thus supplied and produces an electric output current indicative of the output of the laser diode 32. Further, the laser control part 162 controls the laser diode 32 such that the output of the laser diode is maintained constant.

In the construction of FIG. 106, it should be noted that the laser diode 32 can be driven with a low drive voltage. Thereby, ordinary CMOS circuit can be used for the driver circuit 161. Thereby, power consumption of the laser diode is reduced. As the wavelength band to be detected by the monitoring photodetector 142P is in the range of 1.1–1.7 $\mu$m, it is possible to use a photodiode of the InGaAs system. Further, in view of the gradual change of the output of the laser diode, it is not necessary that the photodetector 142P has a high response speed. Thus, it is possible to use a high-sensitivity photodetector while sacrificing the response speed.

Referring back to FIG. 106, there is formed a laser diode array including four laser diodes 32A each having the construction of FIG. 1, and the laser diode array is mounted on the mount substrate 301 of Si together with the drive circuit and the laser control circuit not illustrated. The laser diodes 32A has the wavelength of 1.3 $\mu$cm and may be disposed on a single chip 32 with the pitch of 200 $\mu$m.

Next, the mirror 301 is formed by using a heat conductive Si substrate, which is transparent to the wavelength of 1.3 $\mu$m. By using the Si substrate for the mount substrate 301A, it is possible to form the mirror easily by conducting an anisotropic etching process. Thereby, a crystal surface determined with respect to the principal surface of the substrate 301A is formed with exact angle. The etching process may be conducted by using an etchant such as KOH. With this, a mirror surface having a 45 degrees is formed. Further, an Au deposition is conducted on the mirror surface 301, and the optical waveguide 302 is formed. In such a process, it is possible to control the transmittance of the mirror 301 by controlling the thickens of the Au film.

In the formation of the optical waveguide 302, it should be noted that a PMMA film is formed as the core layer after the cladding layer 302A is formed. By patterning the core layer thus formed, the core pattern 302B is formed. Further, the upper cladding layer 302C is formed so as to cover the core layer 302B.

In the present embodiment, the core pattern 302B is patterned so as to form a cross section of 50×50 μm. The optical waveguide layer 302 thus formed is coupled with the optical fiber not illustrated, and long distance optical telecommunication system is constructed.

For the optical waveguide layer 302, it is possible to use various resins such as polyimide, epoxy resin, polyurethane or polyethylene, in addition to PMMA. Further, it is possible to provide an inorganic film such as silicon oxide film. Further, the formation of the optical waveguide layer 302 can be made by combining the spin coating process or dip coating process and a patterning process. Alternatively, it is possible to form the optical waveguide by a resin molding process or molding process.

Further, the optical axis of the laser diode is set coincident with the optical axis of the optical waveguide, and the mount substrates 301 and 301A are fixed. Further, a planar photodiode is mounted on the mount substrate 301A in optical alignment with the laser beam divided by the mirror 301 as the monitoring photodetector 142P. A photodiode having an optical absorption layer of InGaAs on the InP substrate may be used of this purpose.

Further, the output of the photodetection device 142P is connected to the laser control unit 162 by a wire bonding process With this, the feedback control circuit explained with reference to FIG. 106 is obtained.

Table 11 below shows the result of evaluation of the optical transmission unit conducted external temperature.

TABLE 11

| mirror transmissivitgy (%) | remarks |
|---|---|
| 0.1 | X |
| 0.2 | X |
| 0.3 | X |
| 0.5 | Δ |
| 0.7 | Δ |
| 1.0 | ○ |
| 2.0 | ○ |
| 5.0 | ○ |
| 10 | ○ |
| 20 | ○ |
| 30 | ○ |
| 40 | ○ |
| 50 | ○ |
| 60 | Δ |
| 70 | X |

○ good
Δ fair
X poor

In the experiment, the temperature is changed from 0–70° C. with the step of 10° C., wherein Table 11 shows only the result of 20° C., as the results for other temperatures were more or less the same as the result of 20° C.

Referring to Table 11, it can be sent that an optical power of 10 μW is detected by the monitoring photodetector 142P when the mirror transmissivity is less than 1% for the optical power of mW level, which is used commonly for optical telecommunication. As the change of the optical power of the laser diode is smaller than this, no sufficient optical energy needed for the control of the laser diode is supplied to the photodetection device, and as a result, there is a fluctuation of optical output in the laser diode.

When the transmissivity exceeds 50%, on the other hand, too much energy of the laser output is used for controlling the output power of the laser diode. Thus, there occurs decrease of efficiency of the optical telecommunication system From the result of Table 11, it can se seen that the transmissivity of 2% or more but 30% or less is preferable for the mirror 301. By using such a construction, it is possible to realize an optical transmission unit capable of controlling the laser output stably. Thereby, it is preferable that the transmissivity of the mirror 301 is in the range of 1% or more but 50% or less, more preferably 2% or more but 30% or less.

In the present embodiment, 4 laser diodes were used in the form of array. Of course, the number of the laser diode may be one, or the laser diode may be used in the form of array including 8, 12, 16 or more laser elements.

It is also possible to use an optical fiber for transmitting the optical signals in place of the optical waveguide 301. When transmitting large amount of information over a long distance, the use of single mode optical fiber is suited. In the case of transmitting information for short distance with low cost, the use of plastic optical fiber (POF) is suitable. Further, there may be a possibility of using a multimode optical fiber in the intermediate applications.

FIG. 90 shows another embodiment of the present invention in which the electrode of the photodetection device is used for the mirror.

In the present embodiment, the long-wavelength laser diode 32 of FIG. 1 is mounted on the Si mount substrate together with a driver circuit and a laser control circuit not illustrated. In the present embodiment, a laser diode having a laser oscillation wavelength of 1.2 μm is used.

Similarly to the previous embodiments, a photodetector using a GaAsP material is used for the monitoring photodetector 142. In the present embodiment, the p-type electrode of the optical detection surface is used for the mirror 301.

More specifically, an Au film having a thickness of 300 nm and not allowing passage of the 1.2 μm wavelength radiation is provided on the photodiode as the electrode, and circular openings having various diameters in the range of 0.7–5 μm are formed. With this, a transmissivity of 5% is realized.

The photodiode 142P thus formed is mounted with an angle of 45 degree with regard to the laser diode 32, and the output of the photodiode 142P is connected to the laser control unit 162 electrically. Thereby, there is formed a feedback control system of the laser diode similar to the one shown in FIG. 106.

By providing a multimode optical fiber 302F having a core 302f of 50 μm diameter and a clad of 125 μm diameter in optical alignment with the laser beam reelected by the mirror 301, an optical telecommunication system is constructed. Such an optical telecommunication system is simple in construction with reduced number of parts, and it is possible to provide a compact optical transmission module. Such an optical transmission module can control the laser output stably and a reliable optical telecommunication is realized. In the present embodiment, it is also possible to form the mirror 301 on the surface of the monitoring photodetection device separately to the electrode.

Next, another embodiment of the present invention will be explained with reference to FIG. 108.

Figure 108:
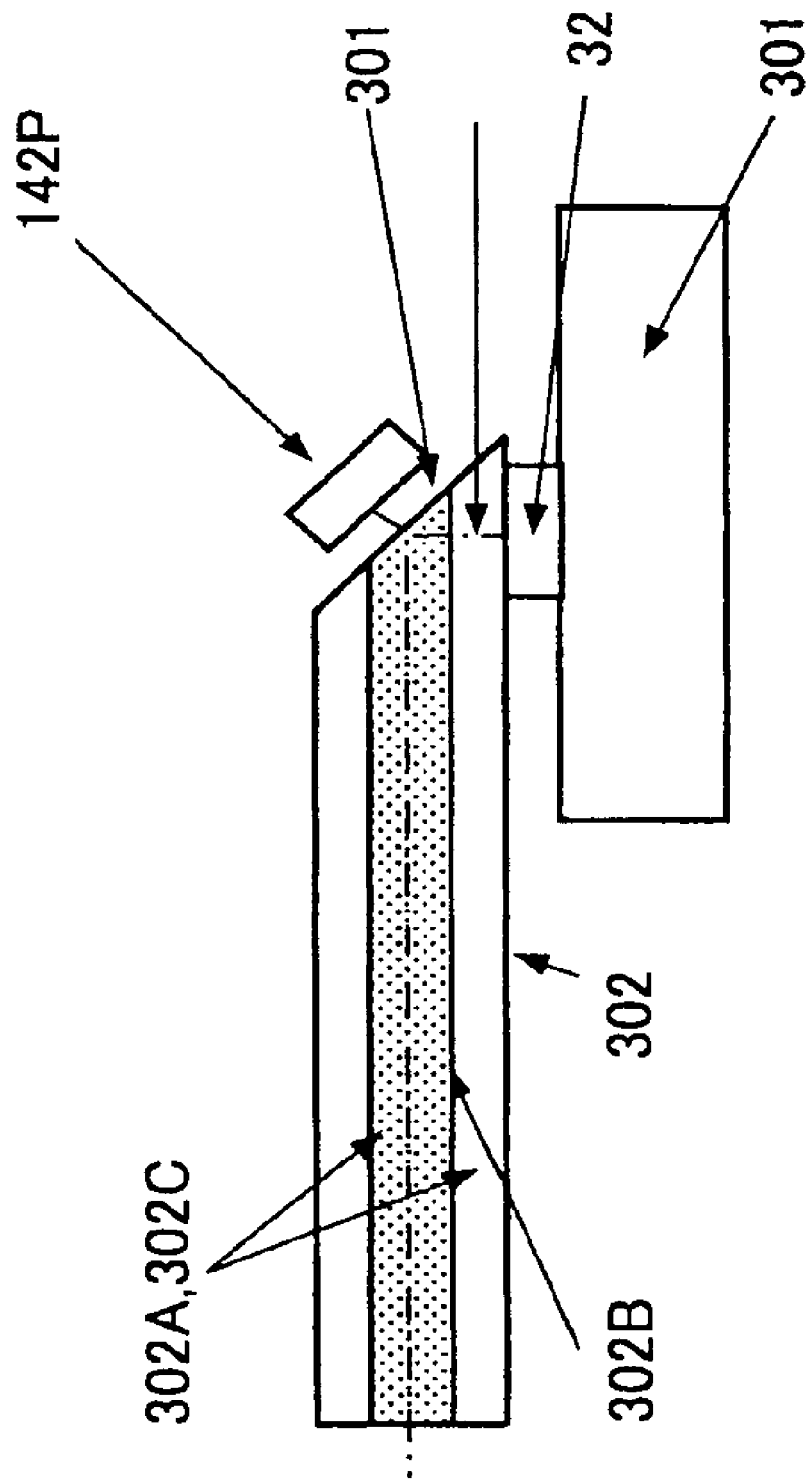
FIG. 108 is a diagram showing the constitution of an optical-fiber telecommunication system that uses a long-wavelength surface-emission laser diode according to an embodiment of this invention.
Figure 109:
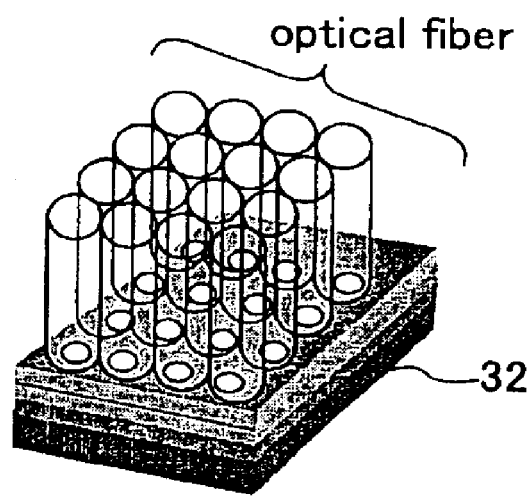
FIG. 109 is a diagram showing the constitution of an optical-fiber telecommunication system that uses a long-wavelength surface-emission laser diode according to an embodiment of this invention.

Referring to FIG. 108, the present embodiment provides the long-wavelength surface-emission laser diode 32 mounted on the Si mount substrate 301 together with the driver circuit and laser control circuit not illustrated. In the illustrated example, four laser diodes 32A are arranged with the pitch of 200 μm, wherein each of the laser diodes has a laser oscillation wavelength of 1.3 μm.

In the present embodiment, the edge of the optical waveguide is cut to form a 45 degree angle by a diamond blade, and the mirror 301 is formed by covering the oblique surface thus formed by an Au film. Thereby, the thickness of the Au film is controlled such that the Au film has a transmissivity of 3%. The optical waveguide 302 thus processed is coupled optically with the laser diode 32 by achieving optical alignment, and the monitoring photodetector 142P is mounted on the optical path of the optical beam divided by the mirror 301. According to such a construction, it is necessary to control the output of the laser diode 32 via the control unit 162 in response to the output of the photodetector 142. By doing so, it becomes possible to construct an optical module of simple construction and reduced number of parts.

[Twenty-Fifth Embodiment]

Next, another embodiment of the present invention will be described.

Conventionally, edge-emission laser diodes are used extensively in optical telecommunication systems. When using such an edge emission laser diode in combination with plural optical fibers, there is a need of achieving optical coupling for each of the laser diodes one by one. In the case of an edge-emission laser diode, there is another problem of large beam divergence in that the laser beam spreads rapidly due to the large emission angle. Further, the emission angle is different in the lateral direction and vertical direction, and the laser bean shows an elongated beam spot characterized by poor aspect ratio. Thus, in the case of conventional edge-emission laser diode, it has been necessary to provide a coupling lens for each of the laser diodes.

Because of these reasons, it was not possible to form the laser diode in the form of high density array in the case of using conventional edge-emission type laser diode.

In contrast, the present invention has enabled the construction of a high-density laser array by using a number of surface-emission laser diodes commonly on a single chip monolithically. By combining optical fibers with the laser diode array thus formed, a large capacity optical transmission system is realized.

Figure 110A:
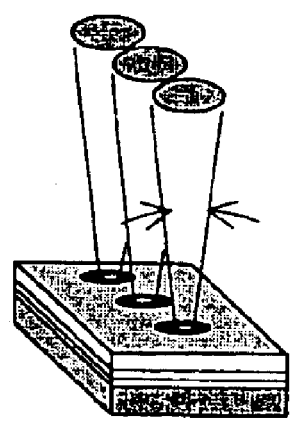
FIGS. 110A and 110B are diagrams showing an emission angle of a laser diode according to an embodiment of this invention.
Figure 110B:
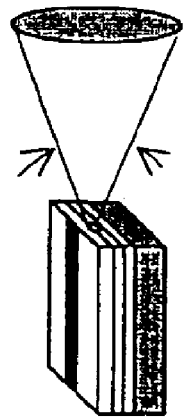

FIGS. 110A and 110B show an example of an optical telecommunication system in which the long-wavelength laser diodes of 1.1–1.7 μm are used in combination with optical fibers.

As represented in FIG. 110A, the surface-emission laser diode of the present invention is characterized by a narrow divergence of the optical beam in any of the horizontal and lateral directions of the beam spot. In fact, the laser beam produced by such a surface-emission laser diode is characterized by a circular beam cross-section.

In contrast, the laser diode of the edge emission type laser diode produces an optical beam diverging rapidly with large emission angle, wherein the laser beam produced by such an edge-emission layer diode shows a beam shape characterized by an eclipse. Thus, the size of the laser beam spot is different in the horizontal direction vertical direction.

Thus, by using the surface-emission laser diode of the present invention, it becomes possible to construct a large capacity optical transmission system by arranging a number of optical fibers with high density.

In the case of such a high-density telecommunication system, it is difficult to use coloring layer or identification ring used commonly in ordinary optical fiber capes for identifying reach of the optical fibers In the cable.

In the case of the surface-emission laser diode, it is possible to form each beam emission part 32A constituting the array simultaneously and in high density by using the lithographic process. In the case of handling a number of optical fibers in such a laser diode array, it is more preferable to handle the optical fibers in the form of bundle, rather than handing each of the optical fibers. Particularly, it is preferable to make a correlation between the optical fibers bundled in the form of a cable and the laser diodes in the array.

On the other hand, in the case the optical fibers 101 are assembled to form a bundle, it is not easy to identify the center of the bundle or individual optical fibers in the bundle.

For example, in the case the cladding 101b of the optical fiber 101X at the center of the optical fiber bundle is colored as represented in FIGS. 11A–11C, the recognition of the optical fiber is easy.

Thus, it is possible to achieve the correlation between the laser diodes in the array and the optical fibers in the bundle by first turning on the laser diode 32AZ at the center of the array. Thereby this laser diode is correlated with the colored optical fiber at the center of the bundle.

Figure 112:
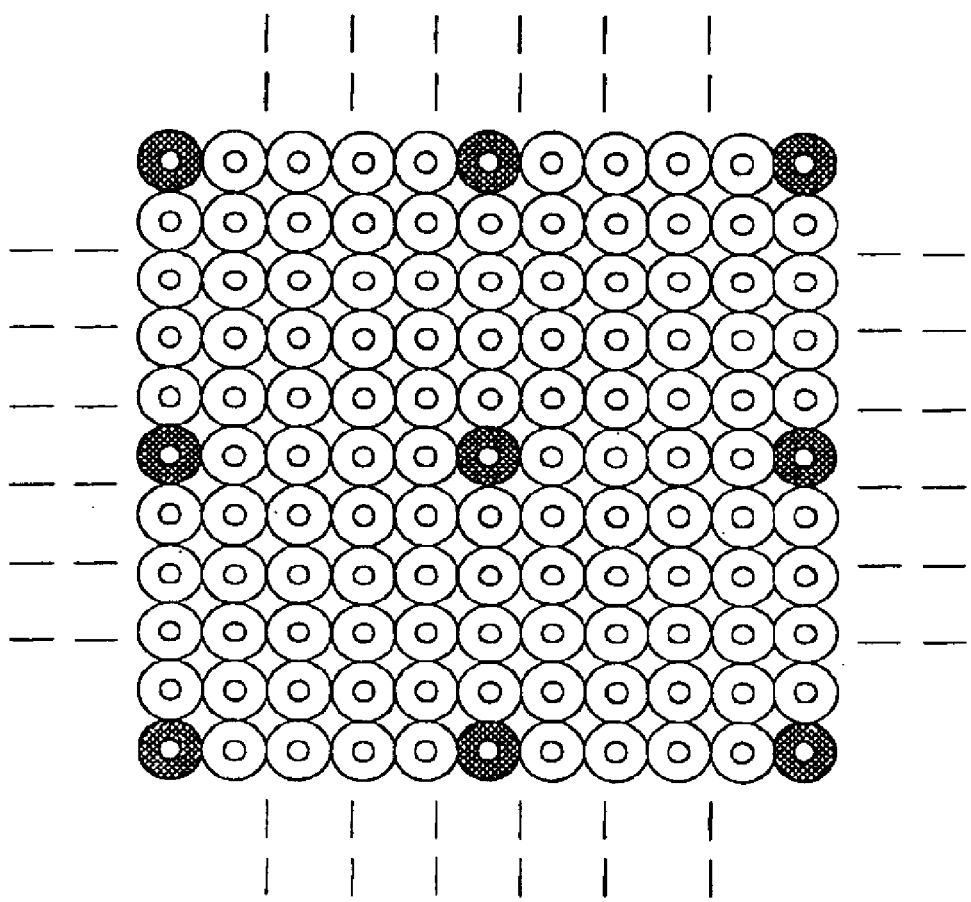
FIG. 112 is a diagram showing an optical fiber bundle according to an embodiment of this invention.

In the example of FIGS. 112, it can be seen that four fibers are colored at cladding layer. By correlating these four optical fibers with four laser diodes, it is possible to easily establish the correspondence between the optical fiber and the laser diode for other optical fibers.

Figure 113B:
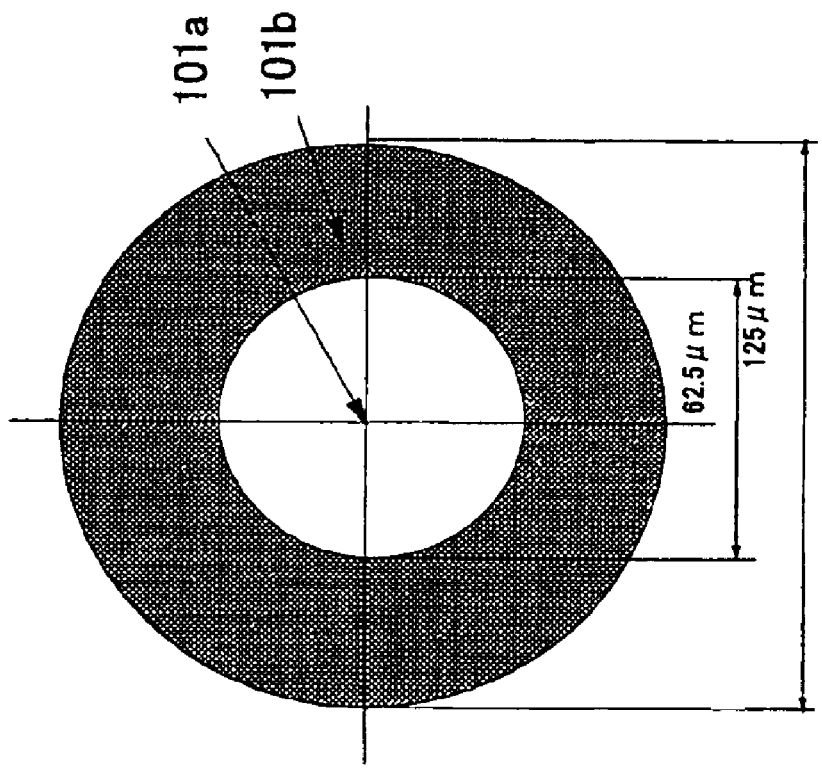
FIGS. 113A and 113B are diagrams showing the cross-section of an optical fiber for multimode transmission according to an embodiment of this invention.
Figure 113A:
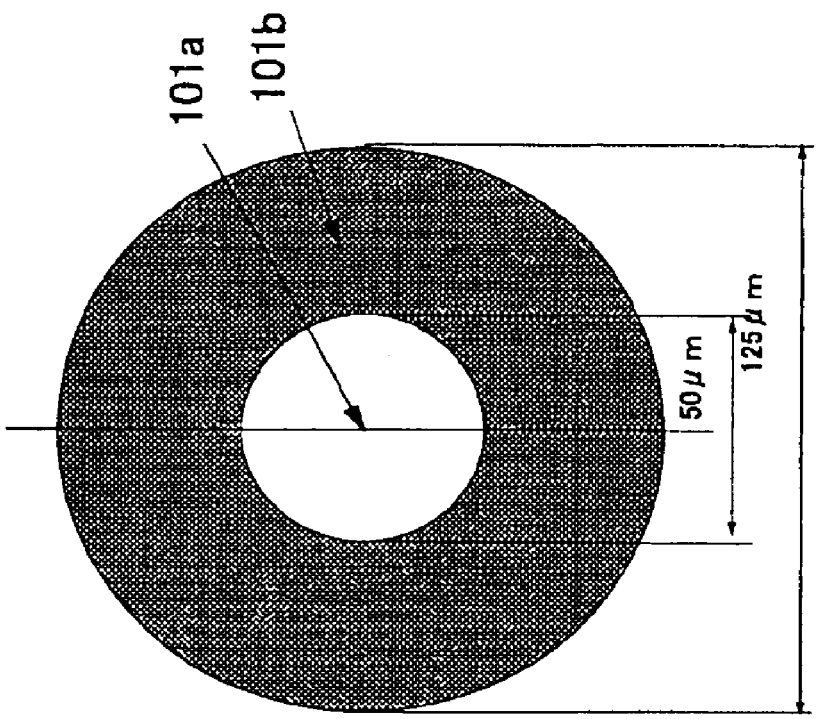

It should be noted that the cladding layer of an optical fiber is used merely for confining the light in the core. Thus, coloring of the cladding layer 101b as shown in FIGS. 113A and 113B does not cause a problem at all with regard to the information transmission, which takes place through the core 110a.

Figure 111A:
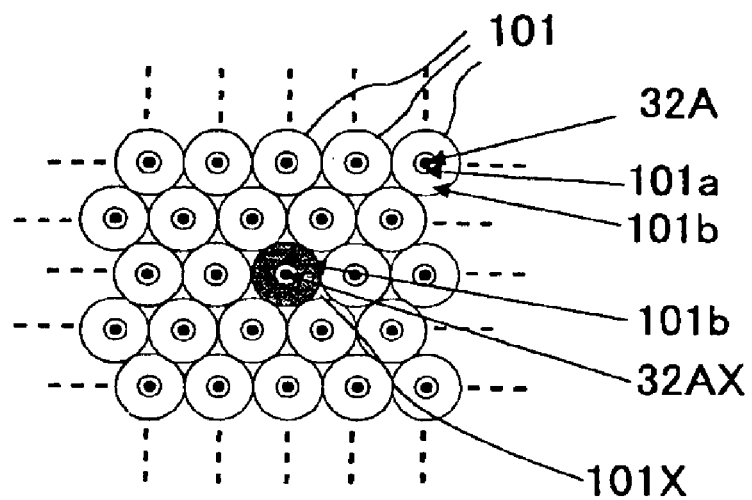
FIGS. 111A–111C are diagrams showing an optical fiber bundle according to an embodiment of this invention.
Figure 111B:
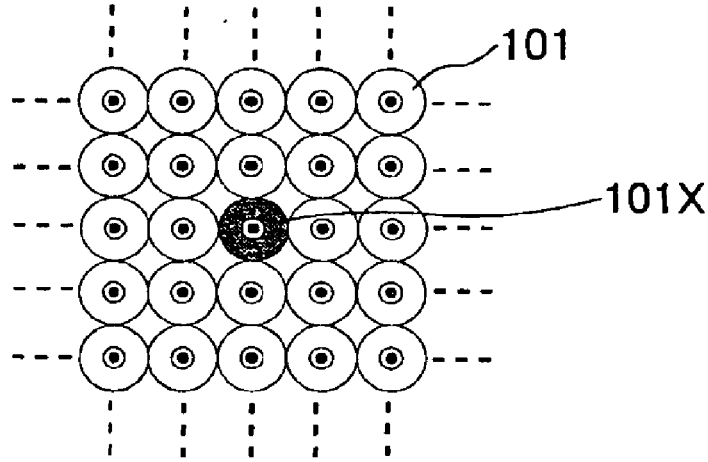
Figure 111C:
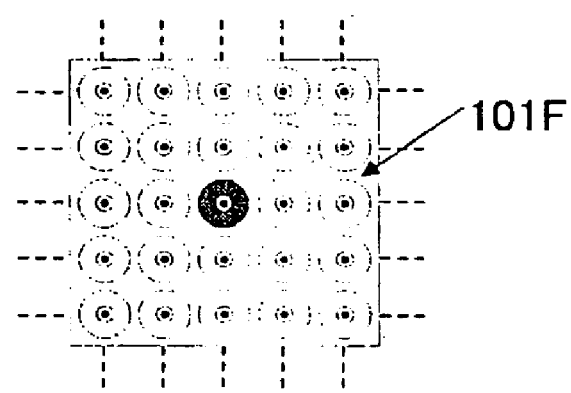

FIGS. 111B and 111C show a modification of FIG. 111A. In the example of FIG. 111A, the optical fibers 101 are arranged in a closest packing state. In the case of FIG. 111B, on the other hand, optical fibers are arranged in a square grid. Further, FIG. 111C shows an example of uses a ferule 101F for marinating the square grid arrangement of the optical fibers.

Figure 114:
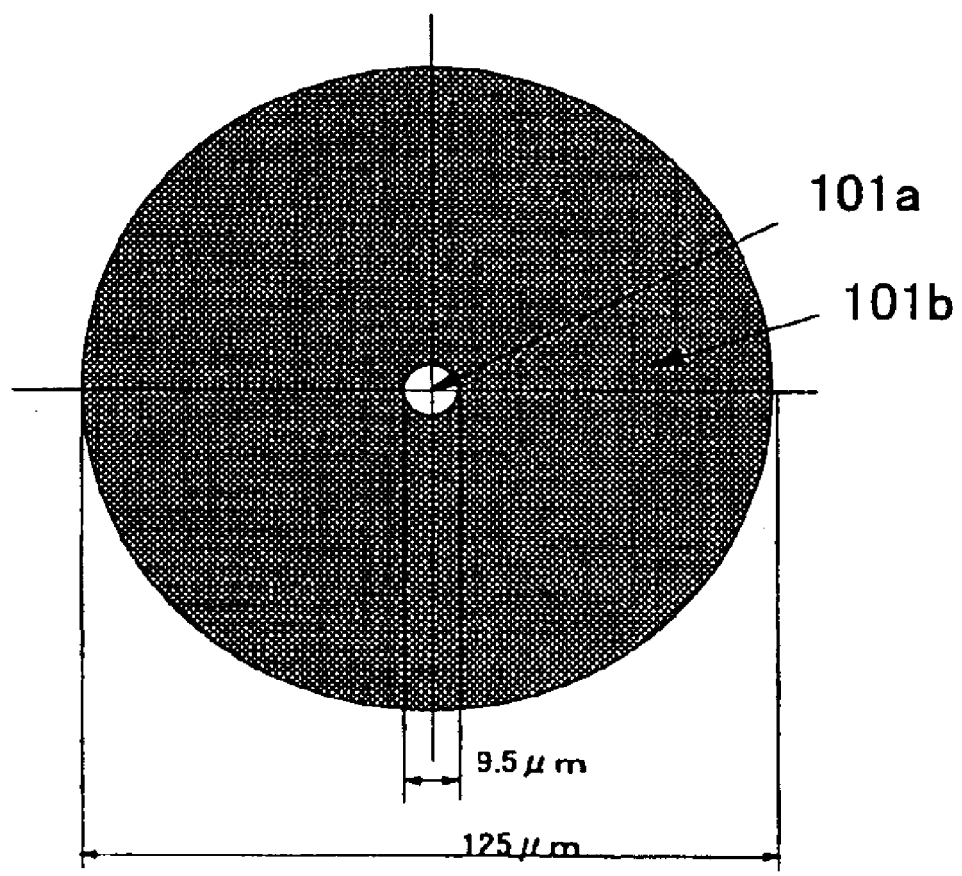
FIG. 114 is a diagram showing the cross-section of an optical fiber for single mode transmission according to an embodiment of this invention.

FIG. 114 shows an example of a single mode optical fiber. As compared with the optical fibers of multimode represented in FIGS. 113A and 113C, the core diameter of the single mode optical fiber is very small with regard to the diameter of the cladding layer of 125 μm, and the area of the cladding layer 101b with respect to the core 101a can reach 172 times as large as the core area of the multimode optical fiber In the case of the single mode fiber, recognition of the optical fiber by using the color layer is facilitated further.

[Twenty-Sixth Embodiment]

Next, another embodiment of the present is invention will be explained. In the conventional laser diode, there has been a problem that the threshold current is changed depending on the temperature. In a telecommunication system, the use of the laser diode at strictly constant temperature is difficult. Thus, in the case of the edge-emission laser diode, it has been practiced to detect the leakage light emitted in the backward direction by a photodetector and the output off the photodetector has been used for a feed back control of the laser outputs such that the output of the laser diode is maintained constant.

In the case of the surface-emission laser diode, however, such detection of the leakage light is not possible. Thus, in the conventional surface-emission laser diode, it has been practiced to provide a photodetector between the laser diode and the optical fiber or at the downstream side of the optical fiber, and the feed back control has been applied by using such a photodetector such that the output of the laser diode is maintained constant.

Figure 115:
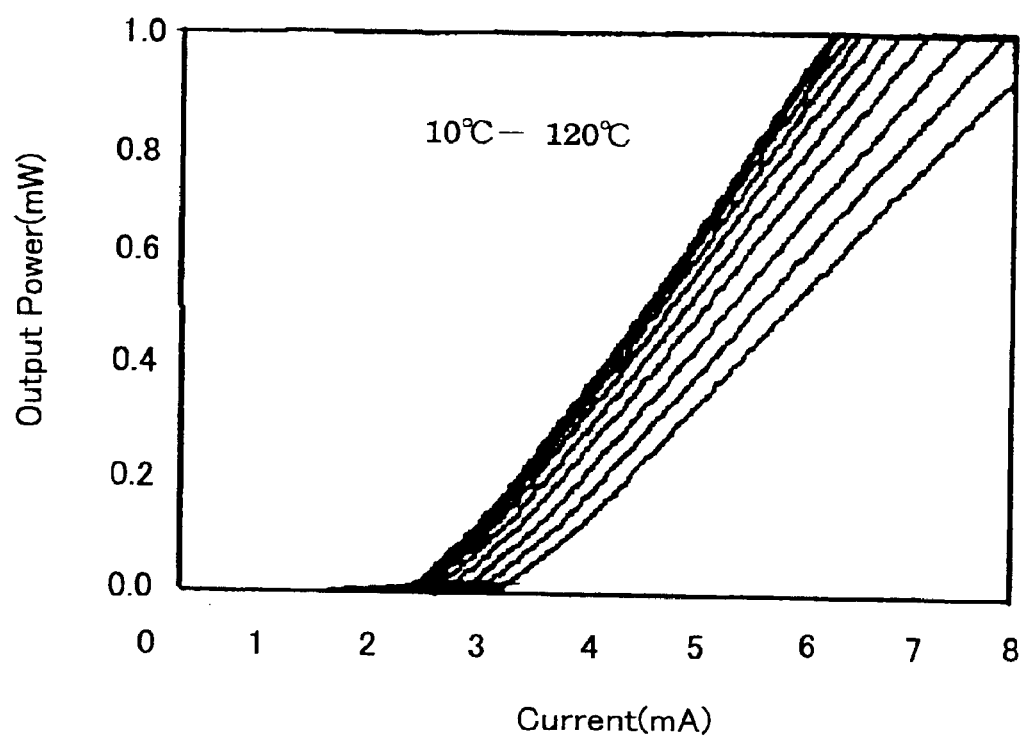
FIG. 115 is a diagram showing the electric current-optical output characteristic of a long-wavelength surface-emission laser diode of an embodiment of this invention for each temperature.
Figure 116:
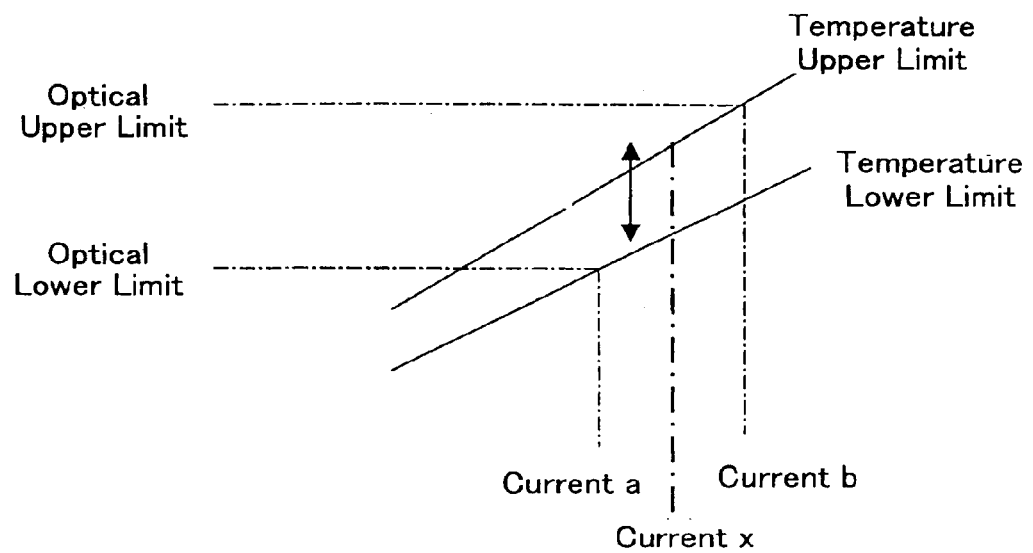
FIG. 116 is a diagram explaining the electric current control of a long-wavelength surface-emission laser diode of an embodiment of this invention.

FIG. 115 shows an example of the I-L (current-optical output) characteristic of the long-wavelength laser diode of the present invention.

Referring to FIG. 115, the laser diode of the present invention has a feature, contrary to the conventional laser diode, in that the change of the threshold current with temperature is very small. Only the slope of the curve is influenced with the temperature.

Thus, as long as the laser diode is driven at a constant drive voltage, the change of the optical output is small even in the case there is a temperature change.

For example, in the case the laser diode is driven at the drive current of 6 mA in FIG. 115, the change of optical output associated with the temperature change from 10° C. to 70° C. is only 0.1 mW. Even when the temperature is changed from 10° C. to 100° C., the change of the optical output is only 0.25 mW. In terms of S/N ratio, this is respectively 26 dB and 18 dB. Thus, the laser diode of the present invention can provide a sufficient signal quality in the commonly used temperature environment of 20–70° C.

It should be noted that the drift of current of a constant current source is in the order of ±2–3% Thus, it is easy to achieve a constant current control.

Thus, by setting the upper limit and lower limit for the optical output and further setting the upper limit and lower limit for the temperature, the present embodiment achieves the desires control of the optical output within the foregoing upper and lower limits by controlling the drive current at a constant value x between a first reference drive current a corresponding to the upper limit optical output at the lower limit temperature and a second reference drive current b corresponding to the lower limit optical output at the upper limit temperature.

According to the present invention, the laser diode is driven at a constant current determined with respect to the target optical output.

[Twenty-Seventh Embodiment]

The threshold current of the laser diode increases gradually with time and when the threshold current has exceeded a predetermined value, it is the lifetime of the laser diode.

Thus, there is a demand to avoid deterioration of signal quality even when the aging is in progress.

Figure 117:
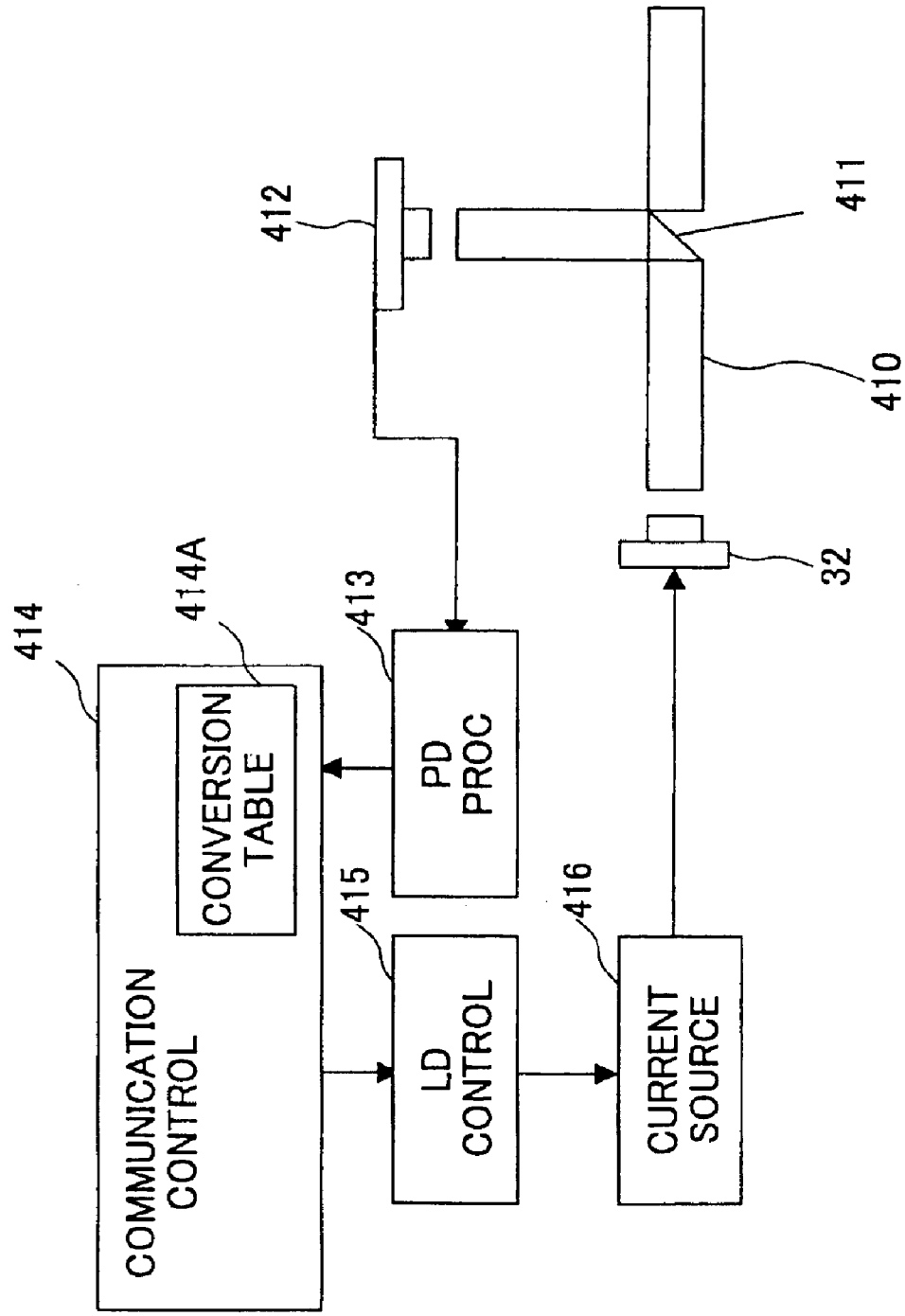
FIG. 117 is a diagram showing the constitution of a long-wavelength surface-emission laser diode according to an embodiment of this invention that uses an electric current control.

As shown in FIG. 117, for example, there is provided a half mirror 411 in the transmission path 410 coupled to the laser diode 32, and the optical beam thus divided is detected by the photodetection device 412. In this case, the intensity of the laser beam detected by the photodetection device, in other words the monitor optical strength, is fed back to the control unit 415 and the constant current source 416.

In the illustrated example, the output of the photodetection device 412 is supplied to the communication control unit 414, and the communication control unit 414 obtains the correction of the drive current by referring to a conversion table 414A representing the relationship between the monitor optical output and the correction of the drive current. According to such a construction, it is possible to eliminate the effect of aging by removing the change of optical output caused by aging. Thereby, a practical telecommunication system is realized.

In order to monitor for the aging or anomaly related to the aging, it is sufficient that the output of the photodetection device at the reception end can be obtained. Thus, it is also possible to transmit the reading of the photodetection device at the reception side in the form of data to the transmission side. For example, it is possible to transmit the reading of the photodetection device periodically or at any time to the optical transmission side, separately to the optical telecommunication data. The data thus transmitted may be forwarded in the transmission side from the communication control unit to the laser control unit for correcting the drive current. By doing so, it is possible to eliminate the fluctuation of optical output caused by aging.

[Twenty-Eighth Embodiment]

Next, a further embodiment of the present invention will be described.

Figure 118:
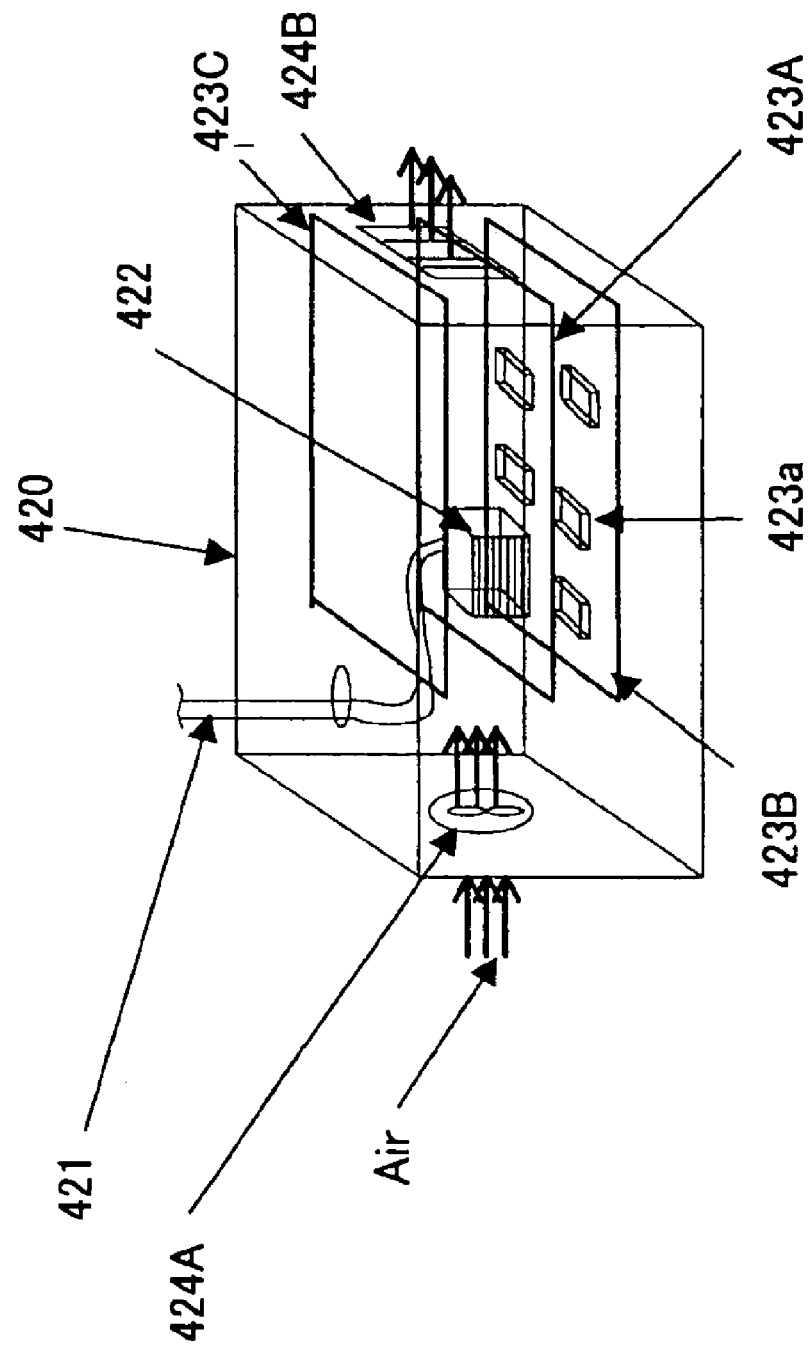
FIG. 118 is a diagram showing the interior of an optical fiber telecommunication apparatus in which a long-wavelength surface-emission laser diode of an embodiment of this invention is provided.

FIG. 118 shows an example of an optical telecommunication system that uses a long-wavelength laser diode 32 of the present invention.

Referring to FIG. 118, it can be seen that the system includes a laser diode module connected with an optical fiber 421, an optical circuit substrate 423 carrying the laser diode module 422, and electronic substrates 423B and 423C provided above and below the optical circuit substrate 423A. The circuit substrates 423A–423C are accommodated in a case 420, wherein the substrates 423A–423C form a air flow path in the case 420. Further, the case 420 is provided with a fan 424A, and an air outlet is formed on the case 420 at the side opposite to the fan 424A. The electronic substrates 423B and 423C carry electronic components 423a thereon.

The fan 424A may be a compulsory air-feeding fan such as sirocco fan, and supplies a cooling air inside the case 420. The cooling air flows along the space between the substrates 423B and 423C and there takes place heat exchange between the air and the laser diode module 422 as the cooling air is caused flow along the substrates. The cooling air thus exchanged heat is expelled from the air outlet. 424B In the illustrated example, the substrate 423B of the smallest heat generation is provided at the lower part and the substrate 423C causing a larger heating is provided thereabove.

It should be noted that the surface of the optical substrate 423A facing the electronic substrate 423C is reduced with projections or depressions so as to minimize disturbance of air flow. Meanwhile, a similar effect is obtained also in the case in which a flat board carrying no electronic components is used for the electronic substrates 423B or 423C While the present embodiment uses only one fan 424A, it is possible to increase the number of fans with the number of the laser diodes provided in the case 420. It should be noted that the heating is increased when the number of the laser diodes is increased. Alternatively, it is possible to increase the flow rate of the air. In this case, the area of the air outlet has to be increased.

It is also possible to use the fan 424A to pull the air inside the case 420. Further, it is possible to provide a fan in the air intake side and another fan in the air outlet side.

[Twenty-Ninth Embodiment]

Figure 119:
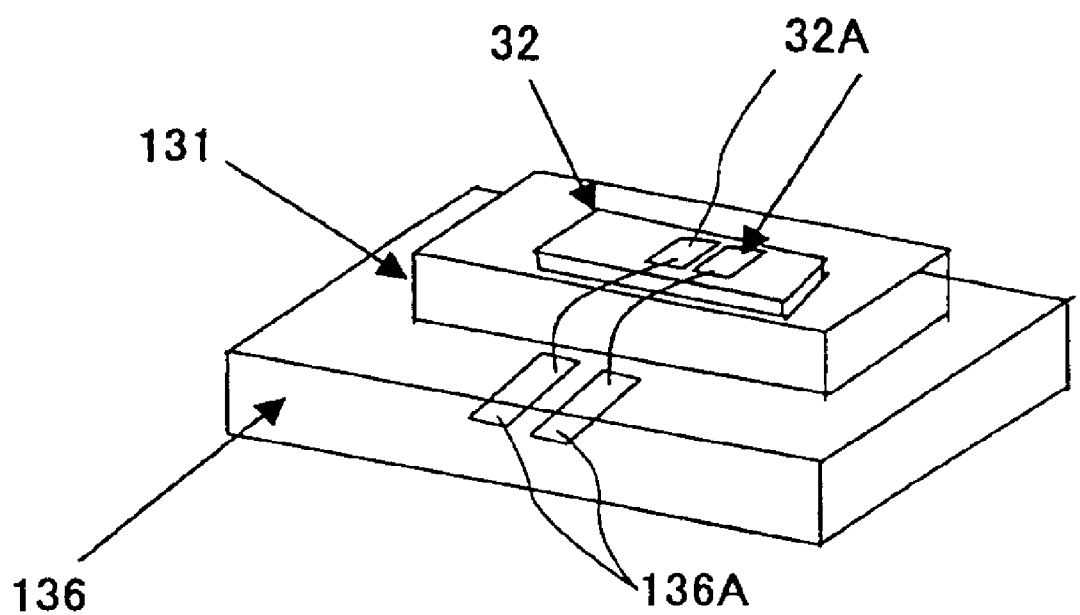
FIG. 119 is a diagram showing the constitution of a long-wavelength surface-emission laser diode module according to an embodiment of this invention.

FIG. 119 shows an example of the laser diode module that uses the long-wavelength laser diode 32 of the present invention.

Referring to FIG. 119, it can be seen that two laser diodes 32A are formed on the GaAs substrate 32 monolithically, and the GaAs substrate 32 is carried by a Si mount substrate 131 having a large thermal conductivity. Further, the Si substrate 131 is carried on a ceramic substrate 1363 having a still larger thermal conductivity. The ceramic substrate 136 is mounted on an optical circuit board such as the substrate 434A shown in FIG. 101. The ceramic substrate 136 is cooled.

Further, electric interconnection to the laser diode 32A is provided by way of bonding wires connecting an electrode 136A on the ceramic substrate 136 and the electrode on the laser diode 32A.

With such a construction, the heat generated by the laser diode 32A is transferred to the GaAs substrate by thermal conduction and then to the Si substrate 131 of lower temperature. Further, the heat is transferred to the ceramic substrate 136 of lower temperature, and efficient cooling of the laser diode 32A becomes possible. It should be noted that the surface area of the ceramic substrate 136 is the largest among the constituent parts, and thus, the ceramic substrate 136 is cooled efficiently by radiation and contact with the air.

The GaAs substrate constituting the laser diode chip of the present invention has a thermal conductivity of 0.54 W/cmK, while it is noted that the thermal conductivity of Si is 1.48 W/cmK. Further, a material having a larger thermal conductivity than Si such as BeO (2.72 W/cmK) or diamond (9.0 W/cmK) can also be used, wherein the value of the thermal conductivity is the value at 300K.

Meanwhile, thermal transfer across tow substrates contacting with each other can be increased by reducing the surface roughness and increasing the intimateness. On the other hand, excessive processing of the surface merely invites increase of cost and the improvement of heat transfer is little. For example, the precision of surface flatness beyond 10 nm merely increases the cost and is not practical Thus, the lower limit of the surface roughness should be around 10 nm.

With regard to the upper limit of surface roughness, excessively rough surface is disadvantageous for contacting two substrates. Thus, the inventor of the present invention conducted extensive study about this matter and discovered that the surface roughness of 1000 nm or less is sufficient for guaranteeing intimate contact and excellent heat transfer. In the experiments conducted by causing the laser diode to oscillate, it was confirmed that the heat generated by the laser diode 32A is transferred from the laser diode chip 32 to the first substrate 131, and to the second substrate 136, without causing accumulation of heat. With this, it became possible to reduce the fluctuation of threshold current of the laser diode caused by heating. Thereby, it became possible to cause the laser diode to oscillate stably.

Figure 120:
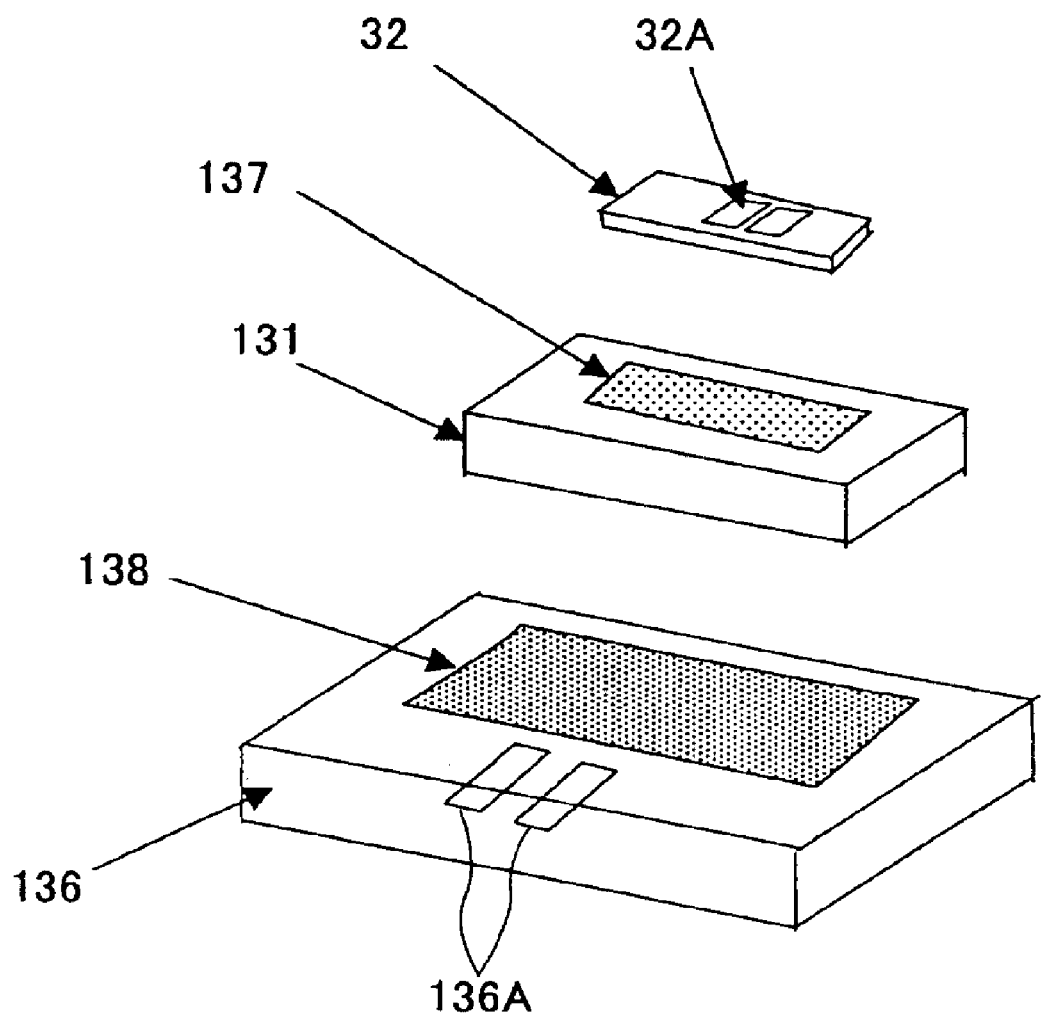

FIG. 120 show an example of the long-wavelength laser diode module of the present embodiment, wherein the GaAs substrate 32 carrying the laser diode 32A is fixed upon the Si mount substrate 131 via a thermal conduction layer 137, and the Si mount substrate 131 is mounted on the ceramic substrate 136 via another thermal conduction layer 138.

In the present embodiment, the contact surfaces of the substrates 32, 131 and 136 are polished by using an alumina abrasive to a surface roughness Ra of 10–1000 nm, and any gap formed therebetween is filled with the thermal conductive layer 137 or 138.

Here, it should be noted that the thermal conductive layer 137 or 138 may be formed of an organic polymer material such as epoxy resin or silicone resin or acryl resin dispersed with metal powders such as aluminum or gold or silver or copper. The metal powders have a diameter of several nanometers to 100 nm and the resin layer is applied with a thickness of 3–100 $\mu$m. The proportion of the metal powders was set to 0.1–1 part with regard to 1 part of resin.

Figure 121:
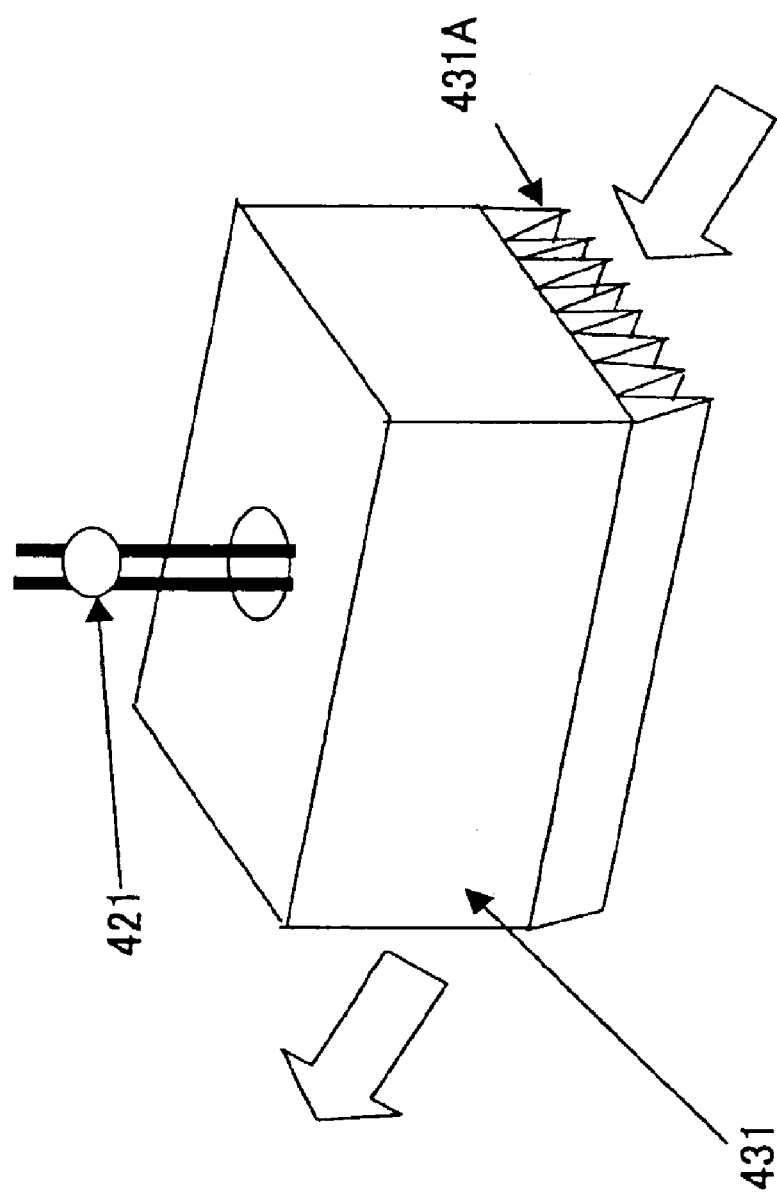

FIG. 121 is an example of a long-wavelength laser diode of the present embodiment and is formed of a laser module package 431 including the laser diode module 422 of FIG. 118 and an optical fiber 421.

At the bottom part of the package 431, there is provided a cooling fin structure 431A having eight cooling fins each having a rectangular cross-section, with a base length of 1 mm and a height of 3 mm, and the cooling air is caused to flow along the cooling fin structure 431A.

It should be noted that the outer surface of the laser module package 431 performs also as a heat-radiating member similar to the ceramic substrate 136, in addition to the function of the packaging of the laser diode. It should be noted that the surface on which the cooling fins are provided ins not limited to the bottom surface but may be other surface along with the cooling air is caused to flow. Further, the number and construction of the cooling fins are by no means limited to the one illustrated.

The point of the present embodiment is to provide, in a heat radiating structure in which a first substrate including a heat source and a second substrate not including a heat source are stacked, such that the surface area of the part of the second substrate not contacting with the first substrate is set larger than the surface area of the second substrate contacting with the first substrate. Any of the structure may be used in place of the cooing fin as long the structure increases the surface area of the second substrate.

As noted previously, in the surface-emission laser diode oscillating at the wavelength of 1.1–1.7 $\mu$m, it is possible to form a number of laser diodes on a common chip and is suitable for large capacity optical telecommunication system. However, design of such a construction including a large number of laser diode has to be made carefully in view of severe heating. The present embodiment provides a solution to this problem. Larger the number of the laser diodes, more effective the construction of the present embodiment.

[Thirtieth Embodiment]

Figure 122:
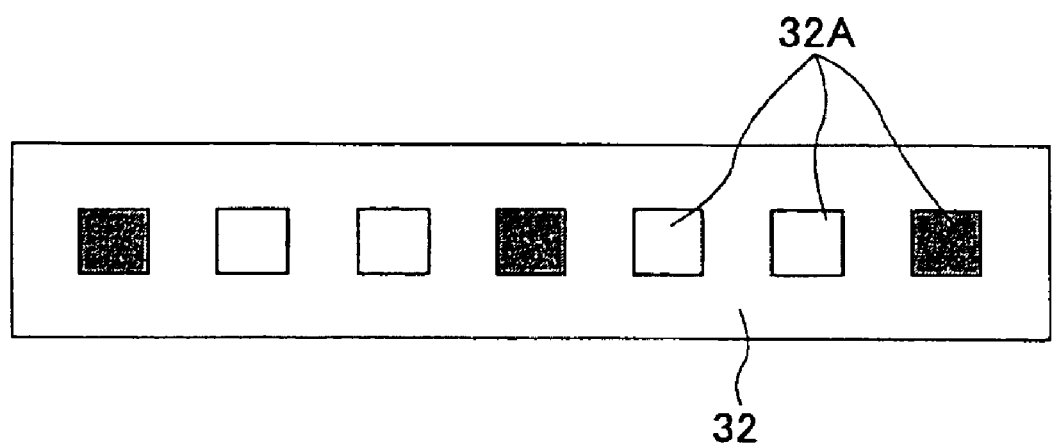
Figure 123:
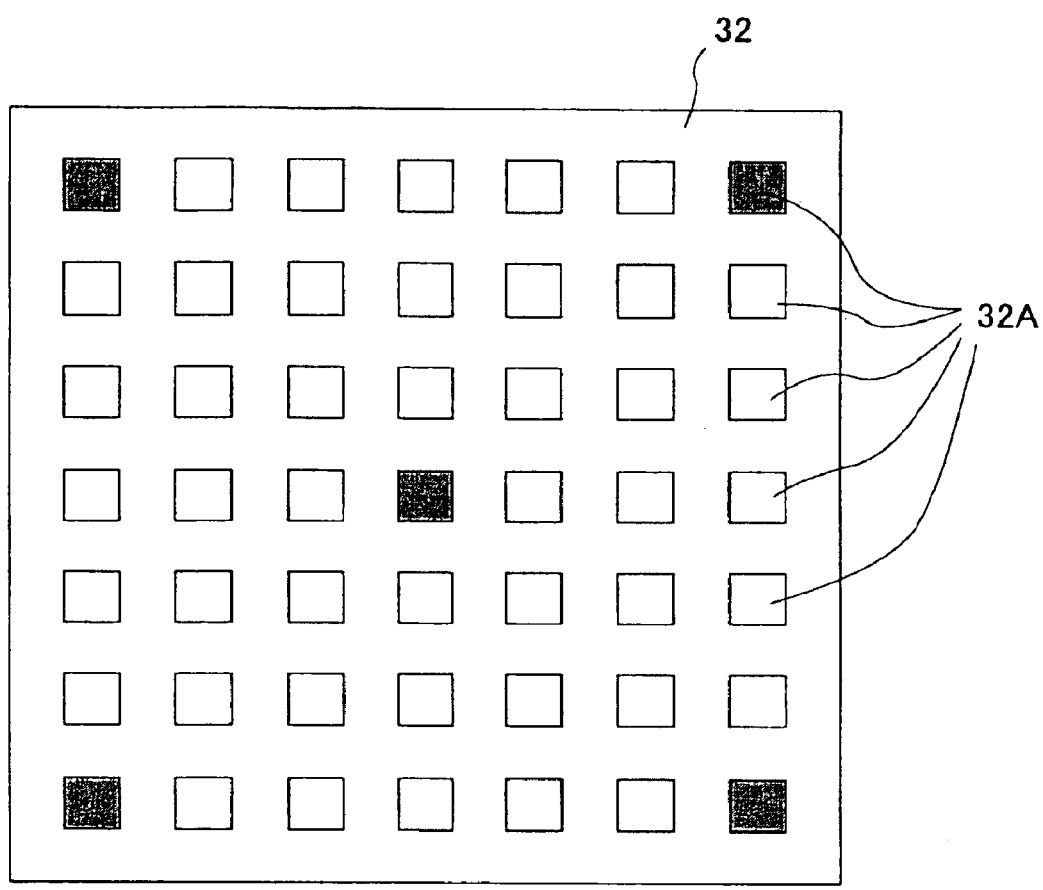

FIGS. 122 and 123 show another embodiment of the present invention, wherein FIG. 122 shows the case a number of long-wavelength surface-emission laser diodes 32A of the present invention are used to form a one-dimensional array, while FIG. 133 show the case the laser diodes form a two-dimensional array.

In the drawings, the laser diode elements 32A provided with shading have corresponding photodetection devices, while other elements have no photodetection device and the output thereof is taken to the outside.

Figure 124:
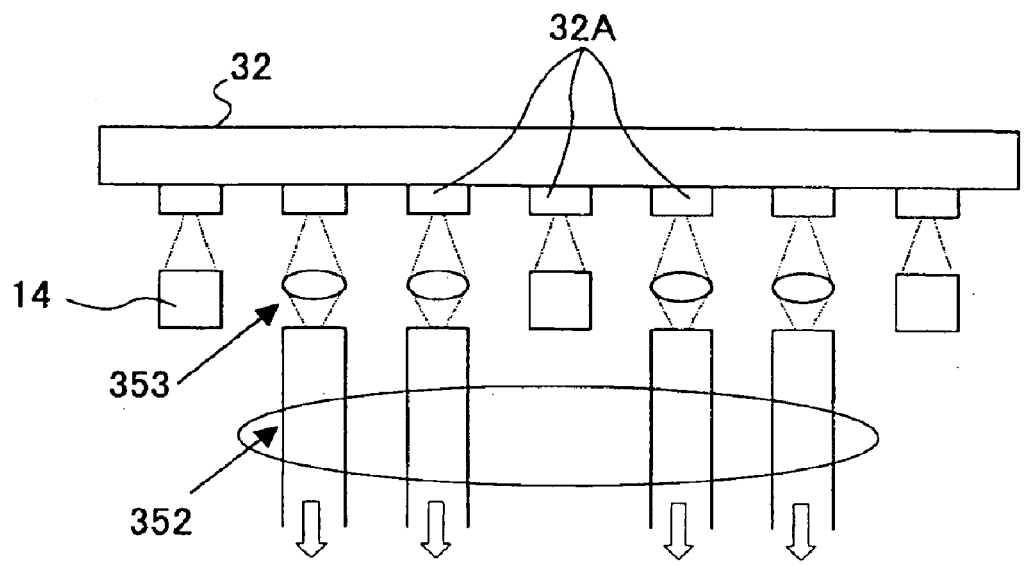

FIG. 124 shows the construction of FIG. 122 from a different angle It can be seen that the laser diode elements 32A provided with the shading is provided with the photodetection device 142P and the photodetection device 142P interrupts the laser beam. On the other hand, the laser beam of the laser diode 32A not provided with the photodetection device 142P is injected into the optical fiber 352 by the lens 353.

Figure 126:
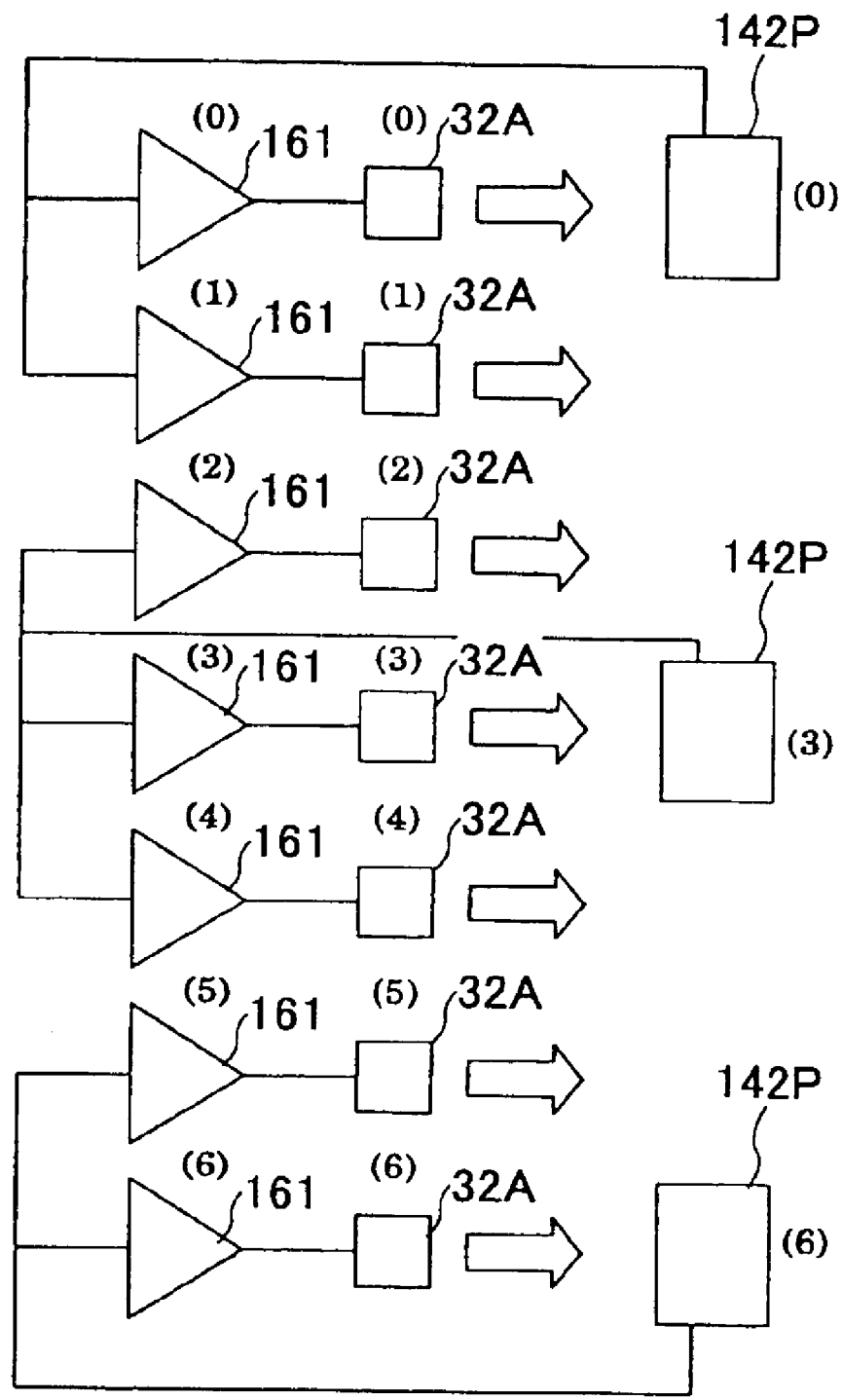
Figure 127:
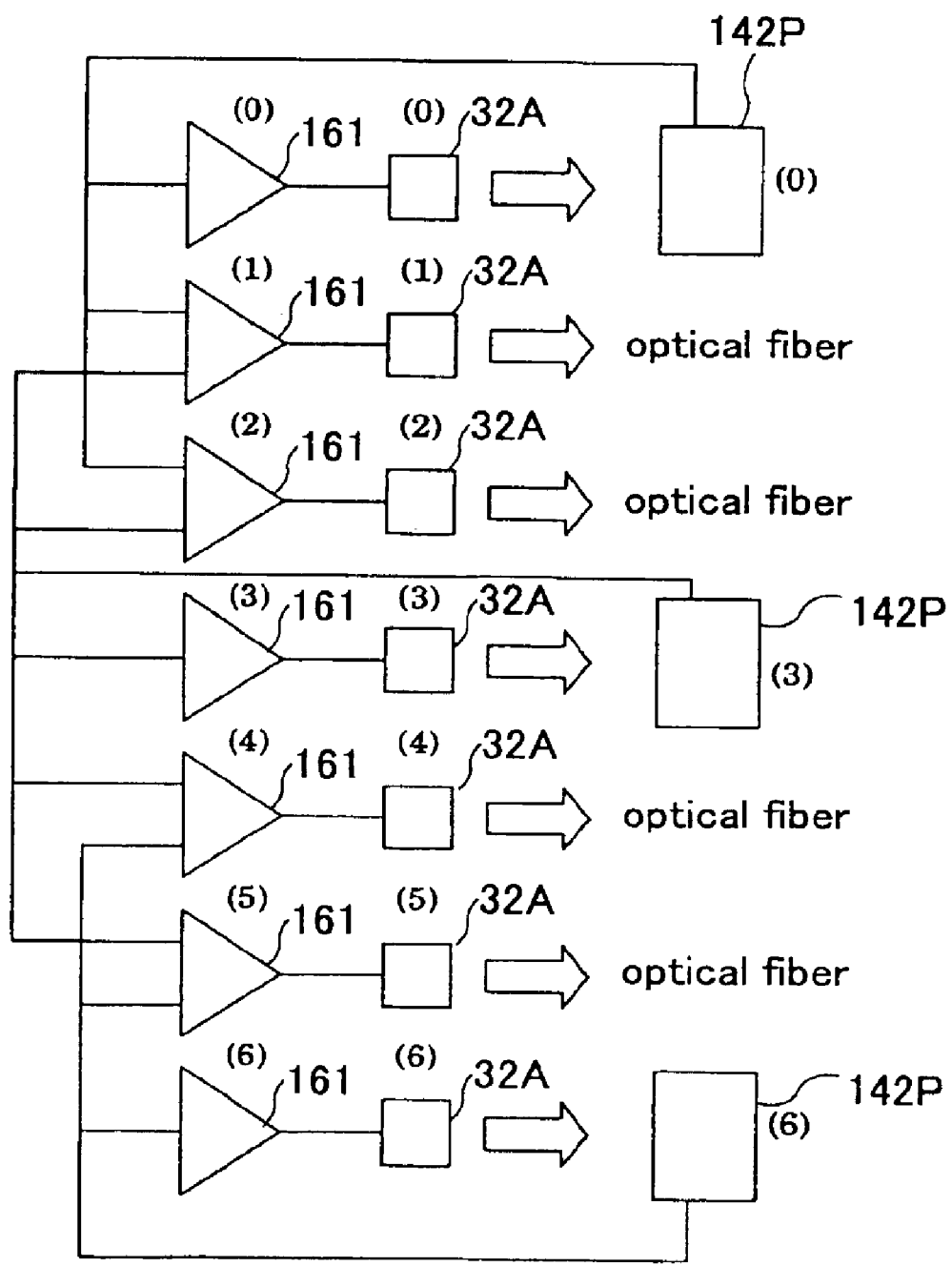

The optical output of the laser diode 32A not provided with the photodetector 142P is calculated based on the output of the photodetector(s) 142P located in the vicinity thereof. Based on the output of the photodetector 142P thus 110 obtained, output of each of the laser diodes 32A is controlled. The variation of output between the laser diodes 32A is easily corrected by using a correction coefficient obtained in advance FIGS. 125–127 show an example of output control of the laser diode using the construction of FIG. 124.

Figure 125:
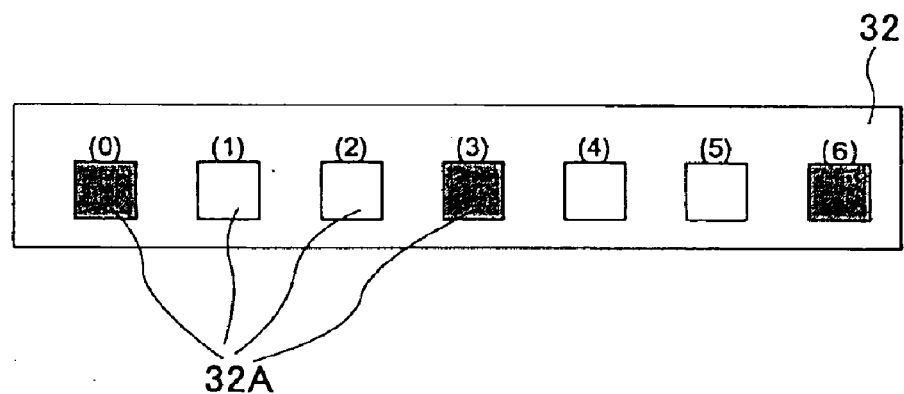

Referring to FIG. 125, the laser diode chip 32 includes a one-dimensional array of laser diodes 32A similar to FIG. 122. For the sake of convenience of explanation, the laser diodes 32A in FIG. 125 are provided with numbers (0)–(6).

EXAMPLE 1

In Example 1, the out put of the photodetection device 142P that monitors the output of the first laser diode 32A (1) is used for controlling the drive currents of the laser diodes 32A (0)–(6) of FIG. 125 by using the driver circuit 106 of FIG. 106 such that $I_0$ is controlled based on the value of $a_0 O_0$;
$I_1$ is controlled based on the value of $a_1 O_0$;
$I_2$ is controlled based on the value of $a_2 O_0$;

$I_3$ is controlled based on the value of $a_3O_0$;
$I_4$ is controlled based on the value of $a_4O_0$;
$I_5$ is controlled based on the value of $a_5O_0$; and
$I_6$ is controlled based on the value of $a_6O_0$,
wherein Ii represents the drive current of the i-th (i=0–6) laser diode 32A and O1 represents the optical output of the i-th laser diode 32A. Further, $a_i$ represents a correction coefficient and is determined in advance by measuring the output of respective laser diodes such that the output calculated based on the drive current is closest to the actual laser output.

EXAMPLE 2

In Example 2, the out put of the photodetection device 142P that monitors the output of the first laser diode 32A (1) is used for controlling the drive currents of the laser diodes 32A (0)–(6) of FIG. 125 by using the driver circuit 106 of FIG. 106 such that
$I_0$ is controlled based on the value of $a_0O_0$;
$I_1$ is controlled based on the value of $a_1O_0+b_1O_3$;
$I_2$ is controlled based on the value of $a_2O_0+b_2O_3$;
$I_3$ is controlled based on the value of $a_3O_3$;
$I_4$ is controlled based on the value of $a_4O_0+b_4O_6$;
$I_5$ is controlled based on the value of $a_5O_0+b_5O_6$; and
$I_6$ is controlled based on the value of $a_6O_6$.

EXAMPLE 3

Figure 128:
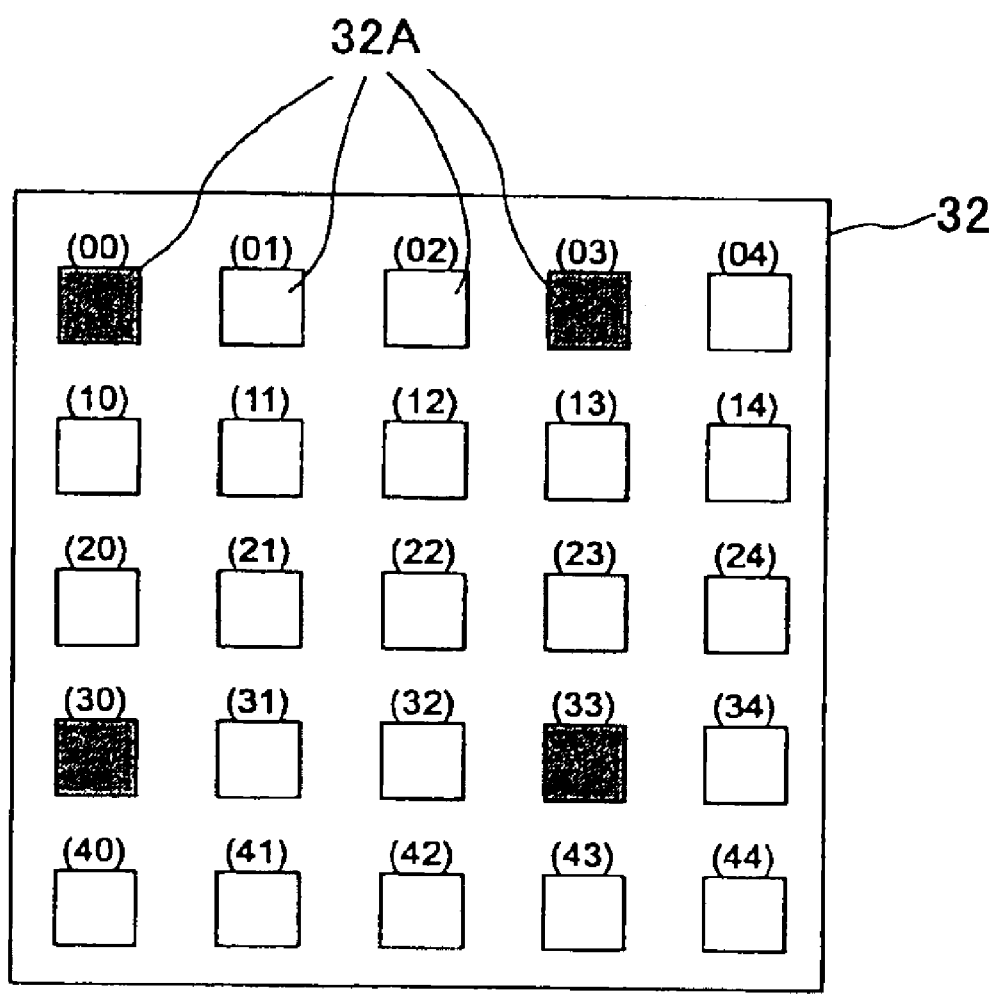

In Example 3, the out put of the photodetection device 142P that monitors the output of the first laser diode 32A (1) is used for controlling the drive currents of the laser diodes 32A (00)–(44) of FIG. 128 by using the driver circuit 106 of FIG. 106 such that
$I_{00}$ is controlled based on the value of $a_{00}O_{00}$;
$I_{01}$ is controlled based on the value of $a_{01}O_{00}$;
$I_{10}$ is controlled based on the value of $a_{10}O_{00}$;
$I_{11}$ is controlled based on the value of $a_{11}O_{00}$;
$I_{02}$ is controlled based on the value of $a_{02}O_{03}$;
$I_{03}$ is controlled based on the value of $a_{03}O_{03}$;
$I_{04}$ is controlled based on the value of $a_{04}O_{03}$,
$I_{12}$ is controlled based on the value of $a_{12}O_{03}$;
$I_{13}$ is controlled based on the value of $a_{13}O_{03}$;
$I_{14}$ is controlled based on the value of $a_{14}O_{03}$,
wherein $a_{ij}$ is a correction coefficient.

EXAMPLE 4

Figure 129:
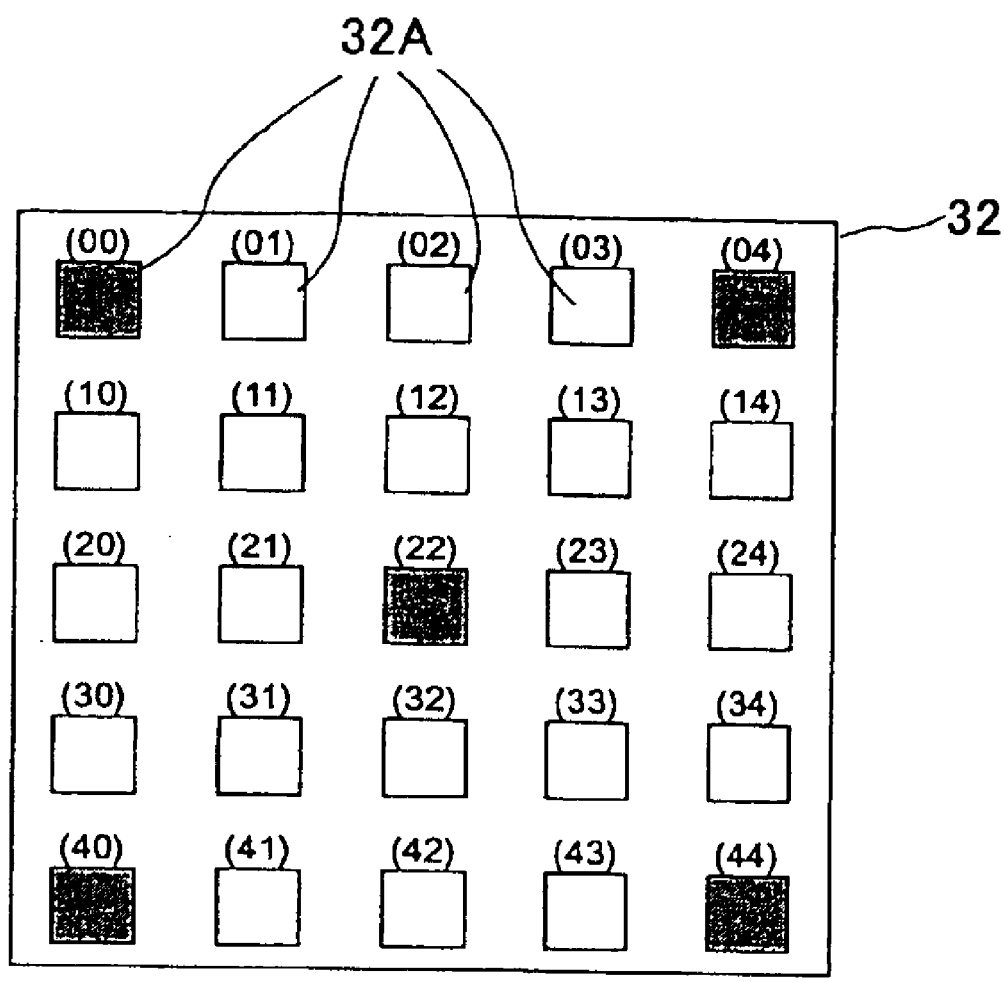

In the example of FIG. 129, the ij-th laser diode 32A of FIG. 129 is controlled such that
$I_{00}$ is controlled based on the value of $a_{00}O_{00}$;
$I_{01}$ is controlled based on the value of $a_{01}O_{00}+b_{01}O_{04}+c_{01}O_{22}$;
$I_{11}$ is controlled based on the value of $a_{11}O_{00}+b_{11}O_{22}$;
$I_{21}$ is controlled based on the value of $a_{21}O_{00}+b_{21}O_{22}+c_{21}O_{10}$;
In Example, 4, $a_{ij}$, $b_{ij}$ and $c_{ij}$ are correction coefficients.
[Thirty-First Embodiment]

Next a further embodiment of the present invention will be explained.

The present embodiment is related to the production control of the laser array module that uses the laser diode of the present invention and used for the long-wavelength optical telecommunication.

Here, it should be noted that the laser array module means that a plurality of surface-emission laser diodes are provided in the form of a module and includes the case in which a number of laser diodes are formed on a single chip or the case in which a number of such chips are arranged. Further, the case of plural chips, each carrying a single laser diode, are arranged is also included.

In the production process of such a laser diode module, laser chip modules carrying a laser diode array are produced.

In such a production process, a predetermined number of laser diode devices or laser diode chips are prepared and these elements are arranged to form the desired laser array module.

Thereafter, an inspection process is conducted with regard to the laser diode modules, wherein the inspection is conducted for each of the laser diode chips and each of the laser diodes. Upon confirmation that a desired quality is achieved for each of the devices and each of the chips, the laser array module becomes the state ready for shipping.

In the case there is detected a single device out of n devices of laser diode chips arranged to form the laser array module is defective, the laser chip module is treated as a defective product.

On the other hand, if it is possible to treat a laser chip module, in which the number c of the defective laser diodes or chips is within a predetermined number n of good products, as being a good product, the productivity of the laser array module is increased significantly.

The inventor of the present invention realized the importance of such a product control process and diligently studied the production control process applicable to the case of producing a product that uses a large number of elements each performing, a single and same function as other elements.

Hereinafter, the present embodiment will be described with reference to FIGS. 130 and 131.

Figure 130:
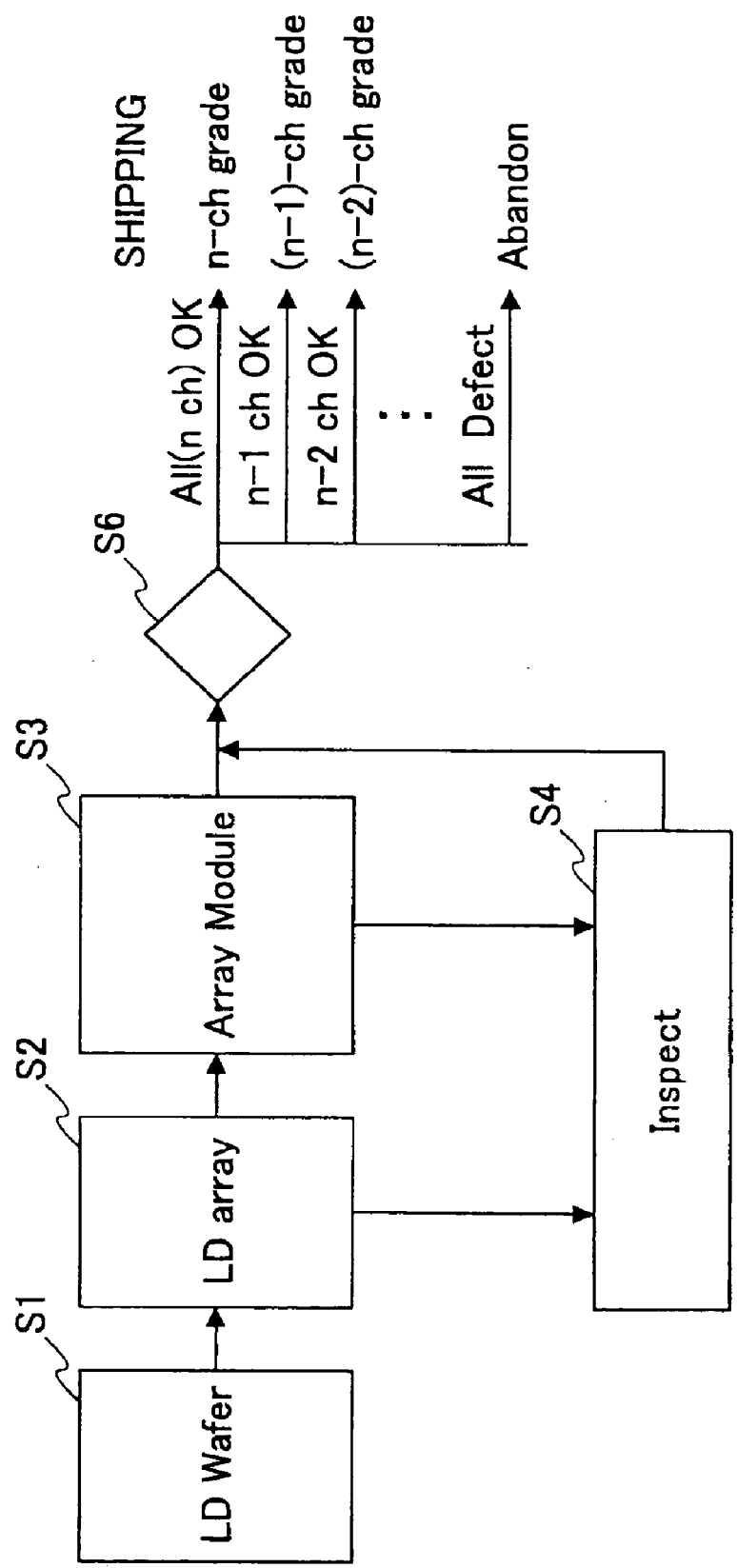

Referring to FIG. 130, the production of the laser diode or chip is conducted according to the step S1 of wafer process step, step S2 for producing a laser diode array step, and S3 for producing a laser array module. Further, there is provided an inspection step S4 for inspecting the array or module produced by the steps S2 and S3.

In the present embodiment, the laser array module that turned out to include a defective device or defective chip is not immediately treated as a defective product. In the event the number c of the defects is within a certain threshold (n–c) (n is the total number of the devices or chips in the module), the product is shipped as the product having the quality of (n–c) In the process of FIG. 113, this examination step is conducted at the step S6. In the case the entire chips n are defective, the laser diode module is treated as a defective device.

Figure 131:
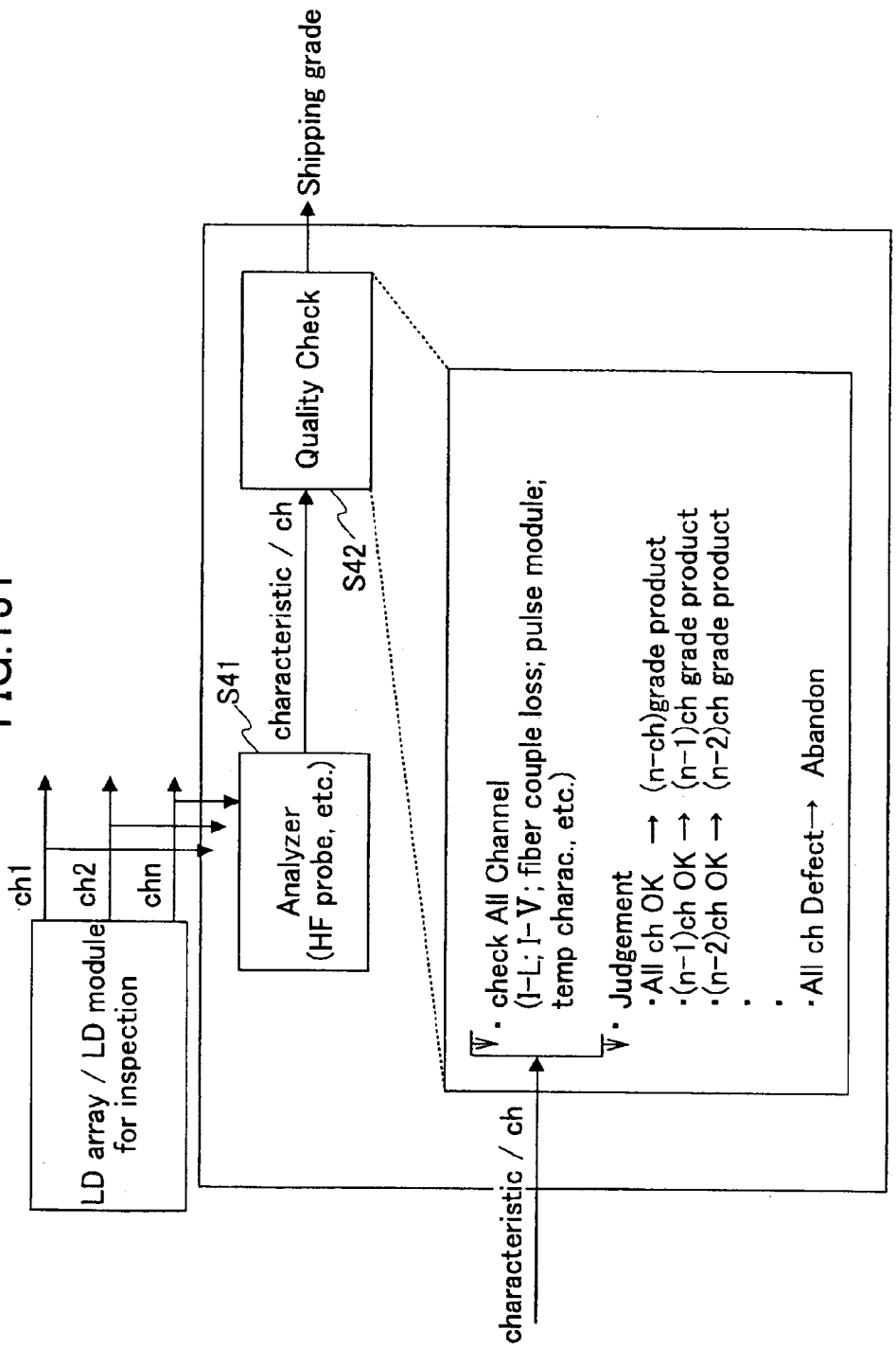

Thus, in the step S4, of FIG. 131, an inspection step 541 is conducted for evaluating the product quality for each channel CH by using a high-frequency probe or analyzer.

The data of the product quality for each channel thus obtained is then examined in the product examination step S42, wherein the step S42 judges whether or not the required quality is satisfied for all of the laser diodes or chips. The judgment is made with regard to the items such as I-L characteristic, I-V characteristic, fiber coupling loss, pulse modulation characteristic, temperature dependence, and the like. Thereby, the laser array modules are shipped according to the grades corresponding to the number of the properly functioning laser diode chips.

From the explanation noted above, it will be apparent that the present embodiment enables the use of most of the laser array modules, used for the optical telecommunication system by using the surface-emission laser diode of 1.1–1.7 $\mu$m, according to the condition of the module.

According to the present embodiment, therefore, the laser array modules are used effectively even in the case only n–c of the laser diodes operate properly, and the loss of the laser array module during the production process is minimized.

The present invention is not limited to the embodiments described heretofore, but various variations and modifications may be made without departing from the scope of the invention.

The present application is based on Japanese priority applications
No. 2001-050145 filed on Feb. 26, 2001,
No. 2001-050171 filed on Feb. 26, 2001,
No. 2001-050083 filed on Feb. 26, 2001,
No. 2001-051253 filed on Feb. 26, 2001,
No. 2001-051256 filed on Feb. 26, 2001,
No. 2001-051266 filed on Feb. 26, 2001,
No. 2001-053213 filed on Feb. 27, 2001,
No. 2001-053218 filed on Feb. 27, 2001,
No. 2001-053200 filed on Feb. 27, 2001,
No. 2002-50548 filed on Feb. 26, 2002,
No. 2001-053190 filed on Feb. 27, 2001,
No. 2001-053225 filed on Feb. 27, 2001,
No. 2001-073767 filed on Mar. 15, 2001,
No. 2001-090711 filed on Mar. 27, 2001,
No. 2002-019748 filed on Jan. 29, 2002,
No. 2002-033590 filed on Feb. 12, 2002,
the entire contents of which are hereby incorporated by reference.

What is claimed is:

1. A distributed Bragg reflector, comprising:
a first semiconductor layer having a first refractive index;
a second semiconductor layer having a second refractive index, said first refractive index larger than said second refractive index, said first and second semiconductor layers being stacked alternately; and
a material layer, provided between said first semiconductor layer and said second semiconductor layer, having a thickness equal to or larger than 5 nm but equal to or smaller than 50 nm such that a reflective change rate is substantially uniform as a compositional gradation layer thickness increases, and having a third refractive index intermediate between said first and second refractive indices,
wherein said distributed Bragg reflector is tuned to a wavelength of 1.1 µm or longer.

2. A distributed Bragg reflector as claimed in claim 1, wherein said material layer has a thickness equal to or larger than 20 nm.

3. A distributed Bragg reflector as claimed in claim 2, wherein said first and second semiconductor layers are formed of any of AlAs, GaAs and AlGaAs, and wherein there is a difference of Al content of less than 80% between said first semiconductor layer and said second semiconductor layer.

4. A distributed Bragg reflector as claimed in claim 1, wherein said material layer has a thickness equal to or larger than 30 nm.

5. A distributed Bragg reflector as claimed in claim 4, wherein said first semiconductor layer and said second semiconductor layer are formed of any of AlAs, GaAs and AlGaAs, and wherein there is a difference of Al content of 80% or more between said first semiconductor layer and said second semiconductor layer.

6. A distributed Bragg reflector, comprising:
a first semiconductor layer having a first refractive index;
a second semiconductor layer having a second refractive index, said first refractive index larger than said second refractive index, said first and second semiconductor layers being stacked alternately; and
a material layer having a third refractive index intermediate between said first and second refractive indices, said distributed Bragg reflector being tuned to a wavelength of 1.1 µm or longer,
said material layer having a thickness equal to or smaller than $(0.05\lambda-15)$(nm) where $\lambda$ is a tuned wavelength (nm) of the distributed Bragg reflector, such that a reflective change rate is substantially uniform as a compositional gradation layer thickness increases.

7. A distributed Bragg reflector as claimed in claim 6, wherein said material layer has a thickness of 20 nm or more.

8. A distributed Bragg reflector as claimed in claim 6, wherein said material layer has a thickness of 30 nm or more.

9. A surface-emission laser diode, comprising:
an active layer; and
a resonator cooperating with said active layer, said active layer comprising upper and lower reflectors disposed above and below said active layer, at least one of said upper and lower reflectors comprising a distributed Bragg reflector, comprising:
a first semiconductor layer having a first refractive index;
a second semiconductor layer having a second refractive index, said first refractive index larger than said second refractive index, said first and second semiconductor layers being stacked alternately; and
a material layer having a third refractive index intermediate between said first and second refractive indices, said distributed Bragg reflector being tuned to a wavelength of 1.1 µm or longer,
said material layer having a thickness equal to or larger than 5 nm but equal to or smaller than 50 nm such that a reflective change rate is substantially uniform as a compositional gradation layer thickness increases.

10. A surface-emission laser diode as claimed in claim 9, wherein said material layer has a thickness equal to or larger than 20 nm.

11. A surface-emission laser diode as claimed in claim 10, wherein said first and second semiconductor layers are formed of any of AlAs, GaAs and AlGaAs, and wherein there is a difference of Al content of less than 80% between said first semiconductor layer and said second semiconductor layer.

12. A surface-emission laser diode as claimed in claim 9, wherein said material layer has a thickness equal to or larger than 30 nm.

13. A surface-emission laser diode as claimed in claim 12, wherein said first semiconductor layer and said second semiconductor layer are formed of any of AlAs, GaAs and AlGaAs, and wherein there is a difference of Al content of 80% or more between said first semiconductor layer and said second semiconductor layer.

14. A surface-emission laser diode as claimed in claim 9, wherein said active layer is formed of any of a GaNAs layer, a GaInAs layer, a GaInNAs layer, a GaAsSb layer, a GaInAsSb layer, and a GaInNAsSb layer.

15. A surface-emission laser diode, comprising:
an active layer; and
a resonator cooperating with said active layer, said active layer comprising upper and lower reflectors disposed above and below said active layer,
at least one of said upper and lower reflectors comprising a distributed Bragg reflector, comprising:
a first semiconductor layer having a first refractive index;

a second semiconductor layer having a second refractive index, said first refractive index larger than said second refractive index, said first and second semiconductor layers being stacked alternately; and a material layer having a third refractive index intermediate between said first and second refractive indices, said distributed Bragg reflector being tuned to a wavelength of 1.1 µm or longer, said material layer having a thickness smaller than or equal to (0.05λ–15)(nm) where λ is a tuned wavelength (nm) of the distributed Bragg reflector, such that a reflective change rate is substantially uniform as a compositional gradation layer thickness increases.

16. A surface-emission laser diode as claimed in claim 15, wherein said material layer has a thickness of 20 nm or more.

17. A surface-emission laser diode as claimed in claim 15, wherein said material layer has a thickness of 30 nm or more.

18. A surface-emission laser diode as claimed in claim 15, wherein said active layer is formed of any of a GaNAs layer, a GaInAs layer, a GaInNAs layer, a GaAsSb layer, a GaInAsSb layer, and a GaInNAsSb layer.

19. A laser diode array, comprising:

a substrate; and a plurality of surface-emission laser diodes formed commonly on said substrate, each of said plurality of surface-emission laser diodes comprising:

an active layer; and a resonator cooperating with said active layer, said active layer comprising upper and lower reflectors disposed above and below said active layer, at least one of said upper and lower reflectors comprising a distributed Bragg reflector, comprising:

a first semiconductor layer having a first refractive index;

a second semiconductor layer having a second refractive index, said first refractive index larger than said second refractive index, said first and second semiconductor layers being stacked alternately; and a material layer having a third refractive index intermediate between said first and second refractive indices, said distributed Bragg reflector being tuned to a wavelength of 1.1 µm or longer, said material layer having a thickness equal to or larger than 5 nm but equal to or smaller than 50 nm such that a reflective change rate is substantially uniform as a compositional gradation layer thickness increases.

20. A laser diode array, comprising:

a substrate; and a plurality of surface-emission laser diodes formed commonly on said substrate, each of said surface emission laser diodes comprising:

an active layer; and a resonator cooperating with said active layer, said active layer comprising upper and lower reflectors disposed above and below said active layer, at least one of said upper and lower reflectors comprising a distributed Bragg reflector, comprising:

a first semiconductor layer having a first refractive index;

a second semiconductor layer having a second refractive index, said first refractive index larger than said second refractive index, said first and second semiconductor layers being stacked alternately; and a material layer having a third refractive index intermediate between said first and second refractive indices, said distributed Bragg reflector being tuned to a wavelength of 1.1 µm or longer, and said material layer having a thickness smaller than or equal to (0.05λ–15)(nm) where λ is a tuned wavelength (nm) of the distributed Bragg reflector, such that a reflective change rate is substantially uniform as a compositional gradation layer thickness increases.

21. An optical interconnection system, comprising:

a surface-emission laser diode; and an optical transmission path coupled optically to said surface-emission laser diode, said surface-emission laser diode comprising:

an active layer; and a resonator cooperating with said active layer, said active layer comprising upper and lower reflectors disposed above and below said active layer, at least one of said upper and lower reflectors comprising a distributed Bragg reflector, comprising:

a first semiconductor layer having a first refractive index;

a second semiconductor layer having a second refractive index, said first refractive index larger than said second refractive index, said first and second semiconductor layers being stacked alternately; and a material layer having a third refractive index intermediate between said first and second refractive indices, said distributed Bragg reflector being tuned to a wavelength of 1.1 µm or longer, and said material layer having a thickness equal to or larger than 5 nm but equal to or smaller than 50 nm such that a reflective change rate is substantially uniform as a compositional gradation layer thickness increases.

22. An optical interconnection system, comprising:

a surface-emission laser diode; and an optical transmission path coupled optically to said surface-emission laser diode, said surface-emission laser diode comprising:

an active layer; and a resonator cooperating with said active layer, said active layer comprising upper and lower reflectors disposed above and below said active layer, at least one of said upper and lower reflectors comprising a distributed Bragg reflector, comprising:

a first semiconductor layer having a first refractive index;

a second semiconductor layer having a second refractive index, said first refractive index larger than said second refractive index, said first and second semiconductor layers being stacked alternately; and a material layer having a third refractive index intermediate between said first and second refractive indices, said distributed Bragg reflector being tuned to a wavelength of 1.1 µm or longer, and said material layer having a thickness smaller than or equal to (0.05λ–15)(nm) where λ is a tuned wavelength (nm) of the distributed Bragg reflector, such that a reflective change rate is substantially uniform as a compositional gradation layer thickness increases.

23. An optical interconnection system, comprising:
a surface-emission laser diode array comprising a substrate and a plurality of surface-emission laser diodes provided commonly on said substrate; and
an optical transmission path coupled optically to each of said plurality of surface-emission laser diodes, each of said plurality of surface-emission laser diodes comprising:
an active layer; and
a resonator cooperating with said active layer, said active layer comprising upper and lower reflectors disposed above and below said active layer, at least one of said upper and lower reflectors comprising a distributed Bragg reflector, comprising:
a first semiconductor layer having a first refractive index;
a second semiconductor layer having a second refractive index, said first refractive index larger than said second refractive index, said first and second semiconductor layers being stacked alternately; and
a material layer having a third refractive index intermediate between said first and second refractive indices,
said distributed Bragg reflector being tuned to a wavelength of 1.1 $\mu$m or longer, and
said material layer having a thickness equal to or larger than 5 nm but equal to or smaller than 50 nm such that a reflective change rate is substantially uniform as a compositional gradation layer thickness increases.

24. An optical interconnection system, comprising:
a surface-emission laser diode array comprising a substrate and a plurality of surface-emission laser diodes formed commonly on said substrate; and
an optical transmission path coupled optically to each of said plurality of surface-emission laser diodes, each of said surface-emission laser diodes comprising:
an active layer; and
a resonator cooperating with said active layer, said active layer comprising upper and lower reflectors disposed above and below said active layer, at least one of said upper and lower reflectors comprising a distributed Bragg reflector, comprising:
a first semiconductor layer having a first refractive index;
a second semiconductor layer having a second refractive index, said first refractive index larger than said second refractive index, said first and second semiconductor layers being stacked alternately; and
a material layer having a third refractive index intermediate between said first and second refractive indices,
said distributed Bragg reflector being tuned to a wavelength of 1.1 gin or longer, and
said material layer having a thickness smaller than or equal to (0.05$\lambda$–15)(nm) where $\lambda$ is a tuned wavelength (nm) of the distributed Bragg reflector, such that a reflective change rate is substantially uniform as a compositional gradation layer thickness increases.

25. An optical telecommunication system, comprising:
a surface-emission laser diode; and
an optical transmission path coupled optically to said surface-emission laser diode, said surface-emission laser diode comprising:
an active layer; and
a resonator cooperating with said active layer, said active layer comprising upper and lower reflectors disposed above and below said active layer, at least one of said upper and lower reflectors comprising a distributed Bragg reflector, comprising:
a first semiconductor layer having a first refractive index;
a second semiconductor layer having a second refractive index, said first refractive index larger than said second refractive index, said first and second semiconductor layers being stacked alternately; and
a material layer having a third refractive index intermediate between said first and second refractive indices,
said distributed Bragg reflector being tuned to a wavelength of 1.1 $\mu$m or longer, and
said material layer having a thickness equal to or larger than 5 nm but equal to or smaller than 50 nm such that a reflective change rate is substantially uniform as a compositional gradation layer thickness increases.

26. An optical telecommunication system, comprising:
a surface-emission laser diode; and
an optical transmission path coupled optically to said surface-emission laser diode, said surface-emission laser diode comprising:
an active layer; and
a resonator cooperating with said active layer, said active layer comprising upper and lower reflectors disposed above and below said active layer, at least one of said upper and lower reflectors comprising a distributed Bragg reflector, comprising:
a first semiconductor layer having a first refractive index;
a second semiconductor layer having a second refractive index, said first refractive index larger than said second refractive index, said first and second semiconductor layers being stacked alternately; and
a material layer having a third refractive index intermediate between said first and second refractive indices,
said distributed Bragg reflector being tuned to a wavelength of 1.1 $\mu$m or longer, and
said material layer having a thickness smaller than or equal to (0.05$\lambda$–15)(nm) where $\lambda$ is a tuned wavelength (nm) of the distributed Bragg reflector, such that a reflective change rate is substantially uniform as a compositional gradation layer thickness increases.

27. An optical telecommunication system, comprising:
a surface-emission laser diode array comprising a substrate and a plurality of surface-emission laser diodes provided commonly on said substrate; and
an optical transmission path coupled optically to each of said plurality of surface-emission laser diodes, each of said plurality of surface-emission laser diodes comprising:
an active layer; and
a resonator cooperating with said active layer, said active layer comprising upper and lower reflectors disposed above and below said active layer, at least one of said upper and lower reflectors comprising a distributed Bragg reflector, comprising:

a first semiconductor layer having a first refractive index;

a second semiconductor layer having a second refractive index, said first refractive index larger than said second refractive index, said first and second semiconductor layers being stacked alternately; and a material layer having a third refractive index intermediate between said first and second refractive indices, said distributed Bragg reflector being tuned to a wavelength of 1.1 μm or longer, and said material layer having a thickness equal to or larger than 5 nm but equal to or smaller than 50 nm such that a reflective change rate is substantially uniform as a compositional gradation layer thickness increases.

28. An optical telecommunication system, comprising:

a surface-emission laser diode array comprising a substrate and a plurality of surface-emission laser diodes provided commonly on said substrate; and an optical transmission path coupled optically to each of said plurality of surface-emission laser diodes, each of said plurality of surface-emission laser diodes comprising:

an active layer; and a resonator cooperating with said active layer, said active layer comprising upper and lower reflectors disposed above and below said active layer, at least one of said upper and lower reflectors comprising a distributed Bragg reflector, comprising:

a first semiconductor layer having a first refractive index;

a second semiconductor layer having a second refractive index, said first refractive index larger than said second refractive index, said first and second semiconductor layers being stacked alternately; and a material layer having a third refractive index intermediate between said first and second refractive indices, said distributed Bragg reflector being tuned to a wavelength of 1.1 μm or longer, and said material layer having a thickness smaller than or equal to $(0.05\lambda - 15)$(nm) where $\lambda$ is a tune wavelength (nm) of the distributed Bragg reflector, such that a reflective change rate is substantially uniform as a compositional gradation layer thickness increases.

* * * * *